United States Patent
Ratnam et al.

(10) Patent No.: US 10,032,908 B1
(45) Date of Patent: Jul. 24, 2018

(54) MULTI-GATE VERTICAL FIELD EFFECT TRANSISTOR WITH CHANNEL STRIPS LATERALLY CONFINED BY GATE DIELECTRIC LAYERS, AND METHOD OF MAKING THEREOF

(71) Applicant: SANDISK TECHNOLOGIES LLC, Plano, TX (US)

(72) Inventors: Perumal Ratnam, Fremont, CA (US); Christopher Petti, Mountain View, CA (US); Juan Saenz, Mountain View, CA (US); Guangle Zhou, Fremont, CA (US); Abhijit Bandyopadhyay, San Jose, CA (US); Tanmay Kumar, Pleasanton, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/400,244

(22) Filed: Jan. 6, 2017

(51) Int. Cl.
*H01L 29/78* (2006.01)
*H01L 27/24* (2006.01)
(Continued)

(52) U.S. Cl.
CPC ...... *H01L 29/7827* (2013.01); *H01L 23/5283* (2013.01); *H01L 27/2454* (2013.01);
(Continued)

(58) Field of Classification Search
CPC ............ H01L 21/823487; H01L 21/84; H01L 27/2454; H01L 27/1203; H01L 27/2481;
(Continued)

(56) References Cited

U.S. PATENT DOCUMENTS

| 5,915,167 A | 6/1999 | Leedy |
| 7,005,350 B2 | 2/2006 | Walker et al. |

(Continued)

FOREIGN PATENT DOCUMENTS

| EP | 0 721 221 A2 | 7/1996 |
| KR | 20100109745 A | 10/2010 |

(Continued)

OTHER PUBLICATIONS

U.S. Appl. No. 15/207,042, filed Jul. 11, 2016, SanDisk Corporation.

(Continued)

*Primary Examiner* — Marc Armand
*Assistant Examiner* — Younes Boulghassoul
(74) *Attorney, Agent, or Firm* — The Marbury Law Group PLLC

(57) ABSTRACT

A matrix rail structure is formed over a substrate. The matrix rail structure includes a pair of lengthwise sidewalls that extend along a first horizontal direction and comprises, or is at least partially subsequently replaced with, a set of at least one gate electrode rail extending along the first horizontal direction and straight-sidewalled gate dielectrics. A pair of vertical semiconductor channel strips and a pair of laterally-undulating gate dielectrics can be formed on sidewalls of the matrix rail structure for each vertical field effect transistor. At least one laterally-undulating gate electrode extending along the first horizontal direction is formed on the laterally-undulating gate dielectrics. Bottom active regions and top active regions are formed at end portions of the vertical semiconductor channel strips. The vertical field effect transistors can be formed as a two-dimensional array, and may be employed as access transistors for a three-dimensional memory device.

26 Claims, 126 Drawing Sheets

(51) Int. Cl.
  *H01L 29/423* (2006.01)
  *H01L 23/528* (2006.01)
  *H01L 29/66* (2006.01)

(52) U.S. Cl.
  CPC .. *H01L 29/42364* (2013.01); *H01L 29/42376* (2013.01); *H01L 29/66666* (2013.01)

(58) Field of Classification Search
  CPC ........... H01L 27/1157; H01L 27/11273; H01L 27/11524; H01L 27/11556; H01L 27/11582; H01L 27/249; H01L 29/66666; H01L 29/6656; H01L 29/66787; H01L 29/7827–29/7828; H01L 29/42392; H01L 29/42356; H01L 29/42384; H01L 29/41741; H01L 29/66712–29/66734; H01L 29/7802–29/7815; H01L 29/78648; H01L 29/0847; H01L 29/7391; H01L 29/78642; H01L 29/1033; H01L 29/7889; H01L 29/7926; H01L 29/4925; H01L 29/4883; H01L 45/04; H01L 45/1226; H01L 45/146; H01L 45/065; H01L 45/085; H01L 45/1233; H01L 45/1253; H01L 45/141; H01L 45/145; H01L 45/1675; H01L 45/124; H01L 45/1246; H01L 45/1266; H01L 51/057; G11C 13/004; G11C 13/0007; G11C 13/0026; G11C 13/0028; G11C 13/0069
  USPC .......................... 257/329, 379; 438/210, 238
  See application file for complete search history.

(56) References Cited

U.S. PATENT DOCUMENTS

| | | |
|---|---|---|
| 7,023,739 B2 | 4/2006 | Chen et al. |
| 7,129,538 B2 | 10/2006 | Lee et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,764,534 B2 | 7/2010 | Thorp et al. |
| 7,808,038 B2 | 10/2010 | Mokhlesi et al. |
| 7,825,455 B2 | 11/2010 | Lee et al. |
| 7,846,782 B2 | 12/2010 | Maxwell et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,932 B2 | 5/2012 | Nguyen et al. |
| 8,394,716 B2 | 3/2013 | Hwang et al. |
| 8,520,425 B2 | 8/2013 | Xiao et al. |
| 9,230,905 B2 | 1/2016 | Takaki et al. |
| 9,331,088 B2 | 5/2016 | Takaki |
| 9,343,507 B2* | 5/2016 | Takaki ................ H01L 27/2481 |
| 9,449,924 B2 | 9/2016 | Takaki |
| 9,583,615 B2* | 2/2017 | Chen ................... H01L 29/0847 |
| 9,768,180 B1* | 9/2017 | Zhou .................... H01L 27/115 |
| 9,806,256 B1* | 10/2017 | Wu ........................ H01L 45/124 |
| 9,911,790 B1* | 3/2018 | Shimabukuro ....... H01L 27/249 |
| 2002/0109176 A1 | 8/2002 | Forbes et al. |
| 2002/0109526 A1 | 8/2002 | Forbes et al. |
| 2003/0062574 A1* | 4/2003 | Hsieh ...................... H01L 27/11 257/379 |
| 2007/0210338 A1 | 9/2007 | Orlowski |
| 2007/0252201 A1 | 11/2007 | Kito et al. |
| 2009/0003082 A1 | 1/2009 | Meeks et al. |
| 2009/0194813 A1 | 8/2009 | Fujimoto |
| 2009/0230449 A1 | 9/2009 | Sakaguchi et al. |
| 2010/0013049 A1 | 1/2010 | Tanaka et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0254191 A1 | 10/2010 | Son et al. |
| 2010/0320528 A1 | 12/2010 | Jeong et al. |
| 2011/0031546 A1 | 2/2011 | Uenaka et al. |
| 2011/0076819 A1 | 3/2011 | Kim et al. |
| 2011/0133606 A1 | 6/2011 | Yoshida et al. |
| 2011/0169071 A1 | 7/2011 | Uenaka |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0132986 A1 | 5/2012 | Kang et al. |
| 2012/0147648 A1 | 6/2012 | Scheuerlein |
| 2012/0161094 A1 | 6/2012 | Huo et al. |
| 2012/0228677 A1 | 9/2012 | Masuoka et al. |
| 2012/0241826 A1 | 9/2012 | Satoh et al. |
| 2013/0026471 A1 | 1/2013 | Zahurak et al. |
| 2013/0264631 A1 | 10/2013 | Alsmeier et al. |
| 2013/0313627 A1 | 11/2013 | Lee |
| 2014/0124729 A1 | 5/2014 | Hwang et al. |
| 2016/0079258 A1 | 3/2016 | Lee et al. |
| 2016/0240665 A1 | 8/2016 | Chen et al. |

FOREIGN PATENT DOCUMENTS

| | | |
|---|---|---|
| KR | 20110021444 A | 3/2011 |
| WO | WO2002/015277 A2 | 2/2002 |

OTHER PUBLICATIONS

U.S. Appl. No. 15/293,971, filed Oct. 14, 2016, SanDisk Corporation.
Invitation to Pay Additional Search Fees issued in PCT Application No. PCT/US13/41410, dated Sep. 9, 2013.(6 pp).
International Search Report & Written Opinion, PCT/US2011/042566, dated Jan. 17, 2012 (30 pp).
Invitation to Pay Additional Fees & Partial International Search Report, PCT/US2011/042566, dated Sep. 28, 2011. (7 pp).
Endoh, T.et al., titled "Novel Ultra High Density Memory With a Stacked-Surrounding Gate Transistor (S-SGT) Structured Cell", IEDM Proc. (2001) 33-36.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Kimura, Masahide "3D Cells Make Terabit NAND Flash Possible," Nikkei Electronics Asia, Sep. 17, 2009, 6pgs.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.
Invitation to Pay Additional Search Fees issued in PCT Application No. PCT/US15/62548, dated Feb. 15, 2016 (8 pgs.).
International Search Report & Written Opinion issued in PCT Application No. PCT/US15/62548, dated Apr. 21, 2016 (17 pgs.).
International search report and written opinion received in connection with international application No. PCT/US2015/019431; dated Jun. 17, 2015.
Liu, Fanyu, "Electrical Characterization and Modeling of Advanced SOI Materials and Devices," Ph. D. Thesis, Universit'e Grenoble

(56) References Cited

OTHER PUBLICATIONS

Alpes, Submitted Oct. 15, 2015, 214 pages. Available at https://tel.archives-ouvertes.fr/tel-01216170.

* cited by examiner

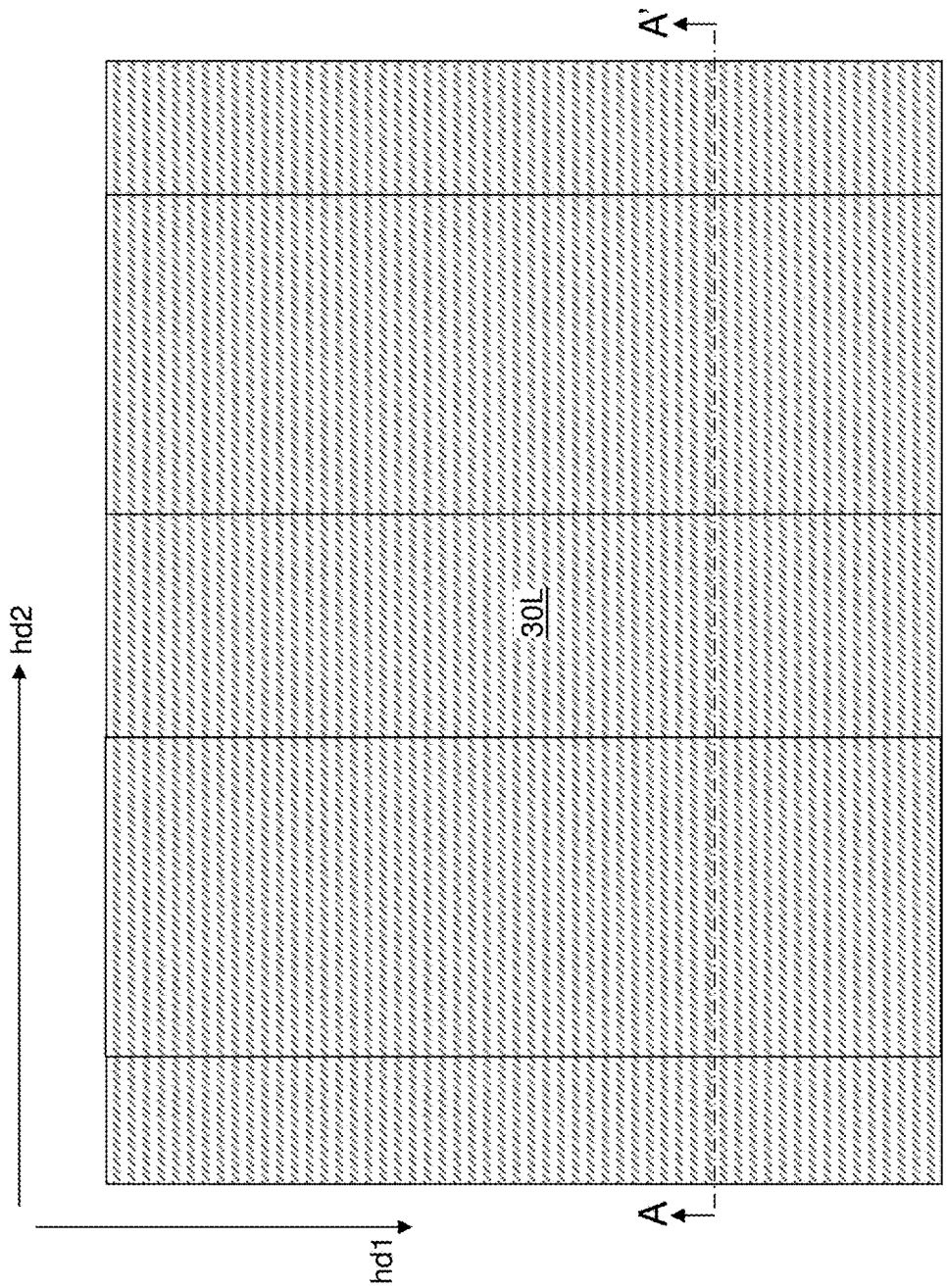

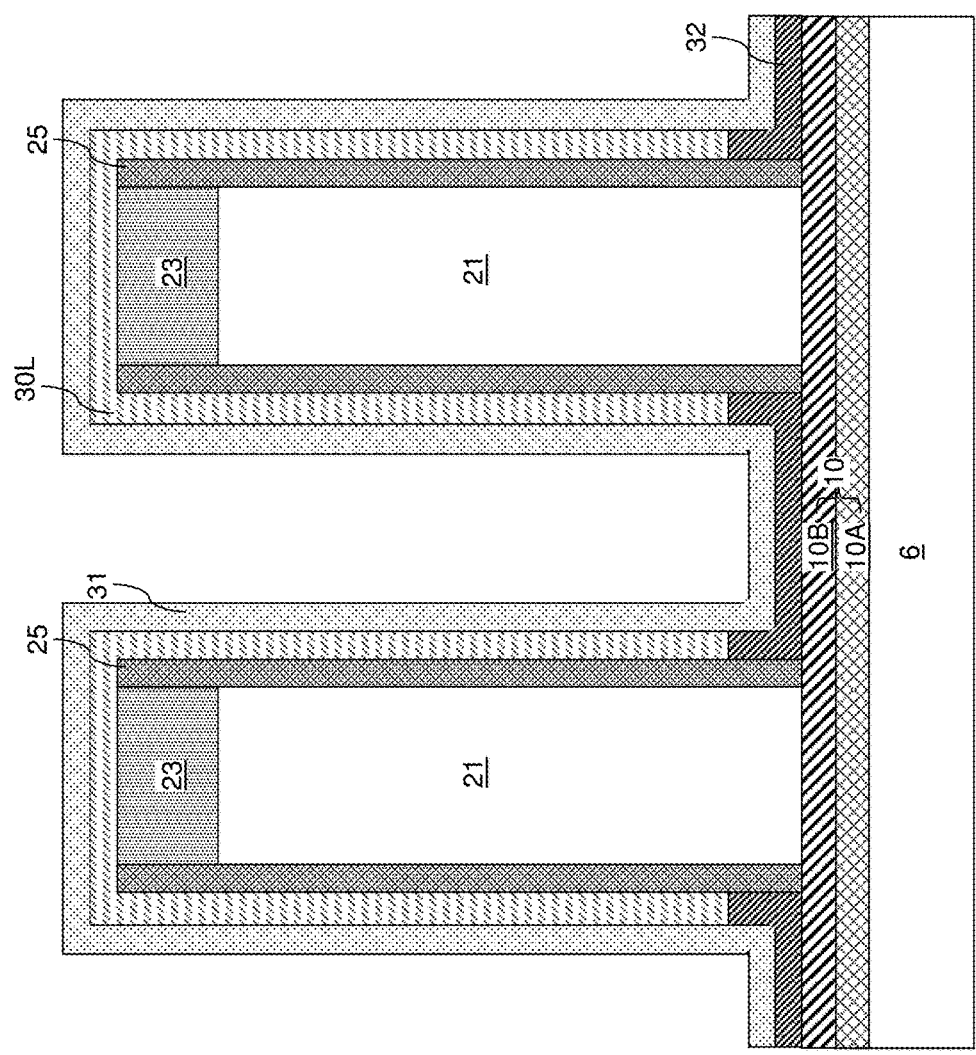

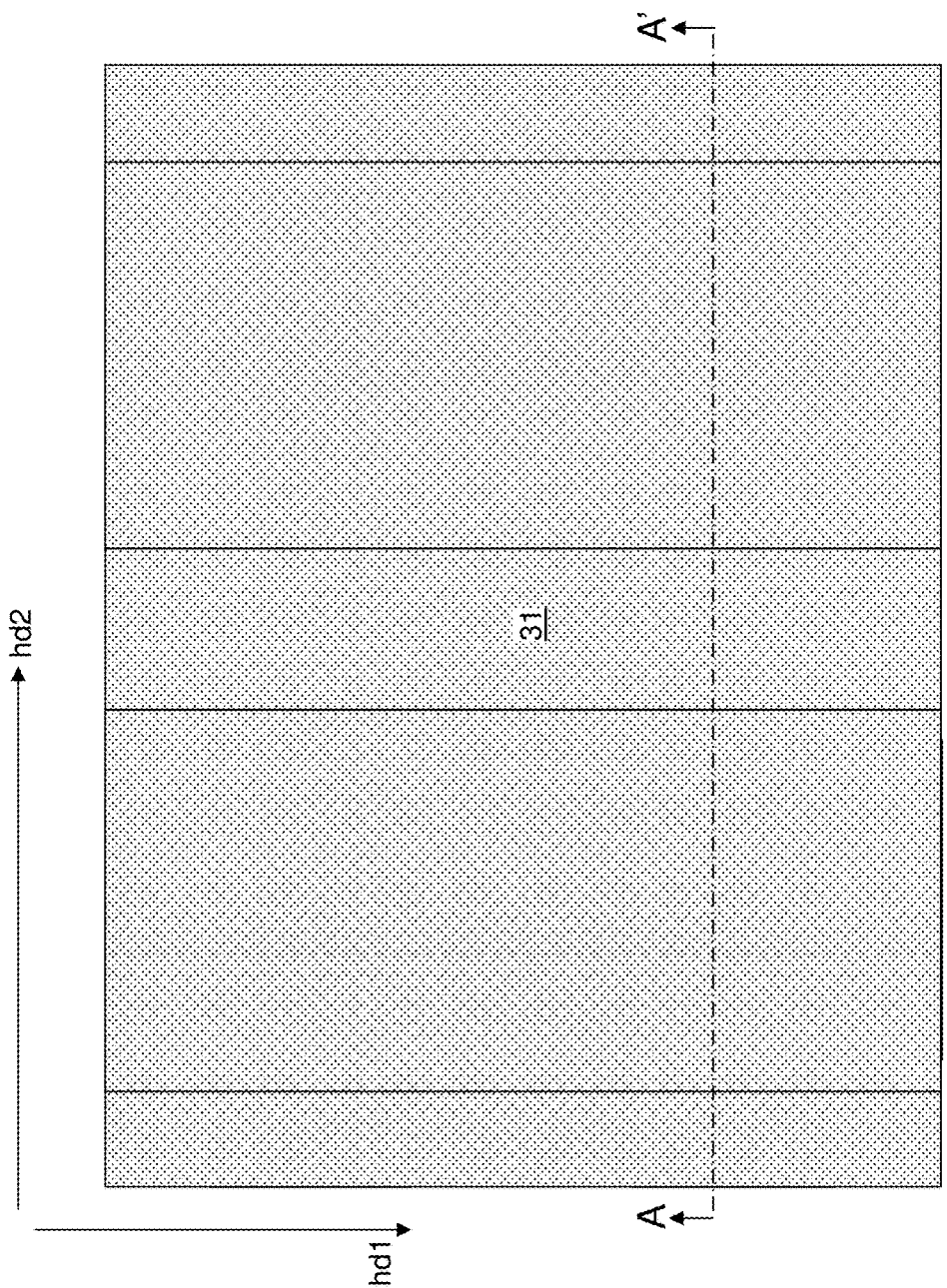

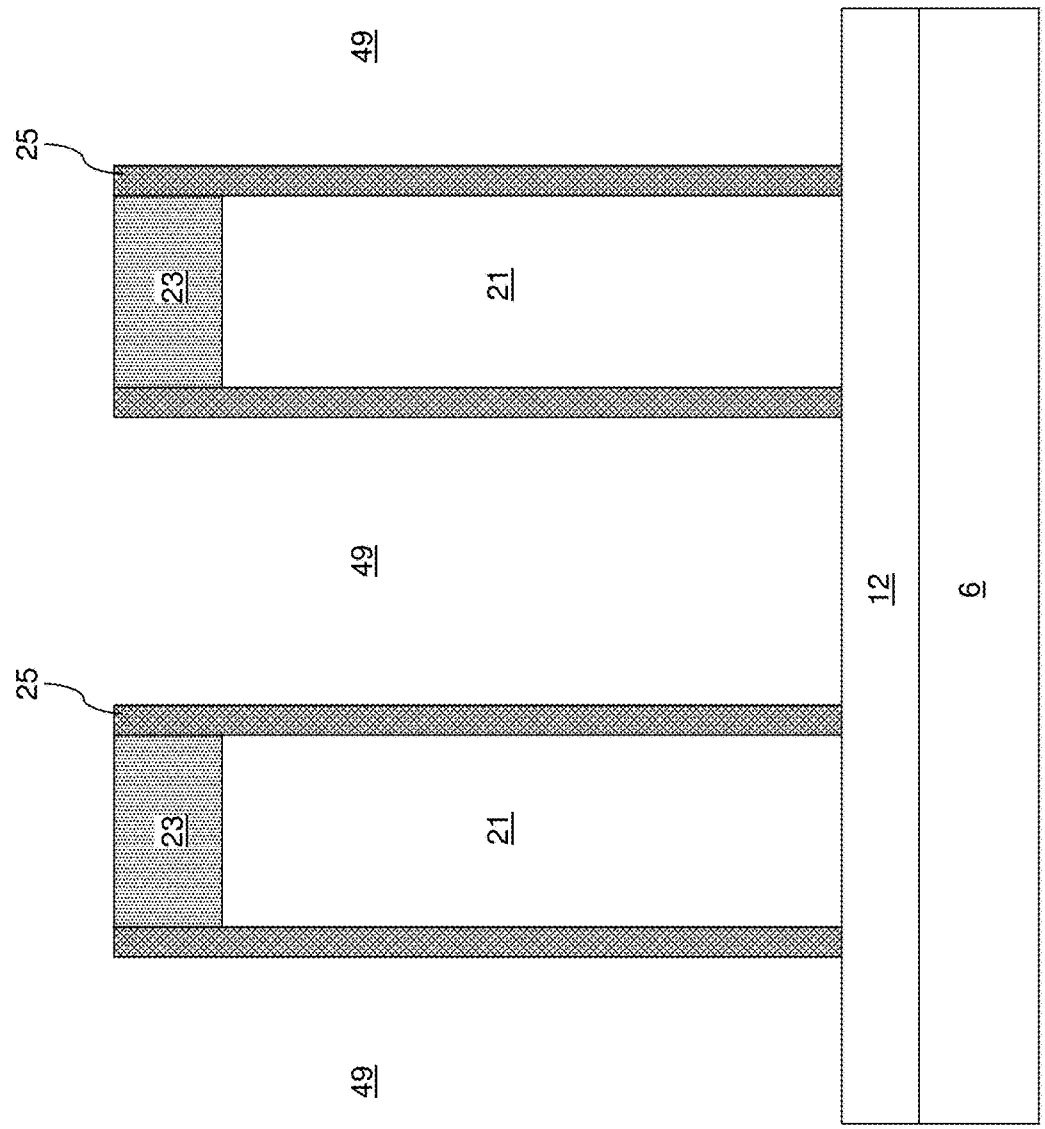

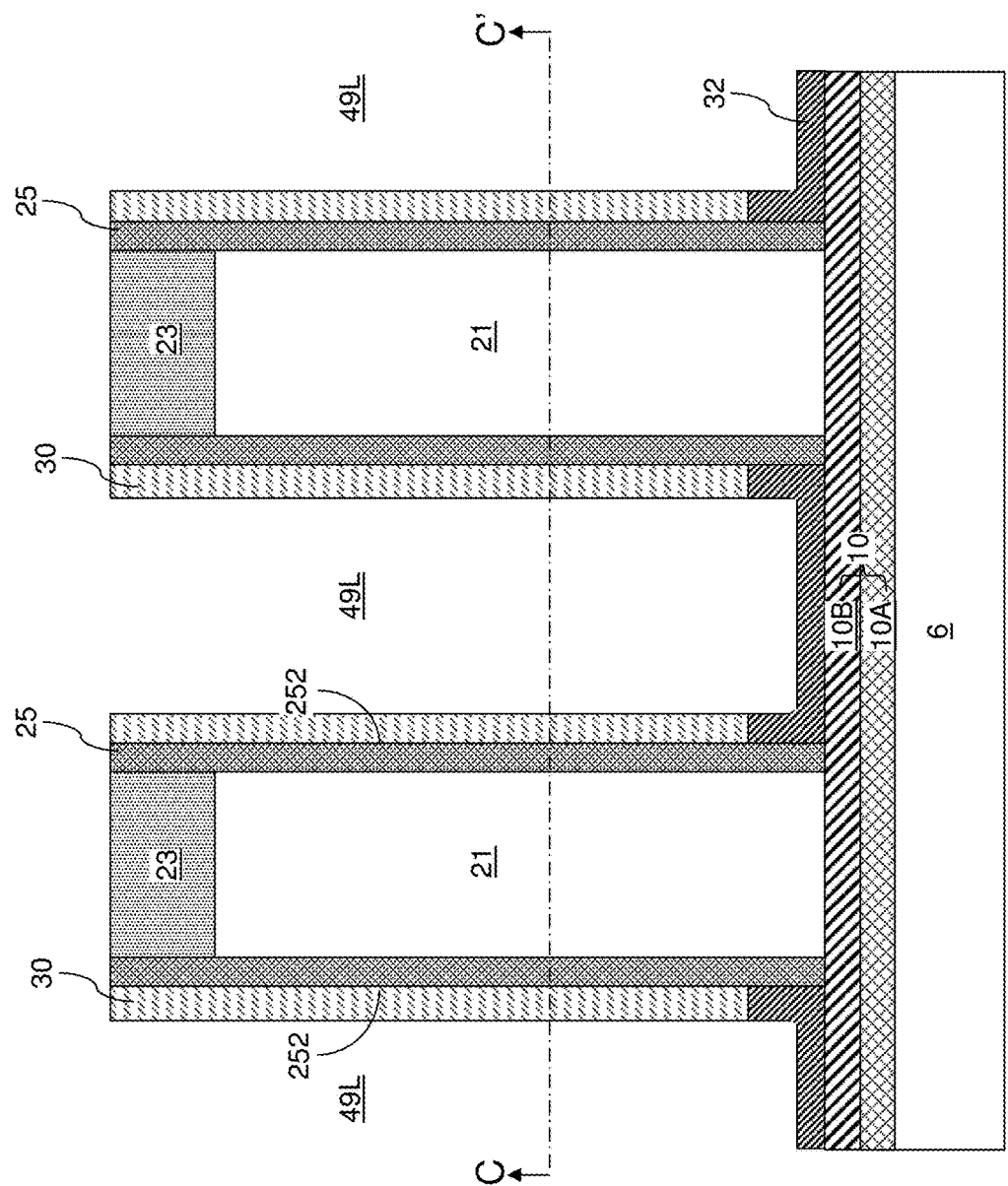

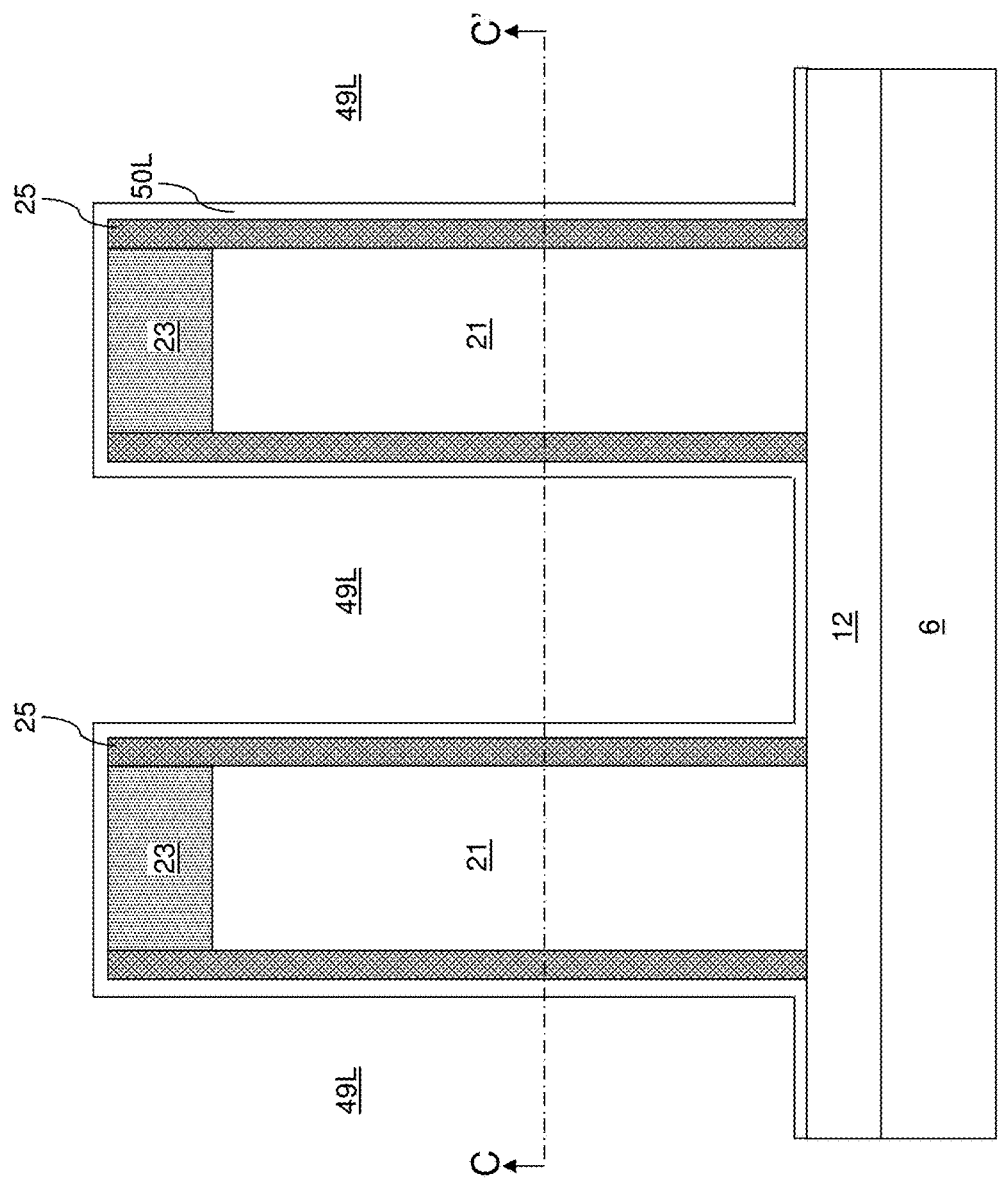

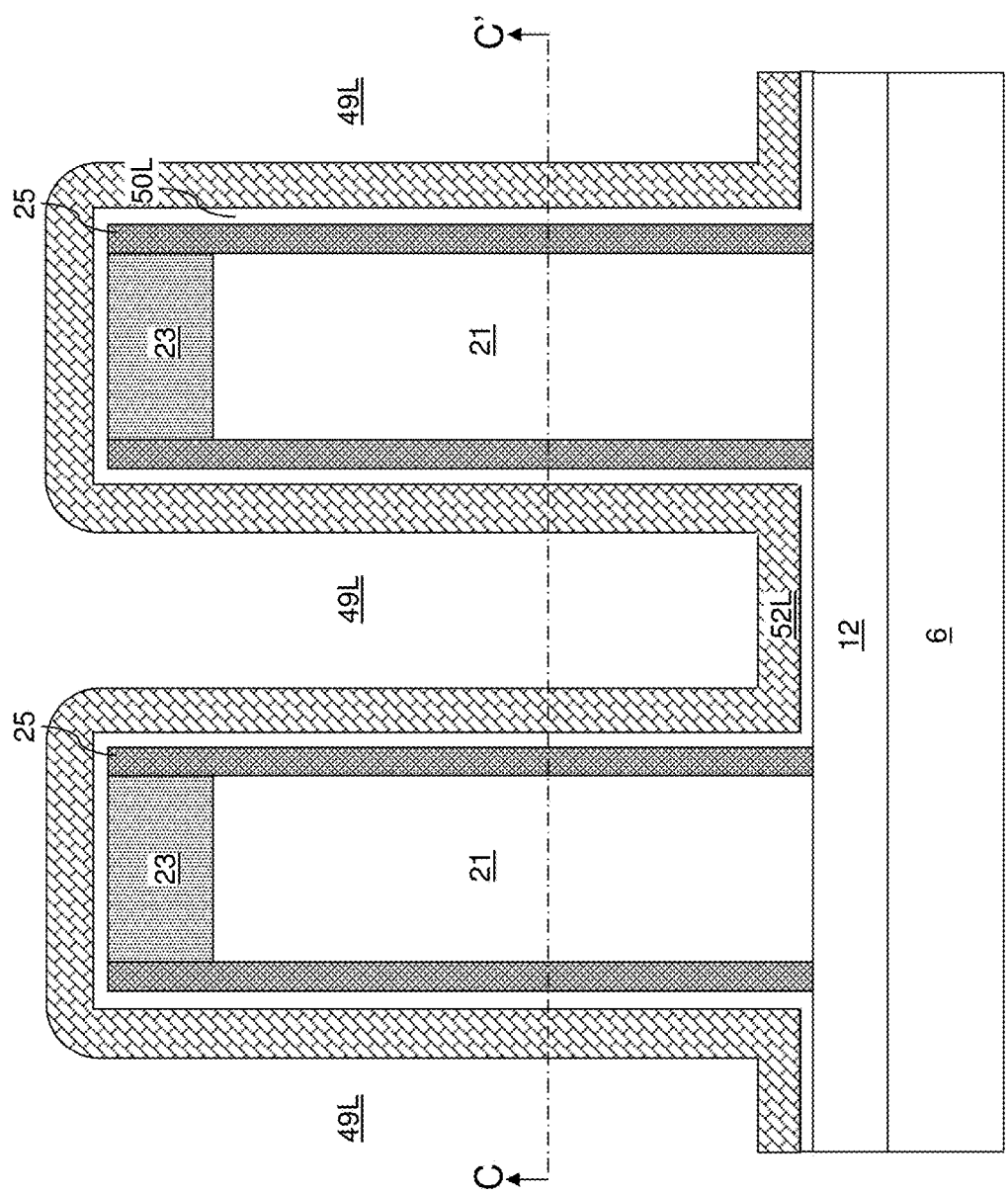

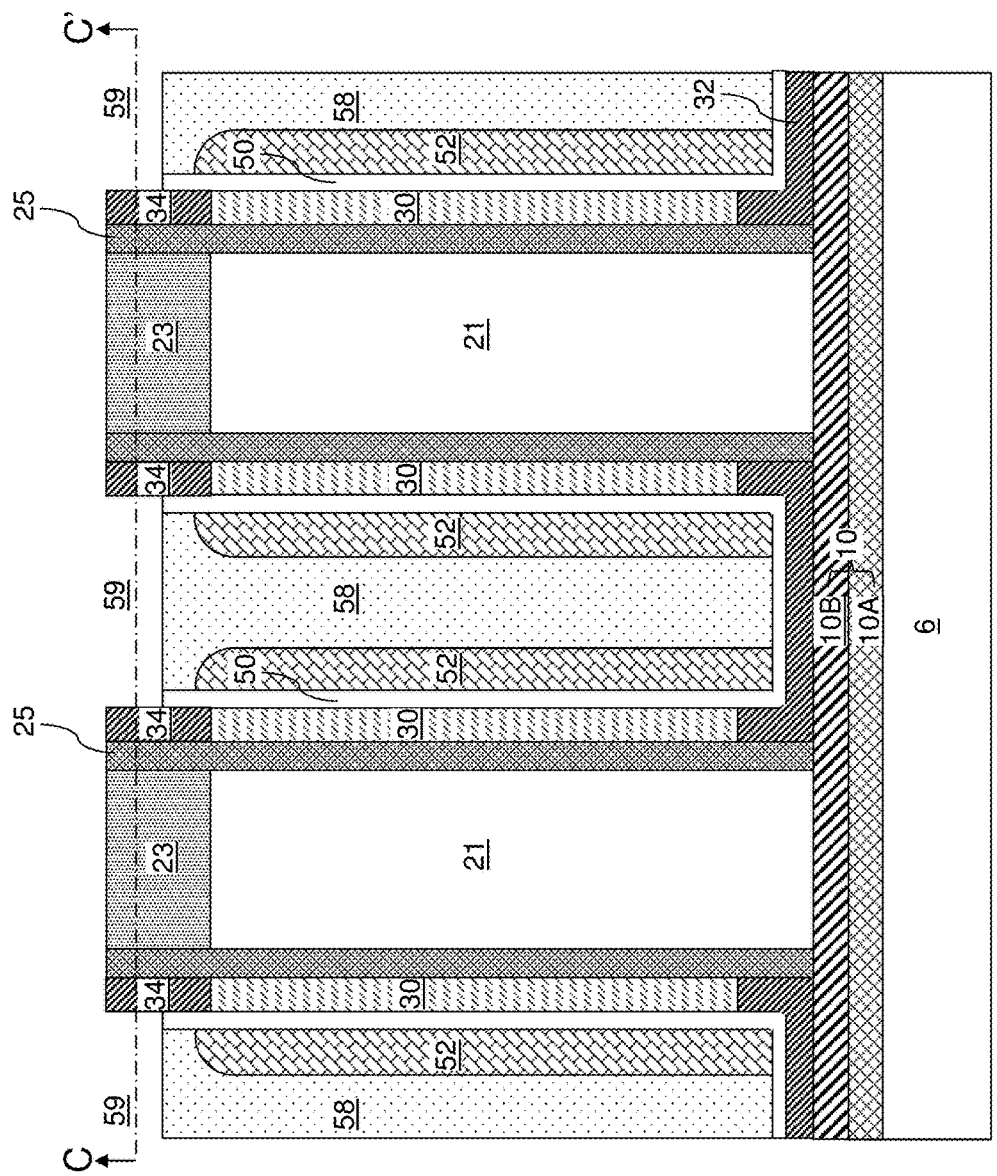

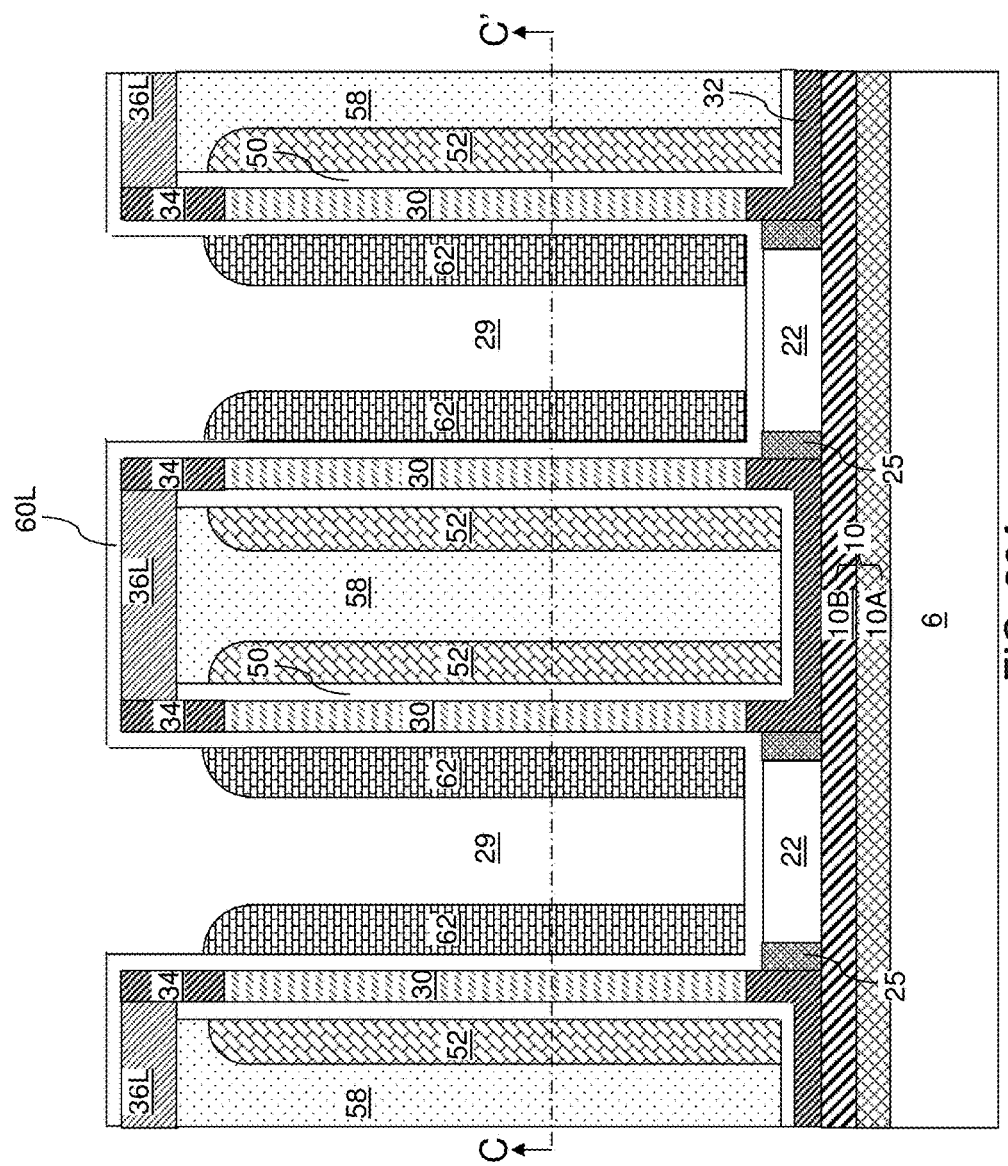

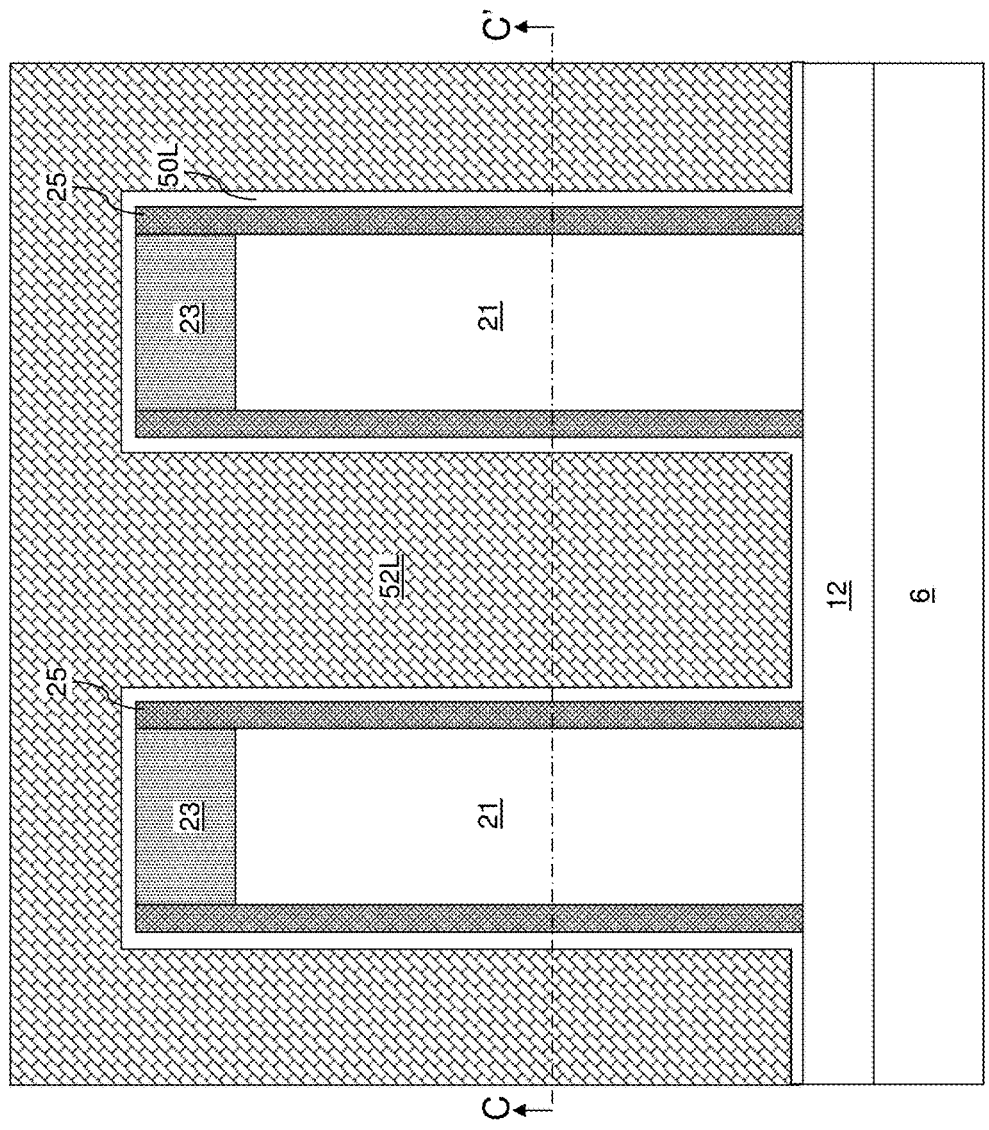

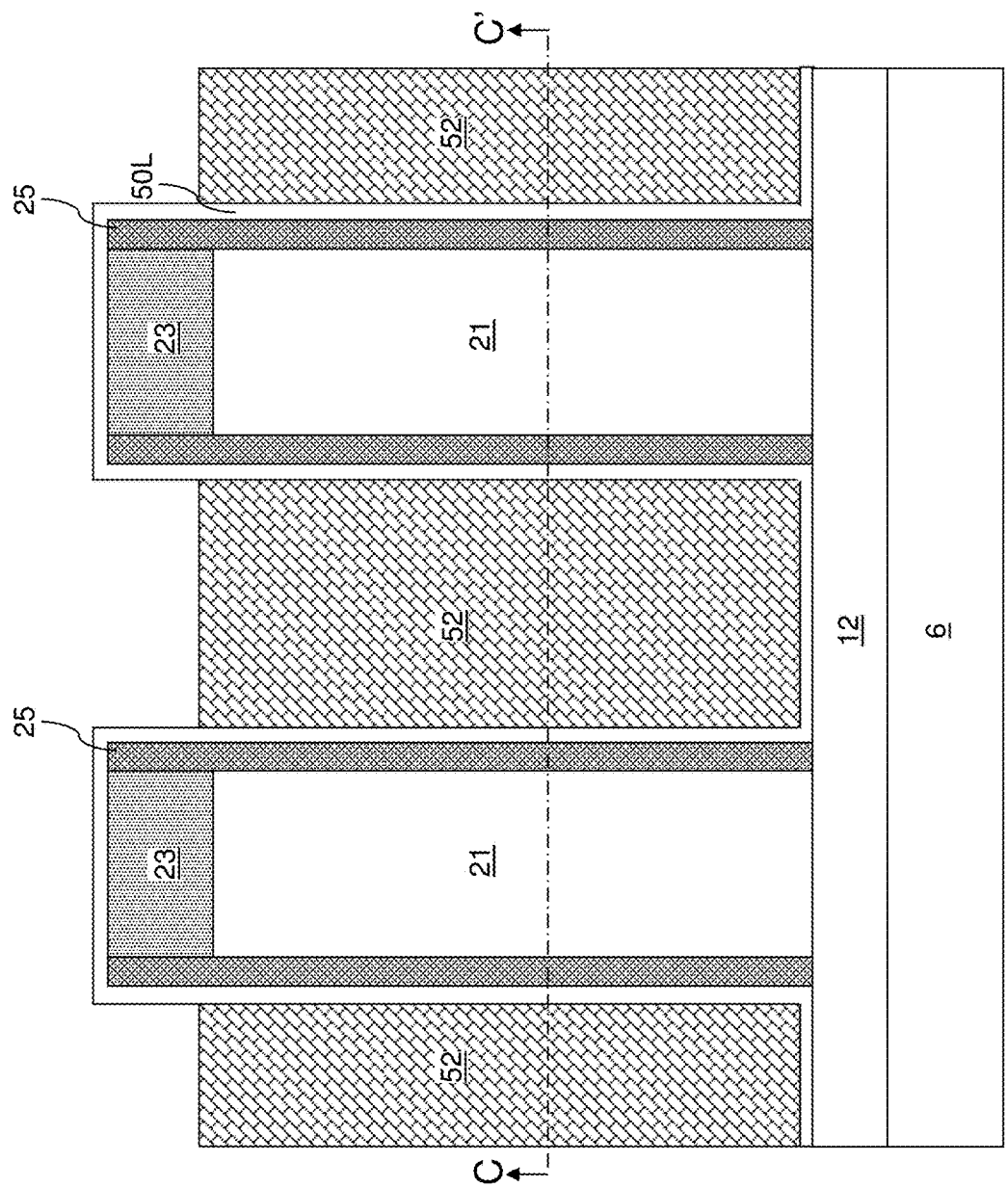

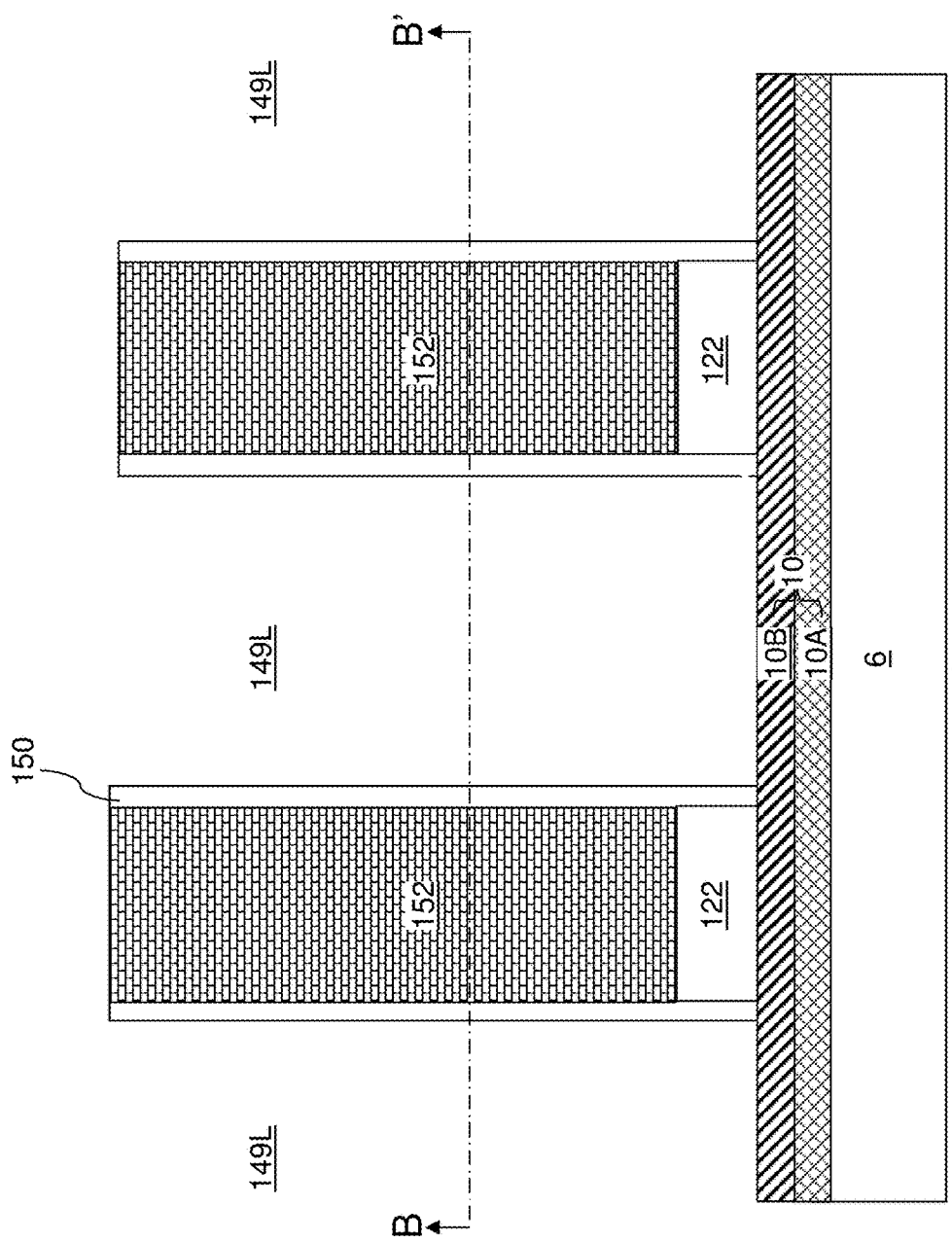

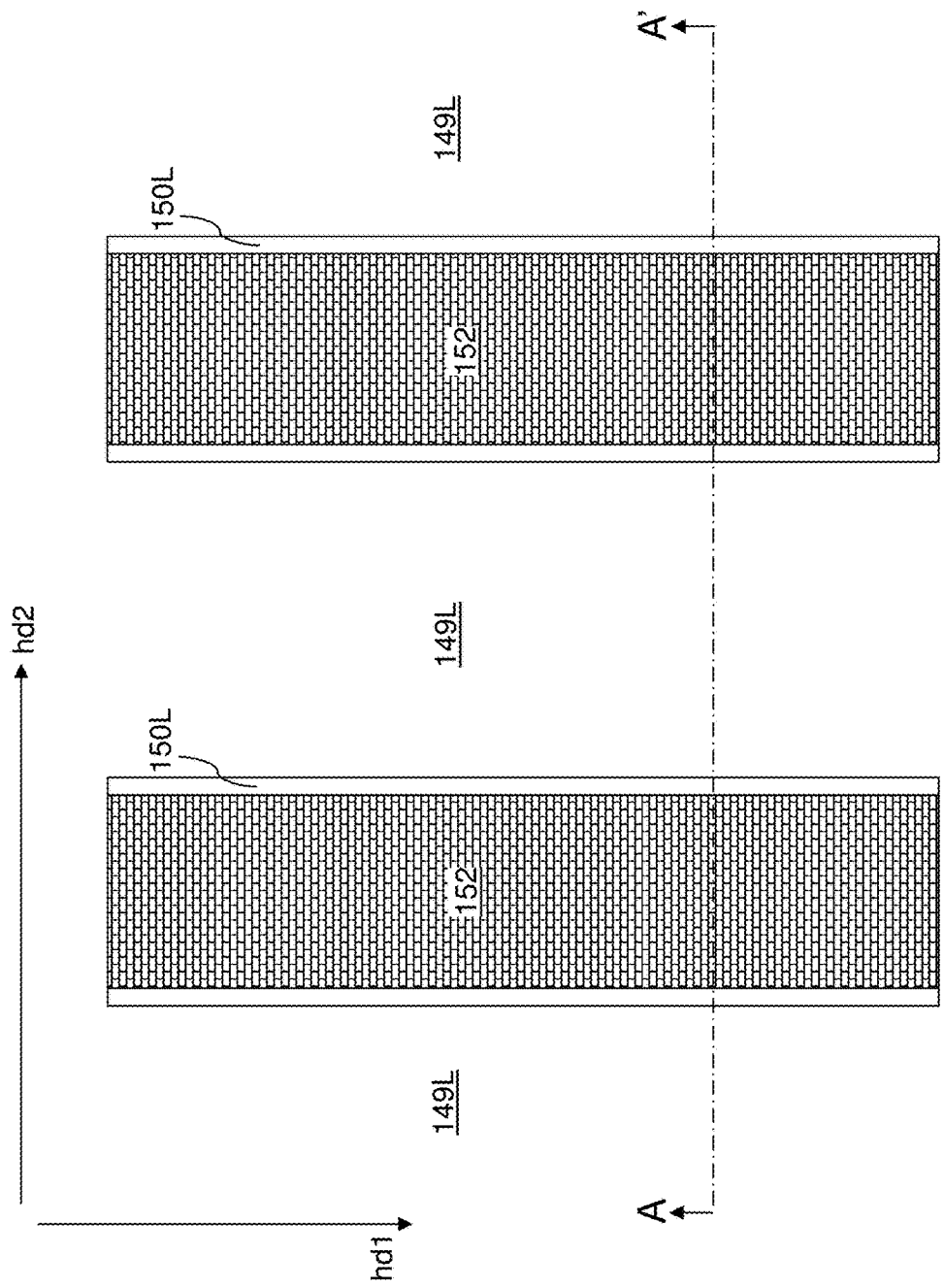

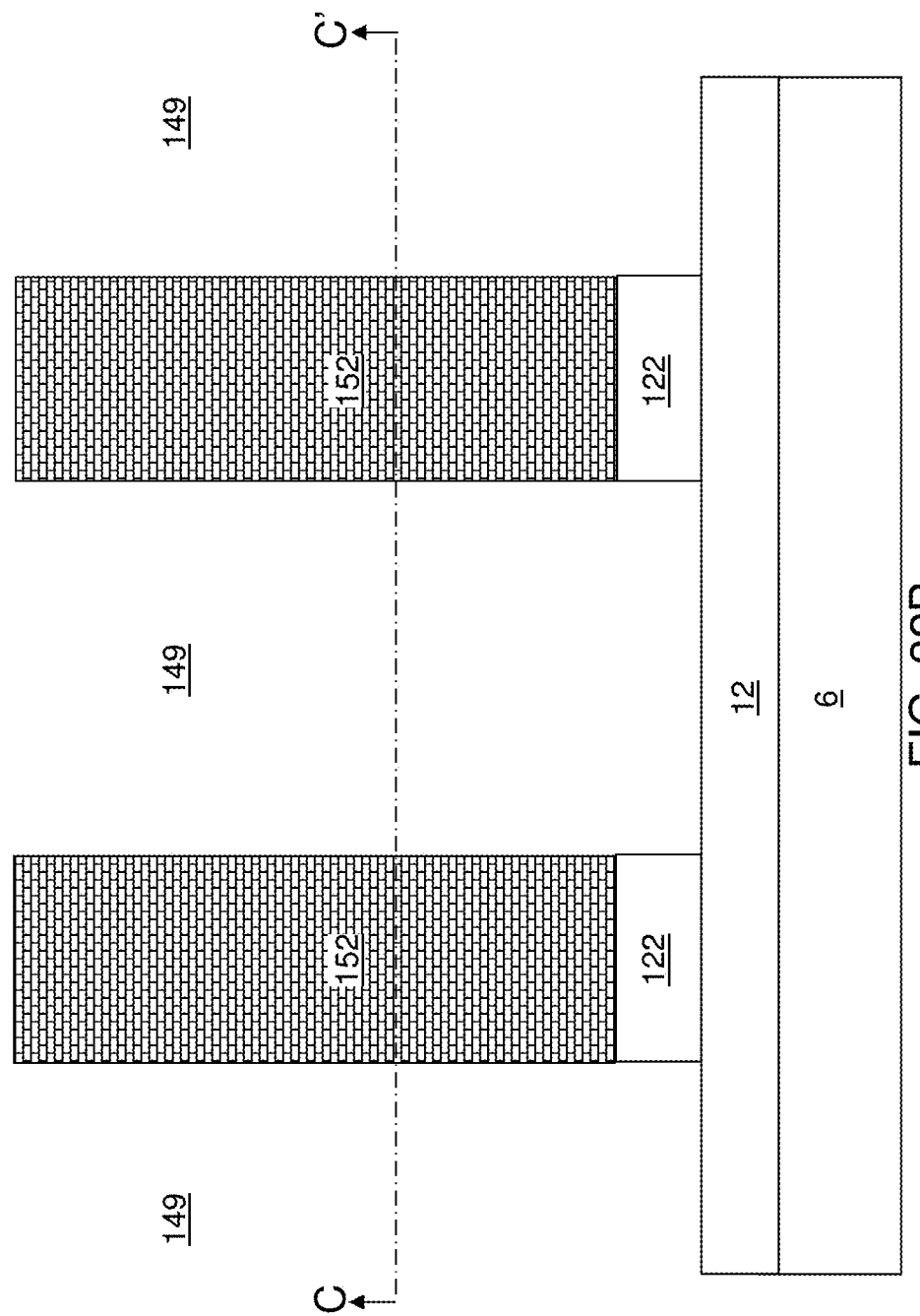

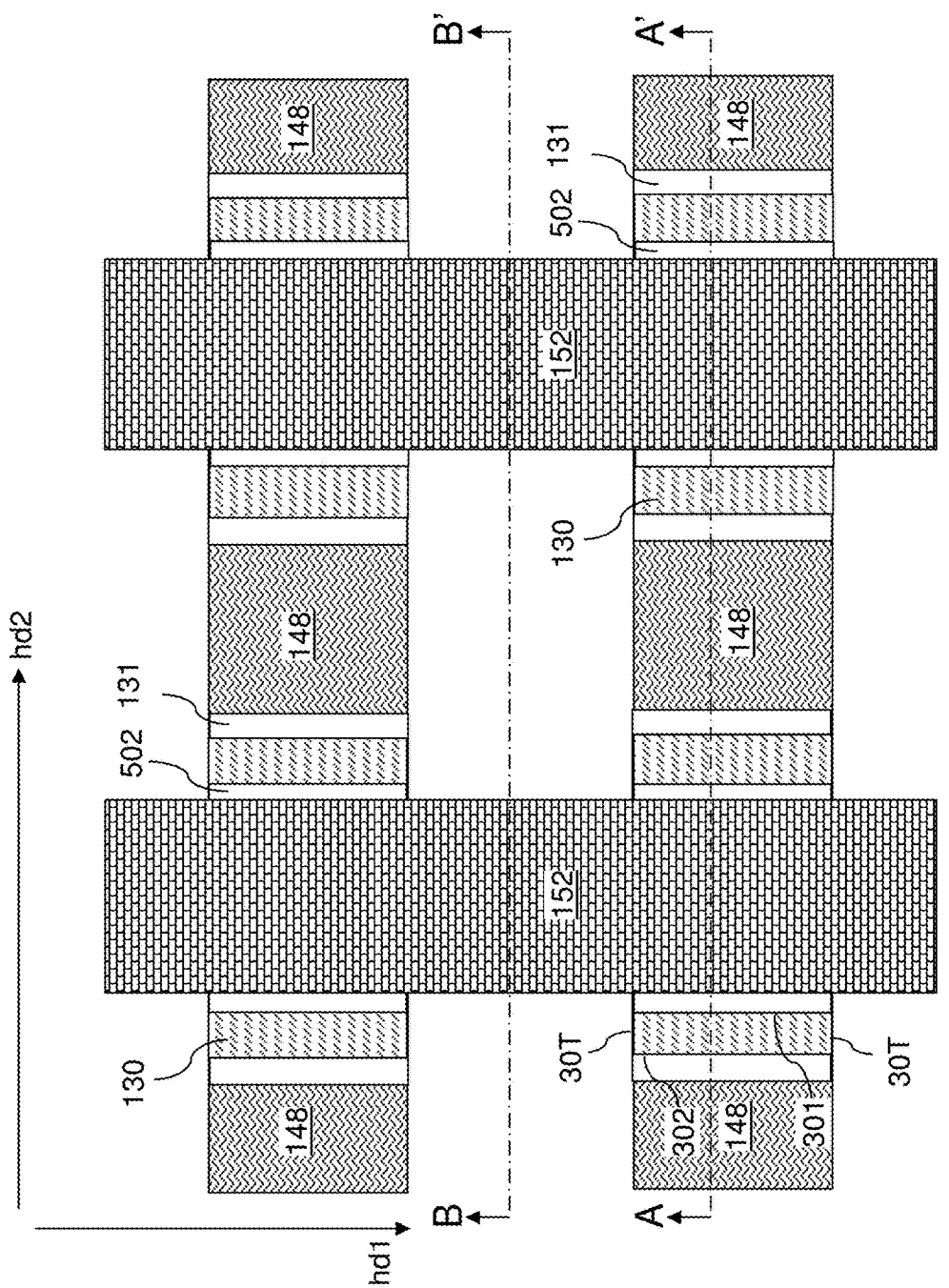

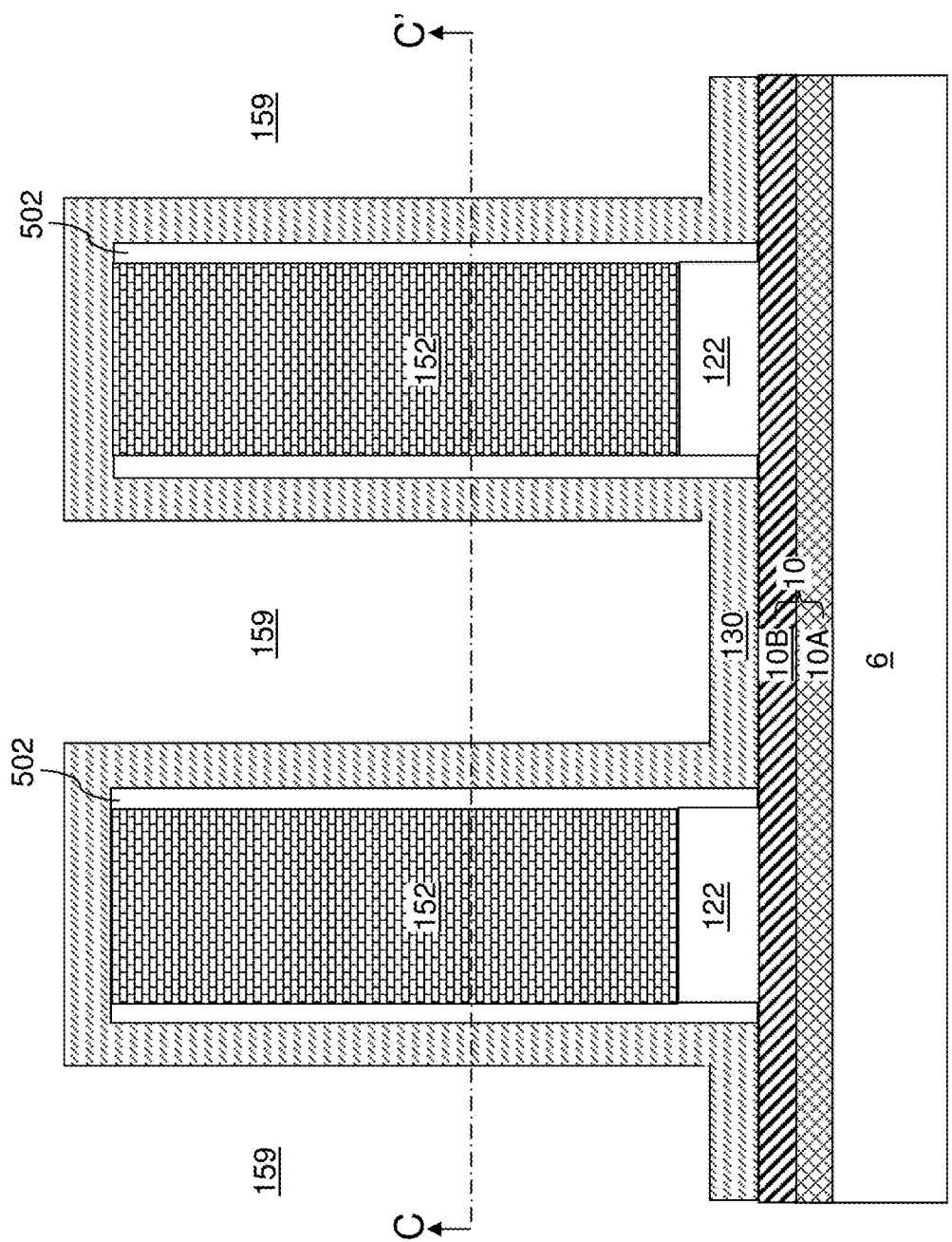

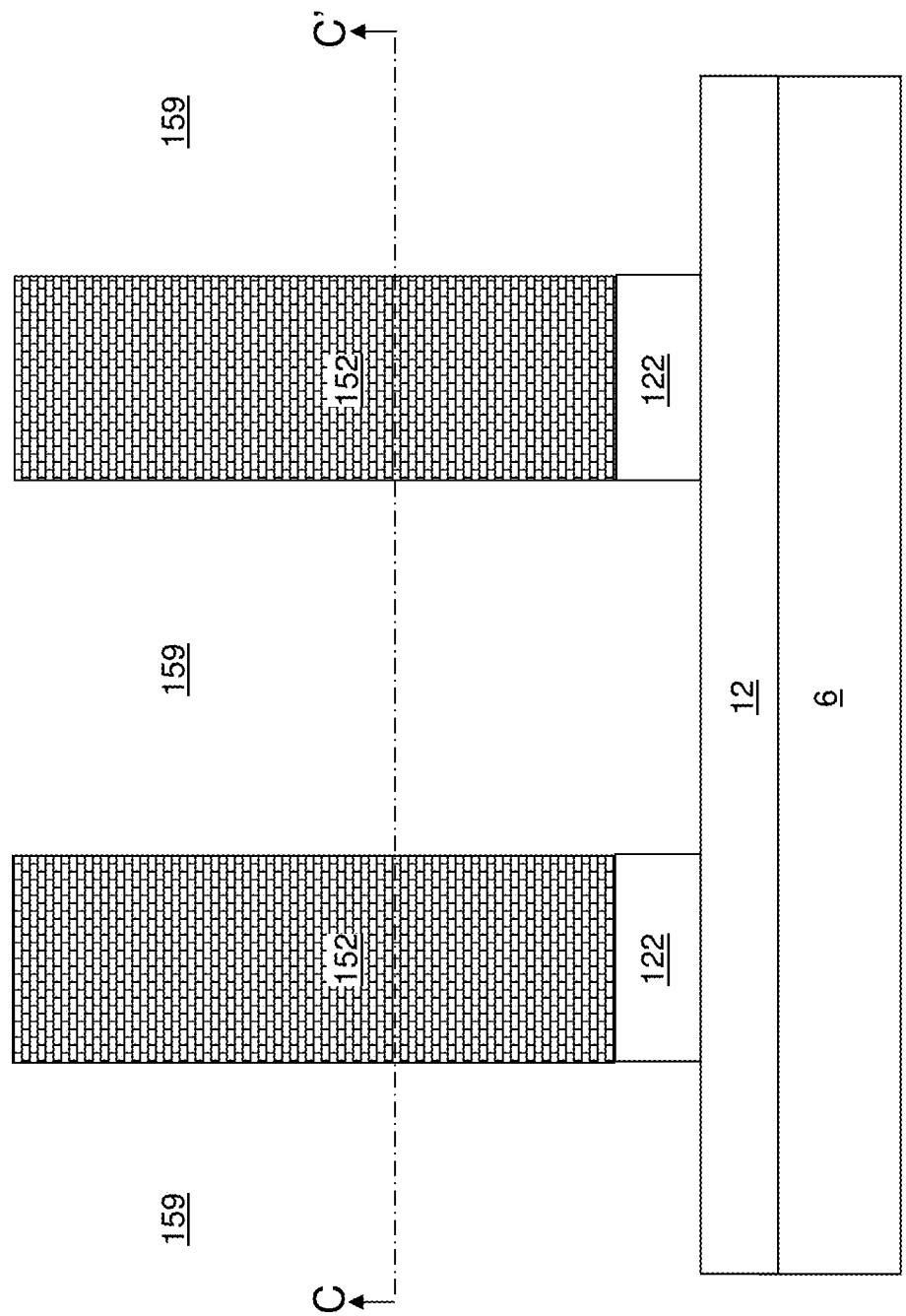

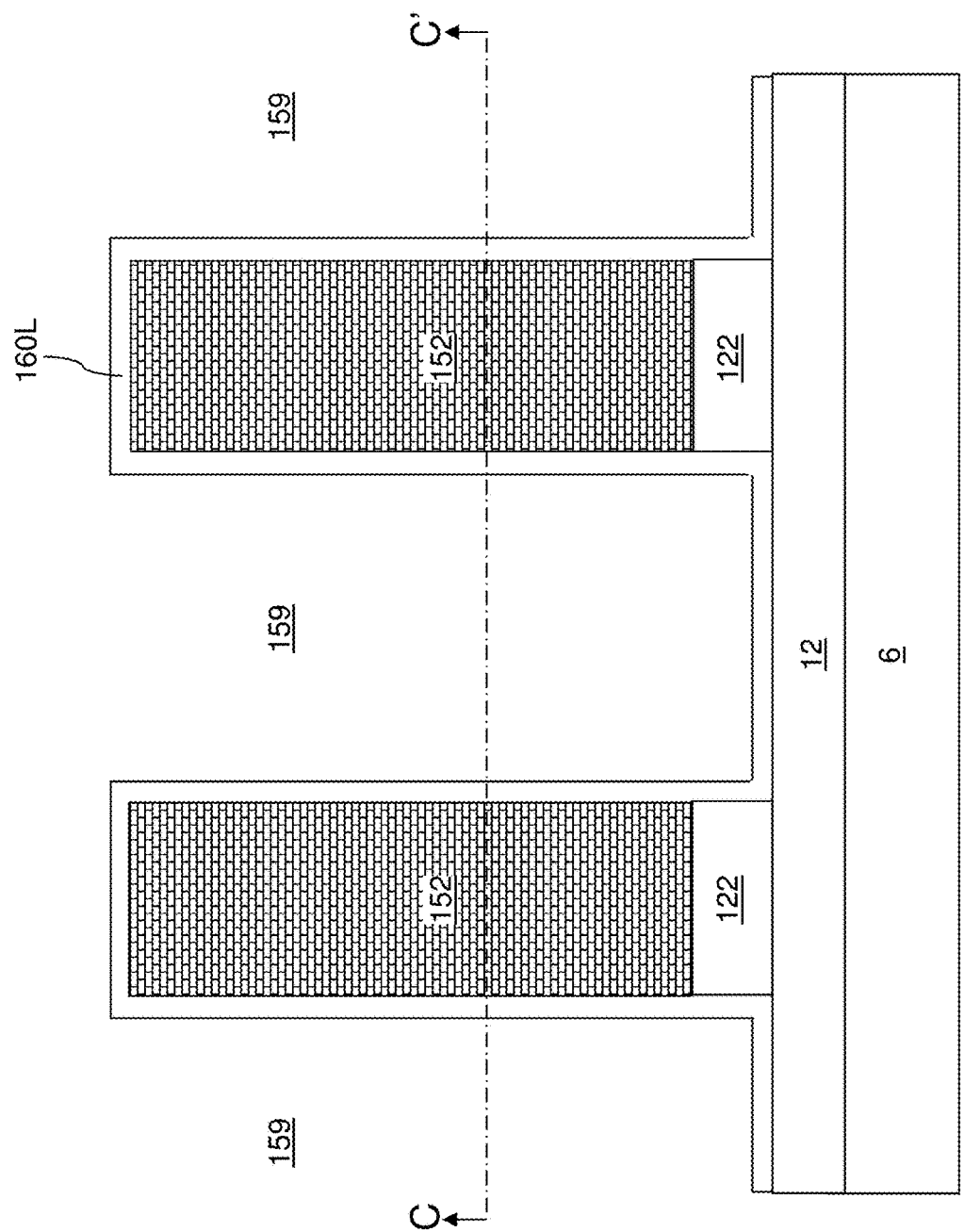

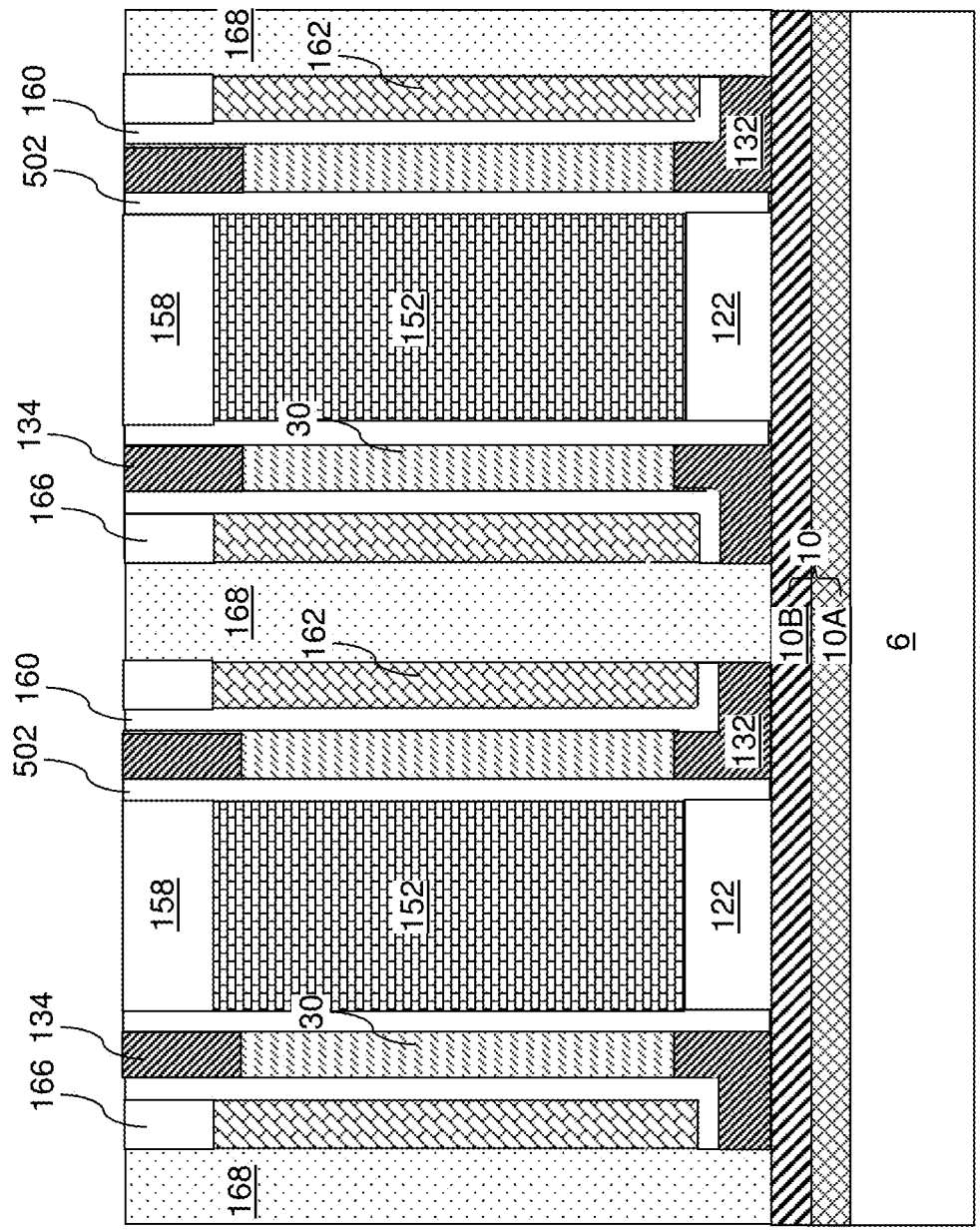

US 10,032,908 B1

MULTI-GATE VERTICAL FIELD EFFECT TRANSISTOR WITH CHANNEL STRIPS LATERALLY CONFINED BY GATE DIELECTRIC LAYERS, AND METHOD OF MAKING THEREOF

FIELD

The present disclosure relates generally to the field of semiconductor devices and specifically to vertical field effect transistors including multiple gate electrodes, and methods of making the same.

BACKGROUND

A two-dimensional array of vertical field effect transistors can be employed as access transistors for vertical conductive lines such as local bit lines of a three-dimensional memory device. Ideally, vertical field effect transistors need to provide a high on-current and a low off-current with a well-defined threshold voltage. Typical vertical field effect transistors have degradation in performance due to various factors, which include high leakage current and low on-current due to crystalline defects and limitation on the spatial extent of the depletion zone. Vertical field effect transistors providing superior performance are desired.

SUMMARY

According to an aspect of the present disclosure, a semiconductor device comprising at least one instance of a vertical field effect transistor is provided. Each instance of the field effect transistor comprises: at least one inner gate electrode extending along a first horizontal direction; a pair of inner gate dielectrics contacting a respective sidewall of the at least one inner gate electrode and vertically extending above topmost edges of the at least one inner gate electrode; a pair of vertical semiconductor channel strips, each including a first sidewall contacting a respective one of the pair of inner gate dielectrics, a second sidewall that is parallel to the first sidewall, and two transverse sidewalls each adjoining the first sidewall and the second sidewall; a pair of outer gate dielectrics contacting a respective one of the pair of vertical semiconductor channel strips; a pair of outer gate electrodes contacting a respective one of the pair of outer gate dielectrics; at least one bottom active region contacting the pair of vertical semiconductor channel strips and electrically shorted to a bottom electrode line; and a pair of top active regions contacting a top portion of a respective one of the pair of vertical semiconductor channel strips and electrically shorted to each other via a conductive structure.

According to another aspect of the present disclosure, a method of forming a semiconductor device comprising at least one instance of a vertical field effect transistor is provided. Matrix rail structures are formed over a substrate. Each of the matrix rail structures includes a pair of lengthwise sidewalls that extend along a first horizontal direction and comprises, or is at least partially subsequently replaced with, a set of at least one gate electrode rail extending along the first horizontal direction and straight-sidewalled gate dielectrics. A plurality of vertical semiconductor channel strips is formed on portions of the lengthwise sidewalls of the matrix rail structures. Each of the plurality of vertical semiconductor channel strips includes a first sidewall contacting a respective portion of the lengthwise sidewalls of the at least one matrix rail structure, a second sidewall that is parallel to the first sidewall, and two transverse sidewalls each adjoining the first sidewall and the second sidewall. A laterally-undulating gate dielectric layer is formed on the second sidewall of the plurality of vertical semiconductor channel strips and on additional portions of the lengthwise sidewalls of the matrix rail structures. At least one laterally-undulating gate electrode line is formed between each neighboring pair of matrix rail structures. Each sidewall of the plurality of vertical semiconductor channel strips is physically contacted by a dielectric surface of a combination of portions of the laterally-undulating gate dielectric layer and a respective straight-sidewalled gate dielectric.

BRIEF DESCRIPTION OF THE DRAWINGS

FIG. 4B is a top-down view of the first exemplary structure of FIG. 4A.

FIG. 5A is a vertical cross-sectional view of the first exemplary structure after formation of a cap material layer and bottom active regions along the vertical plane A-A' in FIG. 5B according to the first embodiment of the present disclosure.

FIG. 5B is a top-down view of the first exemplary structure of FIG. 5A.

FIG. 7B is a vertical cross-sectional view of the first exemplary structure of FIG. 7A along the vertical plane B-B' in FIG. 7C according to the first embodiment of the present disclosure.

FIG. 8A is a vertical cross-sectional view of the first exemplary structure after removal of remaining portions of the sacrificial fill line structures and the cap material layer and formation of laterally-undulating gate electrode trenches along the vertical plane A-A' in FIGS. 8C and 8D according to the first embodiment of the present disclosure.

FIG. 9B is a vertical cross-sectional view of the first exemplary structure of FIG. 9A along the vertical plane B-B' in FIG. 9C according to the first embodiment of the present disclosure.

FIG. 10B is a vertical cross-sectional view of the first exemplary structure of FIG. 10A along the vertical plane B-B' in FIG. 10C according to the first embodiment of the present disclosure.

FIG. 14A is a vertical cross-sectional view of the first exemplary structure after vertically recessing inner isolation dielectric lines along the vertical plane A-A' in FIGS. 14C and 14D according to the first embodiment of the present disclosure.

FIG. 20A is a vertical cross-sectional view of the first exemplary structure after formation of inner gate electrode lines along the vertical plane A-A' in FIG. 20C according to the first embodiment of the present disclosure.

FIG. 24B is a vertical cross-sectional view of the second exemplary structure of FIG. 24A along the vertical plane B-B' in FIG. 24C according to the second embodiment of the present disclosure.

FIG. 25B is a vertical cross-sectional view of the second exemplary structure of FIG. 25A along the vertical plane B-B' in FIG. 25C according to the second embodiment of the present disclosure.

FIG. 29A is a vertical cross-sectional view of the third exemplary structure after formation of matrix rail structures each including a vertical stack of a dielectric pedestal and an inner gate electrode line, and formation of an inner gate dielectric layer along the vertical plane A-A' in FIG. 29B according to the third embodiment of the present disclosure.

FIG. 29B is a horizontal cross-sectional view of the third exemplary structure along the horizontal plane B-B' of FIG. 29B.

FIG. 32B is a vertical cross-sectional view of the third exemplary structure of FIG. 32A along the vertical plane B-B' in FIG. 32C.

FIG. 32C is a vertical cross-sectional view of the third exemplary structure along the horizontal plane C-C' in FIGS. 32A and 32B.

FIG. 34A is a vertical cross-sectional view of the third exemplary structure after removal of remaining portions of the sacrificial fill line structures and the dielectric pillars and formation of laterally-undulating gate electrode trenches along the vertical plane A-A' in FIG. 34C according to the third embodiment of the present disclosure.

FIG. 34B is a vertical cross-sectional view of the third exemplary structure of FIG. 34A along the vertical plane B-B' in FIG. 34C according to the third embodiment of the present disclosure.

FIG. 35B is a vertical cross-sectional view of the third exemplary structure of FIG. 35A along the vertical plane B-B' in FIG. 35C according to the third embodiment of the present disclosure.

FIG. 40A is a vertical cross-sectional view of the third exemplary structure after formation of top active regions and bottom active regions along the vertical plane A-A' in FIG. 40C according to the third embodiment of the present disclosure.

FIG. 42A is a vertical cross-sectional view of a fourth exemplary structure after formation of outer gate electrode cavities along the vertical plane A-A' in FIG. 42C according to the fourth embodiment of the present disclosure.

FIG. 42B is a vertical cross-sectional view of the fourth exemplary structure of FIG. 42A along the vertical plane B-B' in FIG. 42C according to the fourth embodiment of the present disclosure.

FIG. 42C is a horizontal cross-sectional view of the fourth exemplary structure of FIGS. 42A and 42B along the horizontal plane C-C' in FIG. 42B.

FIG. 43A is a vertical cross-sectional view of a fourth exemplary structure after formation of outer gate electrode structures along the vertical plane A-A' in FIG. 43C according to the fourth embodiment of the present disclosure.

FIG. 43B is a vertical cross-sectional view of the fourth exemplary structure of FIG. 43A along the vertical plane B-B' in FIG. 43C according to the fourth embodiment of the present disclosure.

FIG. 43C is a horizontal cross-sectional view of the fourth exemplary structure of FIGS. 43A and 43B along the horizontal plane C-C' in FIG. 43B.

FIG. 43D is a horizontal cross-sectional view of the fourth exemplary structure of FIGS. 43A and 43B along the horizontal plane D-D' in FIG. 43B.

DETAILED DESCRIPTION

Figure 1A:
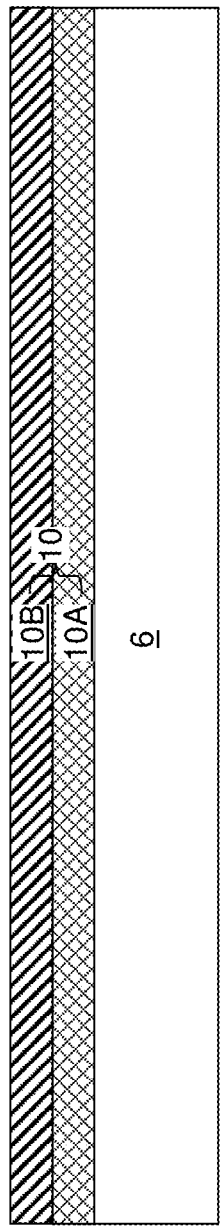
FIG. 1A is a vertical cross-sectional view of a first exemplary structure after formation of a laterally alternating stack of bottom electrode lines and bottom electrode isolation structures along the vertical plane A-A' in FIG. 1C according to a first embodiment of the present disclosure.

As discussed above, the present disclosure is directed to vertical field effect transistors including multiple gate electrodes, and methods of making the same, the various aspects of which are described below. The embodiments of the disclosure can be employed to form various semiconductor devices employing a two-dimensional array of vertical field effect transistors as access transistors such as three-dimensional monolithic memory array devices comprising ReRAM devices.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. As used herein, a first material is removed "selective to" a second material if the rate of removal of the first material is at least twice (such as at least 10 times) the removal rate of the second material.

As used herein, a "line" or a "line structure" refers to a structure in which the structure predominantly extends along a lateral direction with, or without, one or more lateral jogs. The general direction along which a line extends is referred to as a "lengthwise" direction of the line. A line or a line structure may, or may not, have a uniform vertical cross-sectional shape within vertical planes perpendicular to the lengthwise direction of the line or the line structure.

As used herein, a "rail" or a "rail structure" refers to a structure that laterally extends along a lengthwise direction by a greater distance than the maximum dimension of the structure along a widthwise direction with a same vertical cross-sectional shape along vertical planes that are perpendicular to the lengthwise direction. Thus, a rail or a rail structure is a line having a uniform vertical cross-sectional shape along vertical planes that are perpendicular to the lengthwise direction of the line irrespective of the location of the vertical cross-section.

As used herein, a "laterally-undulating sidewall" or an "undulating sidewall" refers to at least one sidewall (i.e., a sidewall or a set of sidewalls) that includes lateral shifts from a general propagation direction of the sidewall in a plan view such that the lateral shifts alternate between two opposite lateral directions that are perpendicular to the general propagation direction. As used herein, a "laterally-undulating" structural element or an "undulating" structural element refers to a structural element that includes a "laterally-undulating sidewall."

As used herein, a "straight-sidewalled" structural element or a "straight" structural element refers to a structural element including sidewalls none of which is a laterally-undulating sidewall. Thus, a rail or a rail structure may be straight-sidewalled. A laterally undulating element is not a rail or a rail structure.

As used herein, an element has a "modulation" in width or has a "modulating width" if the width of the element varies along the lengthwise direction of the element.

Figure 1B:
FIG. 1B is a vertical cross-sectional view of the first exemplary structure of FIG. 1A along the vertical plane B-B' in FIG. 1C.
Figure 1C:
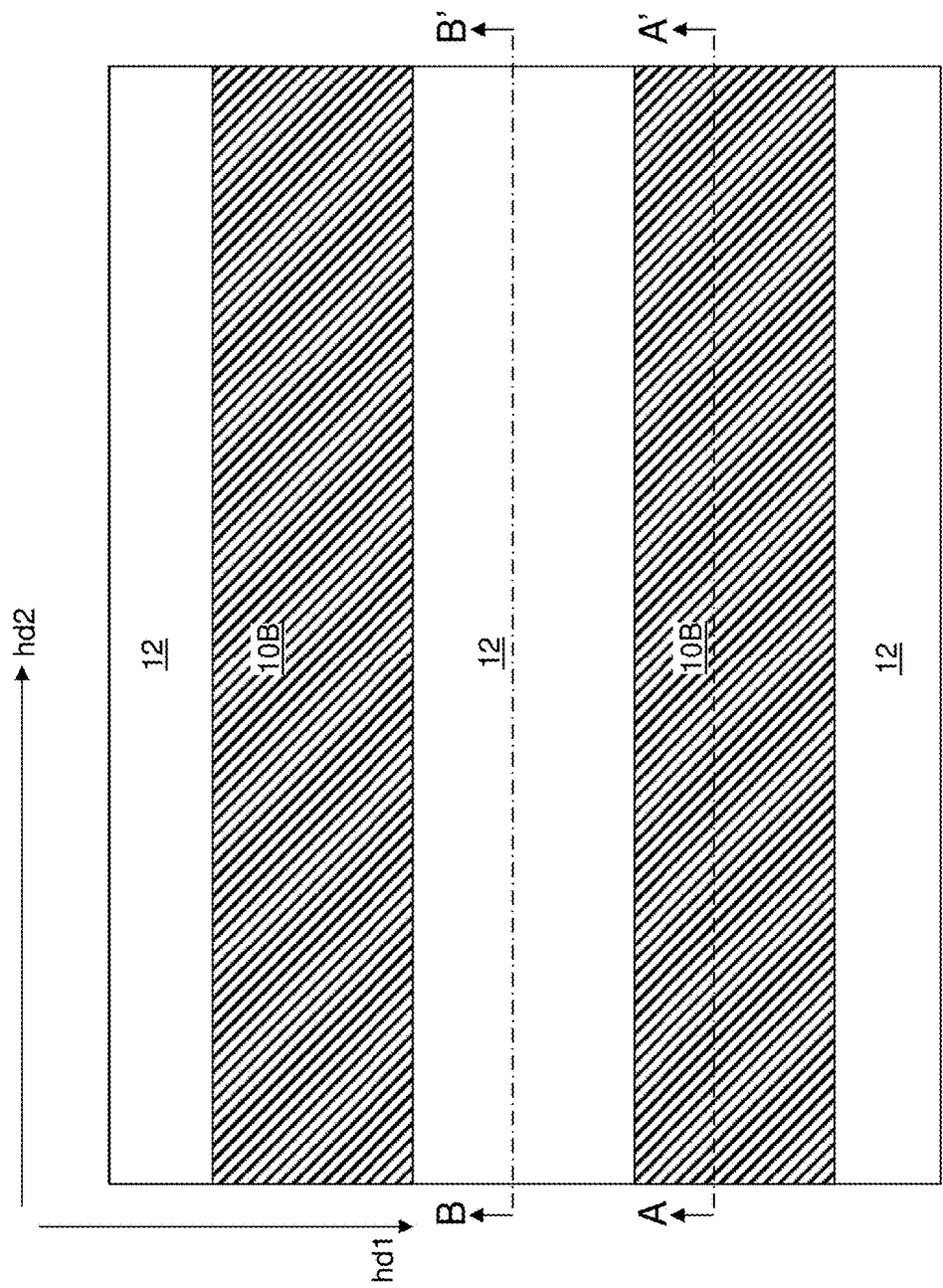
FIG. 1C is a top-down view of the first exemplary structure of FIGS. 1A and 1B.

Referring to FIGS. 1A-1C, a first exemplary structure according to a first embodiment of the present disclosure is provided, which is an in-process structure for forming at least one vertical field effect transistor such as a two-dimensional array of field effect transistors. As used herein, a "prototype" structure or an "in-process" structure refers to a transient structure that is subsequently modified in the shape or composition of at least one component therein.

The first exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, bottom electrode line select transistors for selecting bottom electrode lines to be activated, and/or word line select transistor for selecting word lines to be activated.

Bottom electrode lines 10 are formed over the substrate 6. The bottom electrode lines 10 are parallel electrically conductive lines that are laterally spaced apart in a first horizontal direction hd1, and extending in a second horizontal direction hd2. The bottom electrode lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof).

In one embodiment, each bottom electrode line 10 can include a vertical stack of a metallic bottom electrode line portion 10A and a doped semiconductor bottom electrode line portion 10B. The type of doping of the doped semiconductor bottom electrode line portions 10B is herein referred to as a first conductivity type, which can be p-type or n-type. For example, each metallic bottom electrode line portion 10A can include a metallic nitride material (such as TiN), an elemental metal (such as W, Co, Ni, Ti, Ta, Ru, or Al), or a combination thereof. Each doped semiconductor bottom electrode line portion 10B can include doped polysilicon. The dopant concentration in the doped semiconductor bottom electrode line portions 10B can be in a range from $1.0 \times 10^{19}/cm^3$ to $2.0 \times 10^{21}/cm^3$, although lesser and greater dopant concentrations can also be employed.

The thickness of each metallic bottom electrode line portion 10A can be in a range from 3 nm to 100 nm, although lesser and greater thicknesses can also be employed. The thickness of each doped semiconductor bottom electrode line portion 10B can be in a range from 10 nm to 300 nm, although lesser and greater thicknesses can also be employed.

The space between the bottom electrode lines 10 can be filled with a dielectric material (such as silicon oxide). The dielectric material can be subsequently planarized to remove excess portions from above a horizontal plane including the top surfaces of the bottom electrode lines 10 to form bottom electrode isolation structures 12. Each bottom electrode lines 10 and each bottom electrode isolation structures 12 can extend along the second horizontal direction hd2. A one-dimensional array of the bottom electrode lines 10 and the bottom electrode isolation structures 12 can extend along the first horizontal direction hd2 with a periodicity that is equal to the sum of the width of a bottom electrode line 10 and the width of a bottom electrode isolation structure 12.

Alternatively, the one-dimensional array of the bottom electrode lines 10 and the bottom electrode isolation structures 12 may be formed by depositing a dielectric material layer, forming trenches extending along the second horizontal direction hd2 and laterally spaced from one another along the first horizontal direction hd1, and filling the trenches with at least one conductive material to form the bottom electrode lines 10 therein. Thus, a laterally alternating stack of bottom electrode lines 10 and bottom electrode isolation structures 12 can be formed over the substrate 6.

Figure 2A:
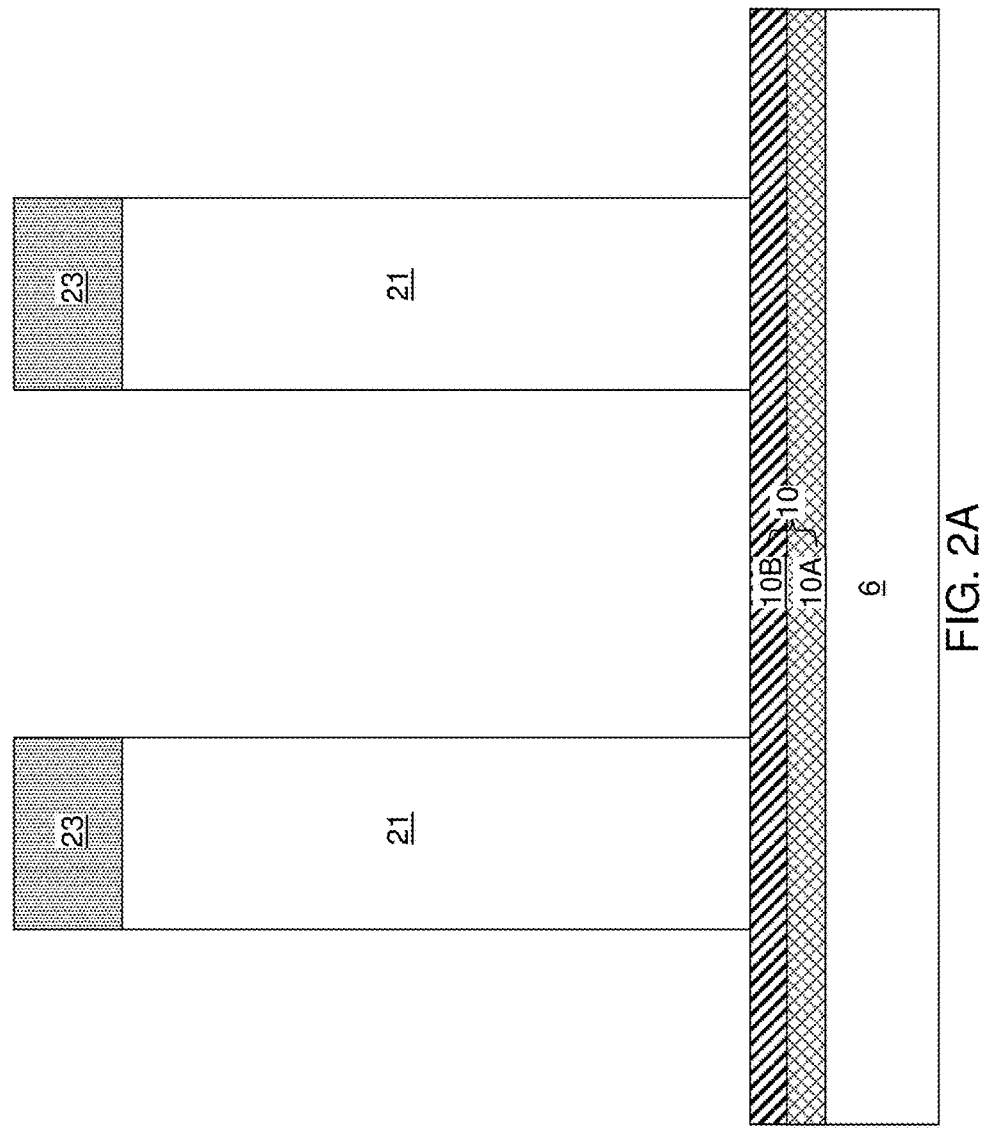
FIG. 2A is a vertical cross-sectional view of the first exemplary structure after formation of dielectric rail structures along the vertical plane A-A' in FIG. 2B according to the first embodiment of the present disclosure.
Figure 2B:
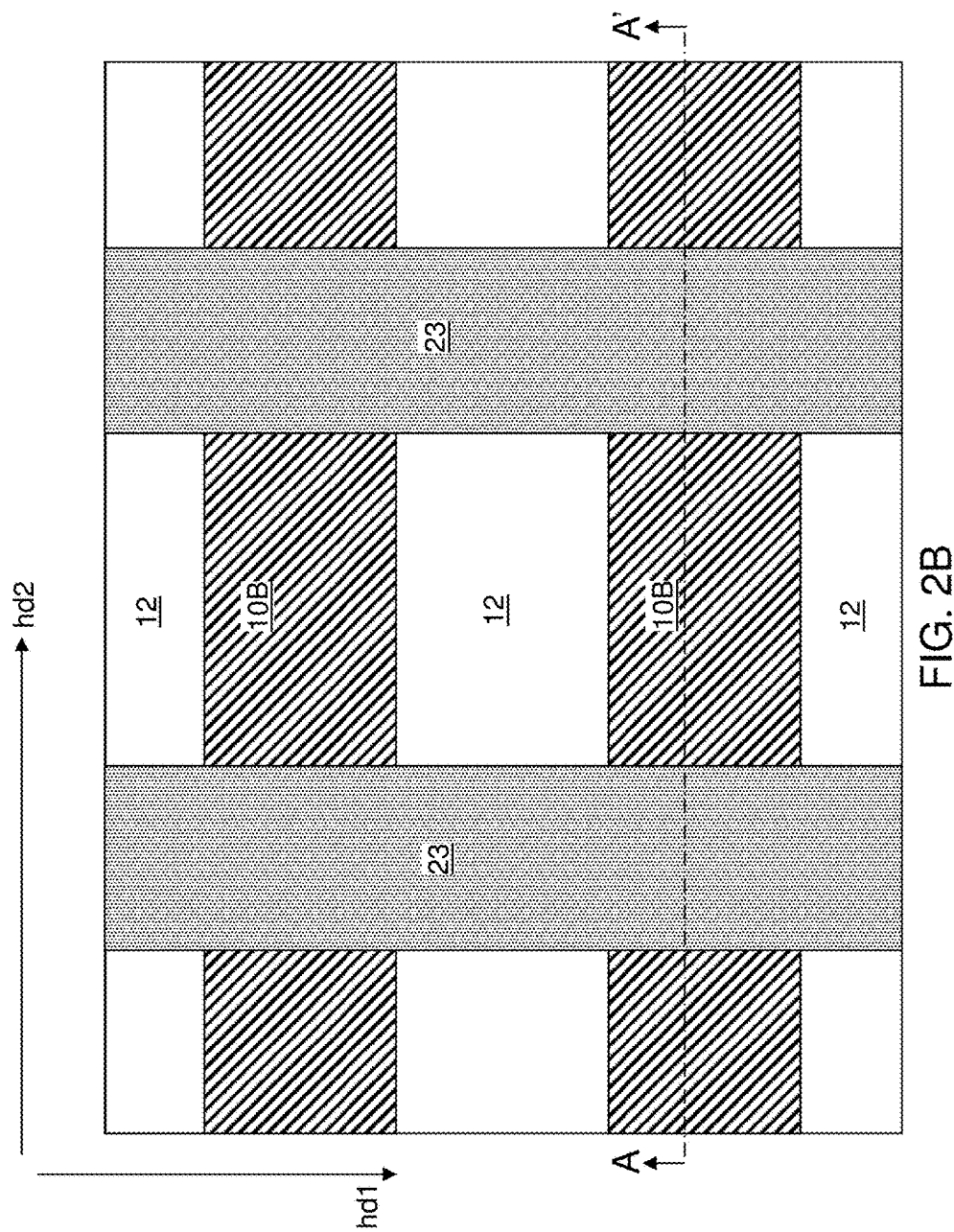
FIG. 2B is a top-down view of the first exemplary structure of FIG. 2A.

Referring to FIGS. 2A and 2B, a layer stack of a first dielectric material layer and a second dielectric material layer can be formed over the laterally alternating stack of bottom electrode lines 10 and bottom electrode isolation structures 12, and can be patterned to form dielectric rail structures (21, 23) laterally extending along the first horizontal direction hd1. For example, the first dielectric material layer can be a silicon oxide layer having a thickness that is on the order of the channel length of the vertical field effect transistors to be subsequently formed. In one embodiment, the thickness of the first dielectric material layer can be in a range from 50 nm to 2,000 nm, although lesser and greater thicknesses can also be employed. The second dielectric material layer can be a silicon nitride layer having a thickness that is on the order of the height of the top active regions to be subsequently formed. In one embodiment, the thickness of the second dielectric material layer can be in a range from 5 nm to 100 nm, although lesser and greater thicknesses can also be employed.

A photoresist layer can be applied over the second dielectric material layer, and can be lithographically patterned with a periodic line and space pattern, i.e., by lithographic exposure and development. Each line pattern in the developed photoresist material can laterally extend along the first horizontal direction hd1, which may be perpendicular to the lengthwise direction of the bottom electrode lines 10 which is the second horizontal direction. At least one anisotropic etch process can be performed to transfer the pattern of the developed photoresist material portions through the second dielectric material layer and the first dielectric material layer. The bottom electrode lines 10 may be employed as an etch stop layer and/or as an end point detection layer.

Each remaining portion of the second dielectric material layer constitutes an upper dielectric rail structure 23. Each remaining portion of the first dielectric material layer constitutes a lower dielectric rail structure 21. A vertical stack of a lower dielectric rail structure 21 and an upper dielectric rail structure 23 constitutes a dielectric rail structure (21, 23), which laterally extends along the first horizontal direction hd1. In one embodiment, each dielectric rail structure (21, 23) can have a uniform width throughout. In one embodiment, the lower dielectric rail structures 21 can include silicon oxide, and the upper dielectric rail structures 23 can include silicon nitride. The width of each dielectric rail structure (21, 23) can be in a range from 30 nm to 500 nm, although lesser and greater widths can also be employed.

Figure 3A:
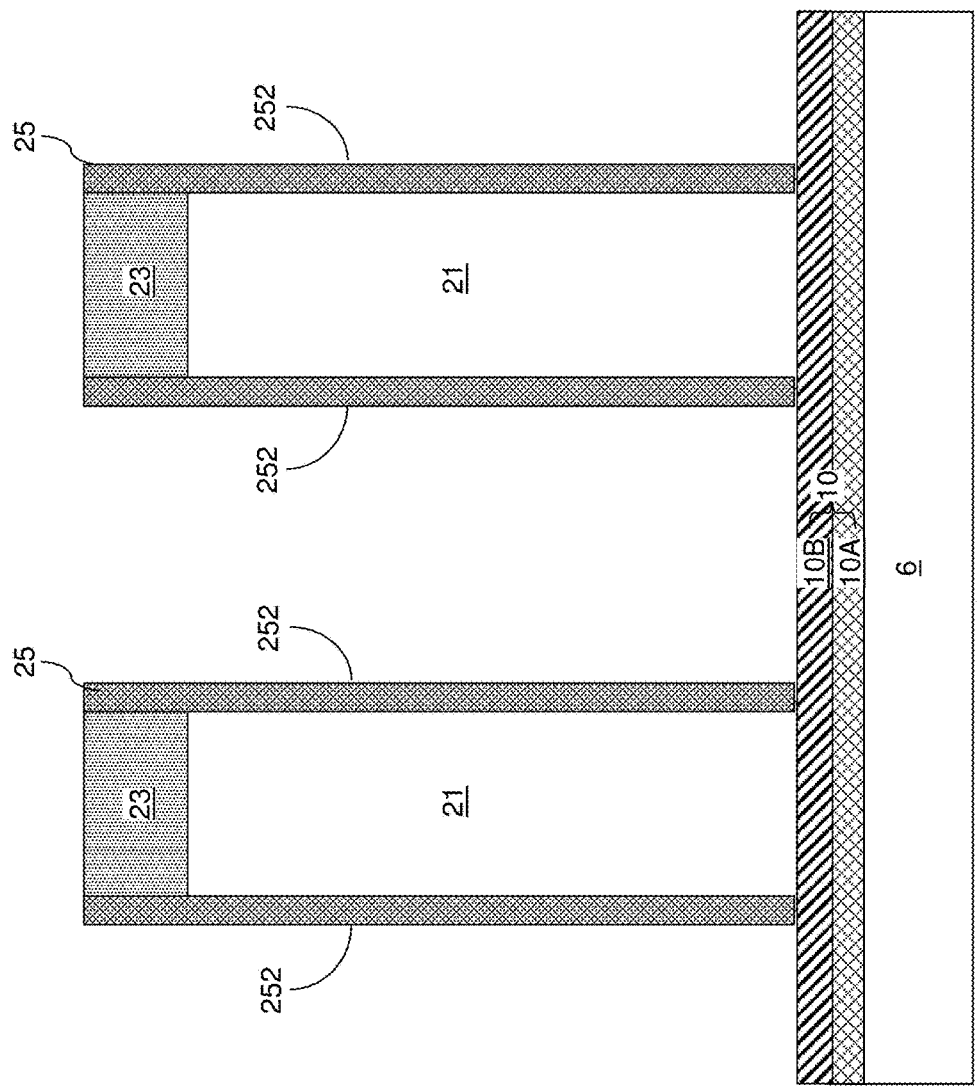
FIG. 3A is a vertical cross-sectional view of the first exemplary structure after formation of dielectric spacers along the vertical plane A-A' in FIG. 3B according to the first embodiment of the present disclosure.
Figure 3B:
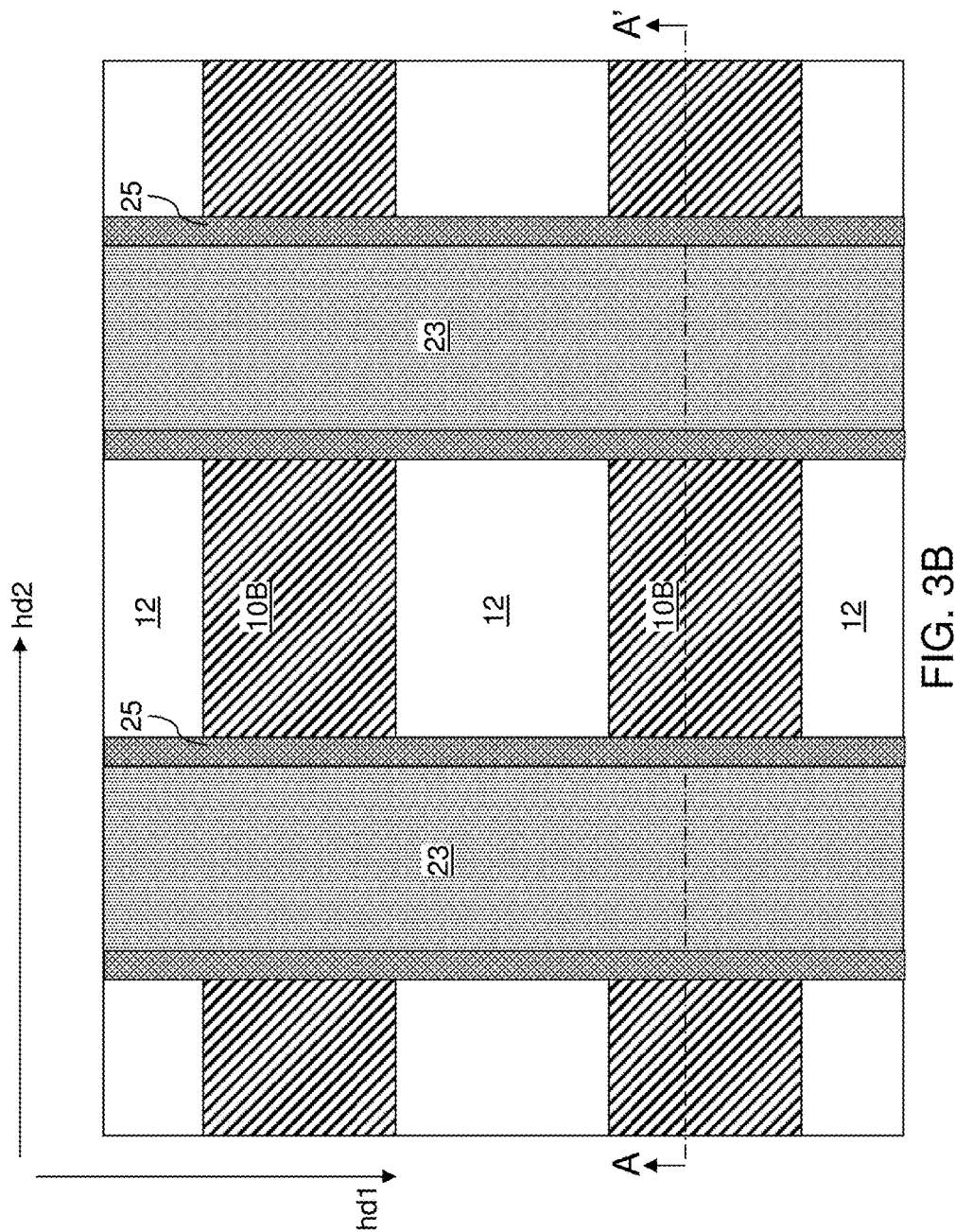
FIG. 3B is a top-down view of the first exemplary structure of FIG. 3A.

Referring to FIGS. 3A and 3B, a dielectric spacer 25 can be formed on each dielectric rail structure (21, 23). The dielectric spacer 25 includes a different dielectric material than the dielectric material of the lower dielectric rail structures 21. For example, the dielectric spacer 25 can include silicon nitride. The dielectric spacers 25 can be formed by conformal deposition of a dielectric material layer (for example, by chemical vapor deposition) and a subsequent anisotropic etch that removes horizontal portions of the conformal dielectric material layer. Each remaining vertical portion of the dielectric material layer constitutes a dielectric spacer 25. The thickness of each dielectric spacer 25 can be in a range from 3 nm to 60 nm, although lesser and greater thicknesses can also be employed. Each contiguous combination of a dielectric rail structure (21, 23) and a dielectric spacer 25 constitutes a matrix rail structure (21, 23, 25).

The matrix rail structures (21, 23, 25) laterally extend along the first horizontal direction hd1. Each matrix rail structure (21, 23, 25) includes a pair of lengthwise sidewalls 252 that extend along the first horizontal direction hd1. Each matrix rail structure (21, 23, 25) is at least partially subsequently replaced with a set of at least one gate electrode rail extending along the first horizontal direction hd1 and straight-sidewalled gate dielectrics, which can be portions of a straight-sidewalled gate dielectric layer that contact sidewalls of vertical semiconductor channel strips to be subsequently formed.

Figure 4A:
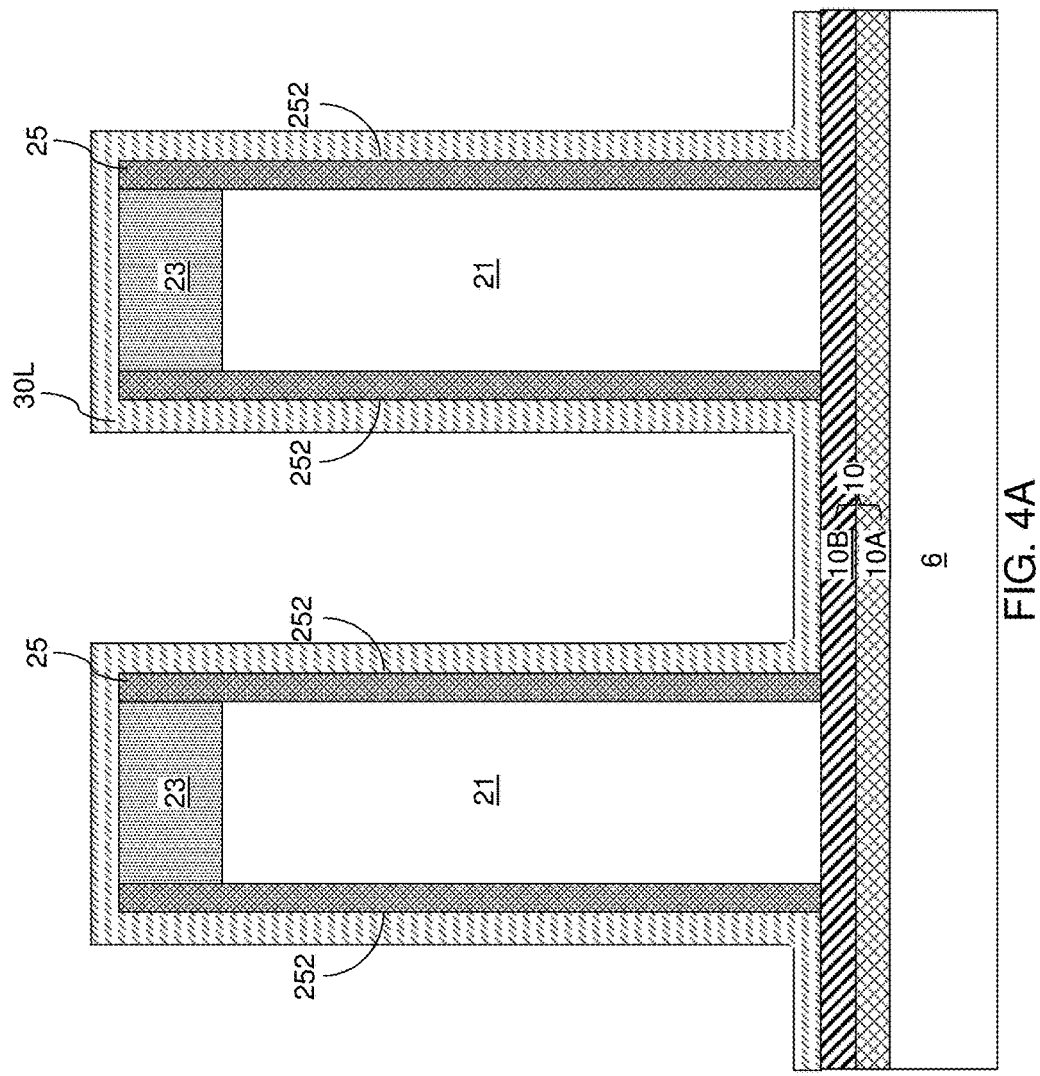
FIG. 4A is a vertical cross-sectional view of the first exemplary structure after formation of a semiconductor channel material layer along the vertical plane A-A' in FIG. 4B according to the first embodiment of the present disclosure.

Referring to FIGS. 4A and 4B, a semiconductor channel material layer 30L can be deposited by a conformal deposition method such as low pressure chemical vapor deposition (LPCVD) or plasma enhanced chemical vapor deposition (PECVD). The semiconductor channel material layer 30L can be formed over each matrix rail structure (21, 23, 25) and on the entirety of the lengthwise sidewalls 252 of each matrix rail structure (21, 23, 25). The semiconductor channel material layer 30L includes a semiconductor material that is subsequently employed for vertical semiconductor channel strips of field effect transistors. For example, the semiconductor channel material layer 30L can include polysilicon, amorphous silicon (which can be converted into polysilicon in a subsequent anneal process), a polycrystalline or amorphous silicon-germanium alloy, a polycrystalline III-V compound semiconductor material (such as polycrystalline GaN), or any other semiconductor material.

In one embodiment, the semiconductor channel material layer 30L may include a layer stack of at least two semiconductor materials such as a layer of a silicon-germanium alloy including germanium at an atomic concentration in a range from 20% to 40% and a polycrystalline cap layer. In another embodiment, the semiconductor channel material layer 30L can include a hydrogen-doped semiconductor material such as hydrogen-doped polysilicon. The atomic percentage of hydrogen atoms in the hydrogen-doped semiconductor material may be in a range from 2% to 10%. If present, hydrogen atoms in the semiconductor material of the semiconductor channel material layer 30L can remove traps through dangling bonds, and enhance mobility of charge carriers therein. The thickness of the semiconductor channel material layer 30L can be uniform throughout the entirety thereof, and can be in a range from 2 nm to 30 nm, such as from 3 nm to 10 nm, although lesser and greater thicknesses can also be employed. The thickness of the semiconductor channel material layer 30L may be selected to enable full depletion of vertical semiconductor channel strips during operation of the vertical field effect transistors.

The semiconductor channel material layer 30L can have a doping of second conductivity type that is the opposite of the first conductivity type. For example, if the first conductivity type is p-type, the second conductivity type is n-type, and vice versa. The dopant concentration in the semiconductor channel material layer 30L can be in a range from $1.0 \times 10^{15}/cm^3$ to $1.0 \times 10^{18}/cm^3$, although lesser and greater dopant concentrations can also be employed.

Referring to FIGS. 5A and 5B, a cap material layer 31 can be formed over the semiconductor channel material layer 30L by a conformal or a non-conformal deposition process. The cap material layer 31 can include a material that can prevent outdiffusion of electrical dopants therethrough during a subsequent anneal process. For example, the cap material layer 31 can include a diffusion barrier dielectric material such as silicon nitride. The thickness of the cap material layer 31 can be in a range from 3 nm to 30 nm, although lesser and greater thicknesses can also be employed.

An anneal process can be performed to diffuse electrical dopants from the doped semiconductor bottom electrode line portions 10B into bottom portions of the semiconductor channel material layer 30L (which is a semiconductor material portion) to form bottom active regions 32. The bottom active regions 32 have a doping of the same conductivity type as the doped semiconductor bottom electrode line portions 10B, i.e., the first conductivity type. The dopant concentration of the bottom active regions 32 can be in a range from $1.0 \times 10^{19}/cm^3$ to $1.0 \times 10^{20}/cm^3$, although lesser and greater dopant concentrations can also be employed. The vertical portions of the semiconductor channel material layer 30L include vertical semiconductor channel strips of field effect transistors to be formed. The temperature and the duration of the anneal process can be selected to optimize the location of the p-n junction between the bottom active regions 32 and the portions of the semiconductor channel material layer 30L that retain the doping of the second conductivity type.

Figure 6A:
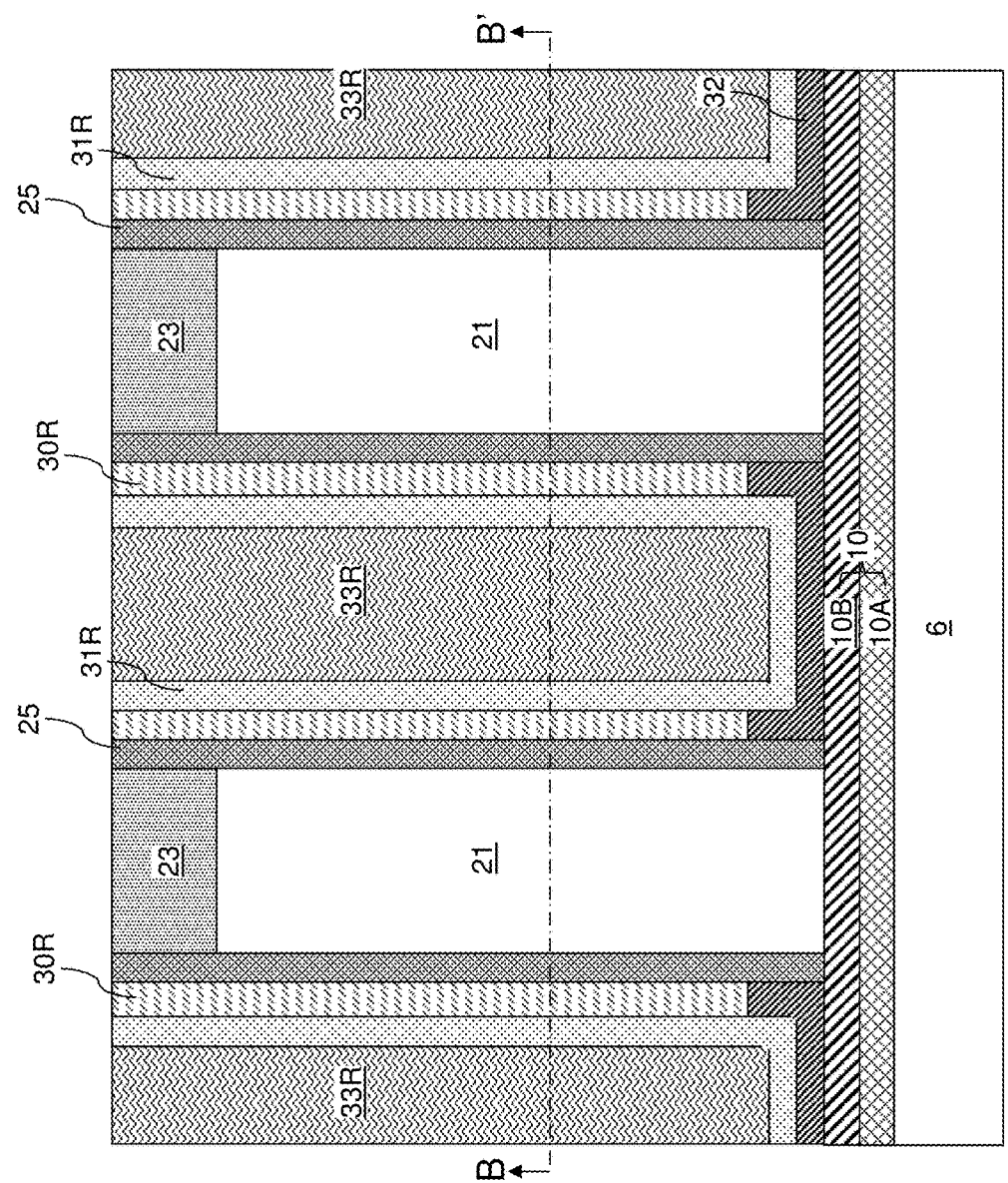
FIG. 6A is a vertical cross-sectional view of the first exemplary structure after formation of sacrificial fill line structures along the vertical plane A-A' in FIG. 6A according to the first embodiment of the present disclosure.
Figure 6B:
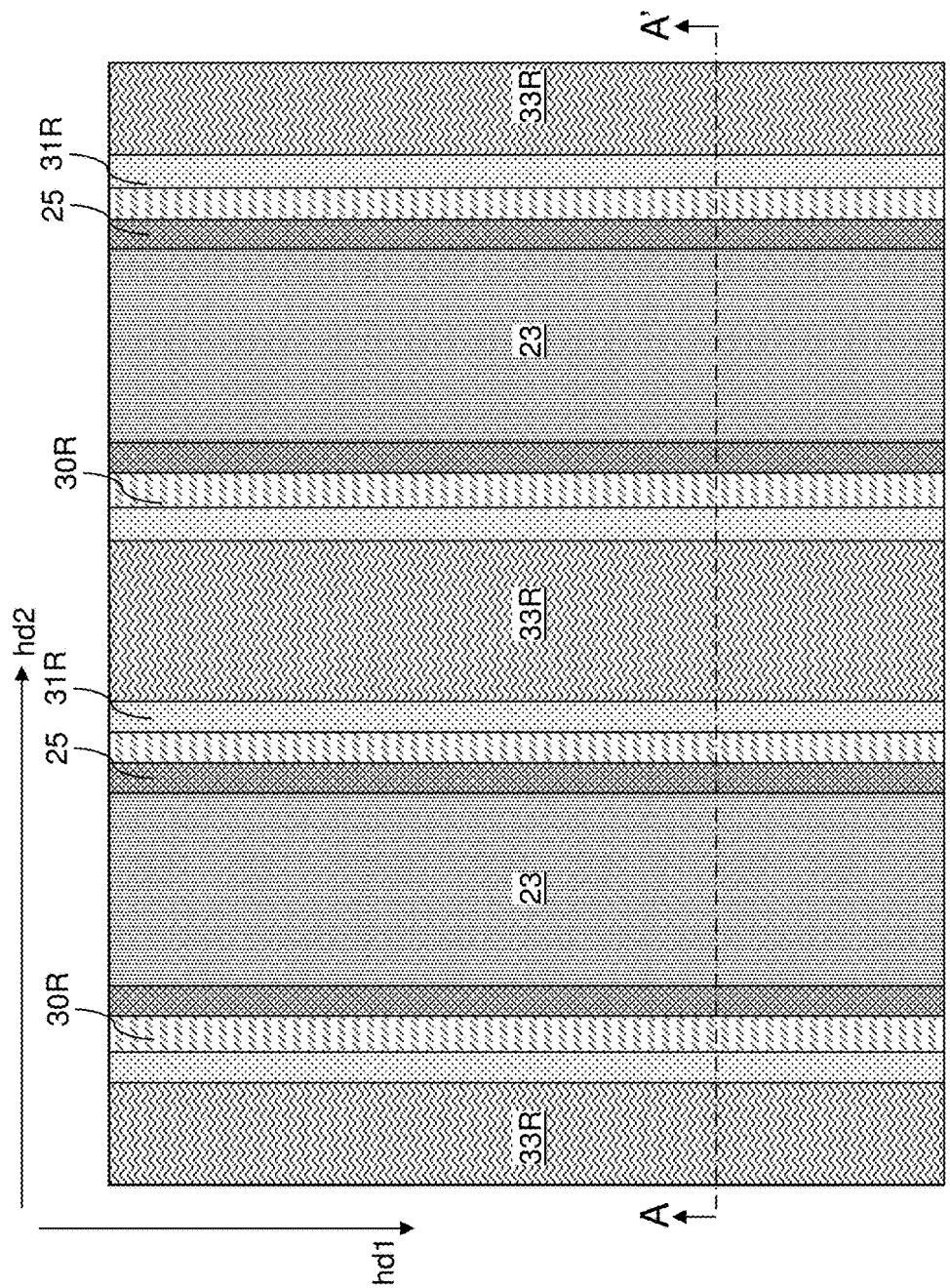
FIG. 6B is a top-down view of the first exemplary structure of FIG. 6A.

Referring to FIGS. 6A and 6B, at least one fill material is deposited in the line trenches between the matrix rail structures (21, 23, 25). The at least one fill material may include a dielectric material such as silicon oxide, or a semiconductor material such as germanium or polysilicon. The at least one fill material is subsequently planarized to remove portions that are located above a horizontal plane including the top surfaces of the upper dielectric rail structures 23. For example, a recess etch or chemical mechanical planarization (CMP) may be employed to planarized the at least one fill material. Each remaining portion of the at least one fill material constitutes a fill material line structure 33R.

Top portions of the cap material layer 31 and the semiconductor channel material layer 30L can be removed from above the a horizontal plane including the top surfaces of the upper dielectric rail structures 23 by the planarization process. Each remaining portion of the cap material layer 31L constitutes a cap material line structure 31R. Each contiguous pair of a cap material line structure 31R and a fill material line structure 33R constitutes a sacrificial fill line structure (31R, 33R). The matrix rail structures (21, 23, 25) are laterally spaced apart along the second horizontal direction hd2 by the sacrificial fill line structures (31R, 33R). Each remaining portion of the semiconductor channel material layer 30L laterally extends along the first horizontal direction hd1, and is herein referred to as a semiconductor channel material line 30R. The top surface of each semiconductor channel material line 30R can be in the same horizontal plane as the top surface of the upper dielectric rail structures 23.

Figure 7A:
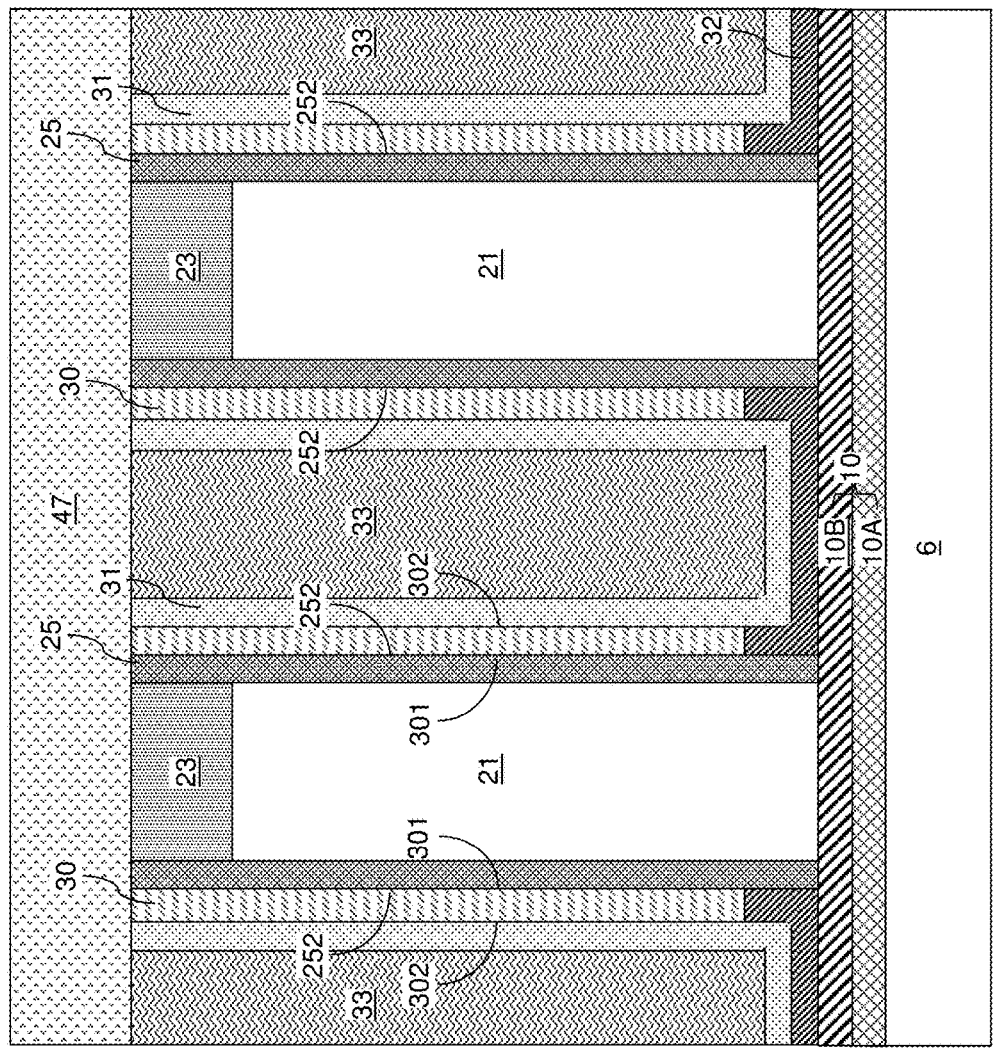
FIG. 7A is a vertical cross-sectional view of the first exemplary structure after formation of etch masks and isolation cavities along the vertical plane A-A' in FIG. 7C according to the first embodiment of the present disclosure.
Figure 7C:
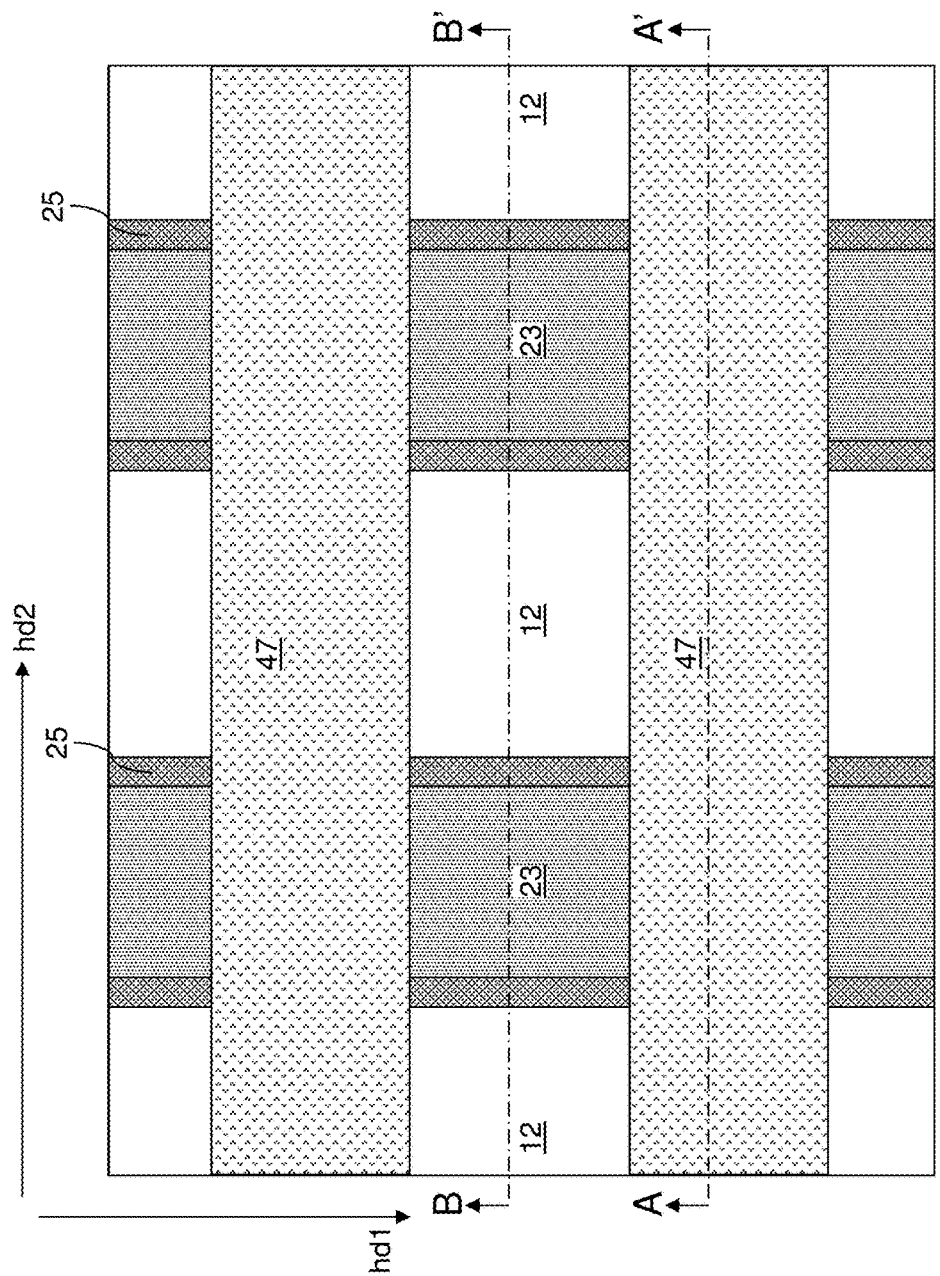
FIG. 7C is a top-down view of the first exemplary structure of FIGS. 7A and 7B.
Figure 8B:
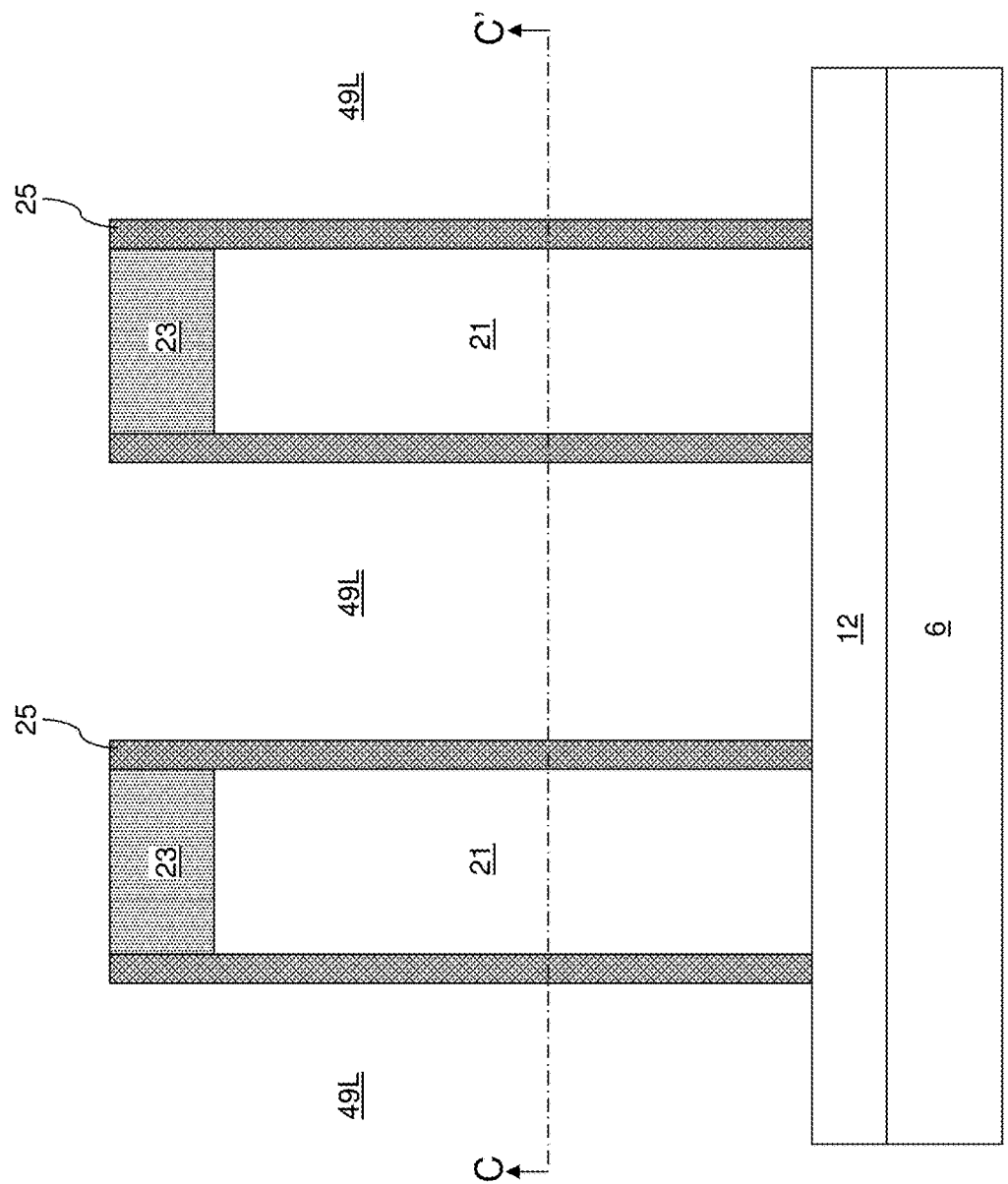
FIG. 8B is a vertical cross-sectional view of the first exemplary structure of FIG. 8A along the vertical plane B-B' in FIGS. 8C and 8D according to the first embodiment of the present disclosure.
Figure 8C:
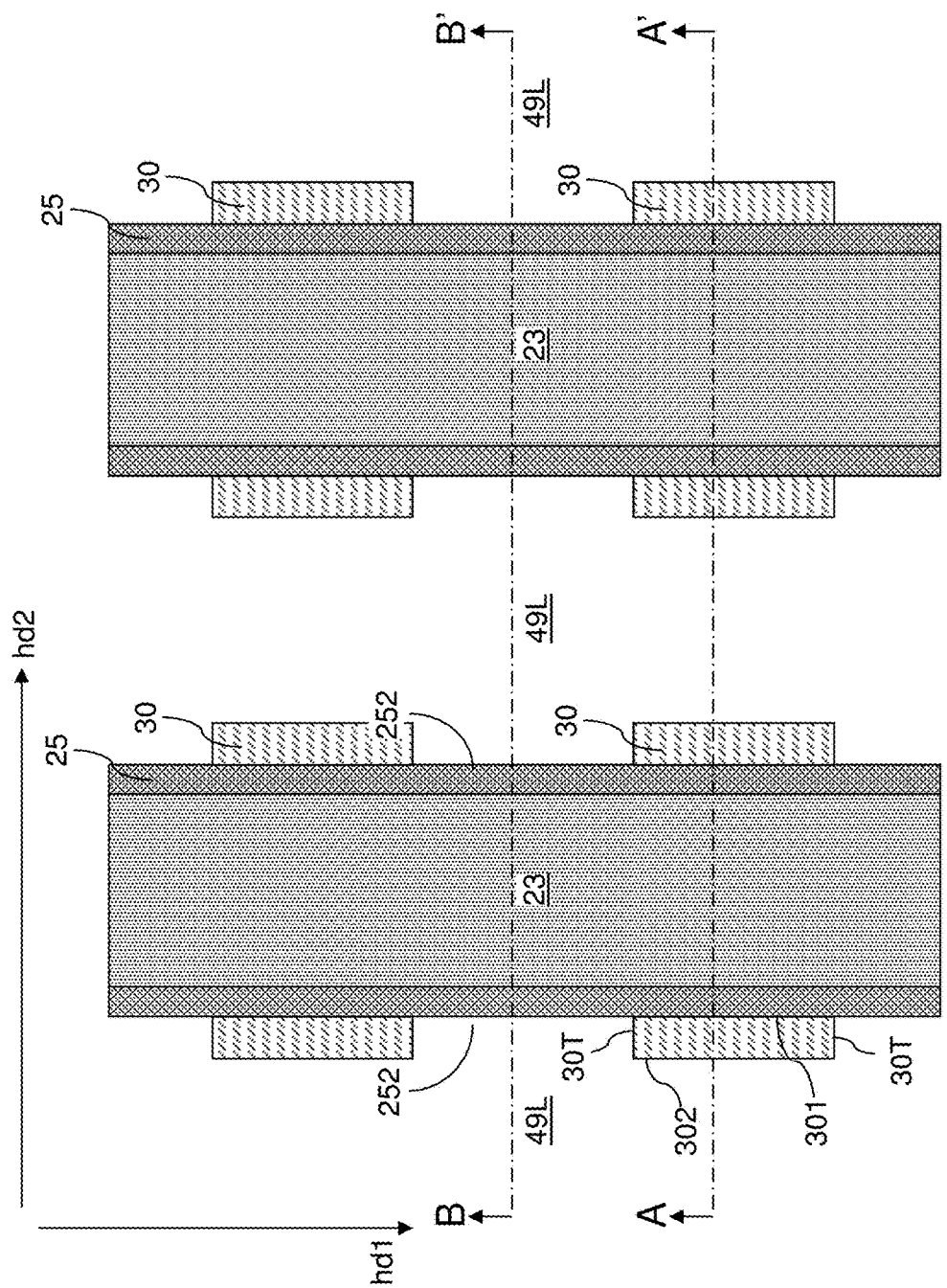
FIG. 8C is a horizontal cross-sectional view of the first exemplary structure of FIGS. 8A and 8B along the horizontal plane C-C' in FIGS. 8A and 8B.
Figure 8D:
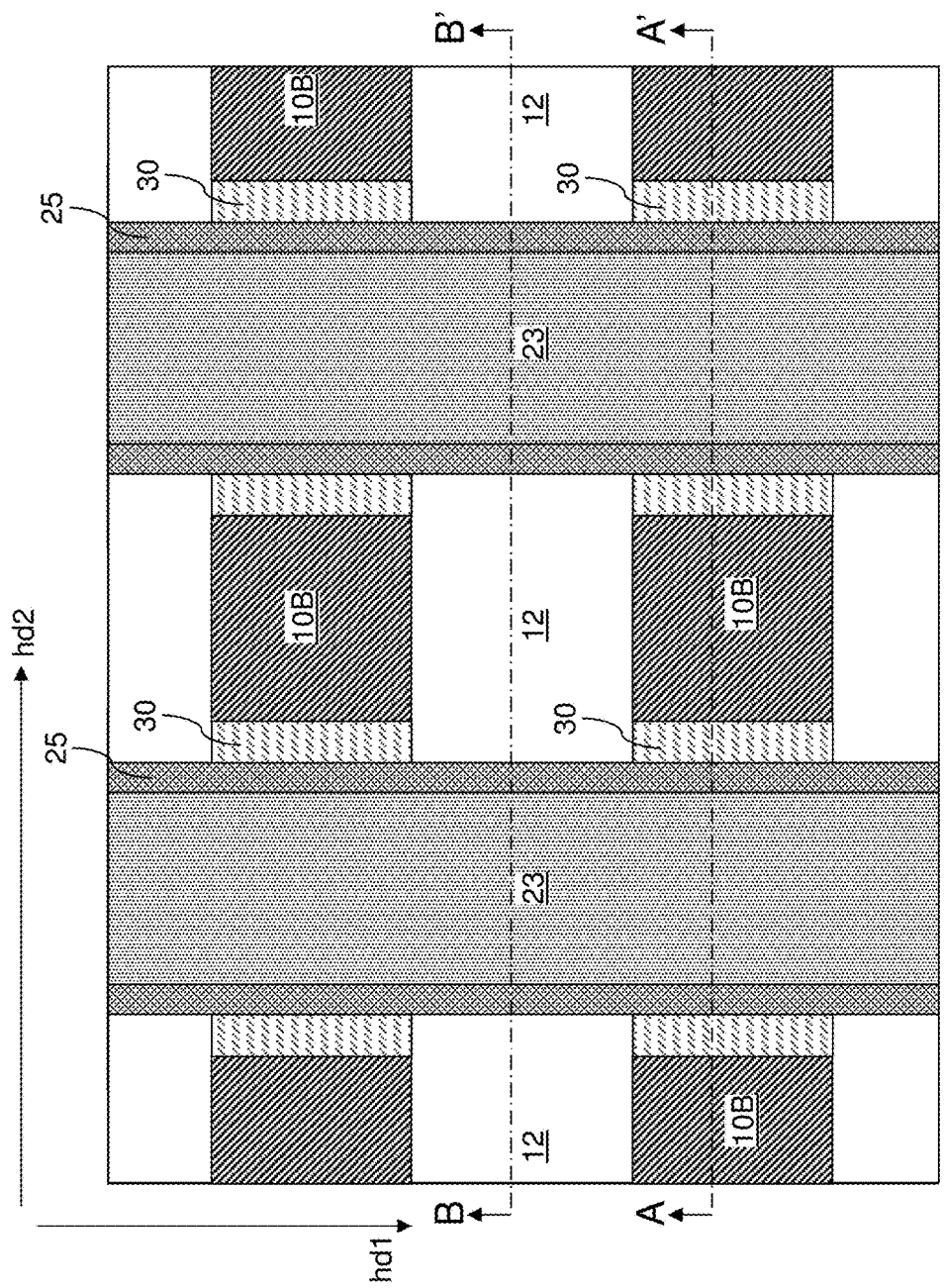
FIG. 8D is a top-down view of the first exemplary structure of FIGS. 8A-8C.

Referring to FIGS. 7A-7C, etch masks 47 can be formed over the matrix rail structures (21, 23, 25) and the sacrificial fill line structures (31R, 33R). The plurality of etch masks 47 can laterally extend along the second horizontal direction hd2, and can be laterally spaced apart among one another along the first horizontal direction hd1, and can extend over the remaining portions of the semiconductor channel material layer 30L, i.e., over the semiconductor channel material lines 30R. Each etch mask 47 can have a uniform thickness throughout. In one embodiment, the etch masks 47 can be patterned portions of a photoresist layer. In this case, the etch masks 47 can be formed, for example, by applying and lithographically patterning a photoresist layer. Alternatively, the etch masks 47 can be a hard mask layer that is patterned by transfer of a pattern in a patterned photoresist layer by an anisotropic etch.

The width of each etch mask 47 can be selected to be on the order of the width of vertical semiconductor channel strips to be subsequently formed underneath the etch mask 47. The spacing between each neighboring pair of etch masks 47 can be on the order of the spacing between a neighboring pair of vertical semiconductor channel strips to be subsequently formed. In one embodiment, the width of each etch mask 47 can be the same, and can be in a range from 20 nm to 600 nm, although lesser and greater widths can also be employed. In one embodiment, the spacing between neighboring pairs of etch mask 47 can be the same, and can be in a range from 20 nm to 600 nm, although lesser and greater spacings can also be employed.

Subsequently, remaining portions of the at least one fill material (i.e., the fill material line structures 33R) and remaining portions of the semiconductor channel material layer 30L (i.e., the semiconductor channel material lines 30R) are removed from within areas that are not covered by the plurality of etch masks 47. Specifically, an anisotropic etch can be performed to remove the material of the fill material line structures 33R selective to the dielectric spacers 25 and the upper dielectric rail structures 23 employing the etch masks 47 semiconductor channel material layer structure. Isolation cavities 49 are formed in each volume of the fill material line structures 33R that are not covered by the etch masks 47. In one embodiment, the anisotropic etch process can be selective to the material of the cap material line structures 31R. In one embodiment, the cap material line structures 31R can include silicon nitride, the fill material line structures 33R can include doped or undoped silicon oxide or organosilicate glass, and the anisotropic etch process can remove unmasked portions of the fill material line structures 33R selective to the material of the cap material line structures 31R. Each remaining discrete portion of the fill material line structures 33R can have a substantially rectangular pillar shape, and is herein referred to as a fill material pillar structure 33, as shown in FIG. 7A.

Subsequently, a first isotropic etch process can be performed to remove portions of the cap material line structures 31R that are physically exposed to the isolation cavities 49, i.e., to remove portions of the cap material line structures 31R that are not covered by the etch masks 47. For example, if the cap material line structures 31R include silicon nitride, a wet etch employing hot phosphoric acid can be employed to remove portions of the cap material line structures 31R located between areas covered by the etch masks 47. Each remaining discrete portion of the cap material line structures 31R can have a horizontal portion adjoined by two vertical portions, and is herein referred to as a cap material liner portion 31.

A second isotropic etch process can be performed to remove portions of the semiconductor channel material lines 30R that are physically exposed to the isolation cavities 49, i.e., to remove portions of the semiconductor channel material lines 30R that are not covered by the etch masks 47. For example, if the semiconductor channel material lines 30R include polysilicon, a wet etch employing a KOH solution can be employed to remove portions of the semiconductor channel material lines 30R located between areas covered by the etch masks 47. Each remaining discrete portion of the semiconductor channel material lines 30R constitutes a vertical semiconductor channel strip 30 that extends between the bottom active regions 32 and a bottom surface of the etch masks 47.

Portions of the bottom active regions 32 that are not covered by the etch masks 47 can be collaterally removed during the second isotropic etch process. Each bottom active region 32 located between a neighboring pair of matrix rail structures (21, 23, 25) can be divided into a plurality of bottom active regions 32 connecting a respective pair of vertical semiconductor channel strips 30. A pair of vertical semiconductor channel strips 30 can contact a common bottom active region 32.

Thus, the semiconductor channel material layer 30L can be patterned into a plurality of vertical semiconductor channel strips 30 between each neighboring pair of matrix rail structures (21, 23, 25). Instances of the plurality of vertical semiconductor channel strips 30 can be repeated between neighboring pairs of matrix rail structures (21, 23, 25) along the second horizontal direction hd2 to form a two-dimensional array of vertical semiconductor channel strip pairs 31. Sidewalls of each vertical semiconductor channel strip 30, each cap material liner portion 31, each fill material pillar structure 33, and each bottom active region 32 can be physically exposed to the isolation cavities 49.

A plurality of vertical semiconductor channel strips 30 are formed on portions of the lengthwise sidewalls 252 of the matrix rail structures (21, 23, 25). As shown in FIG. 7A, each of the plurality of vertical semiconductor channel strips 30 includes a first sidewall 301 contacting a respective portion of the lengthwise sidewalls 252 of the matrix rail structures (21, 23, 25), a second sidewall 302 that is parallel to the first sidewall 301, and two transverse sidewalls each adjoining the first sidewall 301 and the second sidewall 302.

Referring to FIGS. 8A-8D, the etch masks 47 can be removed selective to the vertical semiconductor channel strips 30, for example, by ashing. Remaining portions of the at least one fill material (i.e., the fill material pillar structures 33) and remaining portions of the cap material layer 31L (i.e., the cap material liner portions 31) are removed. An isotropic etch or an anisotropic etch can be performed to remove the material of the fill material pillar structures 33 selective to the vertical semiconductor channel strips 30. For example, if the fill material pillar structures 33 include silicon oxide, a wet etch employing hydrofluoric acid can be performed to remove the fill material pillar structures 33. Subsequently, an isotropic etch can be performed to remove the cap material liner portions 31 selective to the vertical semiconductor channel strips 30. For example, if the cap material liner portions 31 include silicon nitride, a wet etch employing hot phosphoric acid can be employed to remove the cap material liner portions 31.

The second sidewalls 302 and the transverse sidewalls 30T of each vertical semiconductor channel strip 30 are physically exposed to laterally-undulating gate electrode trenches 49L, each of which includes a continuous volume between a neighboring pair of matrix rail structures (21, 23, 25). The first sidewalls 301 of each vertical semiconductor channel strip 30 can contact the lengthwise sidewalls 252 of the matrix rail structures (21, 23, 25). Each laterally-undulating gate electrode trench 49L includes laterally-undulating sidewalls (such as the combination of physically exposed portions of a lengthwise sidewall 252 of a matrix rail structure (21, 23, 25) and the physically exposed sidewalls of the vertical semiconductor channel strips 30 located directly on the lengthwise sidewall 252).

Figure 9A:
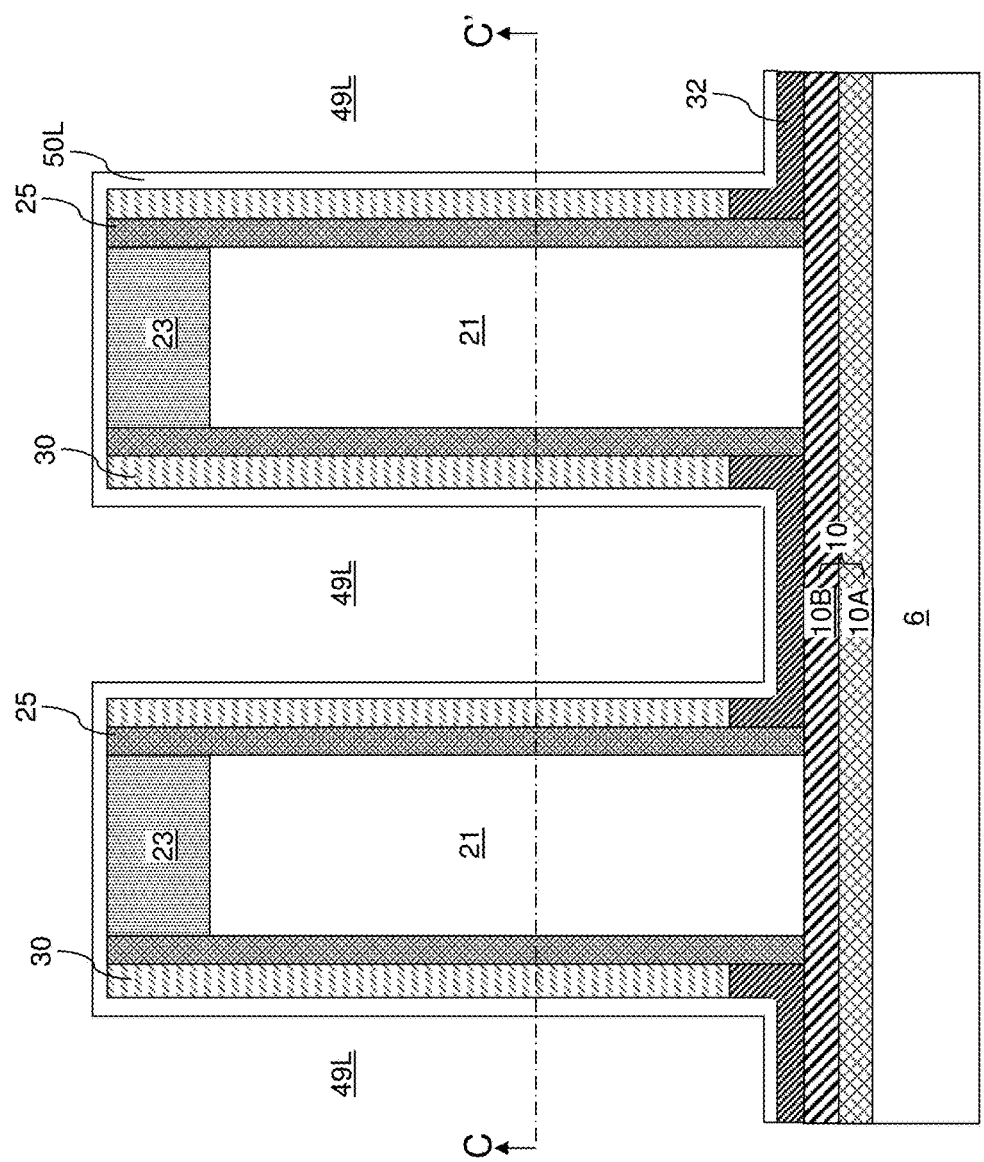
FIG. 9A is a vertical cross-sectional view of the first exemplary structure after formation of an outer gate dielectric layer along the vertical plane A-A' in FIG. 9C according to the first embodiment of the present disclosure.
Figure 9C:
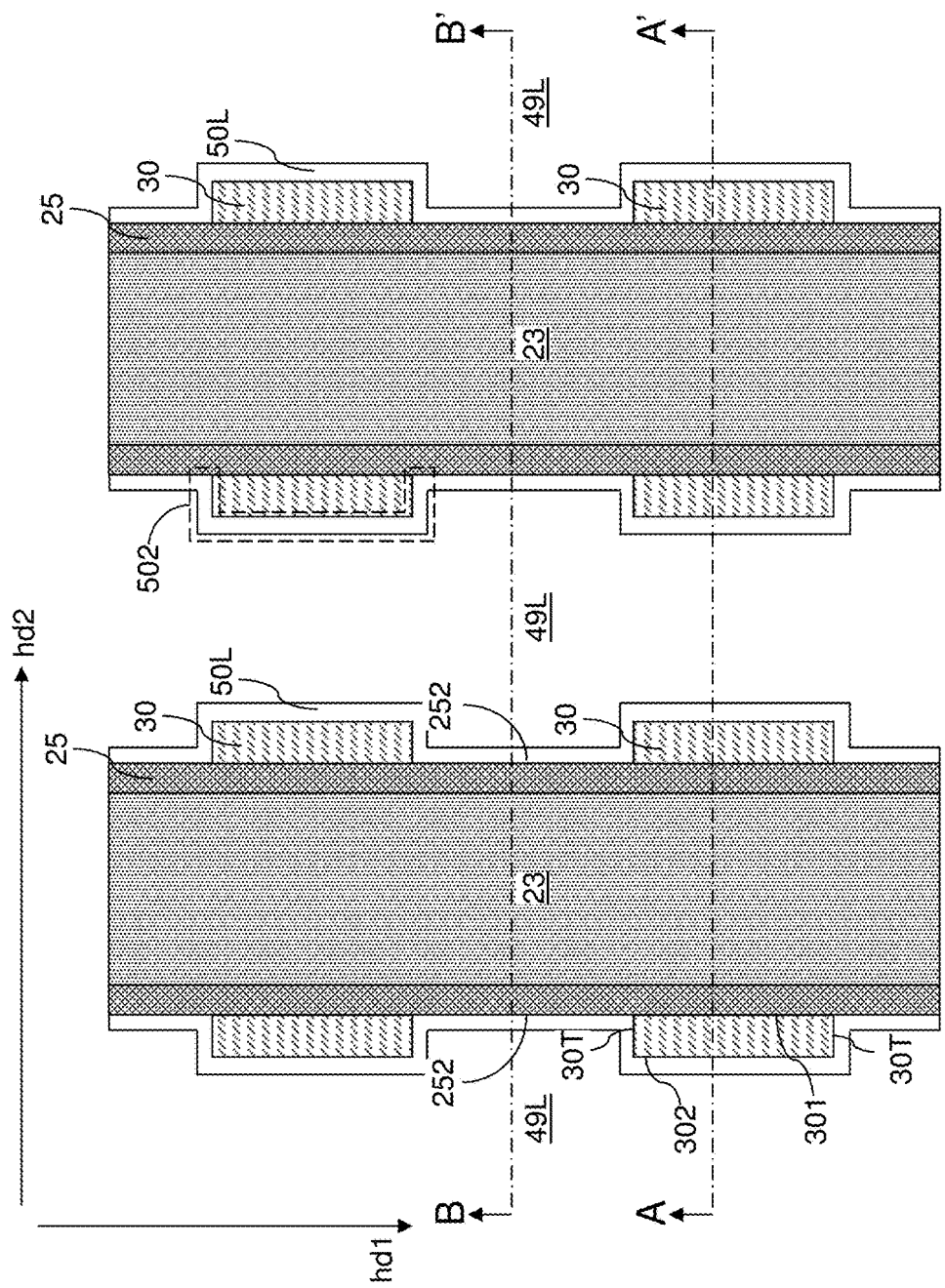
FIG. 9C is a horizontal cross-sectional view of the first exemplary structure of FIGS. 9A and 9B along the horizontal plane C-C' in FIGS. 9A and 9B.

Referring to FIGS. 9A-9C, a laterally-undulating gate dielectric layer 50L can be formed by deposition of a continuous dielectric material layer and/or thermal oxidation and/or nitridation of surface portions of the vertical semiconductor channel strips 30. The laterally-undulating gate dielectric layer 50L includes laterally-undulating sidewalls such as a sidewall (or a set of sidewalls) that includes physically exposed portions of a lengthwise sidewall 252 of a matrix rail structure (21, 23, 25) and the physically exposed sidewalls of the vertical semiconductor channel strips 30 located directly on the lengthwise sidewall 252, or a sidewall that is exposed to a laterally-undulating gate electrode trench 49L. The laterally-undulating sidewalls of the laterally-undulating gate dielectric layer SOL generally extend along the first horizontal direction hd1, and have lateral shifts or "jogs" along the second horizontal direction hd2. In this embodiment, the laterally-undulating gate dielectric layer SOL is an inner gate dielectric layer that includes inner gate dielectrics for field effect transistors to be subsequently formed.

While the present disclosure is described employing an embodiment in which the laterally-undulating gate dielectric layer SOL is formed as a continuous dielectric material layer, embodiments are expressly contemplated in which the laterally-undulating gate dielectric layer SOL is formed as discrete dielectric material portions formed by oxidation and/or nitridation of surface portions of the vertical semiconductor channel strips 30. The laterally-undulating gate dielectric layer SOL can be formed directly on the second sidewall 302 and the two transverse sidewalls 30T of each of the plurality of vertical semiconductor channel strips 30 and on portions of the lengthwise sidewalls 252 of the matrix rail structures (21, 23, 25). Each portion of the laterally-undulating gate dielectric layer SOL that is formed on the second sidewalls 302 and the transverse sidewalls 30T of the vertical semiconductor channel strips 30 constitutes an inner gate dielectric 502, which can be clam-shaped. As used herein, an element is "claim-shaped" if the element includes three sides that are generally arranged in a "C" shape. The laterally-undulating gate dielectric layer 50L can include silicon oxide and/or a dielectric metal oxide (such as aluminum oxide), and can have a thickness in a range from 1 nm to 10 nm, although lesser and greater thicknesses can also be employed.

Figure 10A:
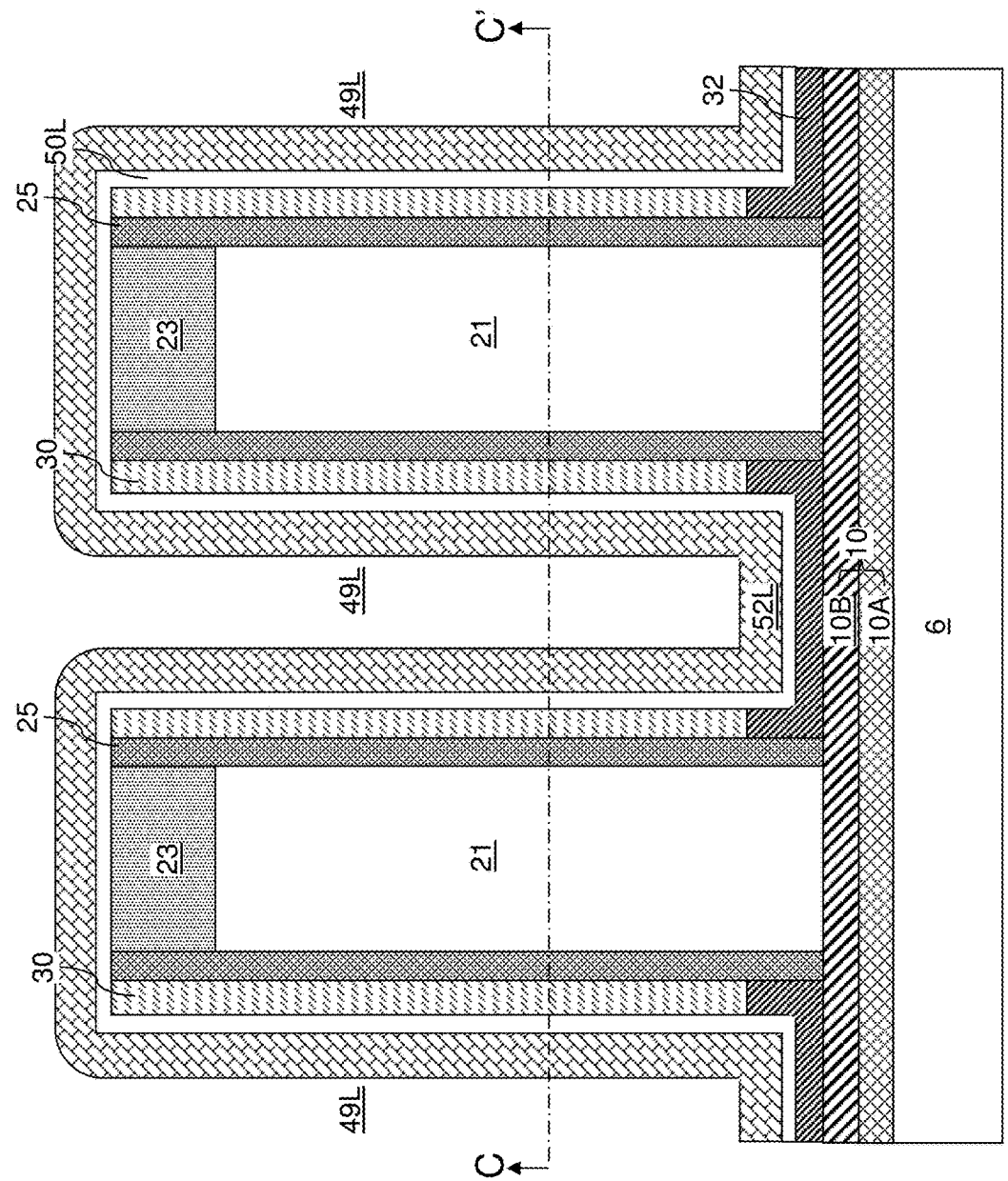
FIG. 10A is a vertical cross-sectional view of the first exemplary structure after formation of a laterally-undulating gate electrode layer along the vertical plane A-A' in FIG. 10C according to the first embodiment of the present disclosure.
Figure 10C:
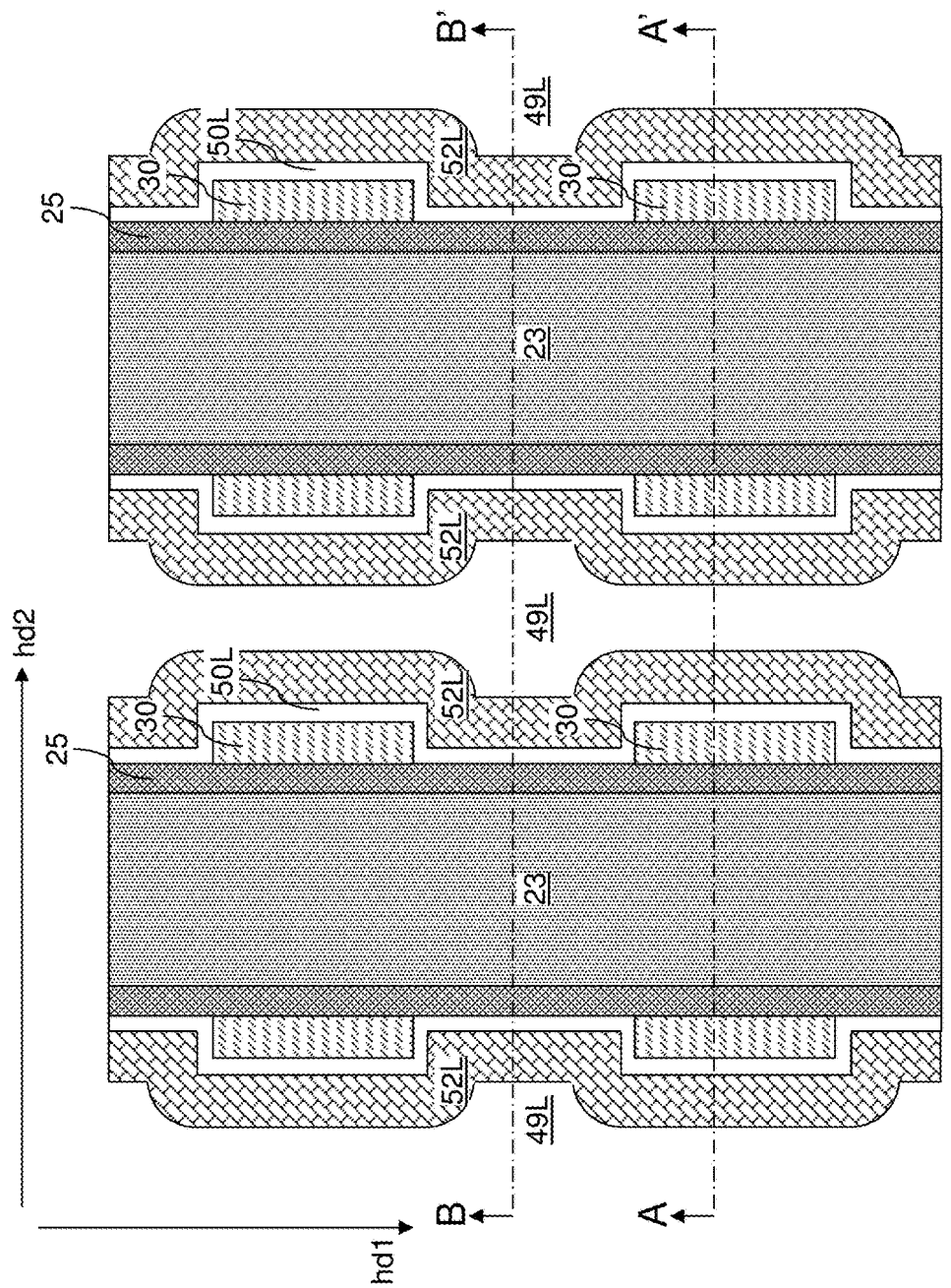
FIG. 10C is a horizontal cross-sectional view of the first exemplary structure of FIGS. 10A and 10B along the horizontal plane C-C' in FIGS. 10A and 10B.

Referring to FIGS. 10A-10C, a laterally-undulating gate electrode layer 52L can be formed on the laterally-undulating gate dielectric layer 50L. The laterally-undulating gate electrode layer 52L includes laterally-undulating sidewalls such as a continuous set of vertical interfaces with the laterally-undulating gate dielectric layer 50L that generally extends along the first horizontal direction hd1 includes lateral shifts or lateral jogs of alternating opposite directions along (or against) the second horizontal direction hd2. The laterally-undulating gate electrode layer 52L can be an inner gate electrode layer. The laterally-undulating gate electrode layer 52L can include a metallic material such as titanium nitride, tantalum nitride, tungsten nitride, tungsten, titanium, tantalum, cobalt, ruthenium, an alloy thereof, and/or a layer stack thereof. In one embodiment, the laterally-undulating gate electrode layer 52L can include a layer of titanium nitride. Alternatively or additionally, the laterally-undulating gate electrode layer 52L can include a doped semiconductor material such as doped polysilicon. The thickness of the laterally-undulating gate electrode layer 52L can be in a range from 2 nm to 200 nm, although lesser and greater thicknesses can also be employed. The laterally-undulating gate electrode layer 52L can be formed by a conformal deposition process such as chemical vapor deposition (CVD) or atomic layer deposition (ALD). The laterally-undulating gate electrode trenches 49L can have a lesser width in a region between an adjacent pair of vertical semiconductor channel strips 30 than in a region between a pair of interfaces between the gate dielectric layers 50L and a neighboring pair of matrix rail structures (21, 23, 25).

Figure 11A:
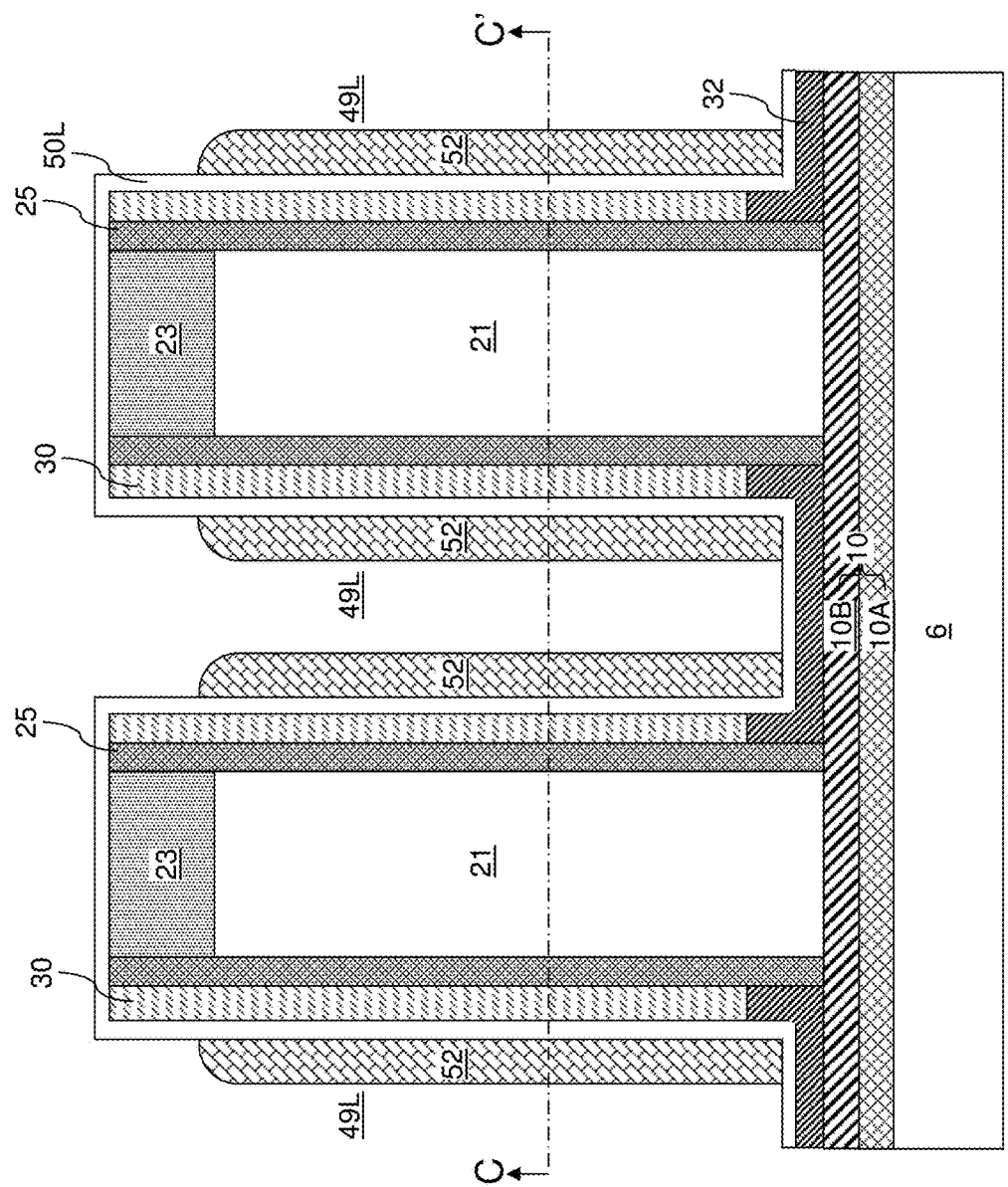
FIG. 11A is a vertical cross-sectional view of the first exemplary structure after formation of outer gate electrode lines by an anisotropic etch along the vertical plane A-A' in FIG. 11C according to the first embodiment of the present disclosure.
Figure 11B:
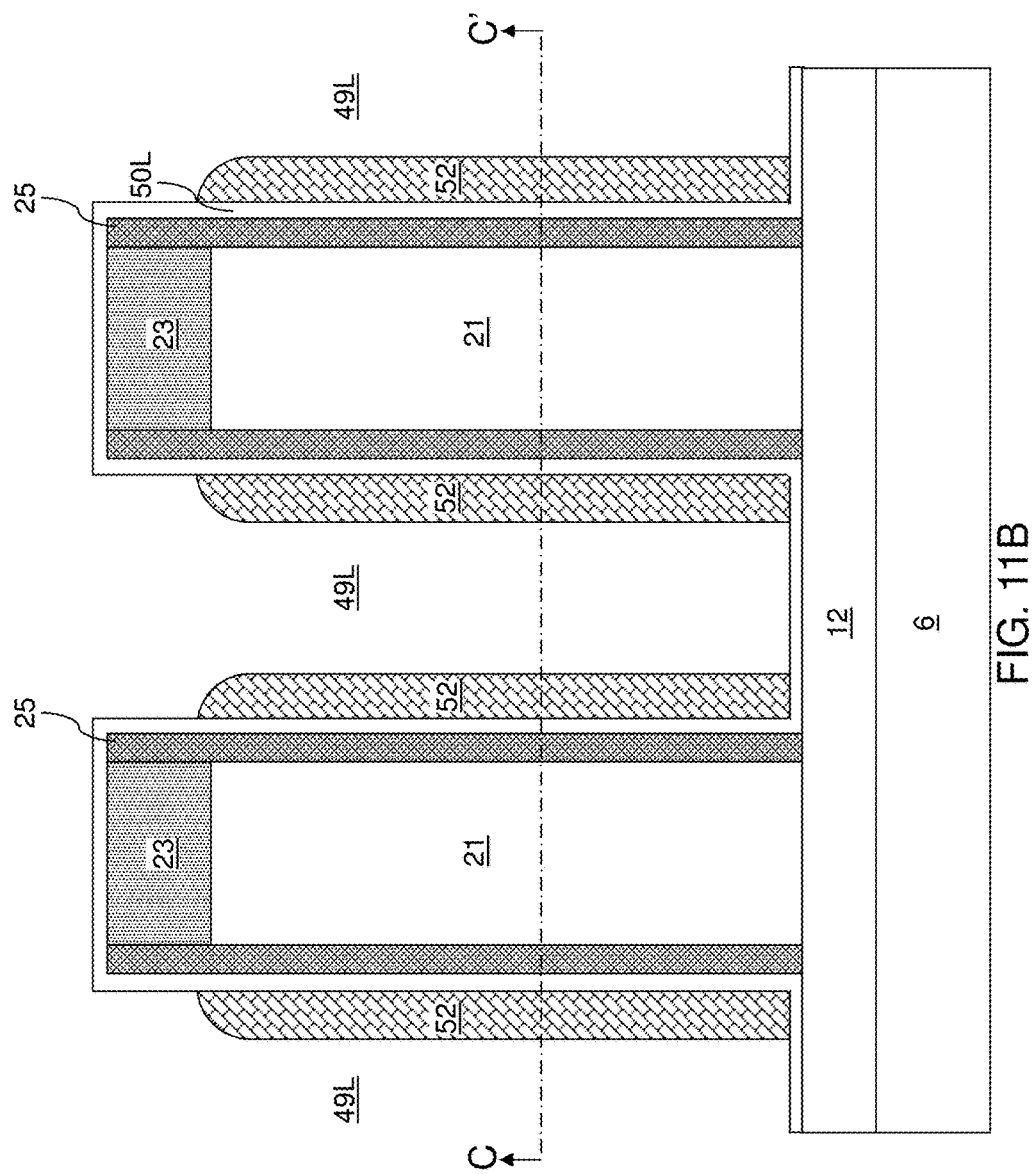
FIG. 11B is a vertical cross-sectional view of the first exemplary structure of FIG. 11A along the vertical plane B-B' in FIG. 11C according to the first embodiment of the present disclosure.
Figure 11C:
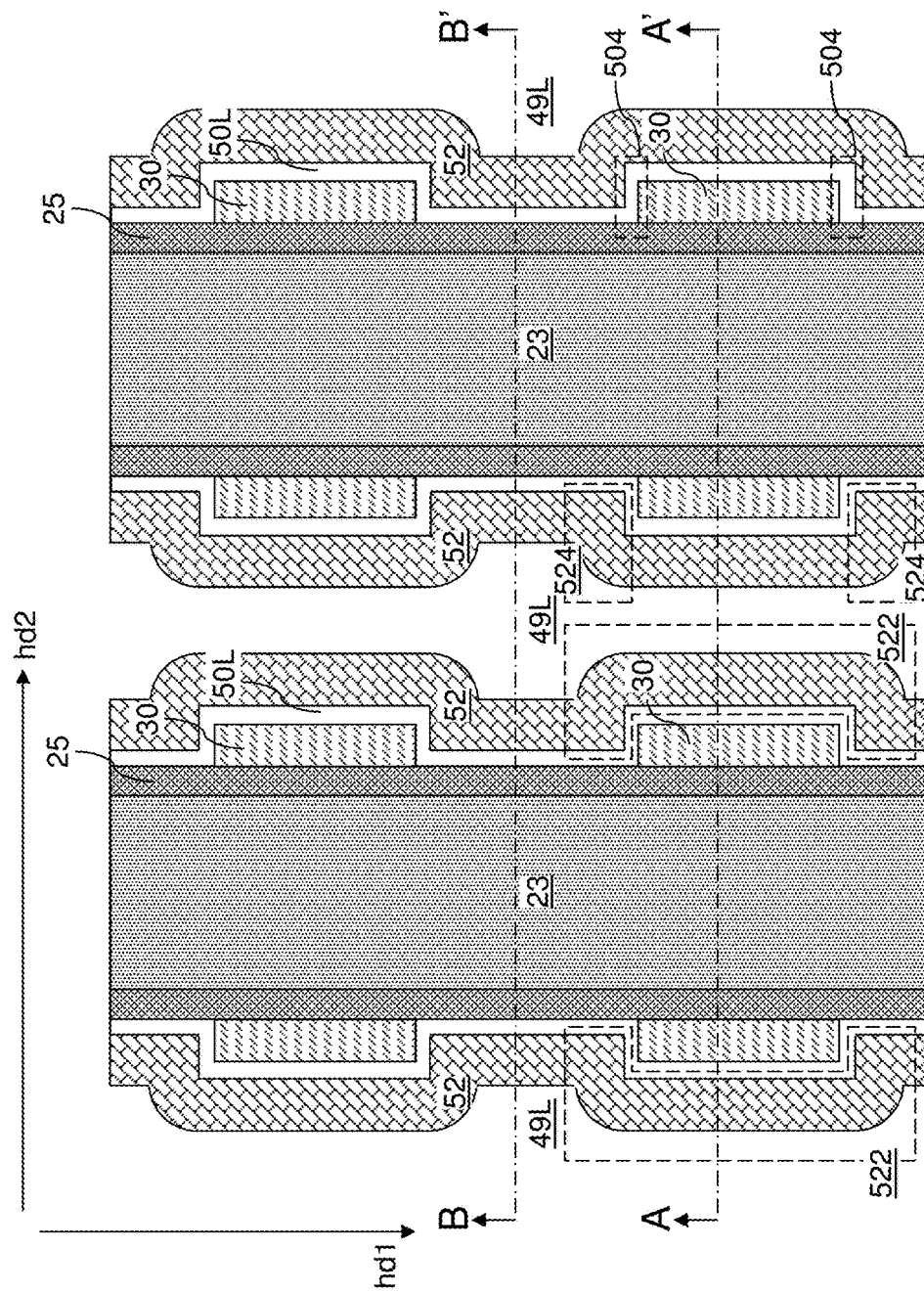
FIG. 11C is a horizontal cross-sectional view of the first exemplary structure of FIGS. 11A and 11B along the horizontal plane C-C' in FIGS. 11A and 11B.

Referring to FIGS. 11A-11C, an anisotropic etch that etches the material of the laterally-undulating gate electrode layer 52L selective to the material of the laterally-undulating gate dielectric layer SOL or selective to the material of the upper dielectric rail structures 23 can be performed to etch horizontal portions of the laterally-undulating gate electrode layer 52L. Each remaining vertical portion of the laterally-undulating gate electrode layer 52L constitutes an inner gate electrode line 52. Each inner gate electrode line 52 is a laterally-undulating structure including laterally-undulating sidewalls, and thus, is a laterally-undulating gate electrode line. Further, an overetch can be performed to vertically recess the top surfaces of the inner gate electrode lines 52 so that the top surfaces of the inner gate electrode lines 52 after the overetch can be approximately at the height at which p-n junctions between the vertical semiconductor channel strips of final vertical field effect transistor structures and top active regions of the final vertical field effect transistor structures.

In the semiconductor device to be subsequently formed, multiple instances of a vertical field effect transistor can be provided around a matrix rail structure (21, 23, 25) such that the multiple instances are spaced apart along the first horizontal direction hd1. Each instance of the vertical field effect transistor can include a pair of inner gate electrodes 522. Each of the pair of inner gate electrodes 522 of the multiple instances of the vertical field effect transistor to be formed around the matrix rail structure (21, 23, 25) can be a respective portion of a pair of inner gate electrode lines 52 that is shared among each of the multiple instances of the vertical field effect transistor. Each pair of inner gate electrodes 522 can contact respective sidewalls of a pair of inner gate dielectrics. Each inner gate electrode 522 is a portion of an inner gate electrode line 52 that extends along the first horizontal direction hd1. Thus, a pair of inner gate electrode lines 52 is provided around each matrix rail structure (21, 23, 25). Each of the pair of inner gate electrode lines 52 laterally extends generally along the first horizontal direction hd1 through each of the multiple instances of the vertical field effect transistor with bends 524 at instances of the lateral jogs 504 of the pair of inner gate dielectric layers 50.

Figure 12A:
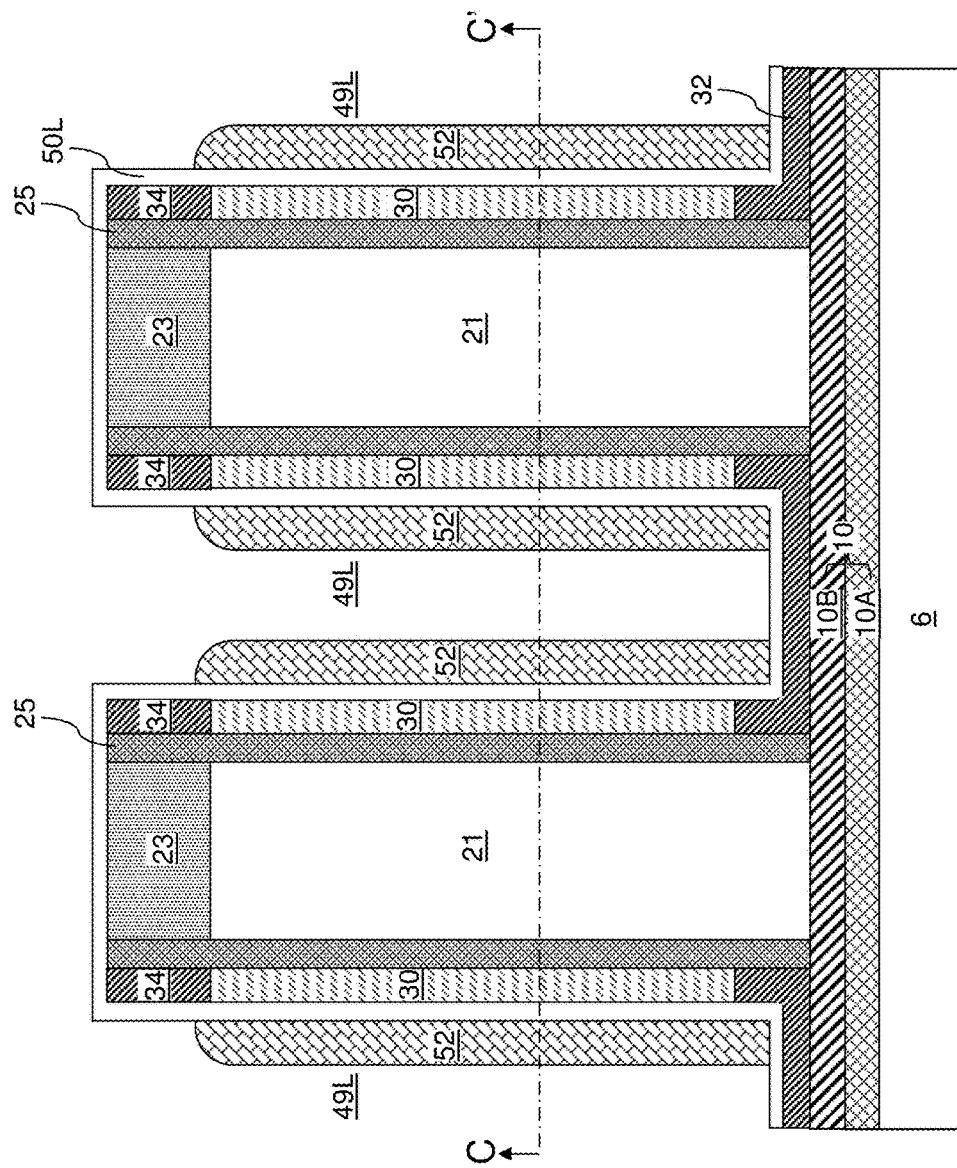
FIG. 12A is a vertical cross-sectional view of the first exemplary structure after formation of top active electrodes along the vertical plane A-A' in FIG. 12C according to the first embodiment of the present disclosure.
Figure 12B:
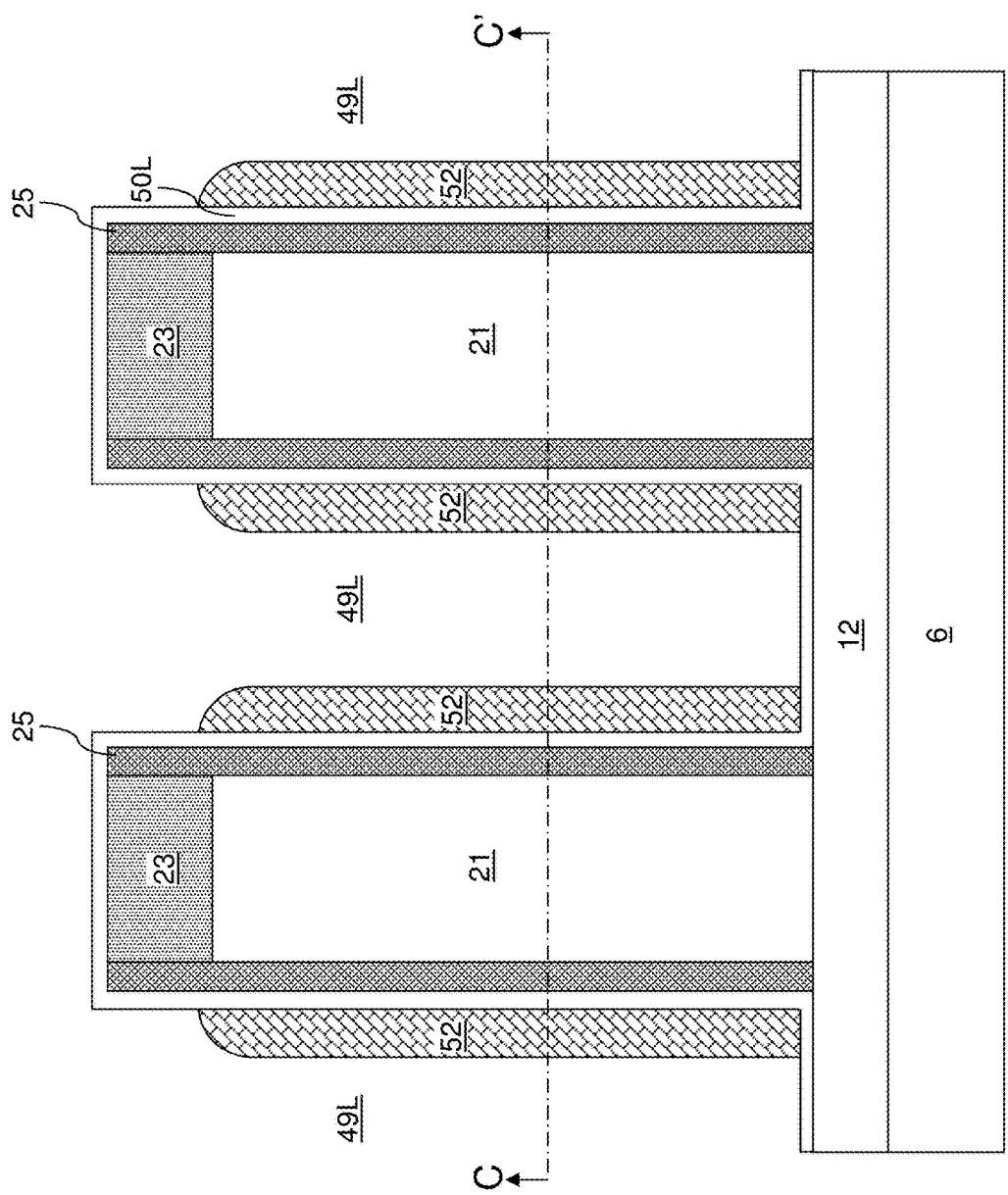
FIG. 12B is a vertical cross-sectional view of the first exemplary structure of FIG. 12A along the vertical plane B-B' in FIG. 12C according to the first embodiment of the present disclosure.
Figure 12C:
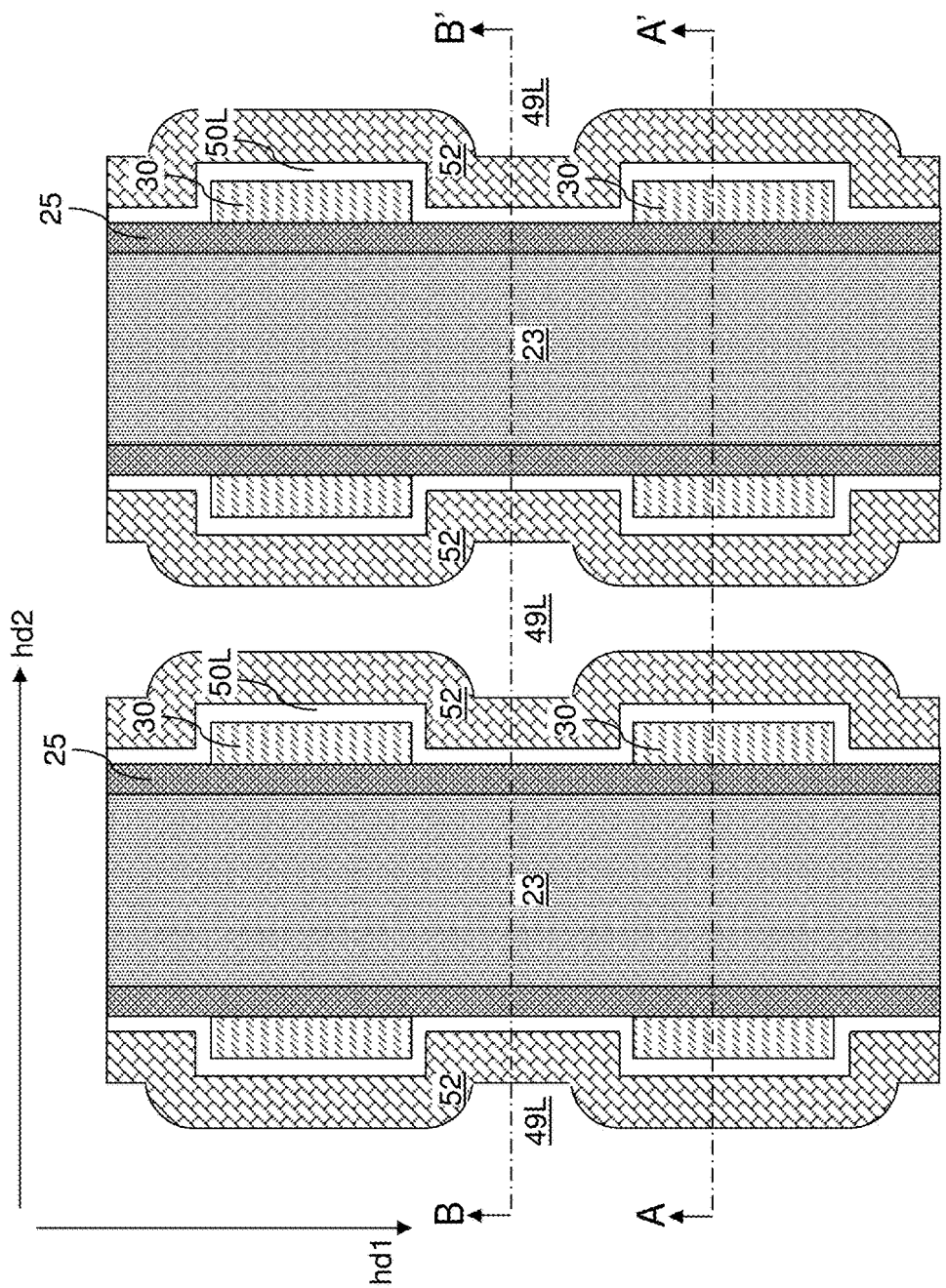
FIG. 12C is a horizontal cross-sectional view of the first exemplary structure of FIGS. 12A and 12B along the horizontal plane C-C' in FIGS. 12A and 12B.

Referring to FIGS. 12A-12C, dopants of the first conductivity type can be implanted into upper portions of the vertical semiconductor channel strips 30 to convert upper portions of each vertical semiconductor channel strip 30 into top active regions 34. The atomic concentration of dopants of the second conductivity type in the top active regions 34 can be in a range from $1.0 \times 10^{19}/cm^3$ to $2.0 \times 10^{21}/cm^3$, although lesser and greater atomic concentrations can also be employed. P-n junctions can be formed between the top active regions 34 and remaining portions of the vertical semiconductor channel strips 30. The height of the p-n junctions between the top active regions 34 and the vertical semiconductor channel strips 30 can be about the height of the top surfaces of the inner gate electrodes, which are portions of the inner gate electrode lines 52.

Figure 13A:
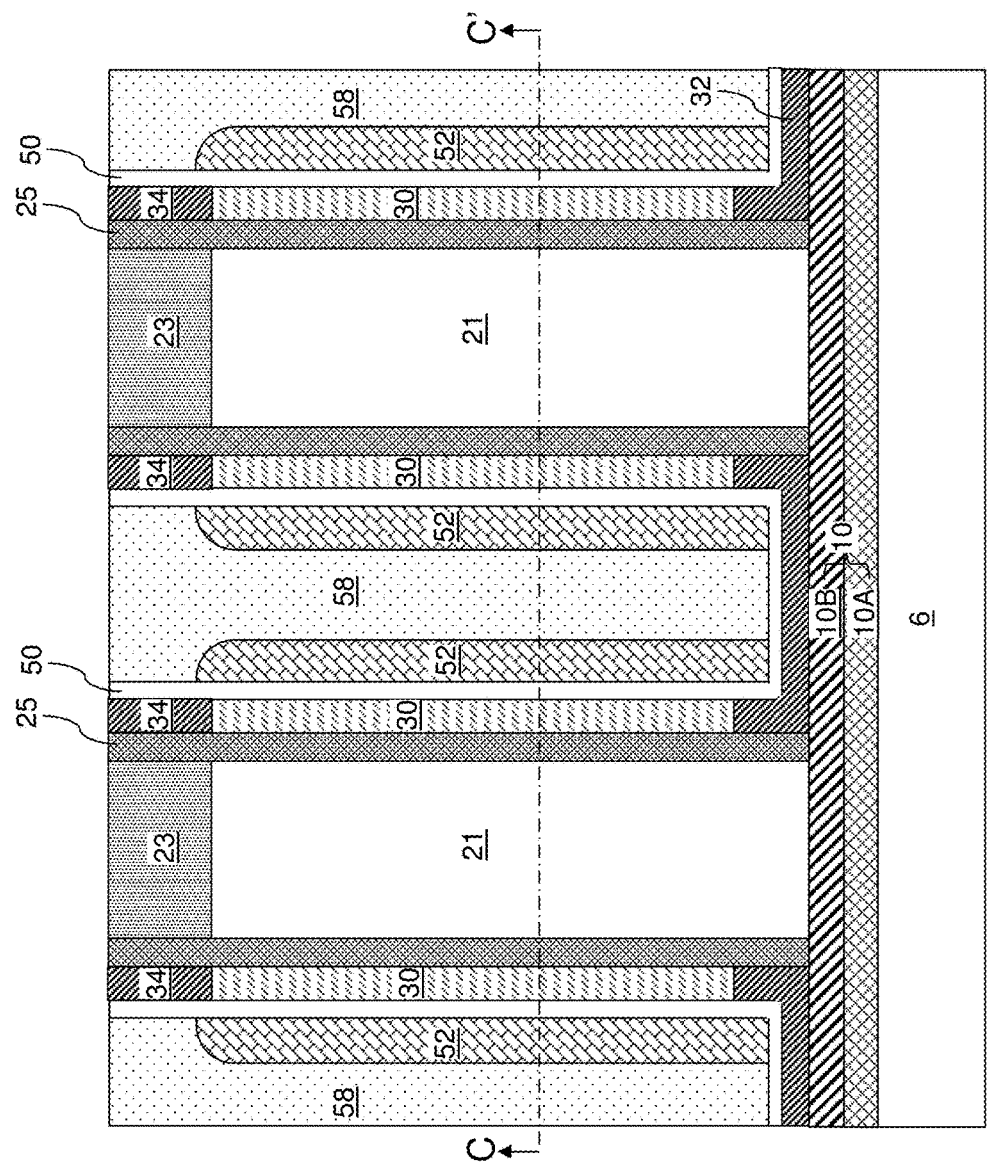
FIG. 13A is a vertical cross-sectional view of the first exemplary structure after formation of inner isolation dielectric lines along the vertical plane A-A' in FIG. 13C according to the first embodiment of the present disclosure.
Figure 13B:
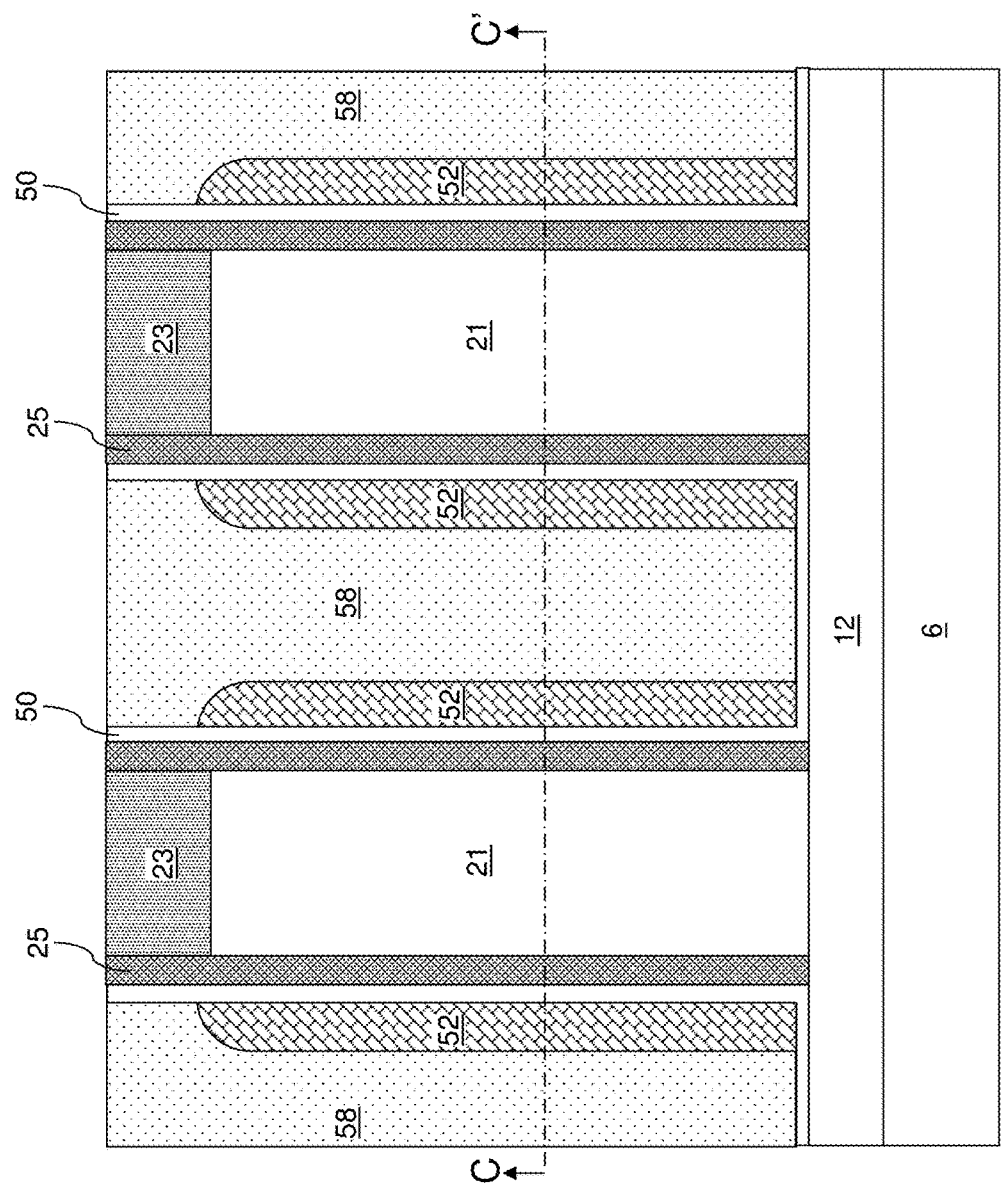
FIG. 13B is a vertical cross-sectional view of the first exemplary structure of FIG. 13A along the vertical plane B-B' in FIG. 13C according to the first embodiment of the present disclosure.
Figure 13C:
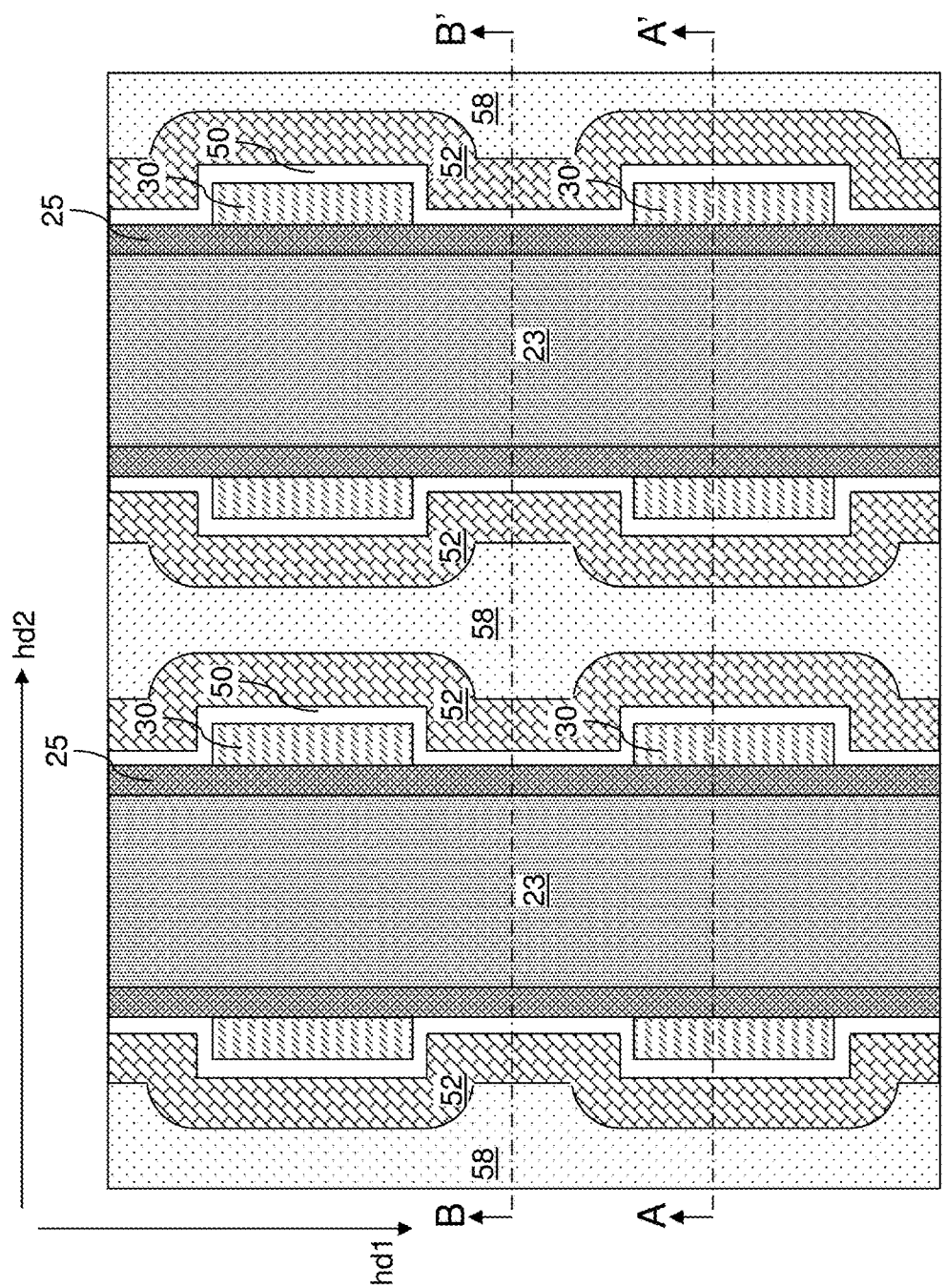
FIG. 13C is a horizontal cross-sectional view of the first exemplary structure of FIGS. 13A and 13B along the horizontal plane C-C' in FIGS. 13A and 13B.
Figure 14B:
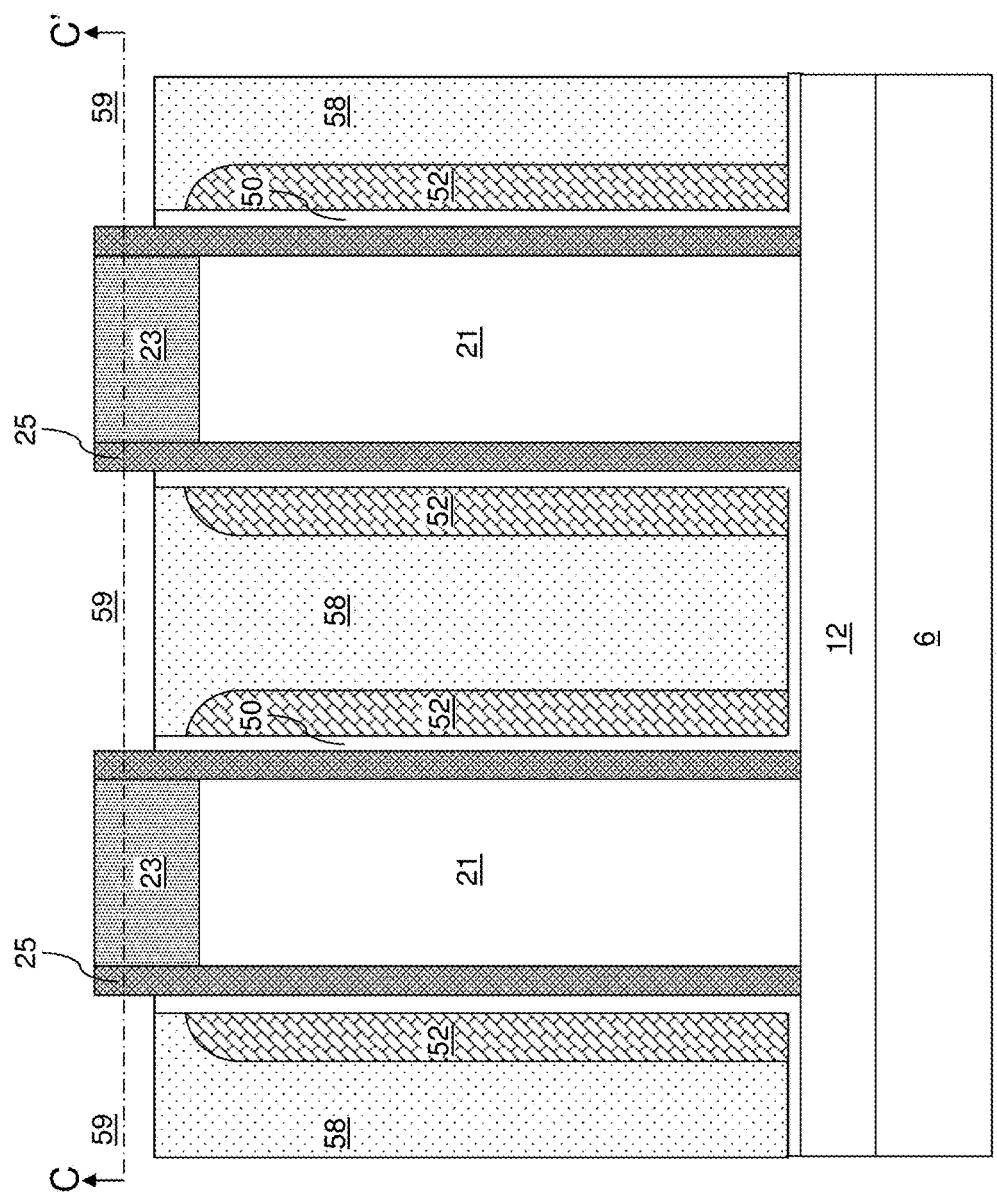
FIG. 14B is a vertical cross-sectional view of the first exemplary structure of FIG. 14A along the vertical plane B-B' in FIGS. 14C and 14D according to the first embodiment of the present disclosure.
Figure 14C:
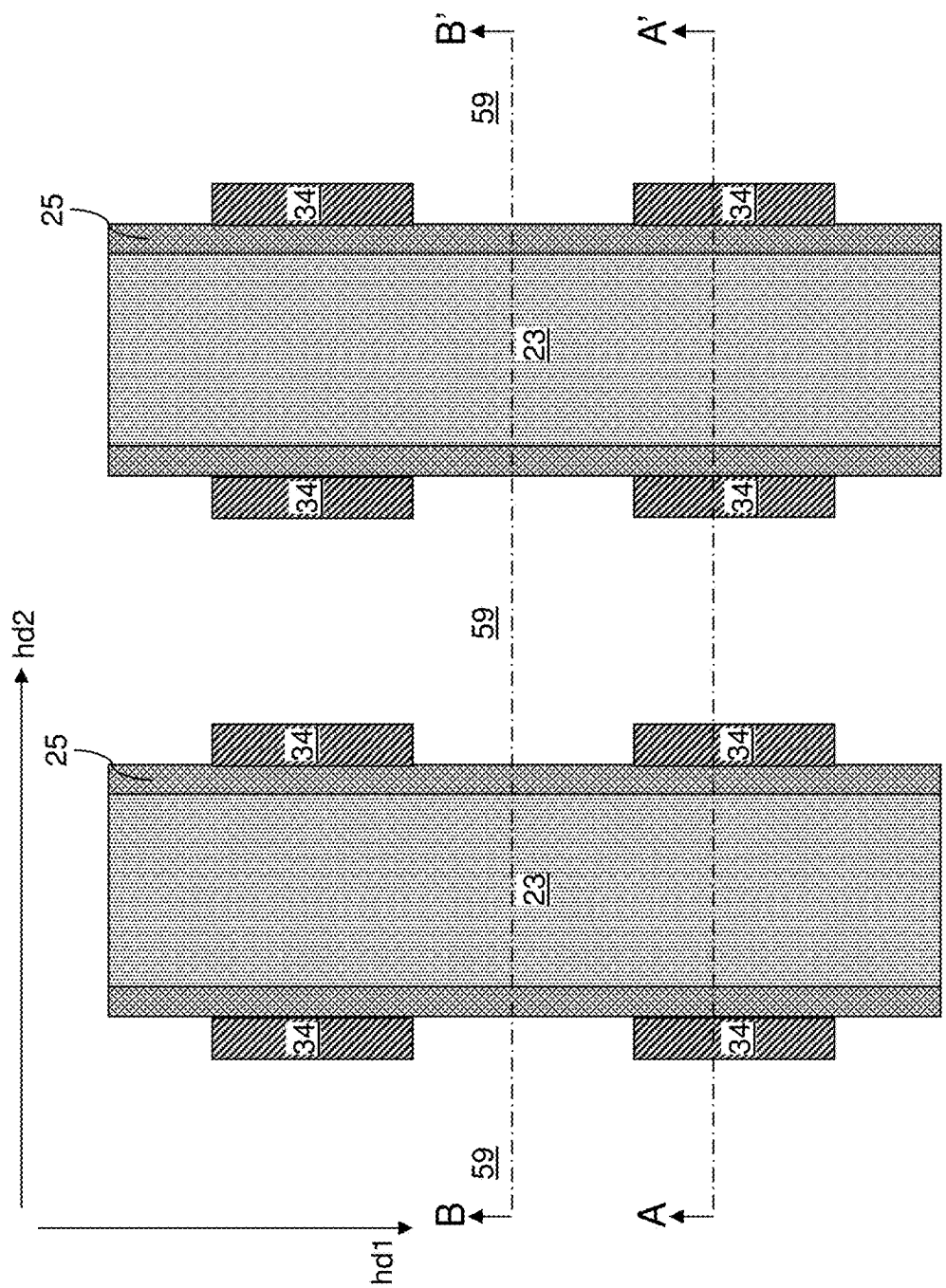
FIG. 14C is a horizontal cross-sectional view of the first exemplary structure of FIGS. 14A and 14B along the horizontal plane C-C' in FIGS. 14A and 14B.
Figure 14D:
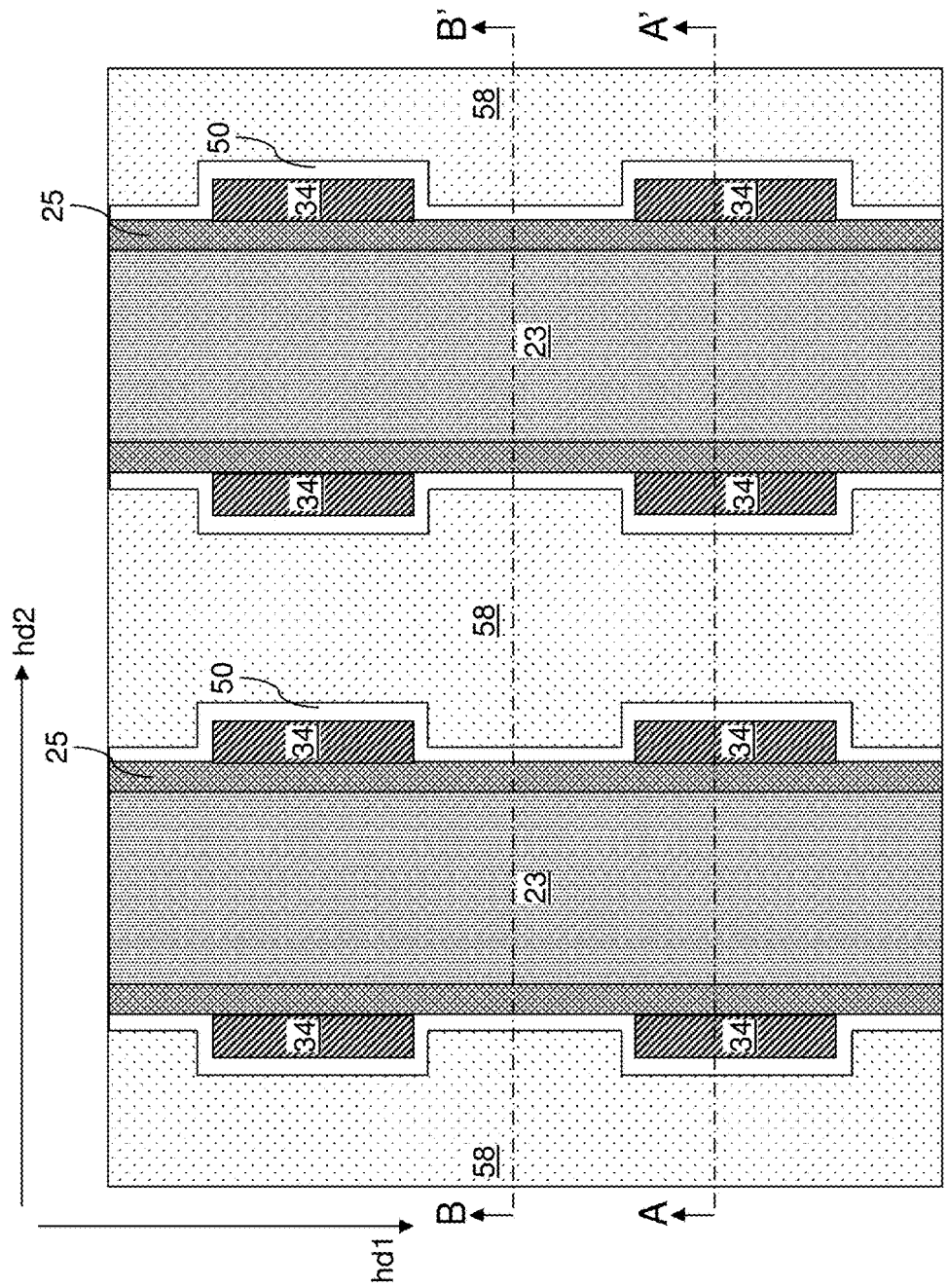
FIG. 14D is a top-down view of the first exemplary structure of FIGS. 14A-14C.

Referring to FIGS. 13A-13C, a dielectric material such as silicon oxide can be deposited in remaining volumes of the laterally-undulating gate electrode trenches 49L by a conformal deposition process or a combination of a non-conformal deposition process and a reflow process. Excess portions of the deposited dielectric material can be removed from above the horizontal plane including the top surfaces of the upper dielectric rail structures 23 by a planarization process. Chemical mechanical planarization (CMP) or a recess etch may be employed for the planarization process. Each remaining portion of the deposited dielectric material constitutes an inner isolation dielectric line 58 that extends along the first horizontal direction hd1. The inner isolation dielectric lines 58 can be formed over the inner gate electrode lines 52.

Referring to FIGS. 14A-14D, inner isolation dielectric lines 58 can be vertically recessed with respect to the top surfaces of the matrix rail structures (21, 23, 25) and the top surfaces of the top active regions 34 by an etch process, which may be an isotropic etch process or an anisotropic etch process. In an illustrative embodiment, the inner isolation dielectric lines 58 can include doped or undoped silicate glass or organosilicate glass, and a wet etch employing hydrofluoric acid can be employed to vertically recess the top surfaces of the inner isolation dielectric lines 58 relative to the top surfaces of the matrix rail structures (21, 23, 25) and the top surfaces of the top active regions 34. Line trenches 59 can be formed in the recessed regions overlying the inner isolation dielectric lines 58. The duration of the etch process can be selected such that the recessed top surfaces of the inner isolation dielectric lines 58 are located above the horizontal plane including the top surfaces of the inner gate electrode lines 52. Thus, the inner gate electrode lines 52 are not physically exposed after formation of the line trenches 59. The line trenches 59 can have a laterally-undulating width along the second horizontal direction hd2. In other words, the width of each line trench 59 as measured along the second horizontal direction hd2 can undulate as the location of measurement of the width moves along the first horizontal direction hd1.

Figure 15A:
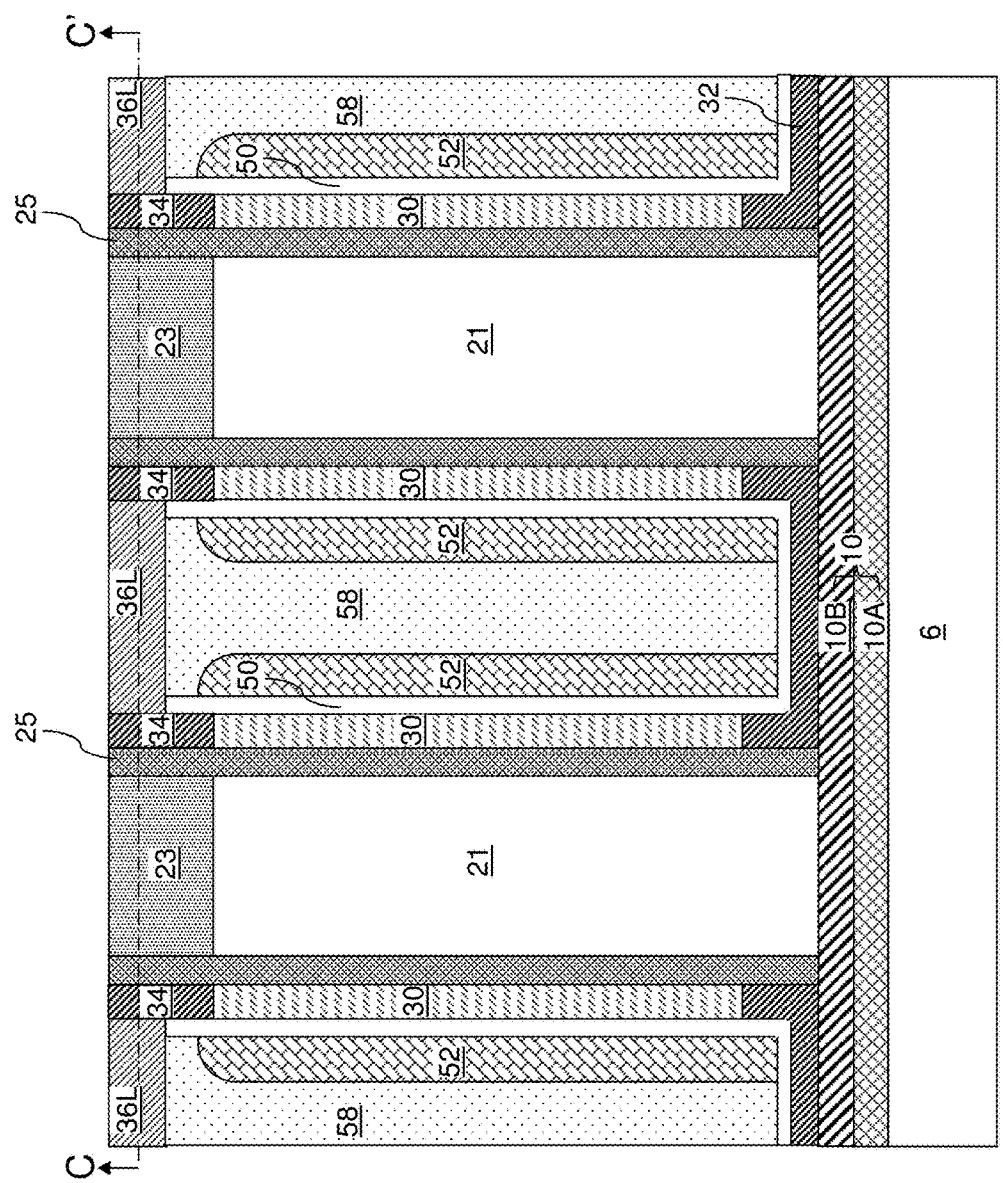
FIG. 15A is a vertical cross-sectional view of the first exemplary structure after formation of top electrode connection layers along the vertical plane A-A' in FIG. 15C according to the first embodiment of the present disclosure.
Figure 15B:
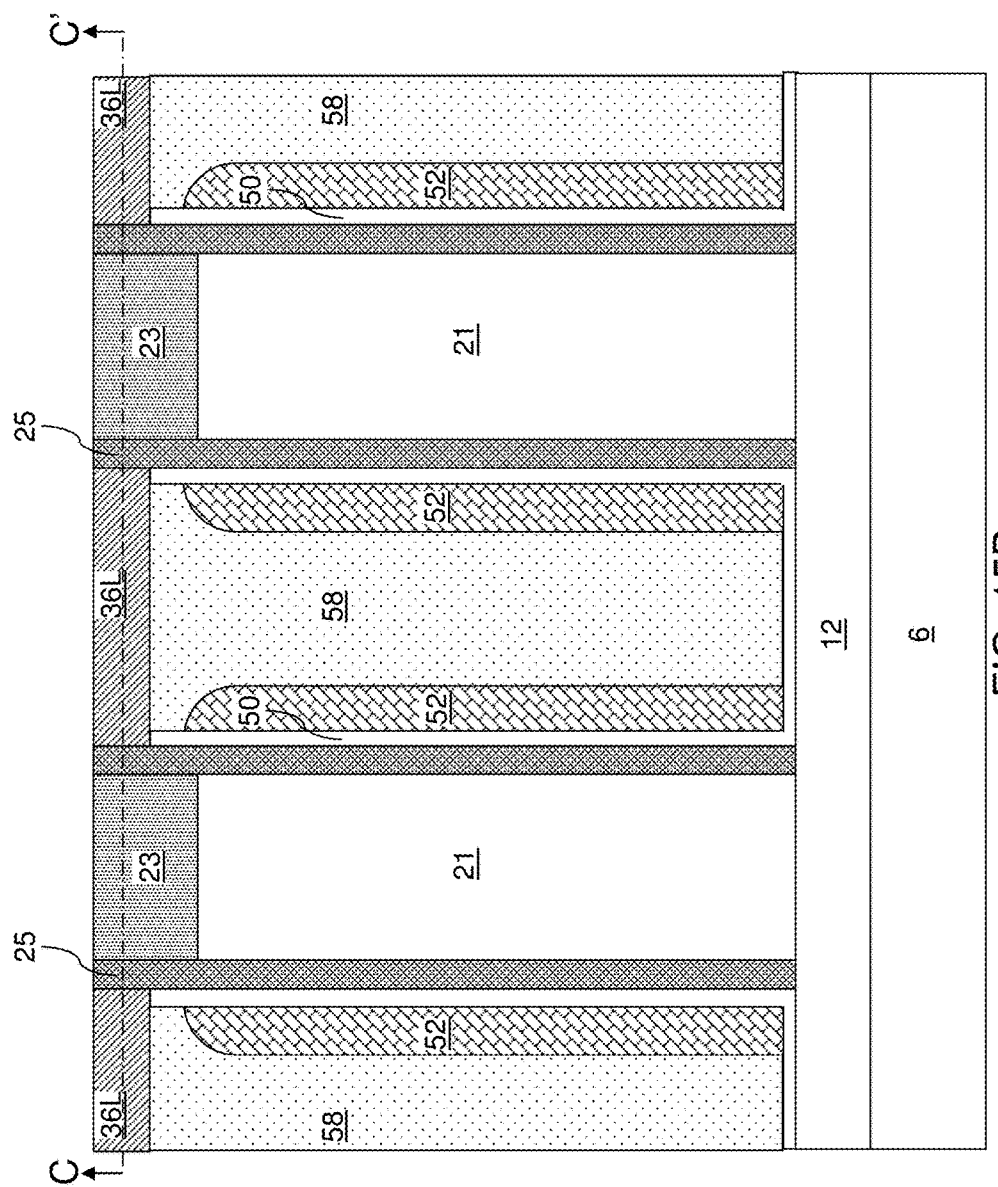
FIG. 15B is a vertical cross-sectional view of the first exemplary structure of FIG. 15A along the vertical plane B-B' in FIG. 15C according to the first embodiment of the present disclosure.
Figure 15C:
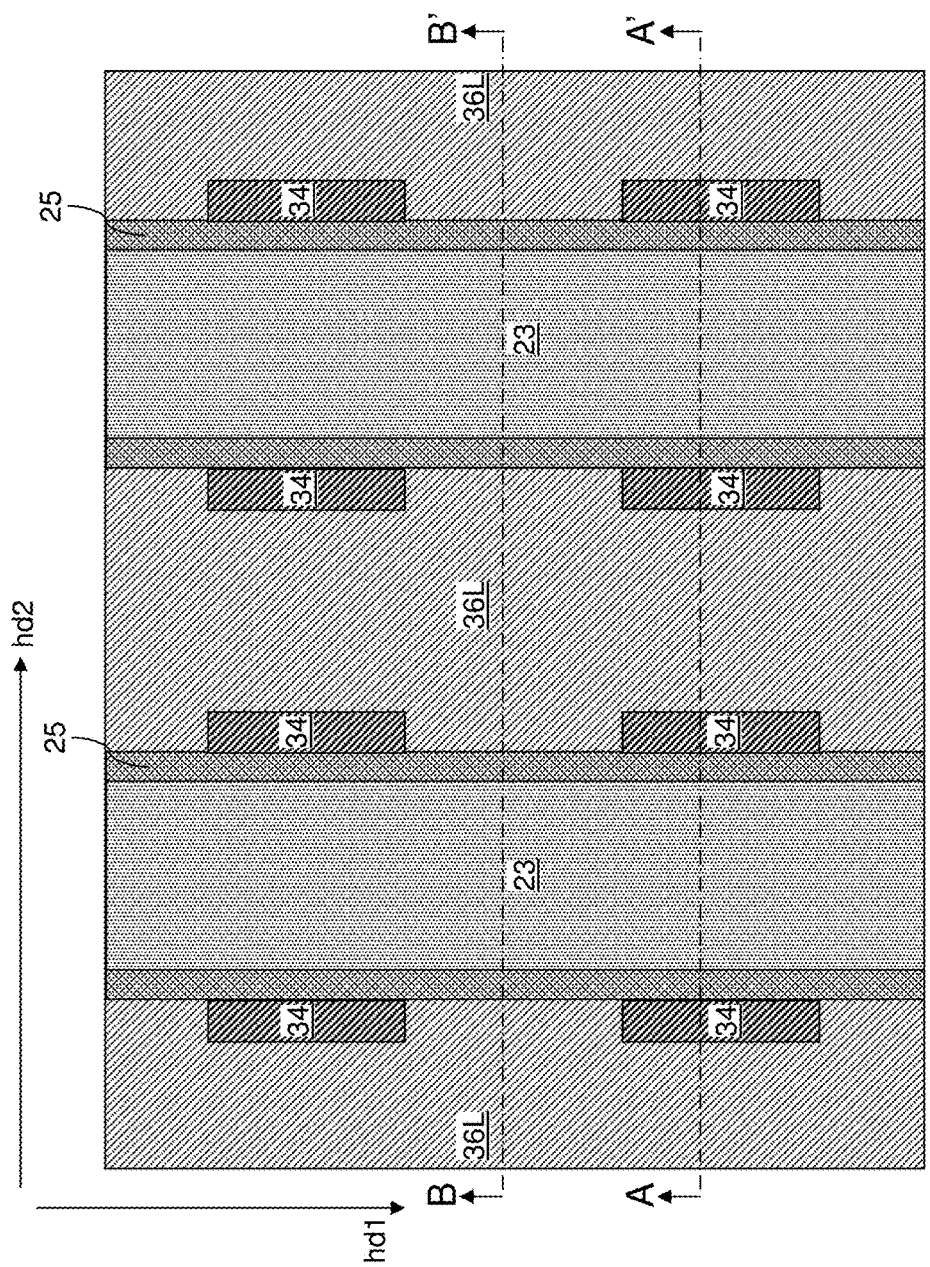
FIG. 15C is a horizontal cross-sectional view of the first exemplary structure of FIGS. 15A and 15B along the horizontal plane C-C' in FIGS. 15A and 15B.

Referring to FIGS. 15A-15C, top electrode connection layers 36L can be formed in the line trenches 59. For example, at least one conductive material can be deposited to fill the line trenches 59. The at least one conductive material can include a doped semiconductor material (such as polysilicon) having a doping of the first conductivity type, and/or a metallic material such as TiN, TaN, WN, W, Co, Ru, Ta, Ti, alloys thereof, and/or layer stacks thereof. In one embodiment, the at least one conductive material can include doped polysilicon. Excess portions of the at least one conductive material can be removed from above the horizontal plane including the top surfaces of the matrix rail structures (21, 23, 25) by a planarization process, which can include, for example, chemical mechanical planarization (CMP) and/or a recess etch. Each top electrode connection layer 36L extends between a neighboring par of matrix rail structures (21, 23, 25), and laterally extends through multiple neighboring pairs of vertical semiconductor channel strips 30 along the first horizontal direction hd1.

Subsequently, each matrix rail structure (21, 23, 25) can be replaced with a respective set of at least one gate electrode rail (i.e., at least one rail embodying a gate electrode) and straight-sidewalled gate dielectrics (i.e., gate dielectrics free of laterally-undulating sidewalls). Each set of the at least one gate electrode rail and straight-sidewalled gate dielectrics may include a pair of gate electrode rail gate electrodes and a straight-sidewalled gate dielectric layer including the straight-sidewalled gate dielectrics therein.

Figure 16A:
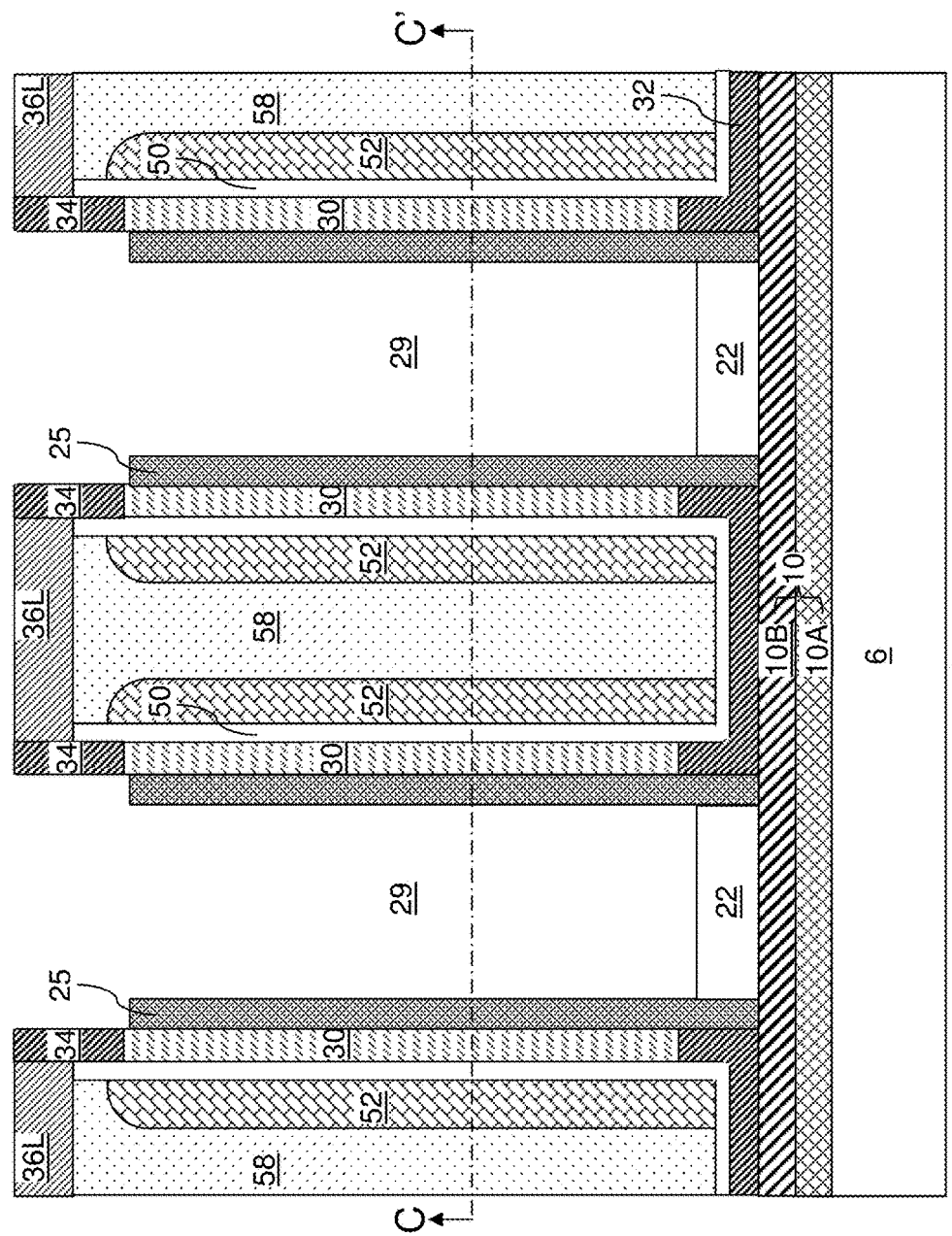
FIG. 16A is a vertical cross-sectional view of the first exemplary structure after removal of second dielectric material portions and an upper portion of each first dielectric material portion along the vertical plane A-A' in FIG. 16C according to the first embodiment of the present disclosure.
Figure 16B:
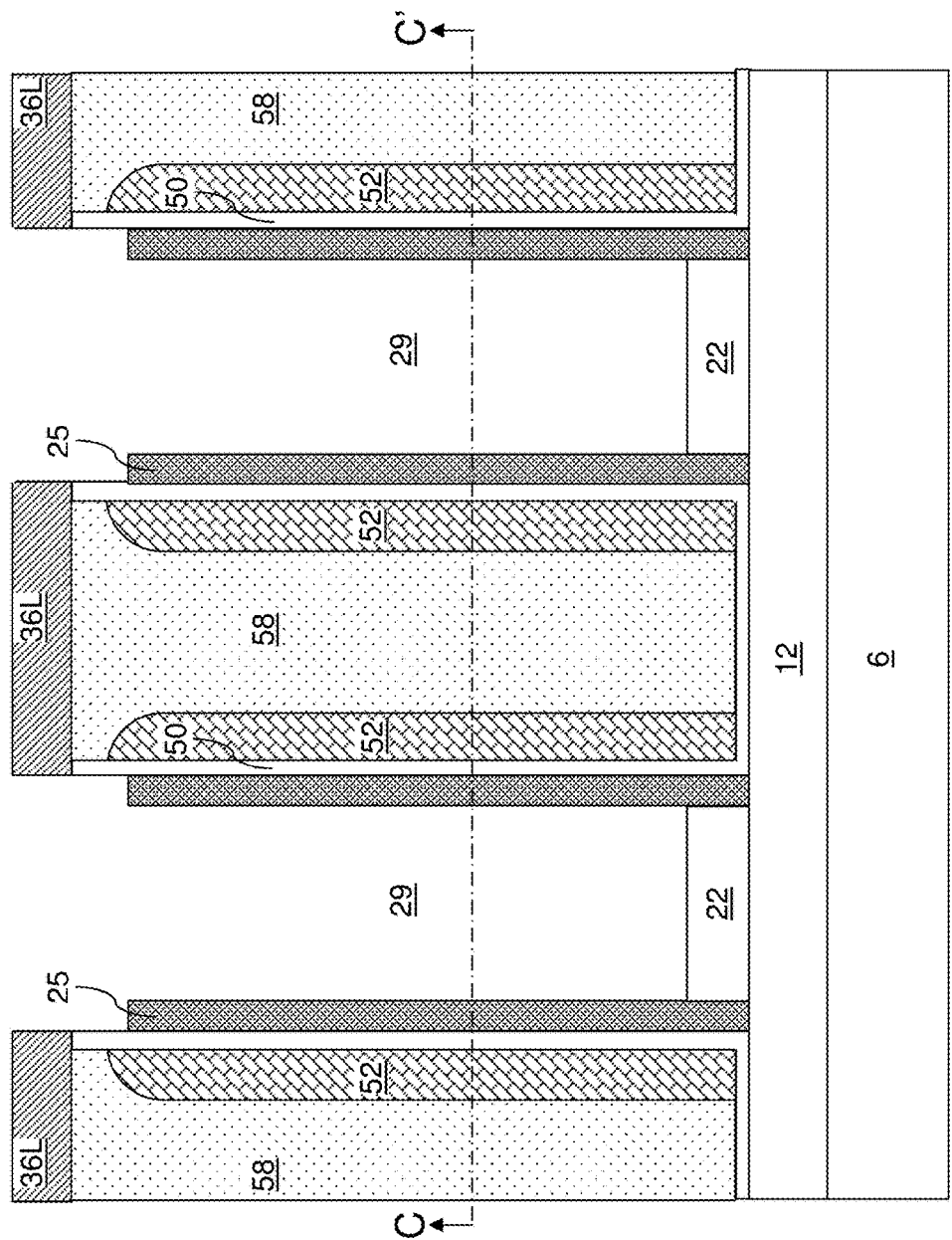
FIG. 16B is a vertical cross-sectional view of the first exemplary structure of FIG. 16A along the vertical plane B-B' in FIG. 16C according to the first embodiment of the present disclosure.
Figure 16C:
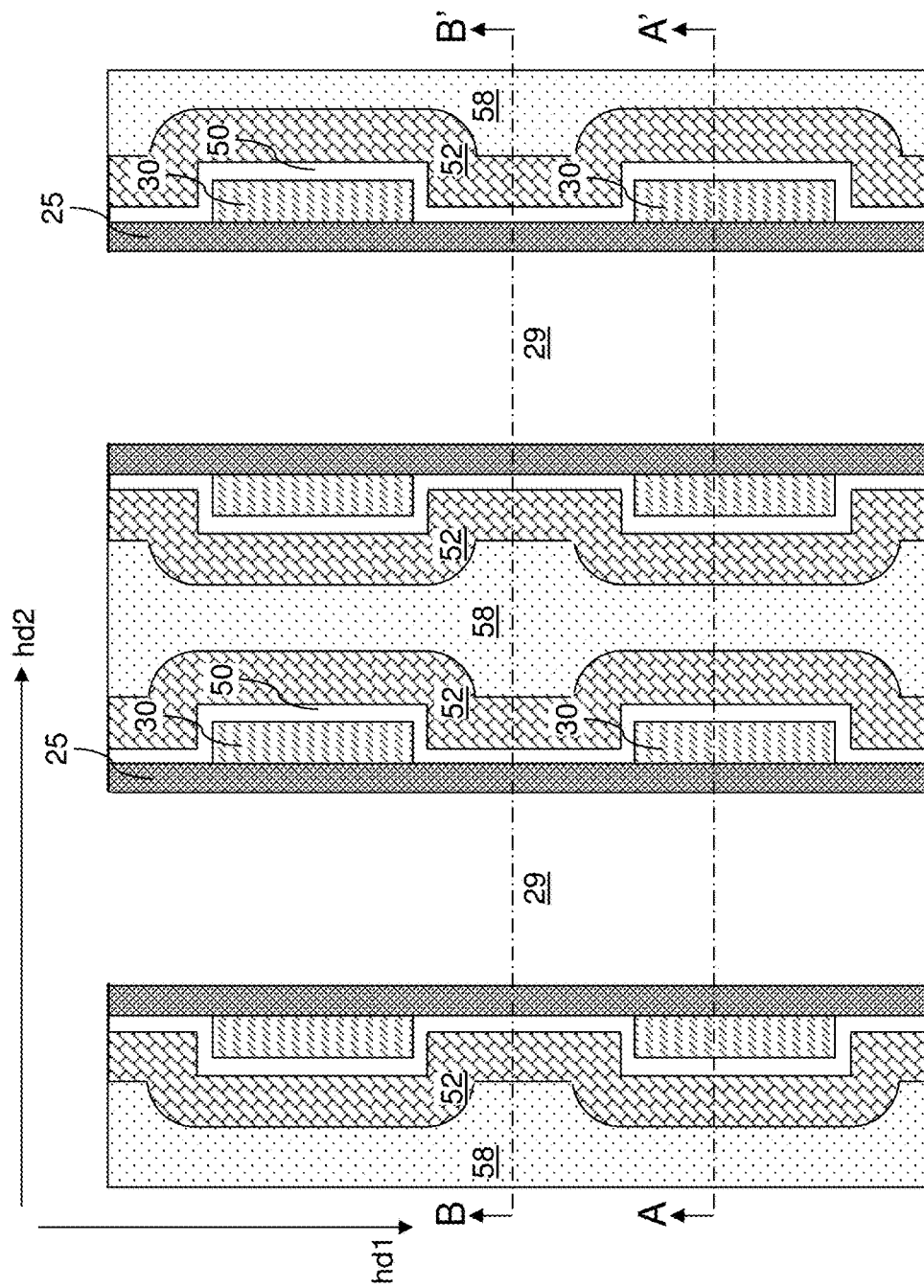
FIG. 16C is a horizontal cross-sectional view of the first exemplary structure of FIGS. 16A and 16B along the horizontal plane C-C' in FIGS. 16A and 16B.

Referring to FIGS. 16A-16C, second dielectric material portions 23 and an upper portion of each first dielectric material portion 21 can be removed by a series of etch processes. For example, a first etch process can be performed to remove the second dielectric material portions 23, and a second etch process can be performed to remove the upper portions of the first dielectric material portions 21. In an illustrative example, the second dielectric material portions 23 can include silicon nitride, and the first etch process can include a wet etch process employing hot phosphoric acid. The second dielectric material portions 21 can include silicon oxide, and the second etch process can include a wet etch process employing hydrofluoric acid or dry etch process employing HF vapor.

The duration of the second etch process can be selected such that a bottom portion of each first dielectric material portion 21 remains over the laterally alternating stack of bottom electrode lines 10 and bottom electrode isolation structures 12. Each remaining portion of the first dielectric material portion 21 is herein referred to as a dielectric pedestal 22. The height of the dielectric pedestals 22 can be selected such that the top surfaces of the dielectric pedestals 22 can be about the level of the top surfaces of the bottom active regions 32. The vertical offset between the top surfaces of the dielectric pedestals 22 and the top surfaces of the bottom active regions 32 can be selected to optimize the performance of vertical field effect transistors to be subsequently formed. In one embodiment, the vertical offset between the top surfaces of the dielectric pedestals 22 and the top surfaces of the bottom active regions 32 can be the overlap distance between outer gate electrodes to be subsequently formed and the bottom active regions 32.

An outer gate electrode cavity 29 can be formed in volumes from which the second dielectric material portions 23 and the upper portions of the first dielectric material portions 21 are removed. Each outer gate electrode cavity 29 can laterally extend along the first horizontal direction hd1. If the etch process that vertically recesses the first dielectric material portions 21 to form the dielectric pedestals 22 is selective to the dielectric material of the dielectric spacers 25, the lower portion of each outer gate electrode cavity 29 can be laterally bounded by sidewalls of the dielectric spacers 25.

Figure 17A:
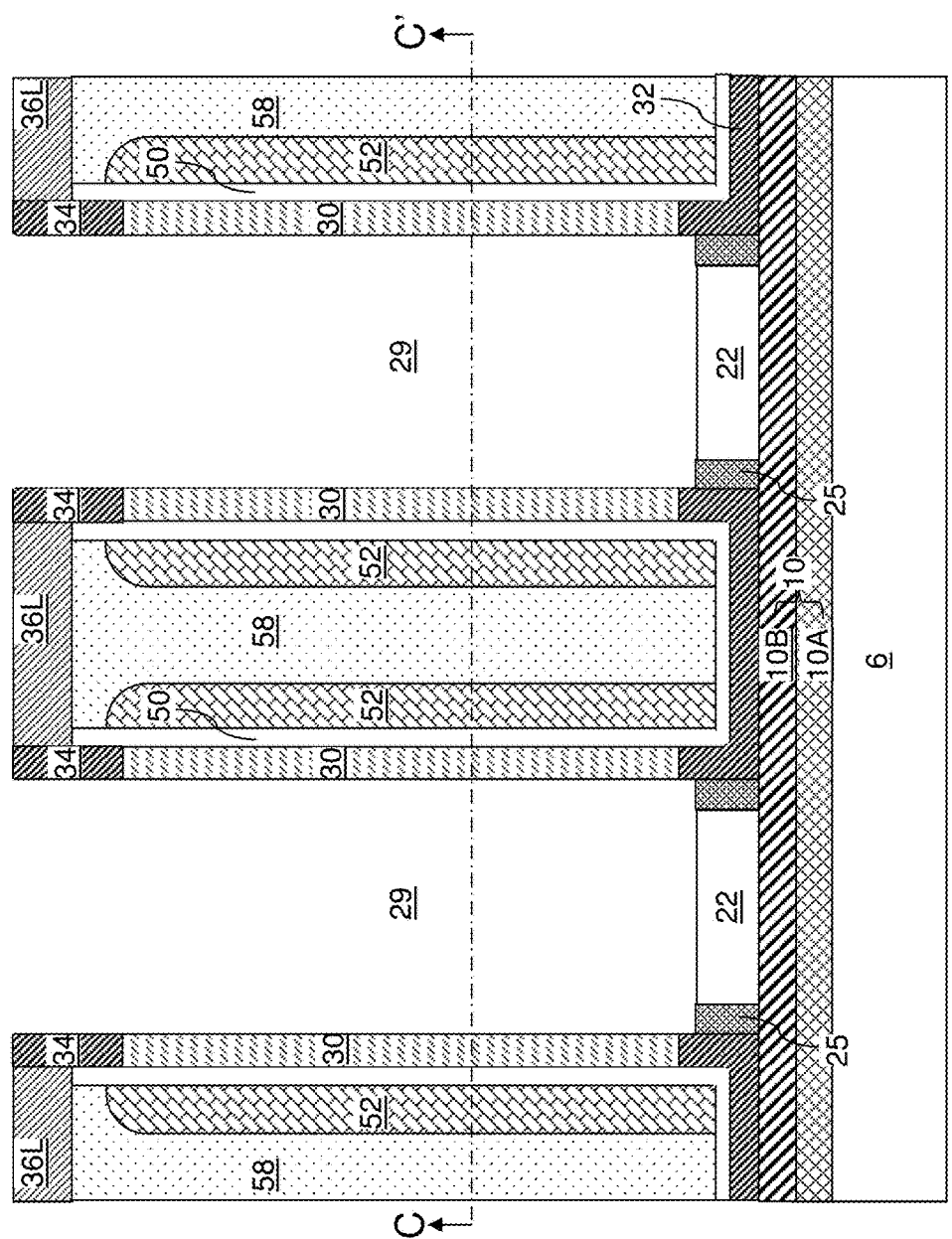
FIG. 17A is a vertical cross-sectional view of the first exemplary structure after removal of a predominant portion of each dielectric spacer along the vertical plane A-A' in FIG. 17C according to the first embodiment of the present disclosure.
Figure 17B:
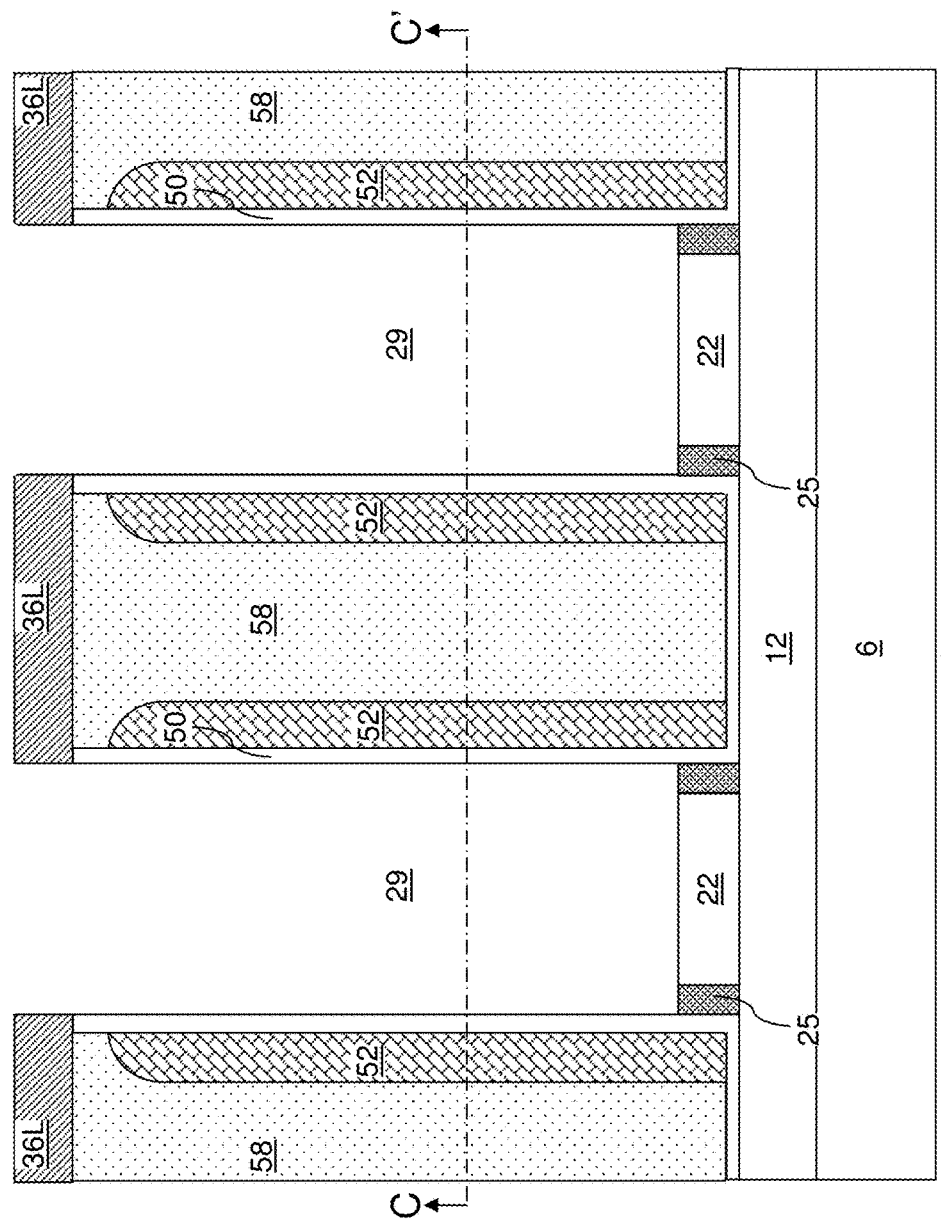
FIG. 17B is a vertical cross-sectional view of the first exemplary structure of FIG. 17A along the vertical plane B-B' in FIG. 17C according to the first embodiment of the present disclosure.
Figure 17C:
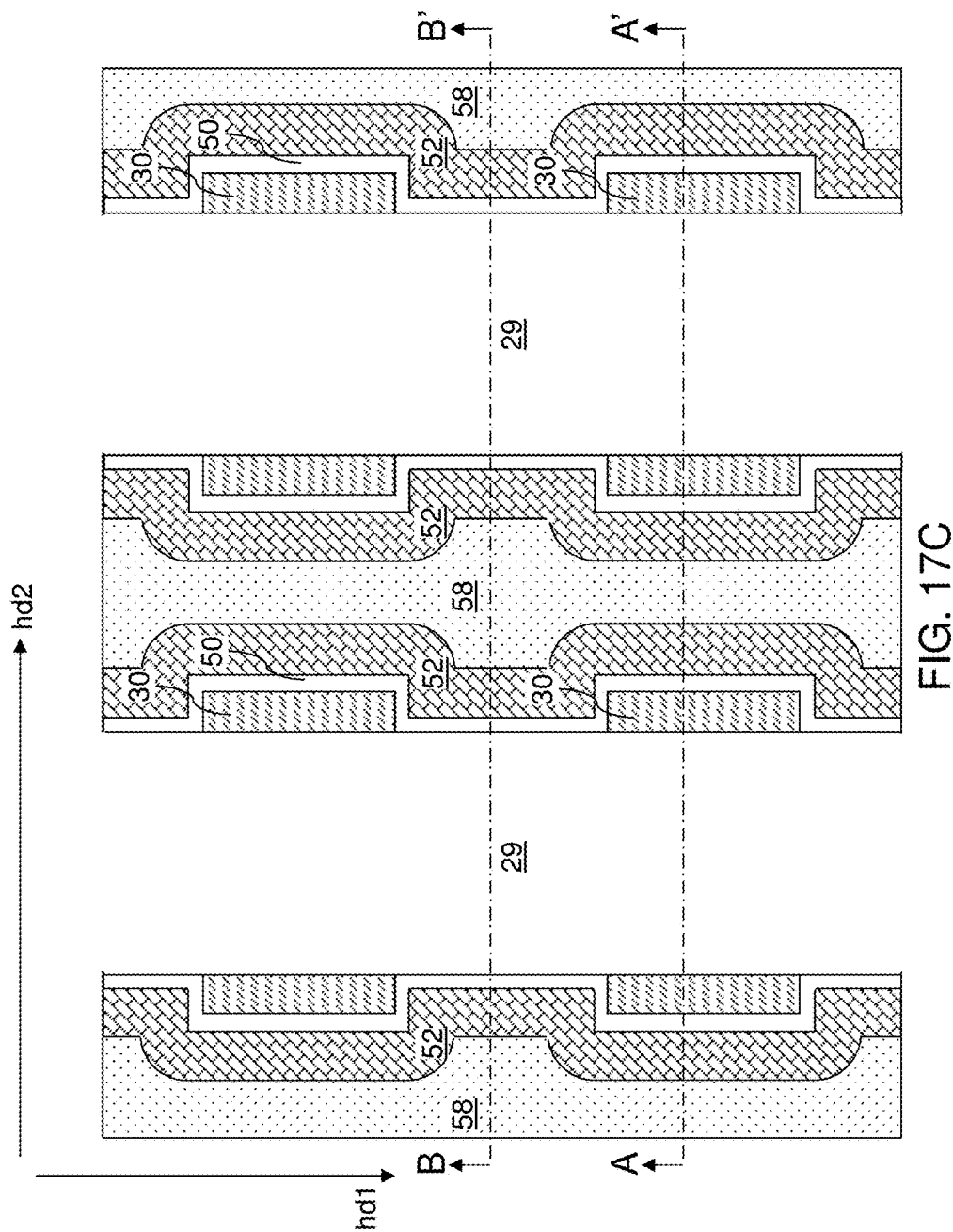
FIG. 17C is a horizontal cross-sectional view of the first exemplary structure of FIGS. 17A and 17B along the horizontal plane C-C' in FIGS. 17A and 17B.

Referring to FIGS. 17A-17C, at least an upper portion of each dielectric spacer 25 can be removed selective to the semiconductor material of the vertical semiconductor channel strips 30, the top active regions 34, and the bottom active regions 32 by an etch process. The etch process can be an isotropic etch process that is selective to the semiconductor materials of the vertical semiconductor channel strips 30, the lower active regions 32, and the upper active regions 34. A predominant portion of each dielectric spacer 26 can be removed. As used herein, a "predominant portion" of an element refers to a portion that includes more than 50% of the entirety of the element.

In one embodiment, a remaining portion of each dielectric spacer 25 may be present on sidewalls of each dielectric pedestal 22. In another embodiment, the entirety of each dielectric spacer 25 may be removed to physically expose portions of top surfaces of the lower electrode lines 10 between each dielectric pedestal 22 and a neighboring bottom active region 32. The duration of the etch process can be selected to preserve the bottom portions of the dielectric spacers 25 or to remove the entirety of each dielectric spacers 25 depending on embodiments. The processing steps of FIGS. 16A-16C and 17A-17C remove a predominant portion of each matrix rail structure (21, 23, 25). Second sidewalls of each of the plurality of vertical semiconductor channel strips 30 can be physically exposed by removal of the predominant portion of each of the matrix rail structures (21, 23, 25).

Figure 18A:
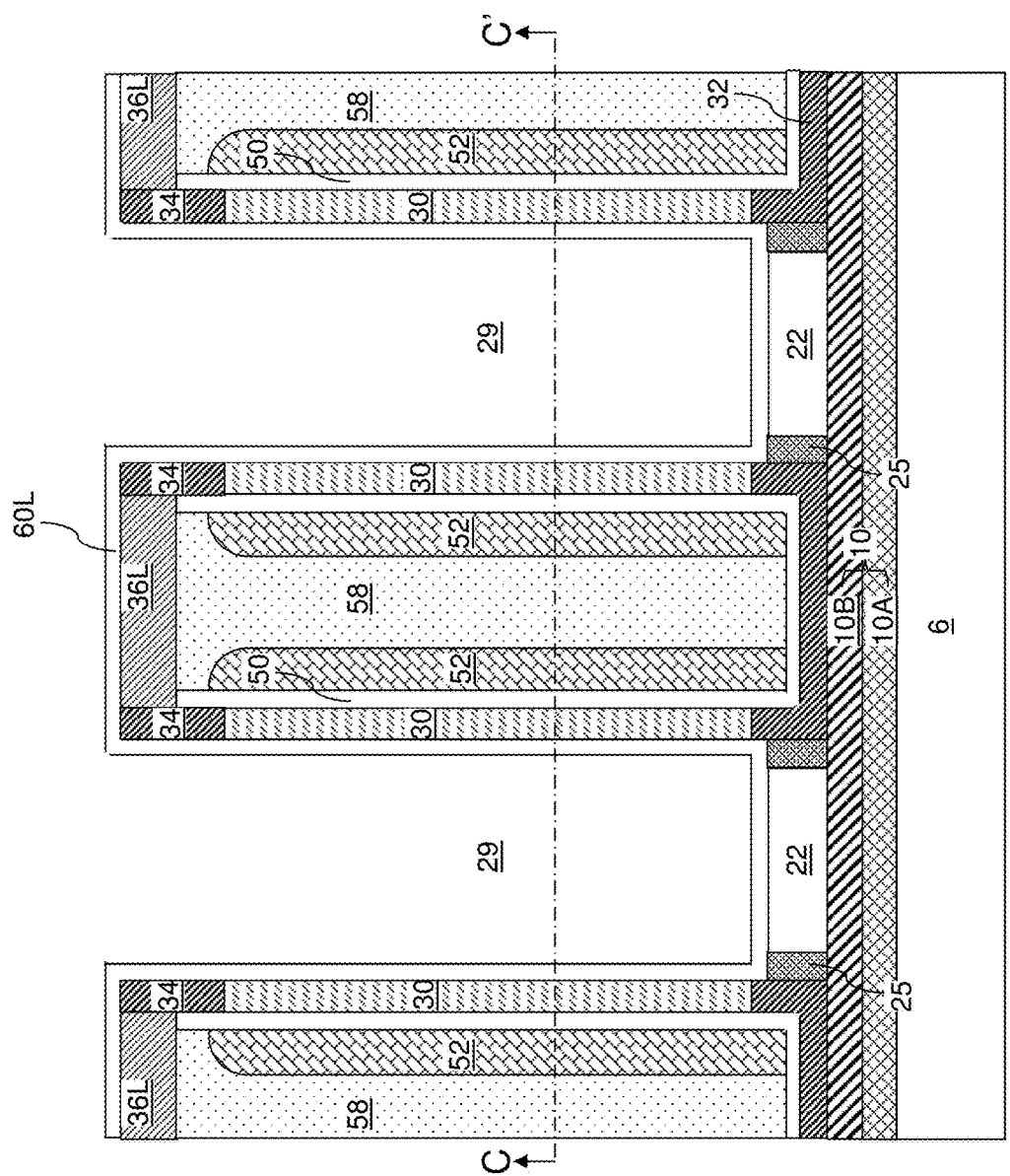
FIG. 18A is a vertical cross-sectional view of the first exemplary structure after formation of an inner gate dielectric layer along the vertical plane A-A' in FIG. 18C according to the first embodiment of the present disclosure.
Figure 18B:
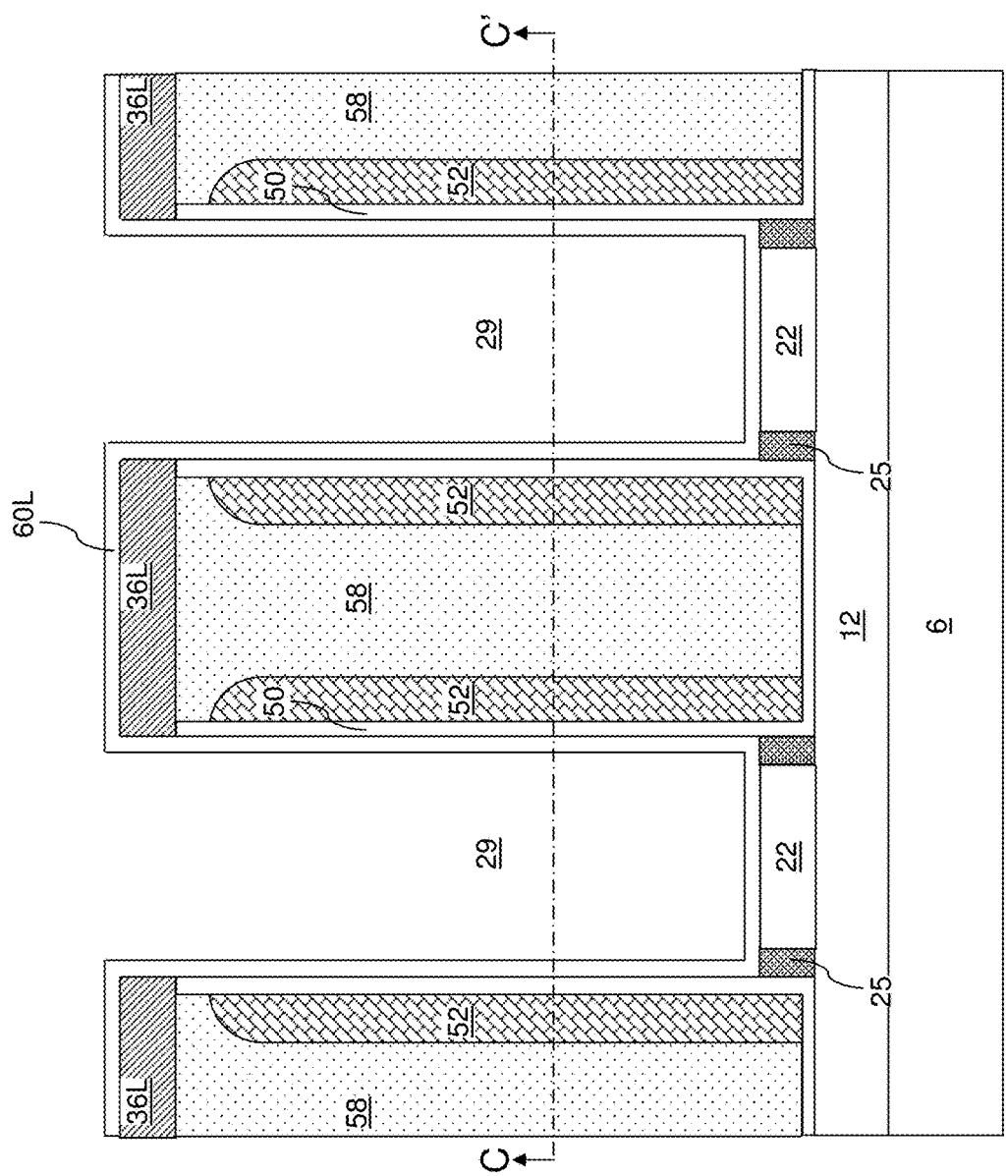
FIG. 18B is a vertical cross-sectional view of the first exemplary structure of FIG. 18A along the vertical plane B-B' in FIG. 18C according to the first embodiment of the present disclosure.
Figure 18C:
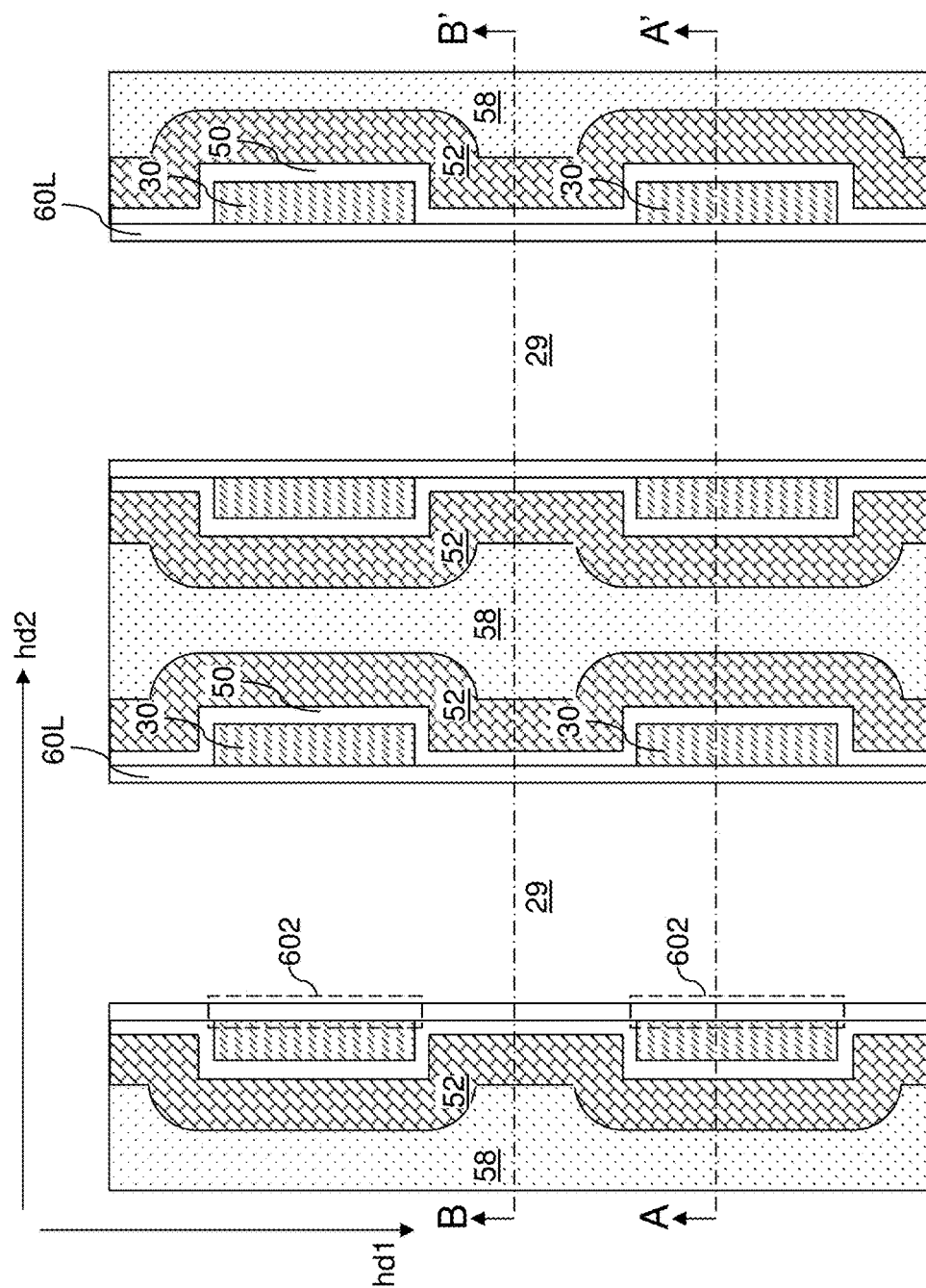
FIG. 18C is a horizontal cross-sectional view of the first exemplary structure of FIGS. 18A and 18B along the horizontal plane C-C' in FIGS. 18A and 18B.

Referring to FIGS. 18A-18C, outer gate dielectrics 602 can be formed on the physically exposed surfaces of the vertical semiconductor channel strips 30 by conformal deposition of a gate dielectric material and/or by thermal oxidation and/or nitridation of the physically exposed surface portions of the vertical semiconductor channel strips 30. For example, a continuous outer gate dielectric layer 60L (which is a straight-sidewalled gate dielectric layer that is free of laterally-undulating sidewalls) can be deposited by a conformal deposition process on the physically exposed second sidewalls of the vertical semiconductor channel strips 30. The continuous outer gate dielectric layer 60L is continuous layer including outer gate dielectrics 602 therein as portions thereof, i.e., an outer gate dielectric layer that extends continuously over the entirety of the first exemplary structure. The continuous outer gate dielectric layer 60L can include a dielectric material such as silicon oxide and/or a dielectric metal oxide (such as aluminum oxide), and can have a thickness in a range from 1 nm to 10 nm, although lesser and greater thicknesses can also be employed.

In one embodiment, the continuous outer gate dielectric layer 60L can extend over the entirety of the first exemplary structure and physically contacts each second sidewall of the plurality of vertical semiconductor channel strips 30. The outer gate dielectrics 602 can comprise portions of the continuous outer gate dielectric layer 60L adjacent to the plurality of vertical semiconductor channel strips 30. While the present disclosure is described employing an embodiment in which a continuous outer gate dielectric layer 60L is employed to provide outer gate dielectrics 602, embodiments are expressly contemplated herein in which discrete dielectric material layers are formed by thermal and/or plasma oxidation and/or nitridation of physically exposed second sidewalls of the vertical semiconductor channel strips to provide outer gate dielectrics 602.

Figure 19A:
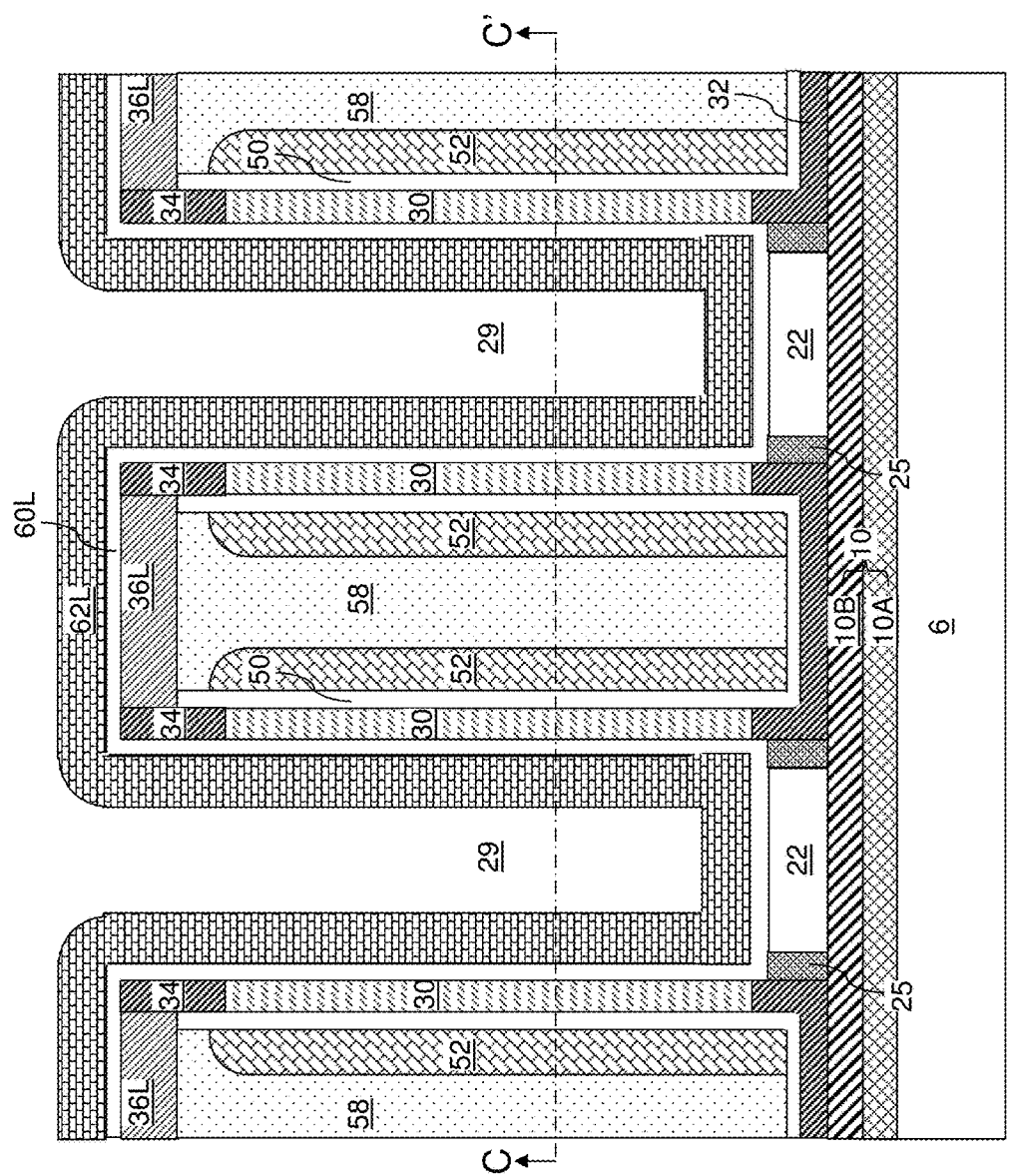
FIG. 19A is a vertical cross-sectional view of the first exemplary structure after formation of an inner gate electrode layer along the vertical plane A-A' in FIG. 19C according to the first embodiment of the present disclosure.
Figure 19B:
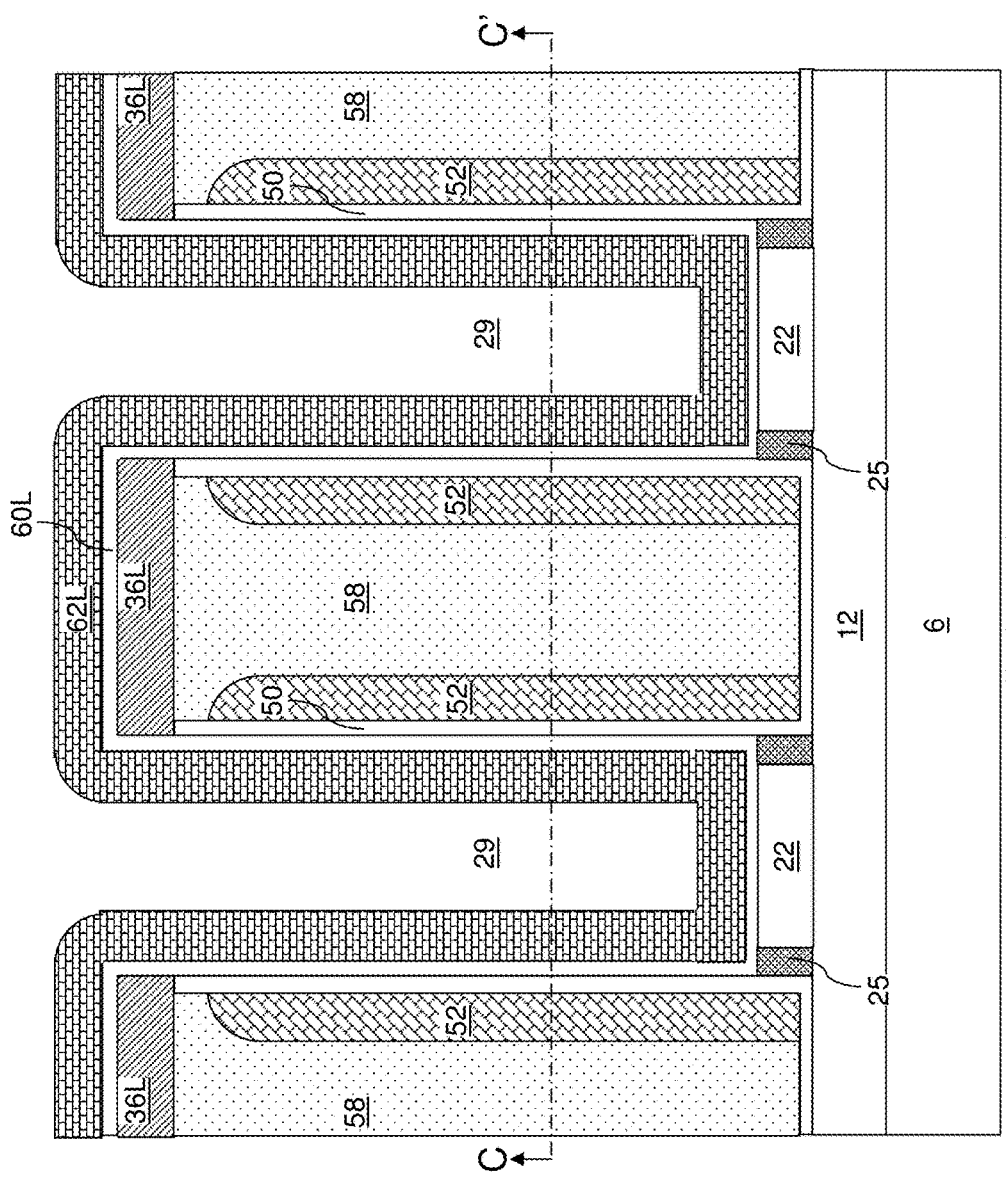
FIG. 19B is a vertical cross-sectional view of the first exemplary structure of FIG. 19A along the vertical plane B-B' in FIG. 19C according to the first embodiment of the present disclosure.
Figure 19C:
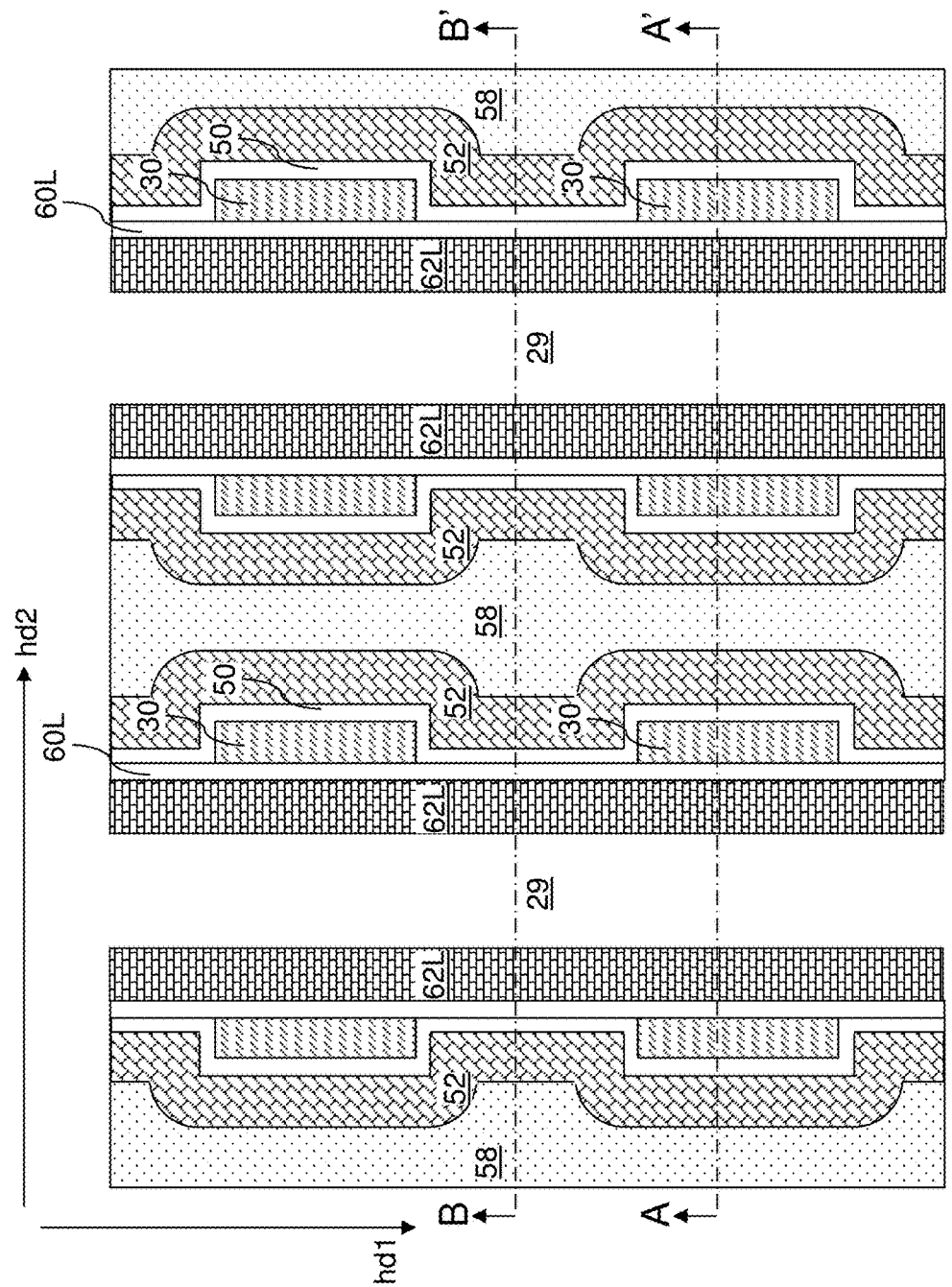
FIG. 19C is a horizontal cross-sectional view of the first exemplary structure of FIGS. 19A and 19B along the horizontal plane C-C' in FIGS. 19A and 19B.

Referring to FIGS. 19A-19C, a straight-sidewalled gate electrode layer 62L can be formed on the continuous outer gate dielectric layer 60L. The straight-sidewalled gate electrode layer 62L is a straight-sidewalled structure that is free of laterally-undulating sidewalls. The straight-sidewalled gate electrode layer 62L can include a metallic material such as titanium nitride, tantalum nitride, tungsten nitride, tungsten, titanium, tantalum, cobalt, ruthenium, an alloy thereof, and/or a layer stack thereof. In one embodiment, the straight-sidewalled gate electrode layer 62L can include a layer of titanium nitride. Alternatively or additionally, the straight-sidewalled gate electrode layer 62L can include a doped semiconductor material such as doped polysilicon. The thickness of the straight-sidewalled gate electrode layer 62L can be selected to be less than one half of the width of each laterally-undulating gate electrode trench 29 as provided in the processing steps of FIGS. 18A-18C. In one embodiment, the thickness of the straight-sidewalled gate electrode layer 62L can be in a range from 2 nm to 200 nm, although lesser and greater thicknesses can also be employed. The straight-sidewalled gate electrode layer 62L can be formed by a conformal deposition process such as chemical vapor deposition (CVD) or atomic layer deposition (ALD). Each remaining portion of the laterally-undulating gate electrode trenches 29 laterally extends along the first horizontal direction hd1, and can have a substantially uniform width throughout.

Figure 20B:
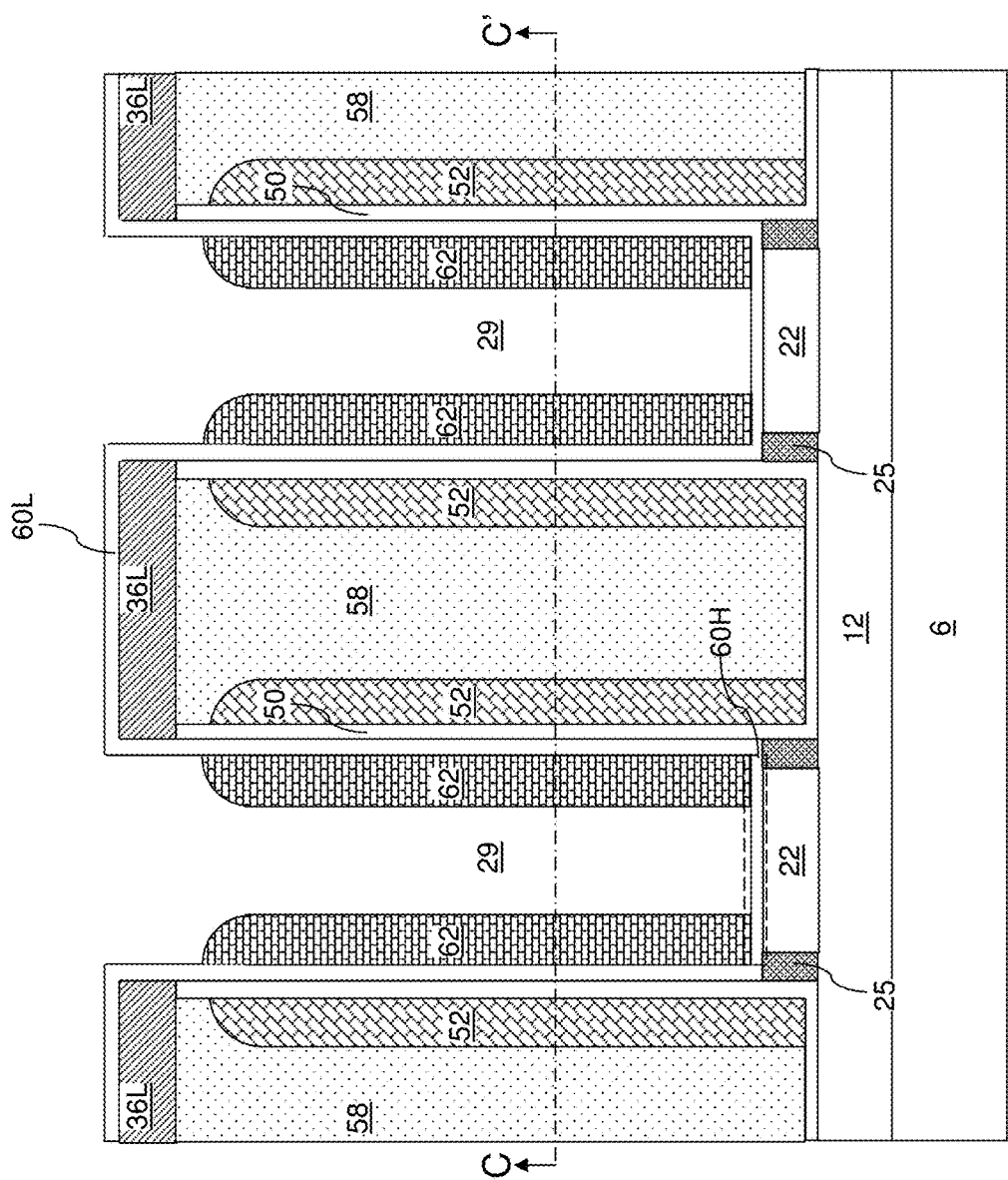
FIG. 20B is a vertical cross-sectional view of the first exemplary structure of FIG. 20A along the vertical plane B-B' in FIG. 20C according to the first embodiment of the present disclosure.
Figure 20C:
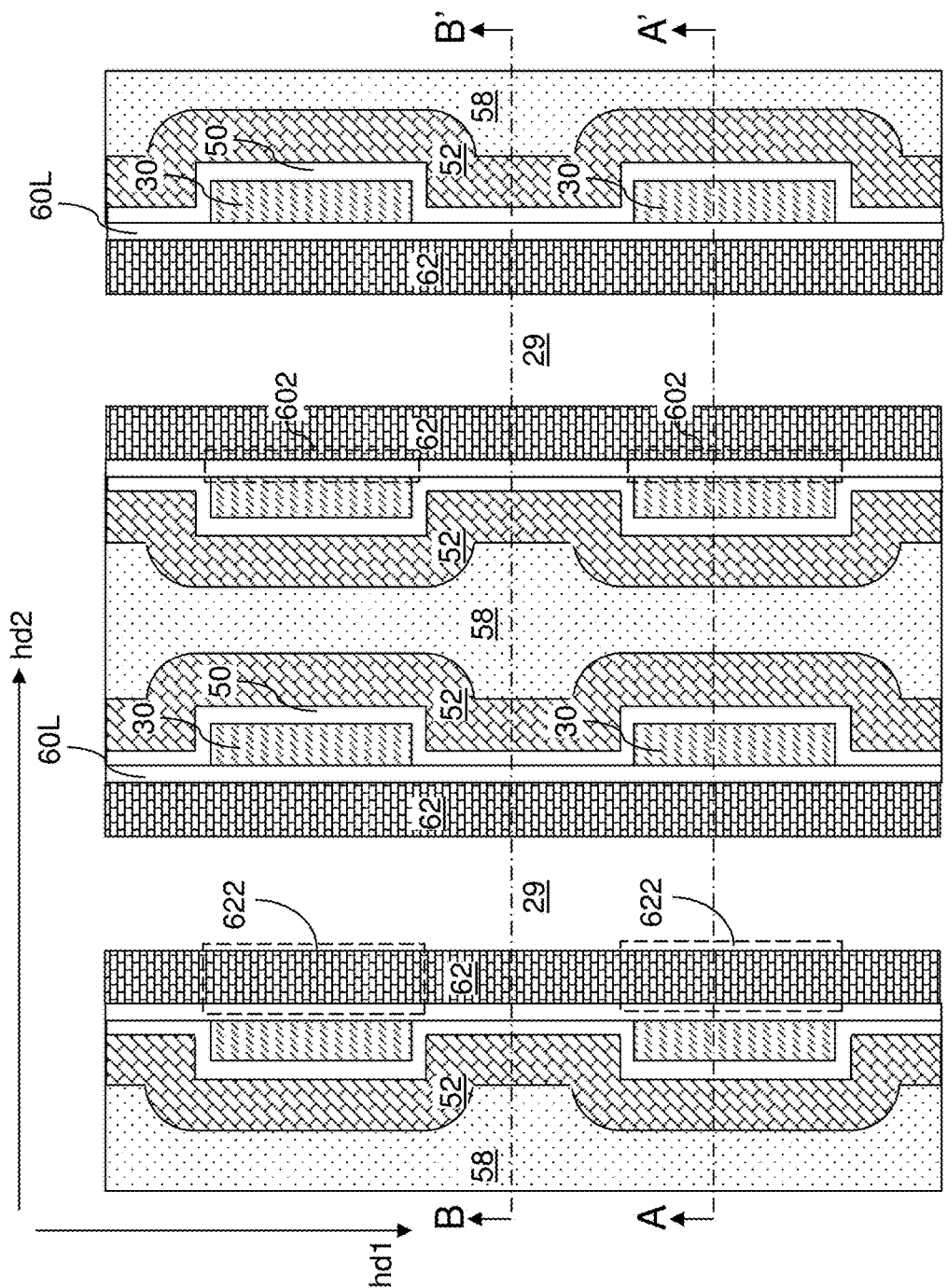
FIG. 20C is a horizontal cross-sectional view of the first exemplary structure of FIGS. 20A and 20B along the horizontal plane C-C' in FIGS. 20A and 20B.
Figure 21A:
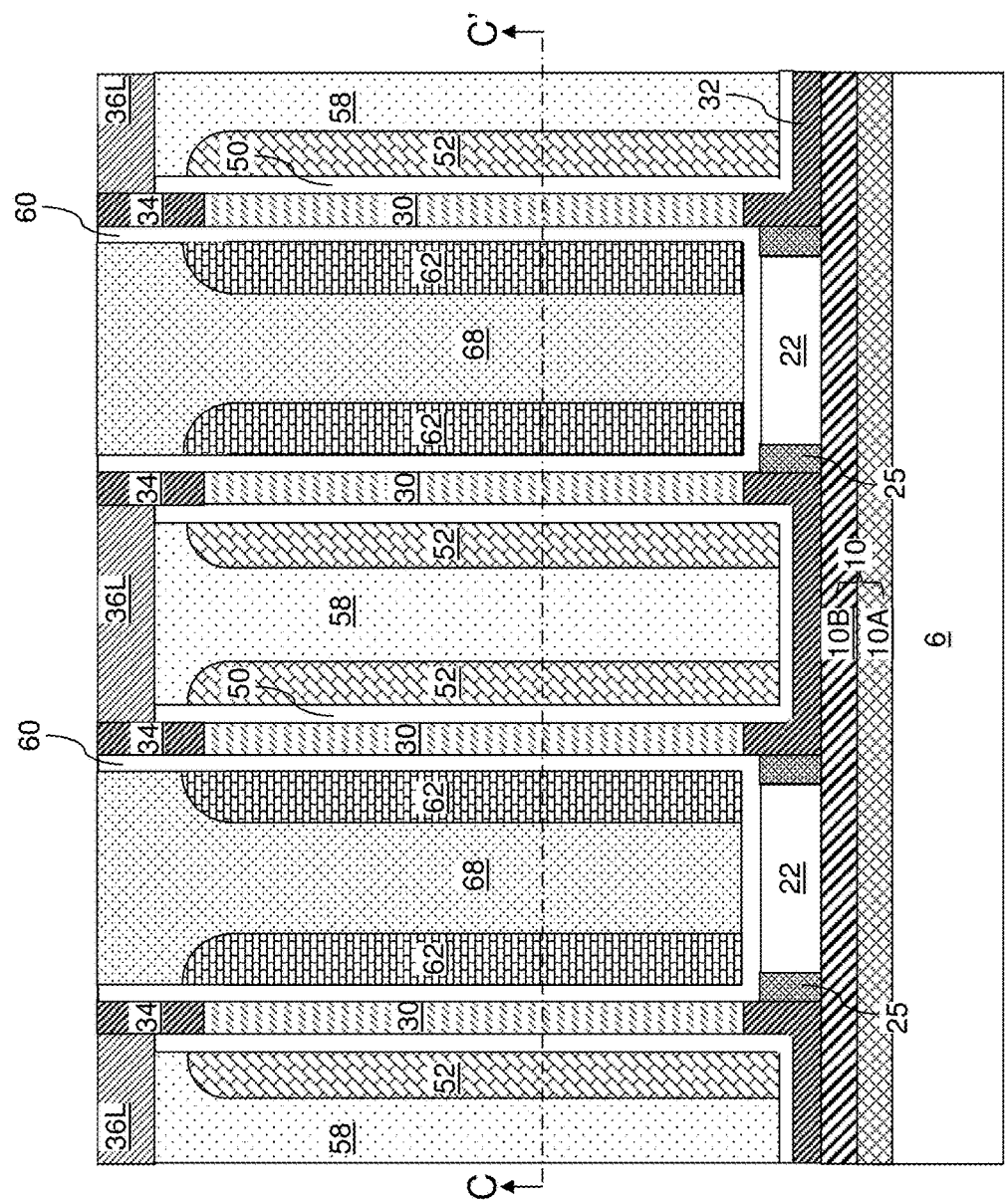
FIG. 21A is a vertical cross-sectional view of the first exemplary structure after formation of outer isolation dielectric lines along the vertical plane A-A' in FIGS. 21C and 21D according to the first embodiment of the present disclosure.
Figure 21B:
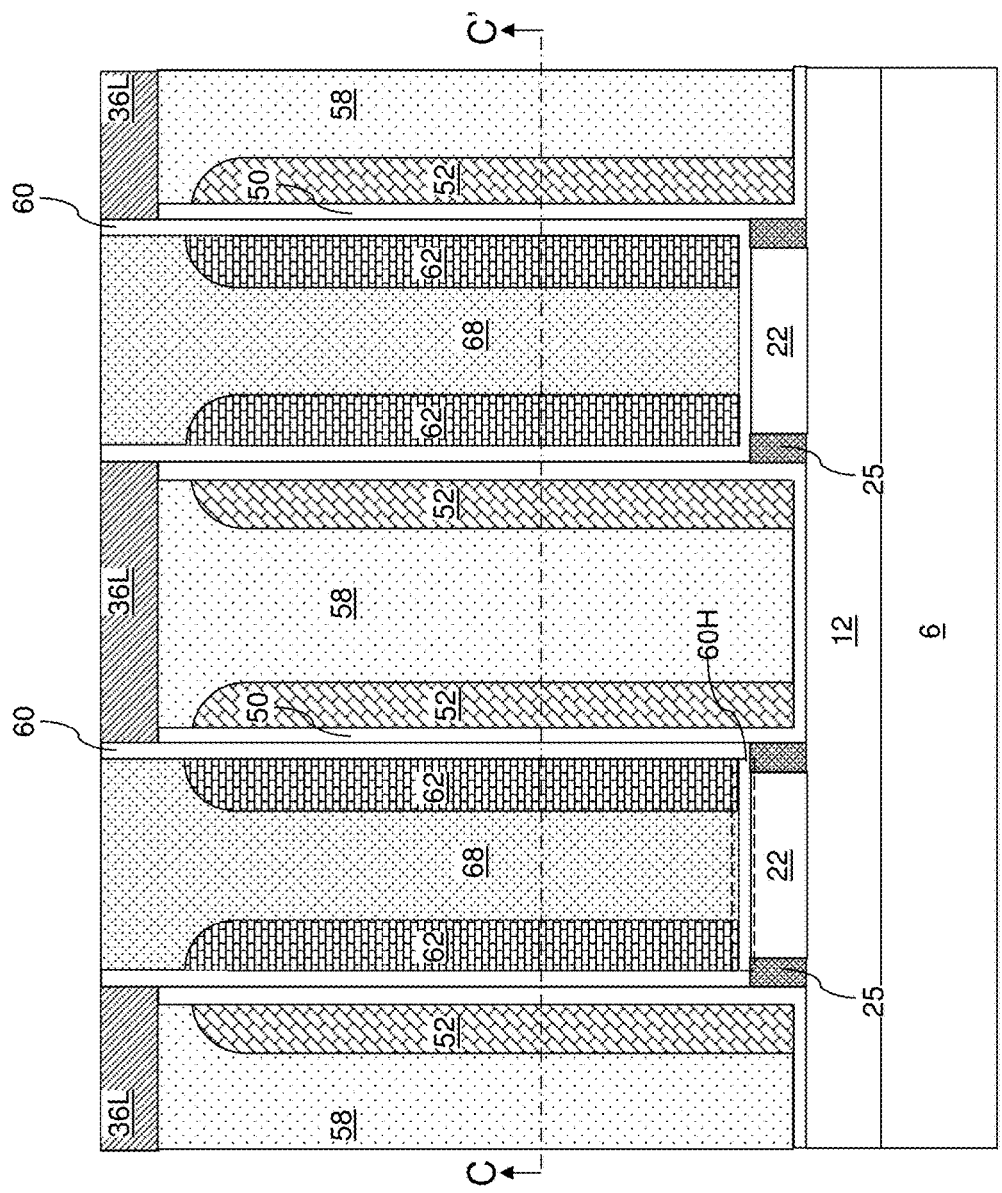
FIG. 21B is a vertical cross-sectional view of the first exemplary structure of FIG. 21A along the vertical plane B-B' in FIGS. 21C and 21D according to the first embodiment of the present disclosure.
Figure 21C:
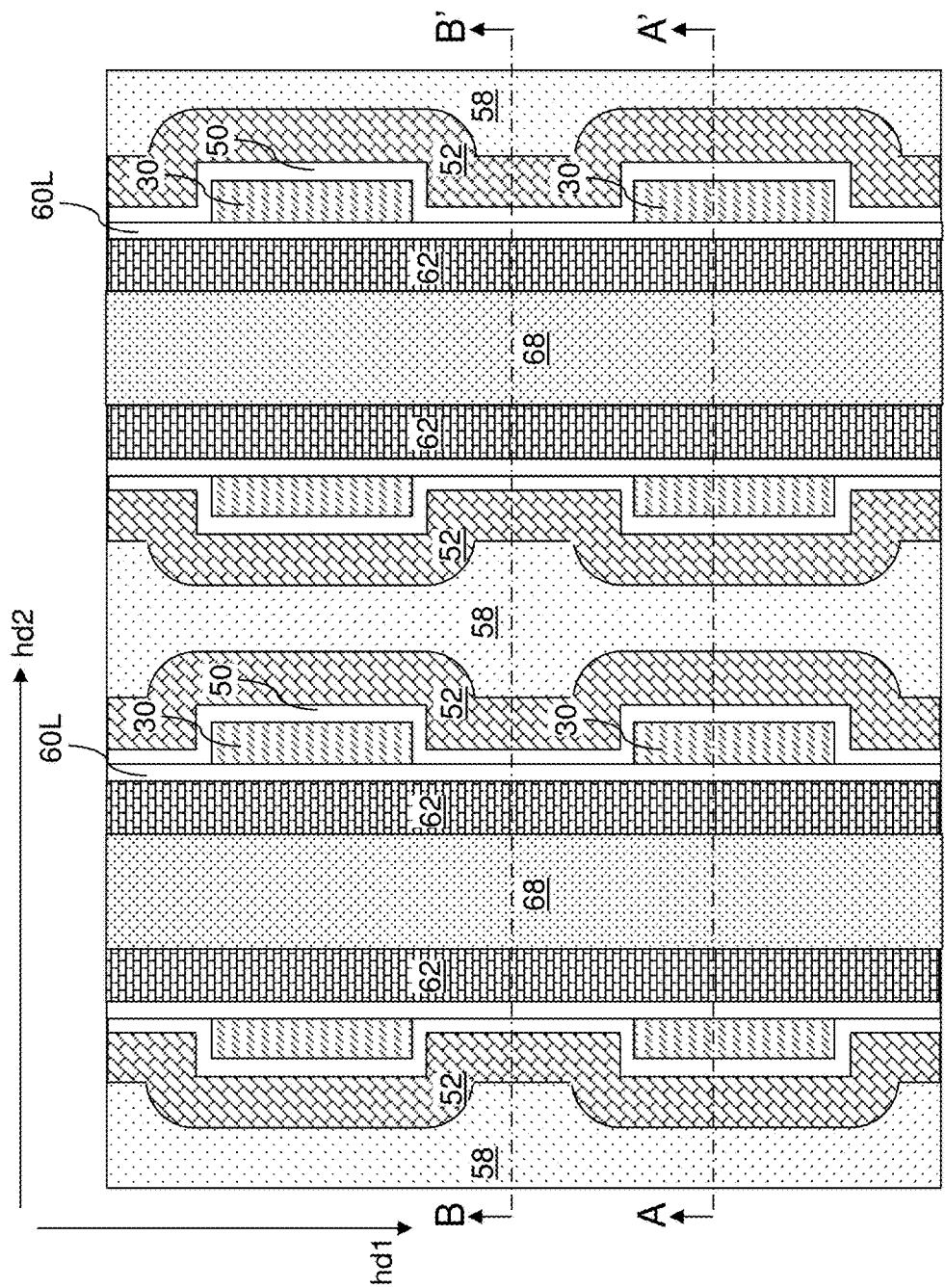
FIG. 21C is a horizontal cross-sectional view of the first exemplary structure of FIGS. 21A and 21B along the horizontal plane C-C' in FIGS. 21A and 21B.
Figure 21D:
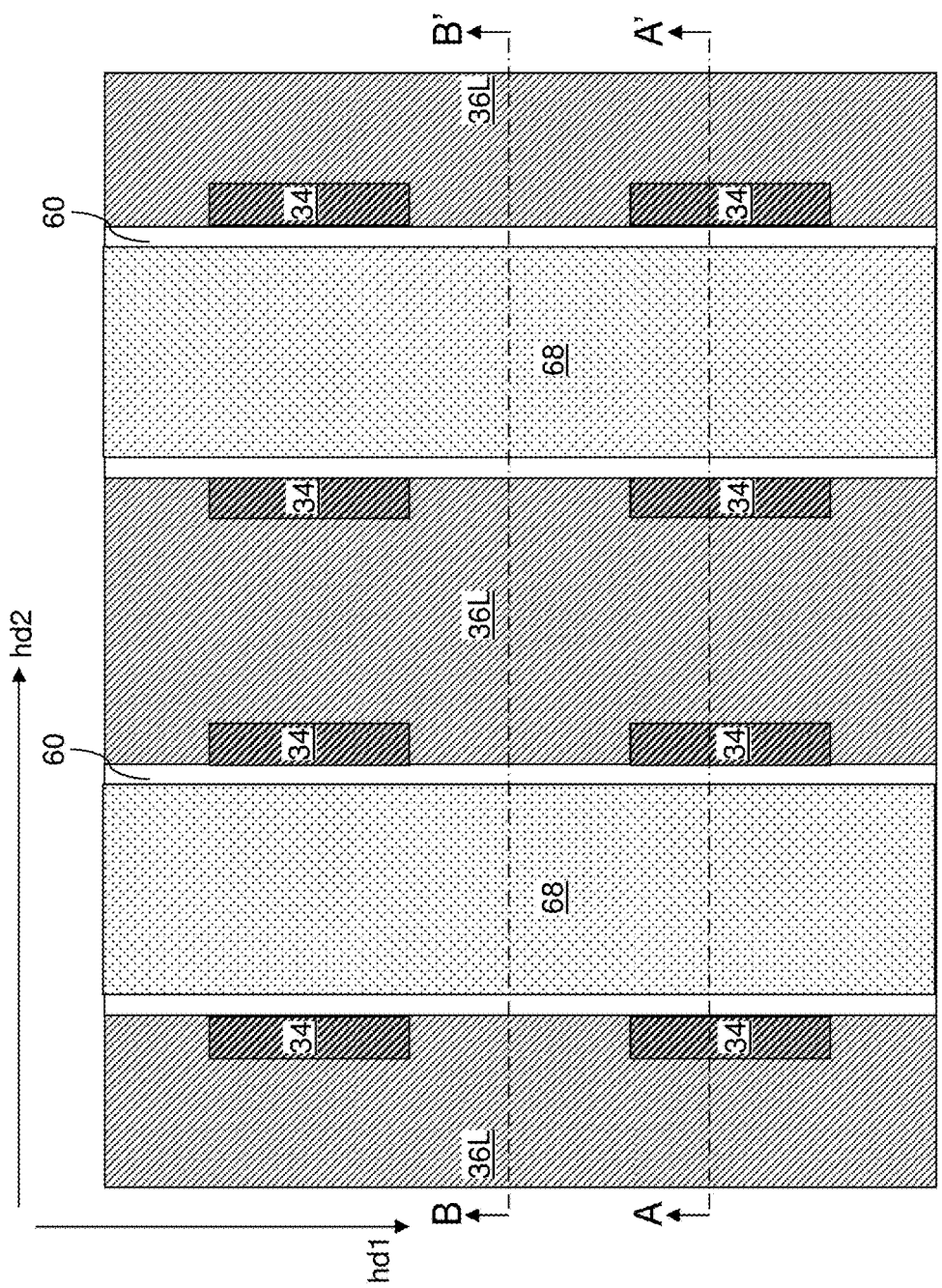
FIG. 21D is a top-down view of the first exemplary structure of FIGS. 21A-21C.

Referring to FIGS. 20A-20C, an anisotropic etch that etches the material of the straight-sidewalled gate electrode layer 62L selective to the material of outer gate dielectric layer 60L or selective to the material of the top electrode connection layers 36L can be performed to etch horizontal portions of the straight-sidewalled gate electrode layer 62L. Each remaining vertical portion of the straight-sidewalled gate electrode layer 62L constitutes an outer gate electrode line 62. Further, an overetch can be performed to vertically recess the top surfaces of the outer gate electrode lines 62 so that the top surfaces of the outer gate electrode lines 62 after the overetch can be approximately at the height of p-n junctions between the vertical semiconductor channel strips 30 and the top active regions 34. The vertical overlap between each outer gate electrode line 62 and the top active regions 34 can be optimized for performance of the vertical field effect transistors. Each outer gate electrode line 62 can have a uniform vertical cross-sectional shape along the vertical planes that are perpendicular to the first horizontal direction hd1, and thus, can be a gate electrode rail located on outer sidewalls of the vertical semiconductor channel strips 30, i.e., an outer gate electrode rail. Further, each outer gate electrode line 62 is a straight-sidewalled structure that is free of laterally-undulating sidewalls.

Specifically, remaining vertical portion of the straight-sidewalled gate electrode layer 62L comprises the two outer gate electrode lines 62 that are spaced apart by an outer gate electrode cavity 29. Thus, the two outer gate electrode lines 62 are straight-sidewalled gate electrode lines 62 that are free of laterally-undulating sidewalls. Multiple portions of the continuous outer gate dielectric layer 60L around the two outer gate electrode lines 62 constitute outer gate dielectrics 602. The two outer gate electrode lines 62 can contact a respective portion of a top surface of a horizontal portion 60H of the continuous outer gate dielectric layer 60L that extends from a bottom end of a first vertical portion of the continuous outer gate dielectric layer 60L that includes a first subset of the respective multiple portions of the continuous outer gate dielectric layer 60L to a second vertical portion of the continuous outer gate dielectric layer 60L that includes a second subset of the respective multiple portions of the continuous outer gate dielectric layer 60L.

In one embodiment, each outer gate electrode line 62 can have a uniform width along a second horizontal direction hd2 that is perpendicular to the first horizontal direction hd1 throughout the multiple instances of the vertical field effect transistor located around a same outer gate electrode cavity 29. In one embodiment, a pair of outer gate electrode lines 62 having a uniform width throughout and laterally spaced apart from each other along a second horizontal direction hd2 that is perpendicular to the first horizontal direction hd1 can be provided around each outer gate electrode cavity 29. In one embodiment, each of the two outer gate electrode lines 62 can have a uniform vertical cross-sectional shape along vertical directions perpendicular to the first horizontal direction hd1, and thus, can be gate electrode rails, which are also referred to as outer gate electrode rails. Each outer gate electrode 622 of the multiple instances of the vertical field effect transistor around the outer gate electrode cavity 29 can be a respective portion of the pair of outer gate electrode lines 62.

Each portion of the outer gate electrode lines 62 that is adjacent to a vertical semiconductor channel strip 30 constitutes an outer gate electrode 622 of a vertical field effect transistor. Multiple instances of a vertical field effect transistor can be formed around each laterally-undulating gate electrode trench 29. Each instance of the vertical field effect transistor can include a pair of outer gate electrodes 622. Each of the pair of outer gate electrodes 622 of the multiple instances of the vertical field effect transistor formed around an outer gate electrode cavity 29 can be a respective portion of a pair of outer gate electrode lines 62 that is shared among each of the multiple instances of the vertical field effect transistor located around the outer gate electrode cavity 29 and arranged as a one-dimensional array extending along the first horizontal direction hd1. Each pair of outer gate electrodes 622 can contact respective second sidewalls of the pair of outer gate dielectrics, which are portions of the continuous outer gate dielectric layer 60L. Each outer gate electrode 622 is a portion of an outer gate electrode line 62 that extend along the first horizontal direction hd1. Thus, a pair of outer gate electrode lines 62 is provided around outer gate electrode cavity 29. Each of the pair of outer gate electrode lines 62 laterally extends generally along the first horizontal direction hd1 through each of the multiple instances of the vertical field effect transistor.

Referring to FIGS. 21A-21D, a dielectric material such as doped or undoped silicate glass or organosilicate glass can be deposited in the outer gate electrode cavities 29 to fill the entire volumes of the outer gate electrode cavities 29. Excess portions of the deposited dielectric material can be removed from above a horizontal plane including top surfaces of the top electrode connection layers 36L. Each remaining portion of the deposited dielectric material filling a respective outer gate electrode cavity 29 constitutes an outer isolation dielectric line 68, which can have a top surface within a same horizontal plane as the top surfaces of the top electrode connection layers 36L. Each outer isolation dielectric line 68 can laterally extend along the first horizontal direction hd1. Each outer isolation dielectric line 68 can be formed over two outer gate electrode lines 62 and directly on a region of a top surface of the horizontal portion of an outer gate dielectric layer 60 and between the two outer gate electrode lines 62.

The continuous outer gate dielectric layer 60L can be divided into outer gate dielectric layers 60 extending along the first horizontal direction hd1 and including a horizontal portion 60H overlying a dielectric pedestal 22, a first vertical portion vertically extending upward from a first edge of the horizontal portion 60H of the dielectric pedestal 22 and contacting a first set of vertical semiconductor channel strips 30, and a second vertical portion vertically extending upward from a second edge of the horizontal portion 60H of the dielectric pedestal 22 and contacting a second set of vertical semiconductor channel strips 30. In one embodiment, multiple instances of the vertical field effect transistor can be formed around a same outer isolation dielectric line 68.

Figure 22A:
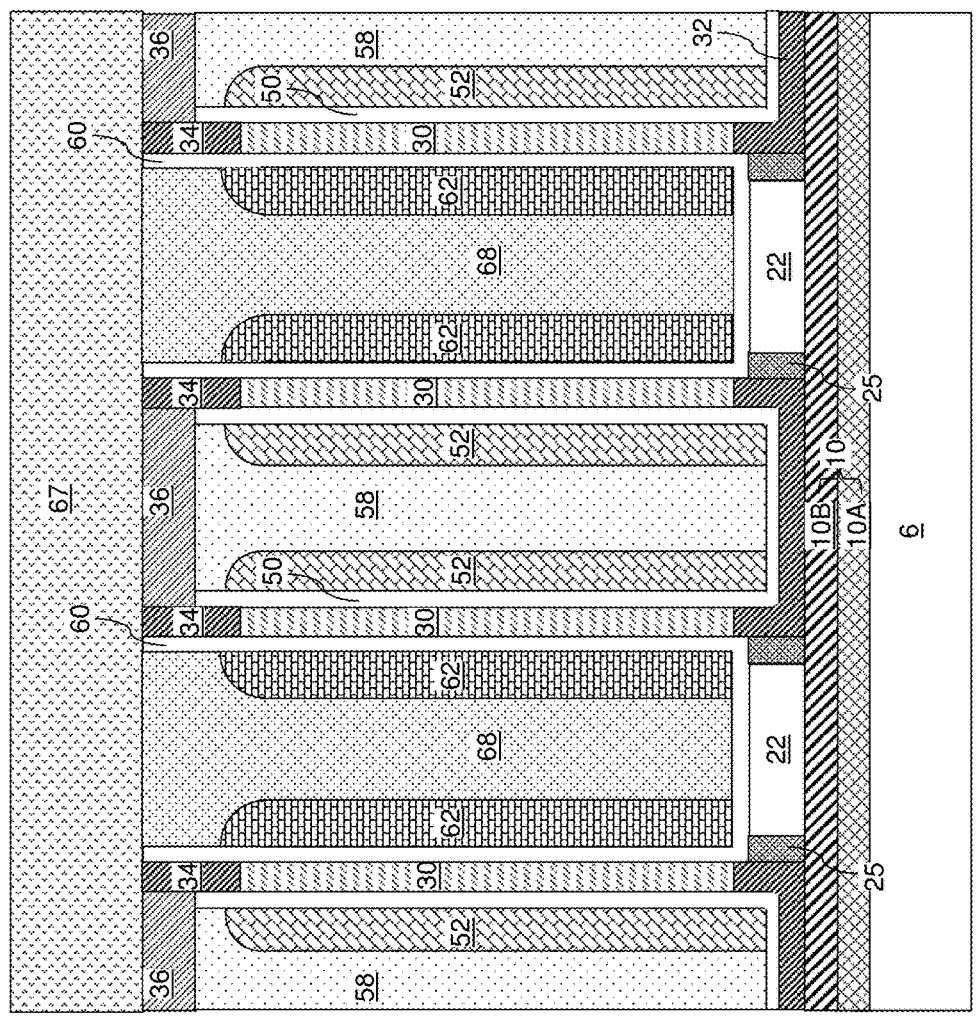
FIG. 22A is a vertical cross-sectional view of the first exemplary structure after patterning top electrode connection layers into top electrode connectors along the vertical plane A-A' in FIG. 22C according to the first embodiment of the present disclosure.
Figure 22B:
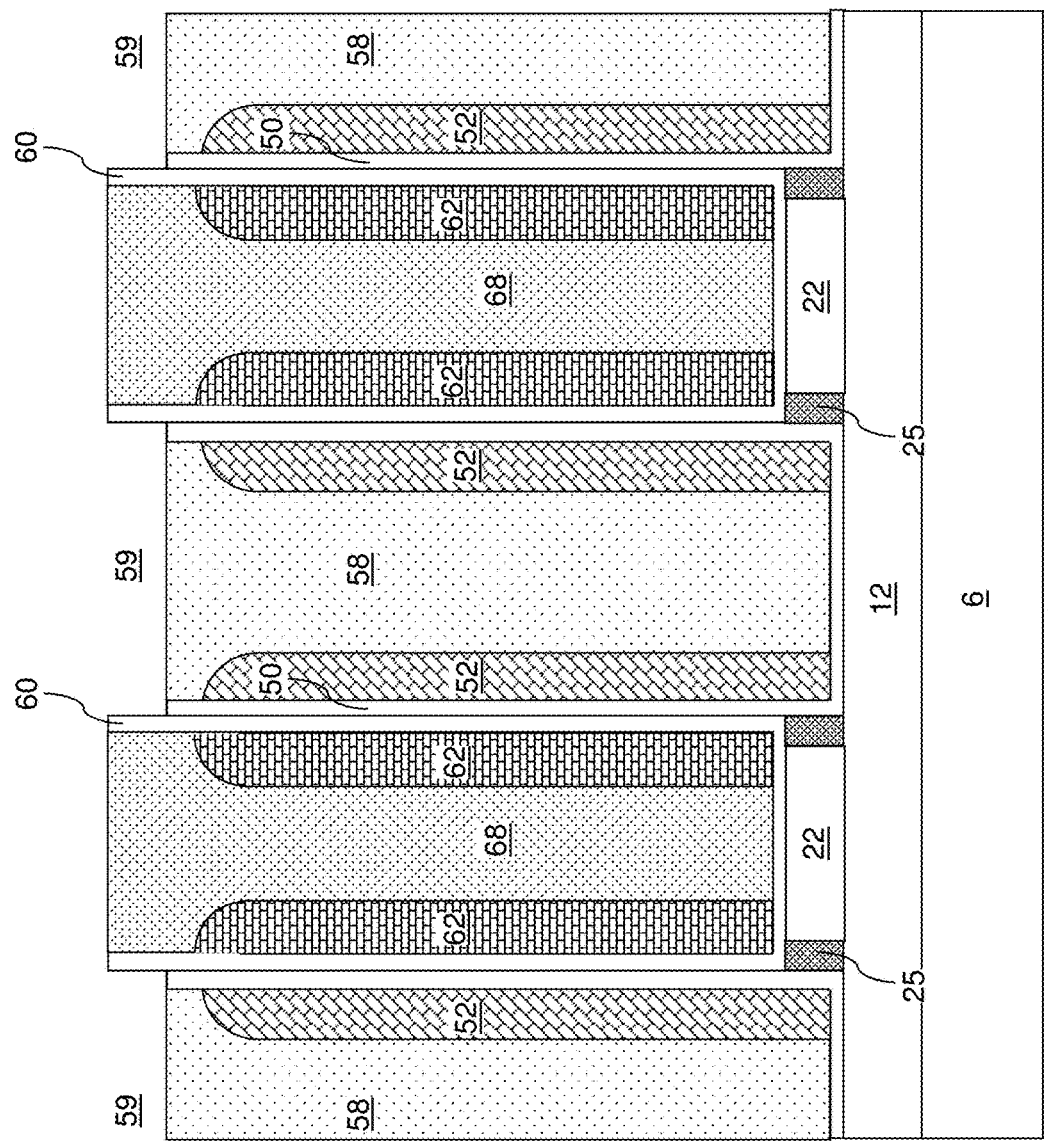
FIG. 22B is a vertical cross-sectional view of the first exemplary structure of FIG. 22A along the vertical plane B-B' in FIG. 22C according to the first embodiment of the present disclosure.
Figure 22C:
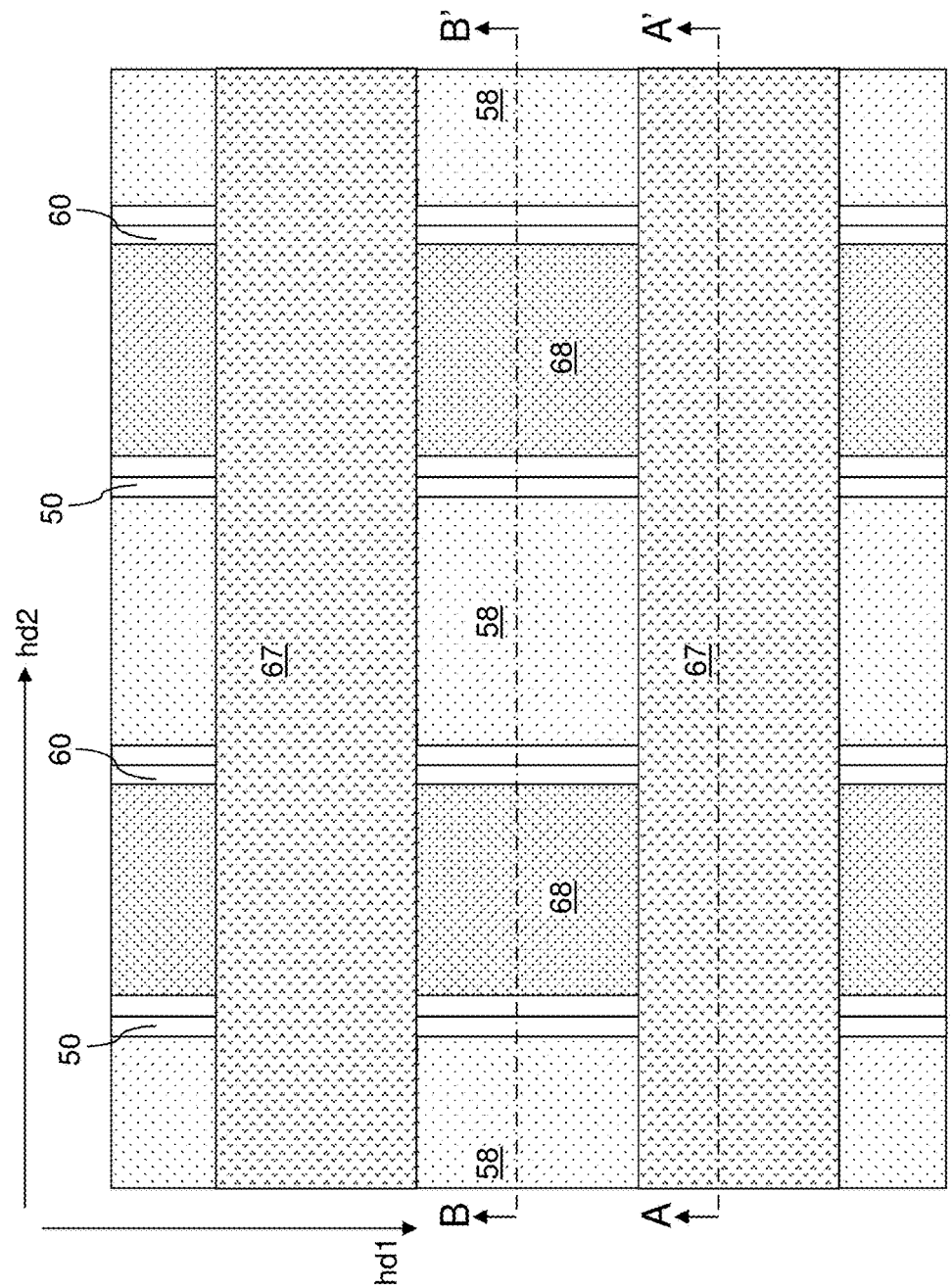
FIG. 22C is a horizontal cross-sectional view of the first exemplary structure of FIGS. 22A and 22B along the horizontal plane C-C' in FIGS. 22A and 22B.

Referring to FIGS. 22A-22C, a photoresist layer 67 can be applied over the top electrode connection layers 36, the inner isolation dielectric lines 58, and the outer isolation dielectric lines 68, and can be lithographically patterned. The patterned photoresist layer 67 can include line portions that laterally extend along the second horizontal direction hd2 and overlie the vertical semiconductor channel strips 30. Each vertical semiconductor channel strip 30 can be covered by a portion of the photoresist layer 67.

An etch process can be performed to etch the portions of the top electrode connection layers 36L that are not covered by the patterned photoresist layer 67 selective to the material of the inner isolation dielectric lines 58 and the outer isolation dielectric lines 68. For example, if the top electrode connection layers 36L include doped polysilicon, a wet etch employing KOH or a dry etch employing a fluorocarbon gas or a hydrofluorocarbon gas can be employed to etch the material of the top electrode connection layers 36L selective to the materials of the inner isolation dielectric lines 58 and the outer isolation dielectric lines 68. Each volume from which a portion of the top electrode connection layers 36L is removed by the etch process constitutes a recess region 59. Each remaining portion of the top electrode connection layers 36L is a top electrode connector 36 that connects a pair of top active regions 34 that overlie a pair of inner gate electrodes 52. The photoresist layer 67 can be subsequently removed, for example, by ashing.

Figure 23A:
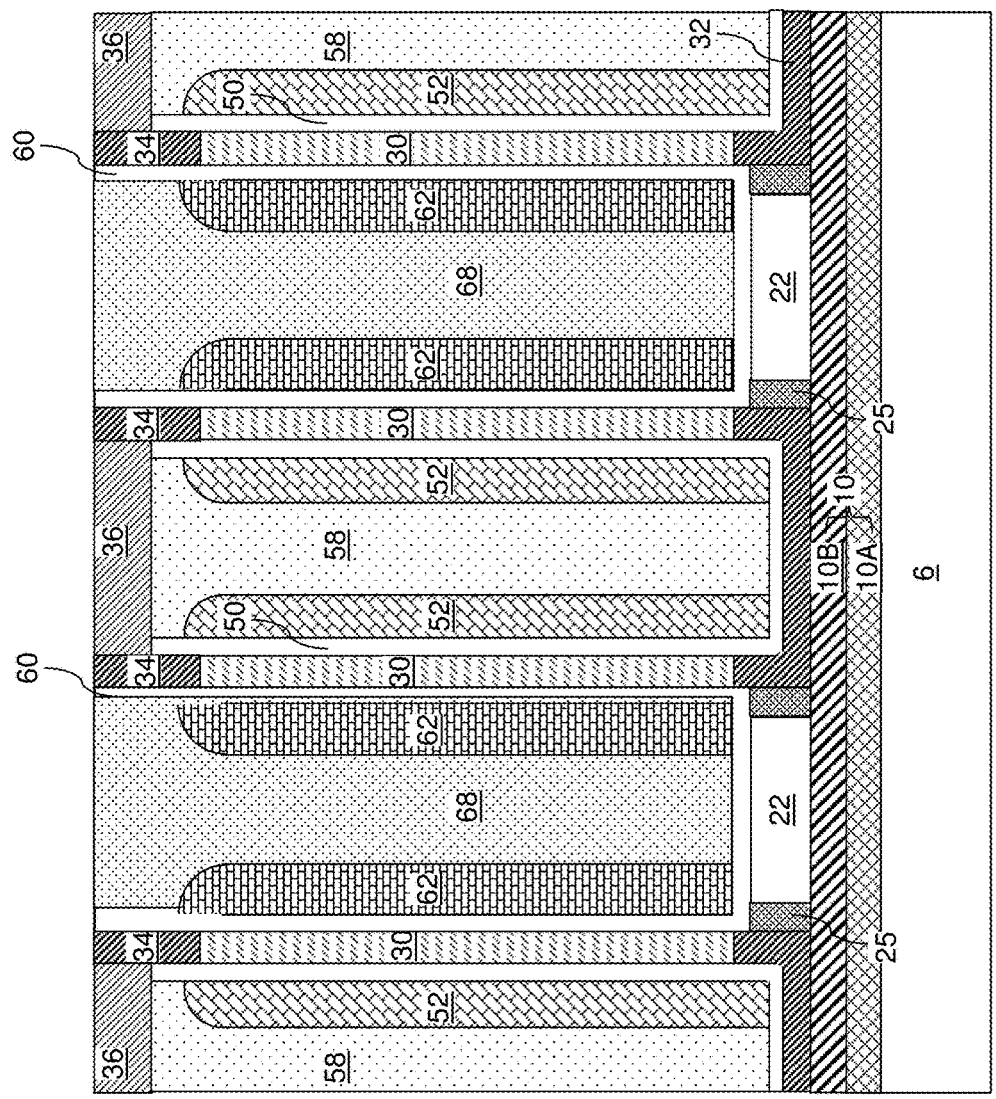
FIG. 23A is a vertical cross-sectional view of the first exemplary structure after formation of top electrode separation dielectrics along the vertical plane A-A' in FIG. 23C according to the first embodiment of the present disclosure.
Figure 23B:
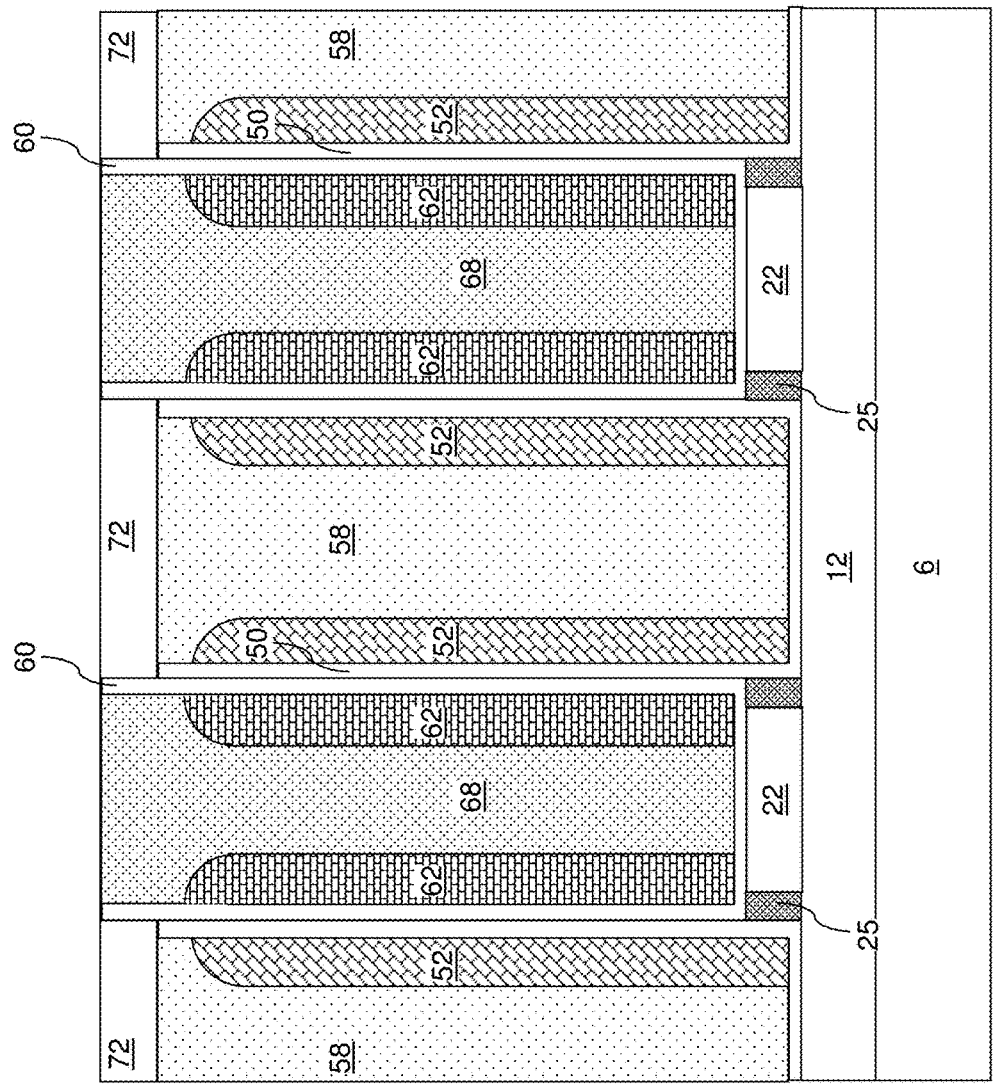
FIG. 23B is a vertical cross-sectional view of the first exemplary structure of FIG. 23A along the vertical plane B-B' in FIG. 23C according to the first embodiment of the present disclosure.
Figure 23C:
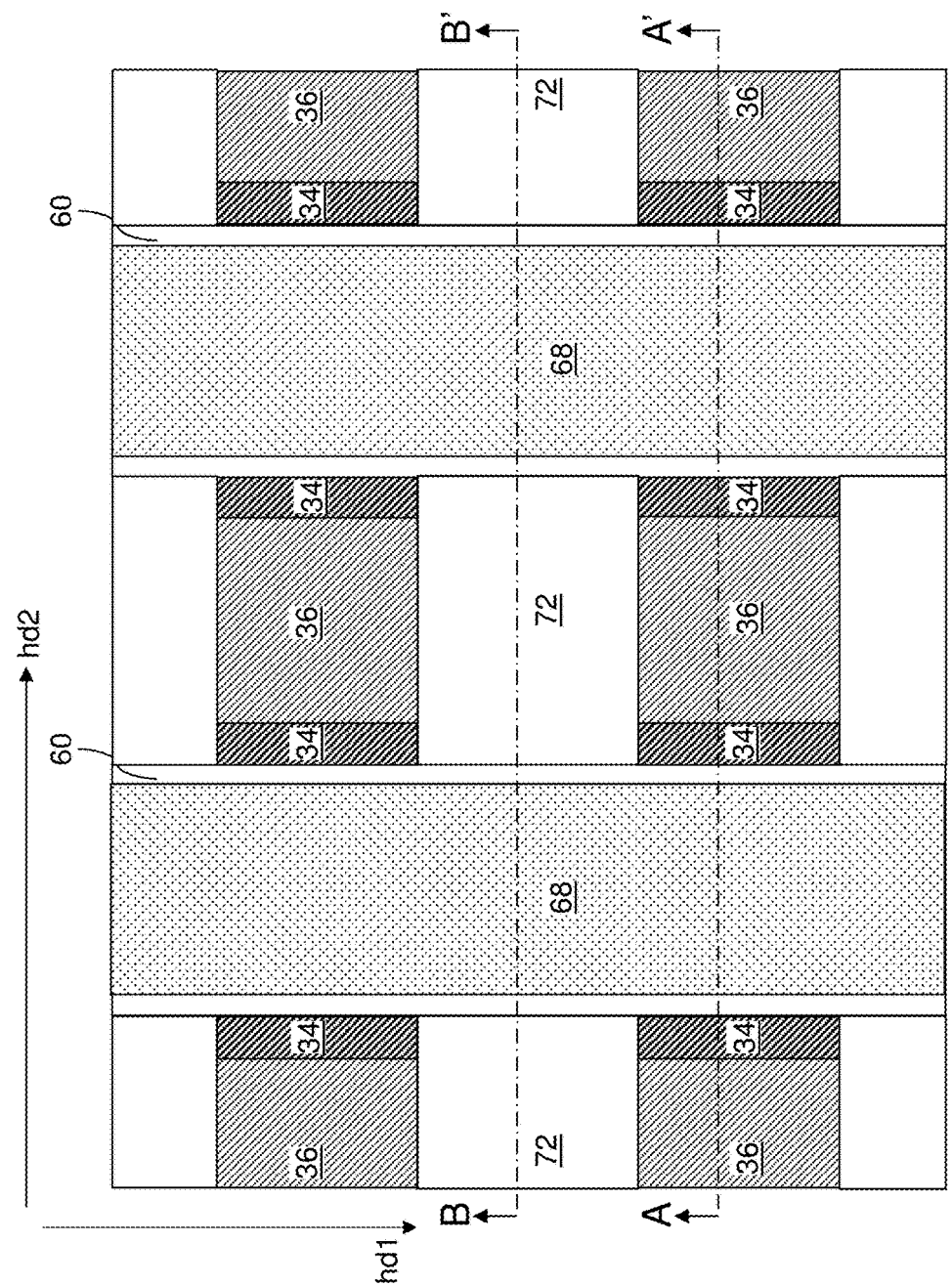
FIG. 23C is a horizontal cross-sectional view of the first exemplary structure of FIGS. 23A and 23B along the horizontal plane C-C' in FIGS. 23A and 23B.

Referring to FIGS. 23A-23C, a dielectric material can be deposited in the recess regions 59. Excess portions of the deposited dielectric material can be removed by a planarization process, which can include chemical mechanical planarization and/or a recess etch. Each remaining portion of the dielectric material that fills the recess regions 59 is herein referred to as a top electrode separation dielectric 72.

Each of the pair of inner gate dielectrics of the multiple instances of the vertical field effect transistor is a respective portion of an inner gate dielectric layer 50 (which is a laterally-undulating gate dielectric layer) that laterally extends generally along the first horizontal direction hd1 through each of the multiple instances of the vertical field effect transistor with lateral jogs at instances of the transverse sidewalls along the second horizontal direction hd2. An outer gate dielectric contacts a first sidewall of each vertical semiconductor channel strip 30, and an inner gate dielectric contacts a second sidewall of each vertical semiconductor channel strip 30. Each transverse sidewall of the vertical semiconductor channel strips 30 contacts a respective inner gate dielectric.

Each vertical field effect transistor includes a pair of vertical semiconductor channel strips 30. A pair of bottom active regions 32 can contact a pair of vertical semiconductor channel strips 30, and can be electrically shorted to each other via a bottom electrode line 10. A pair of top active regions 34 contacts top portions of the pair of vertical semiconductor channel strips 30, and can be electrically shorted to each other via a conductive structure such as a top electrode connector 36.

Figure 23D:
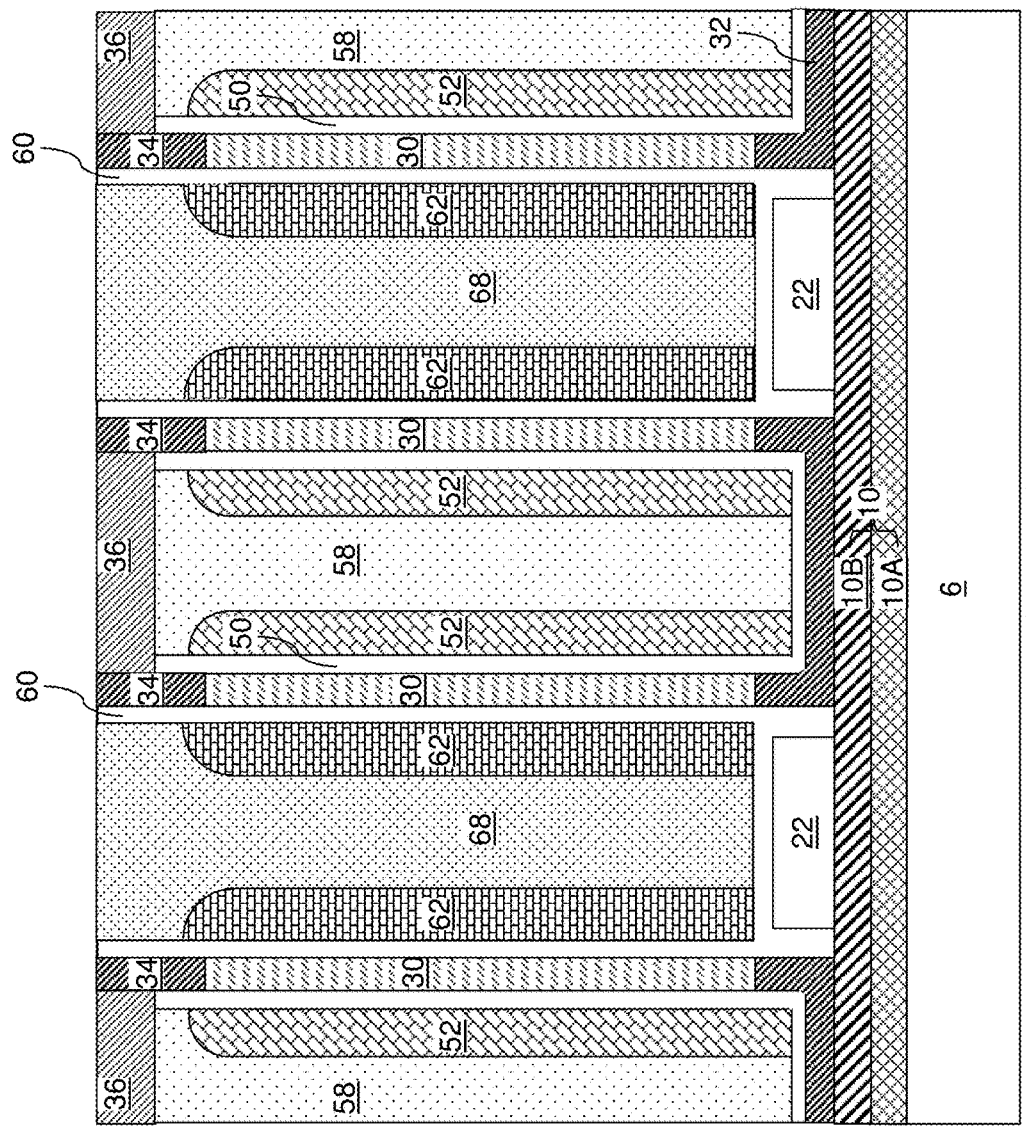
FIG. 23D is a vertical cross-sectional view of an alternate embodiment of the first exemplary structure along a vertical plane that corresponds to the vertical plane A-A' in FIG. 23C.
Figure 23E:
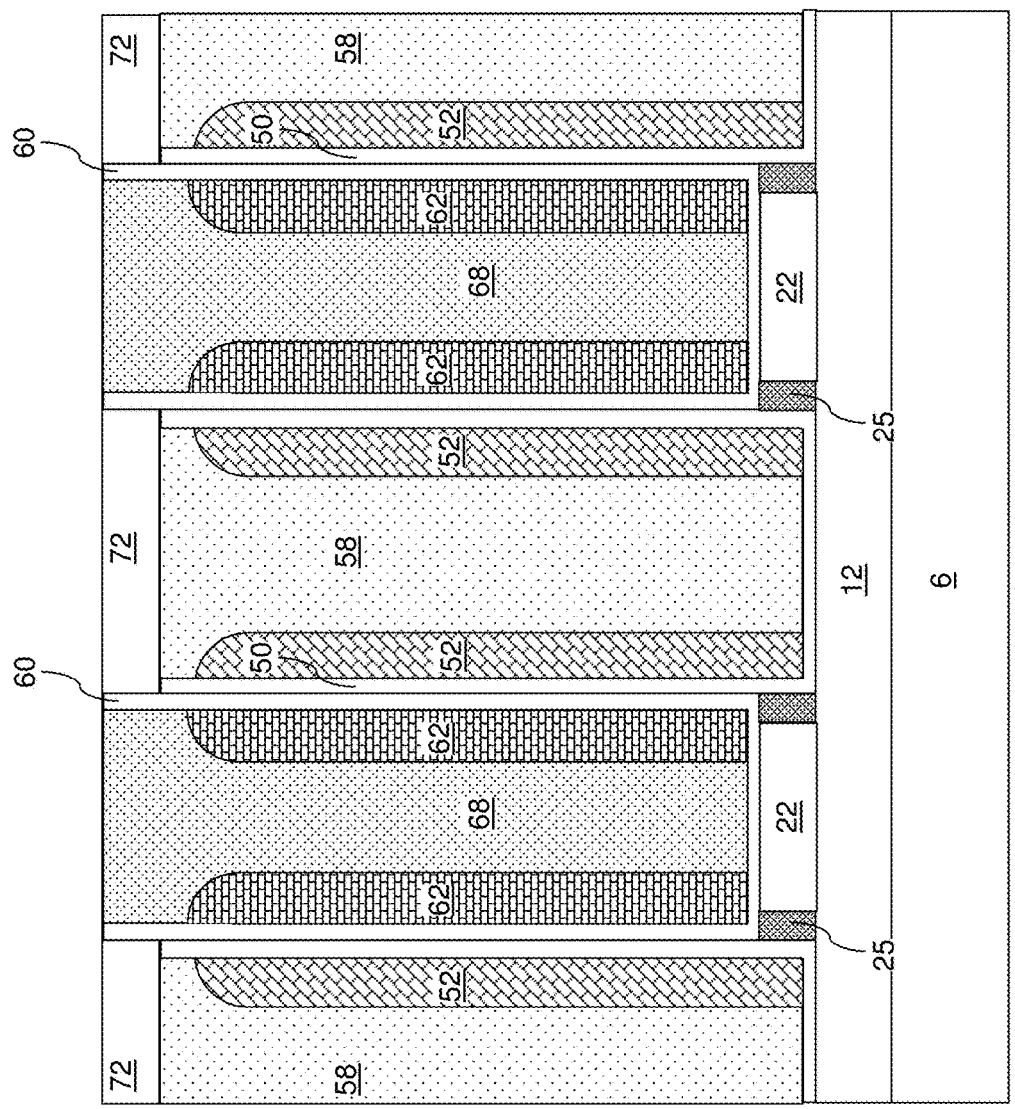
FIG. 23E is a vertical cross-sectional view of the alternate embodiment of the first exemplary structure of FIG. 23D along a vertical plane that corresponds to the vertical plane B-B' in FIG. 23C.

Referring to FIGS. 23D and 23E, an alternate embodiment of the first exemplary structure is illustrated, which can be derived from the first exemplary structure of by modifying the processing steps of 17A-17C to completely remove the dielectric spacers 25. In this case, the outer gate dielectric layers 60 can contact the lower electrode lines 10 and the bottom electrode isolation structures 12.

Multiple instances of the vertical field effect transistor illustrated in FIG. 23A-23C or 23D-23E can be implemented as a two-dimensional rectangular array of a plurality of instances of the vertical field effect transistor.

Figure 24A:
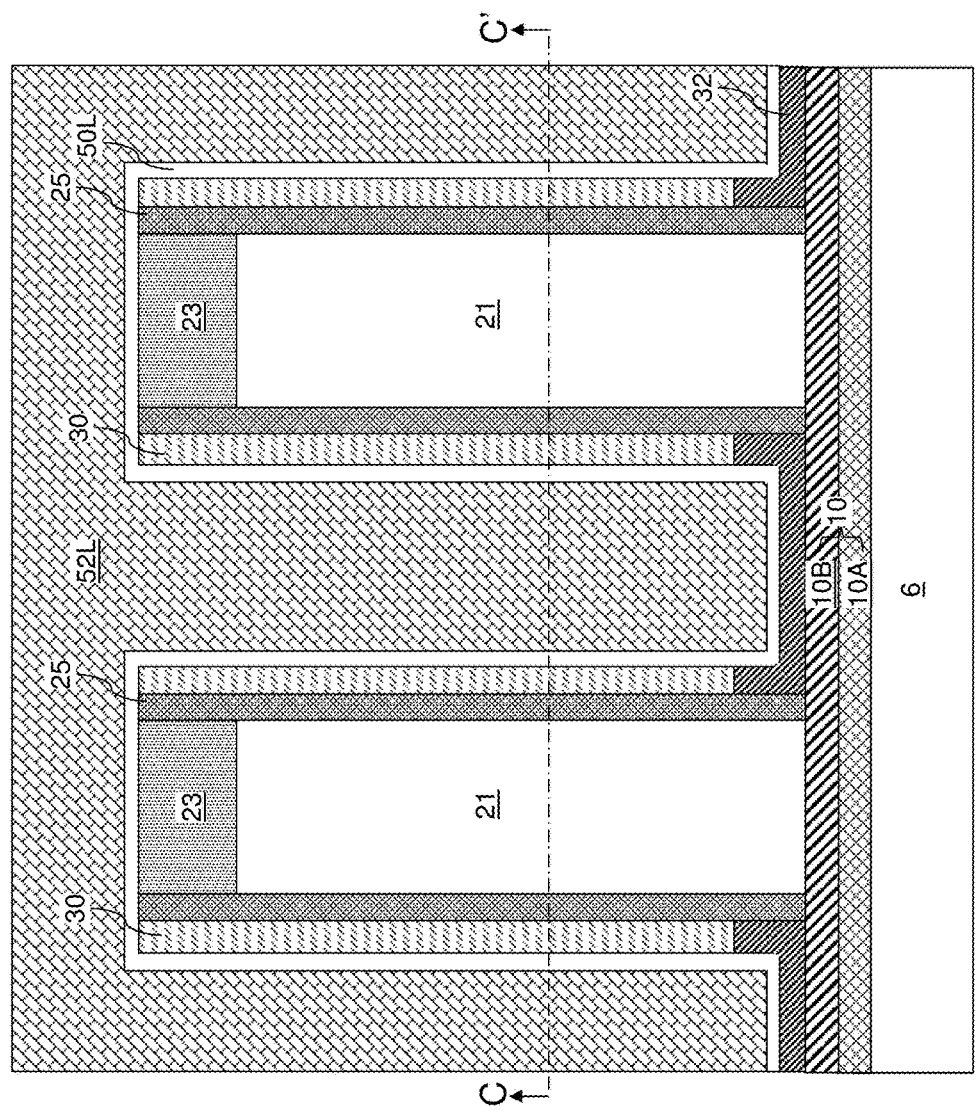
FIG. 24A is a vertical cross-sectional view of a second exemplary structure after formation of a laterally-undulating gate electrode layer along the vertical plane A-A' in FIG. 24C according to a second embodiment of the present disclosure.
Figure 24C:
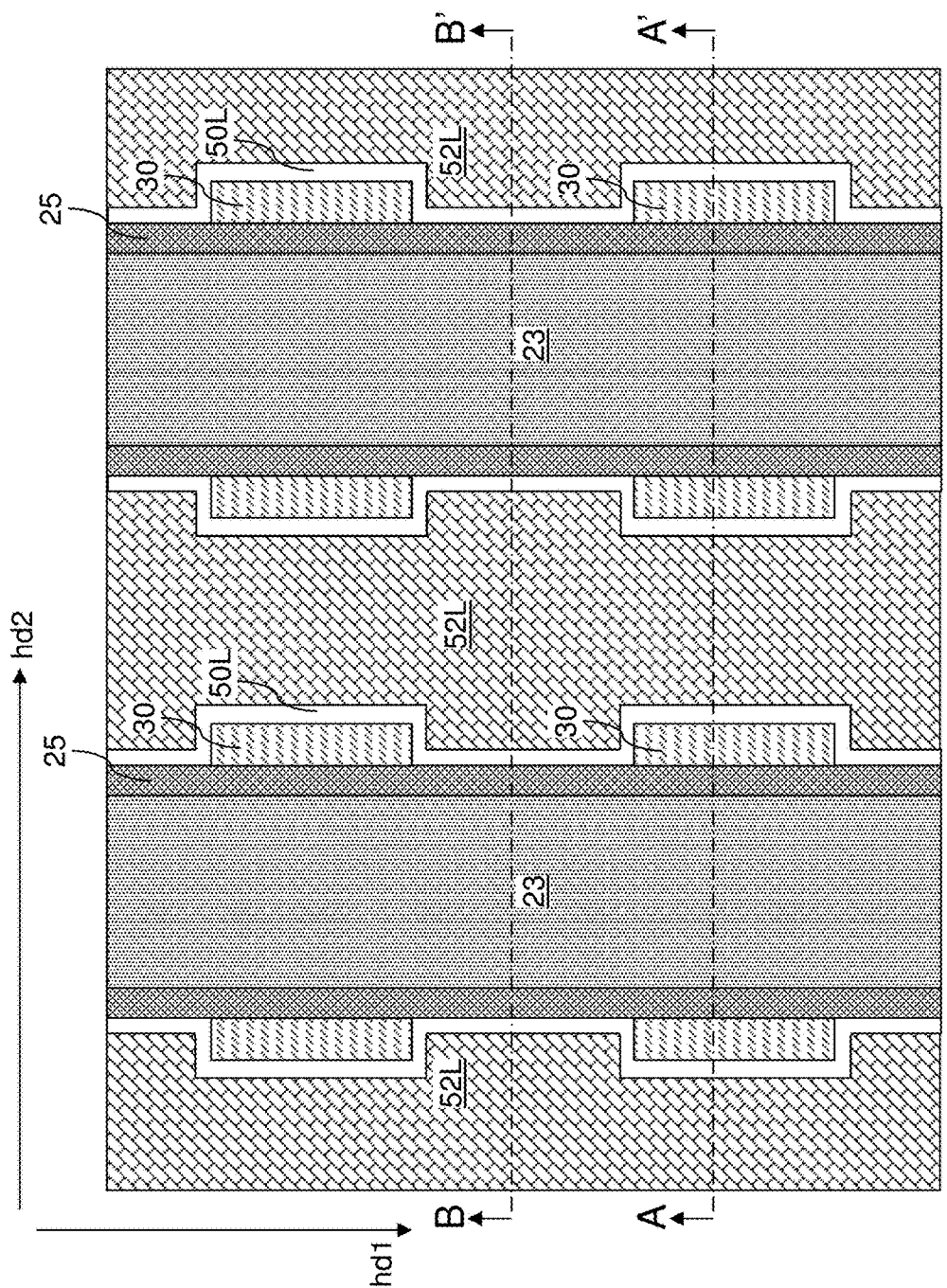
FIG. 24C is a horizontal cross-sectional view of the second exemplary structure of FIGS. 24A and 24B along the horizontal plane C-C' in FIGS. 24A and 24B.

Referring to FIGS. 24A-24C, a second exemplary structure according to a second embodiment of the present disclosure can be derived from the first exemplary structure illustrated in FIGS. 9A-9C by filling entire volumes of the laterally-undulating gate electrode trenches 49L within a laterally-undulating gate electrode layer 52L. The laterally-undulating gate electrode layer 52L includes laterally-undulating sidewalls such as a continuous set of vertical interfaces with the laterally-undulating gate dielectric layer SOL that generally extends along the first horizontal direction hd1 includes lateral shifts or lateral jogs of alternating opposite directions along (or against) the second horizontal direction hd2. The laterally-undulating gate electrode layer 52L can be an inner gate electrode layer. The laterally-undulating gate electrode layer 52L can be formed by a conformal deposition process such as chemical vapor deposition (CVD) or atomic layer deposition (ALD). The laterally-undulating gate electrode trenches 49L can have a lesser width in a region between an adjacent pair of vertical semiconductor channel strips 30 than in a region between a pair of interfaces between the gate dielectric layers SOL and a neighboring pair of matrix rail structures (21, 23, 25).

Figure 25A:
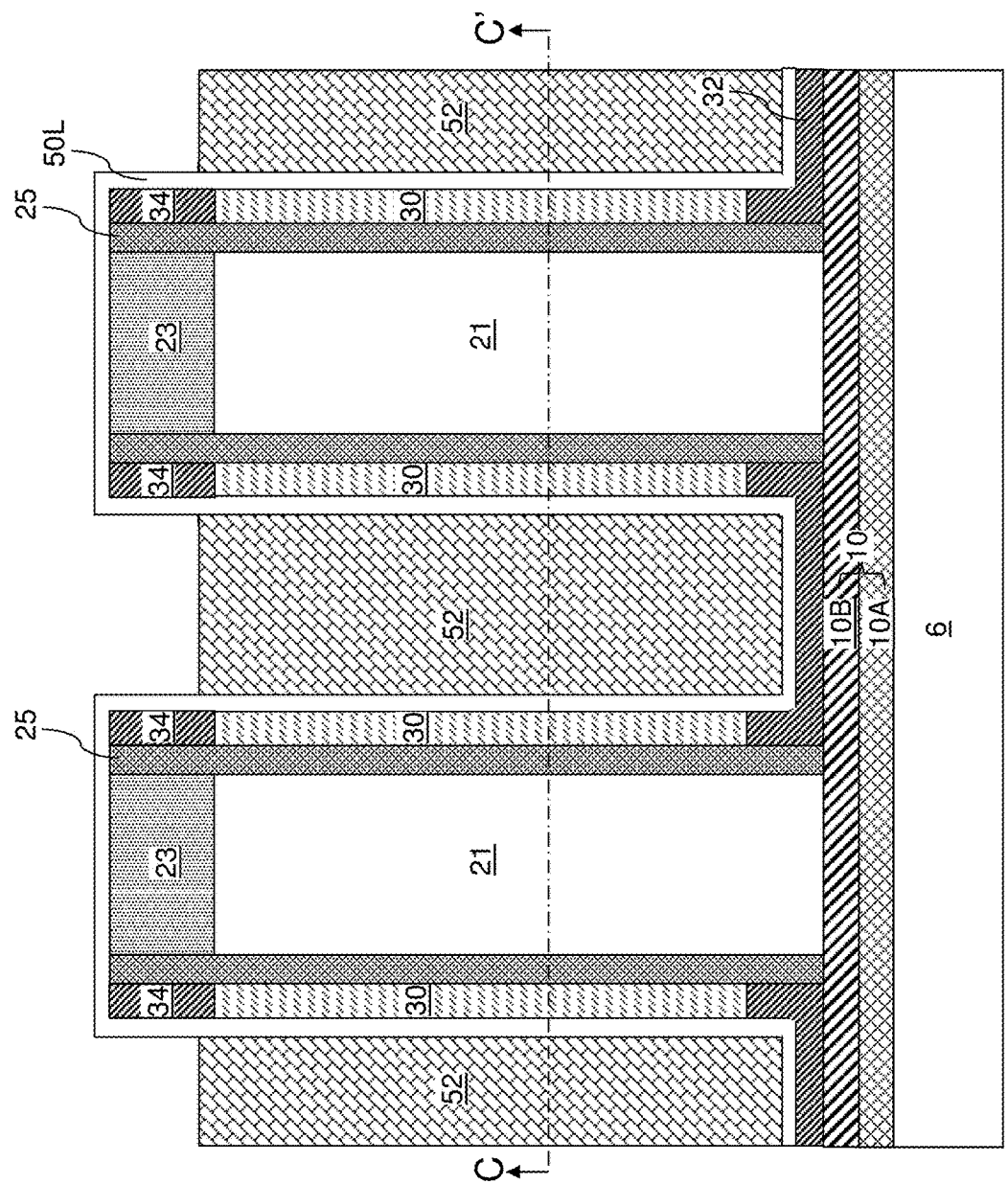
FIG. 25A is a vertical cross-sectional view of the second exemplary structure after formation of laterally-undulating gate electrode lines along the vertical plane A-A' in FIG. 25C according to a second embodiment of the present disclosure.
Figure 25C:
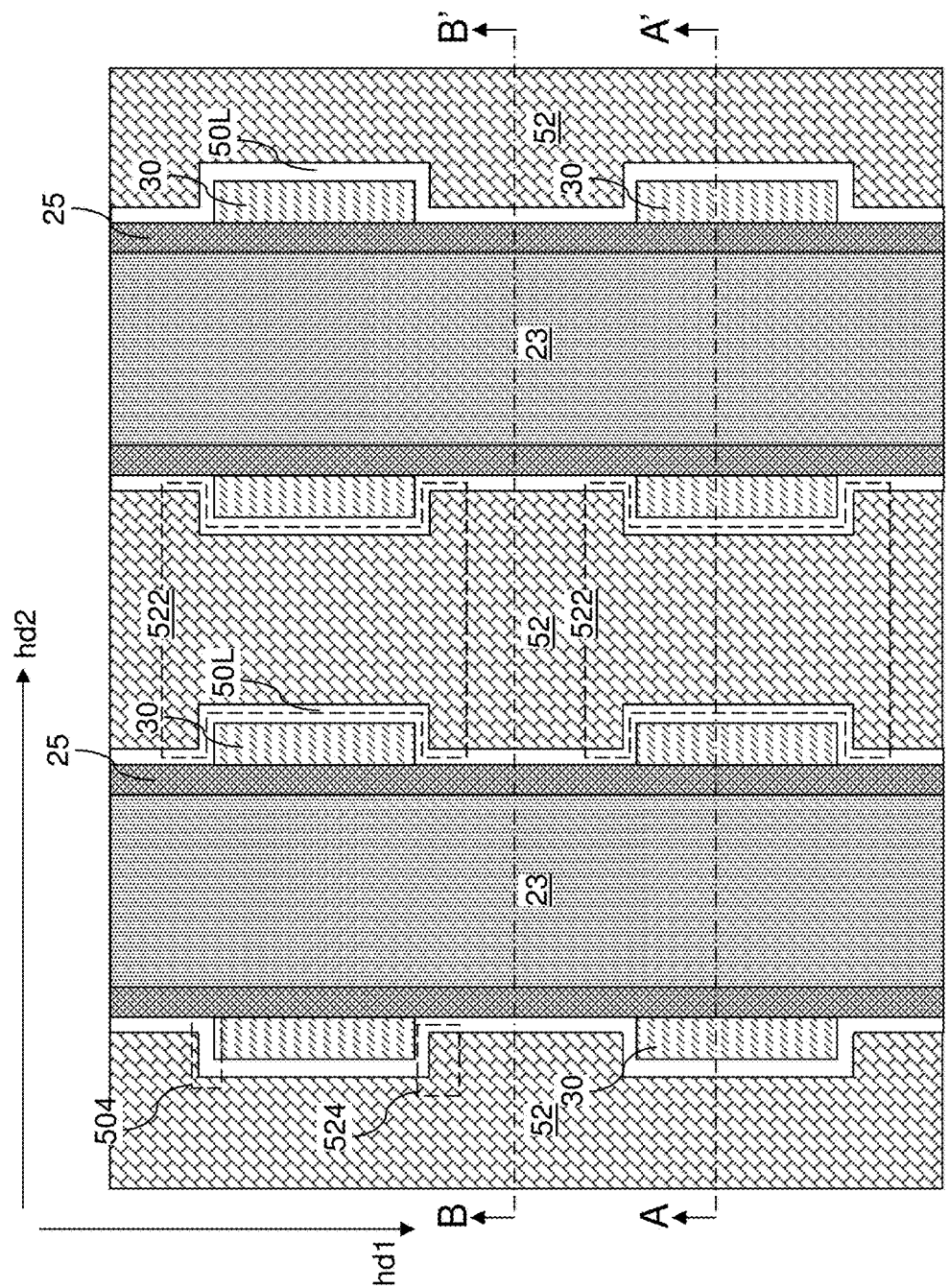
FIG. 25C is a horizontal cross-sectional view of the second exemplary structure of FIGS. 25A and 25B along the horizontal plane C-C' in FIGS. 25A and 25B.
Figure 26A:
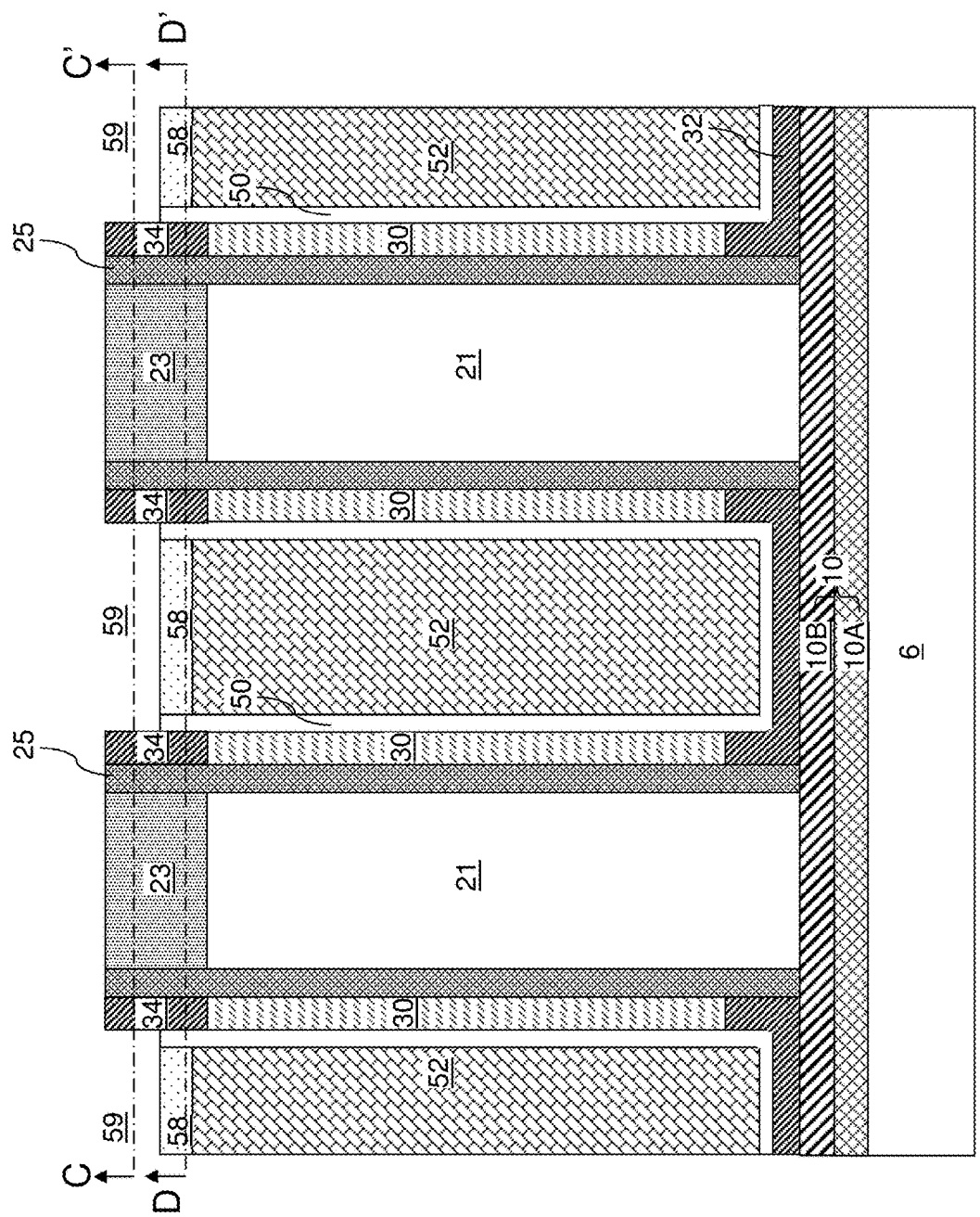
FIG. 26A is a vertical cross-sectional view of the second exemplary structure after formation of inner isolation dielectric lines and laterally-undulating line trenches along the vertical plane A-A' in FIG. 26C according to a second embodiment of the present disclosure.
Figure 26B:
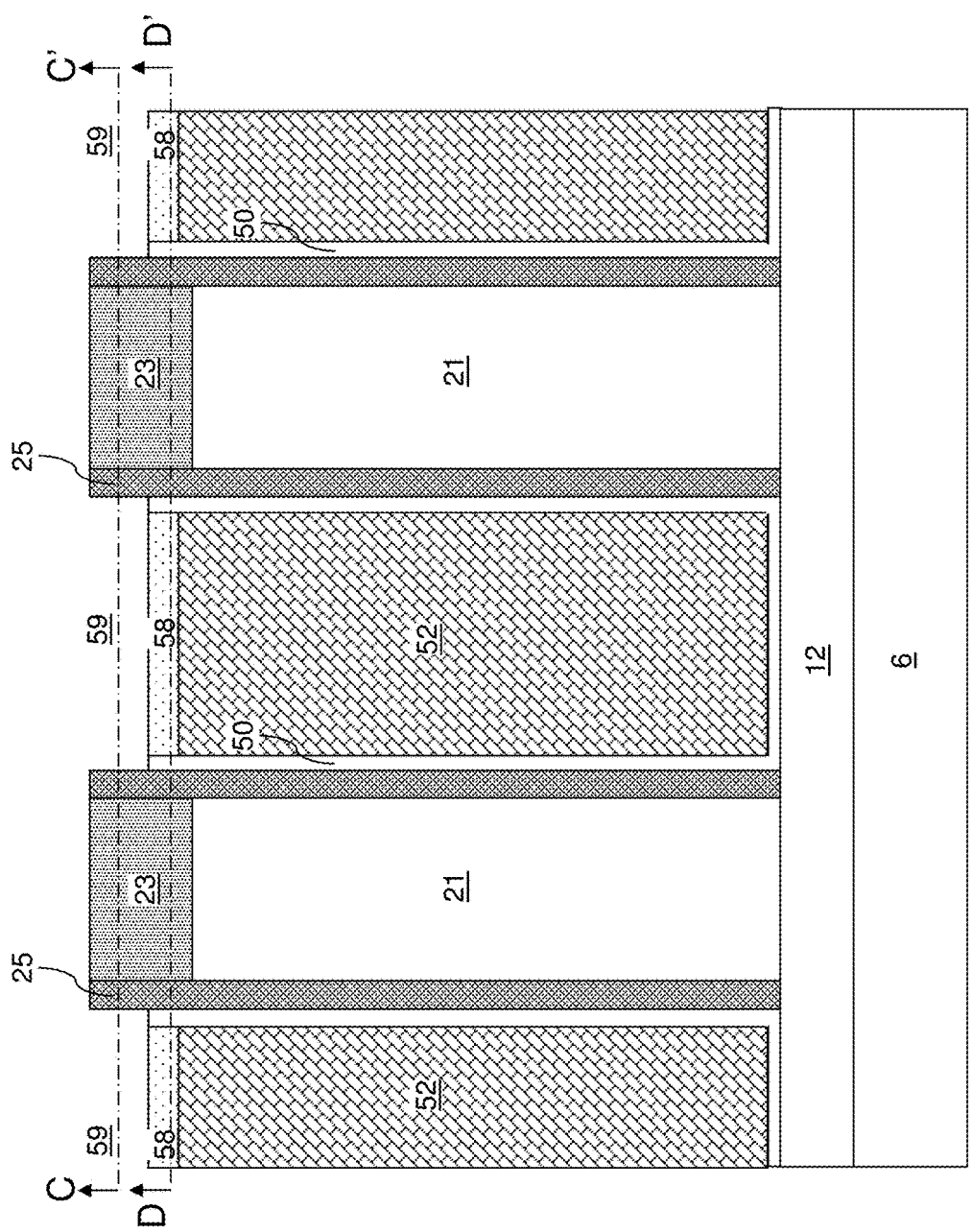
FIG. 26B is a vertical cross-sectional view of the second exemplary structure of FIG. 26A along the vertical plane B-B' in FIG. 26C according to the second embodiment of the present disclosure.
Figure 26C:
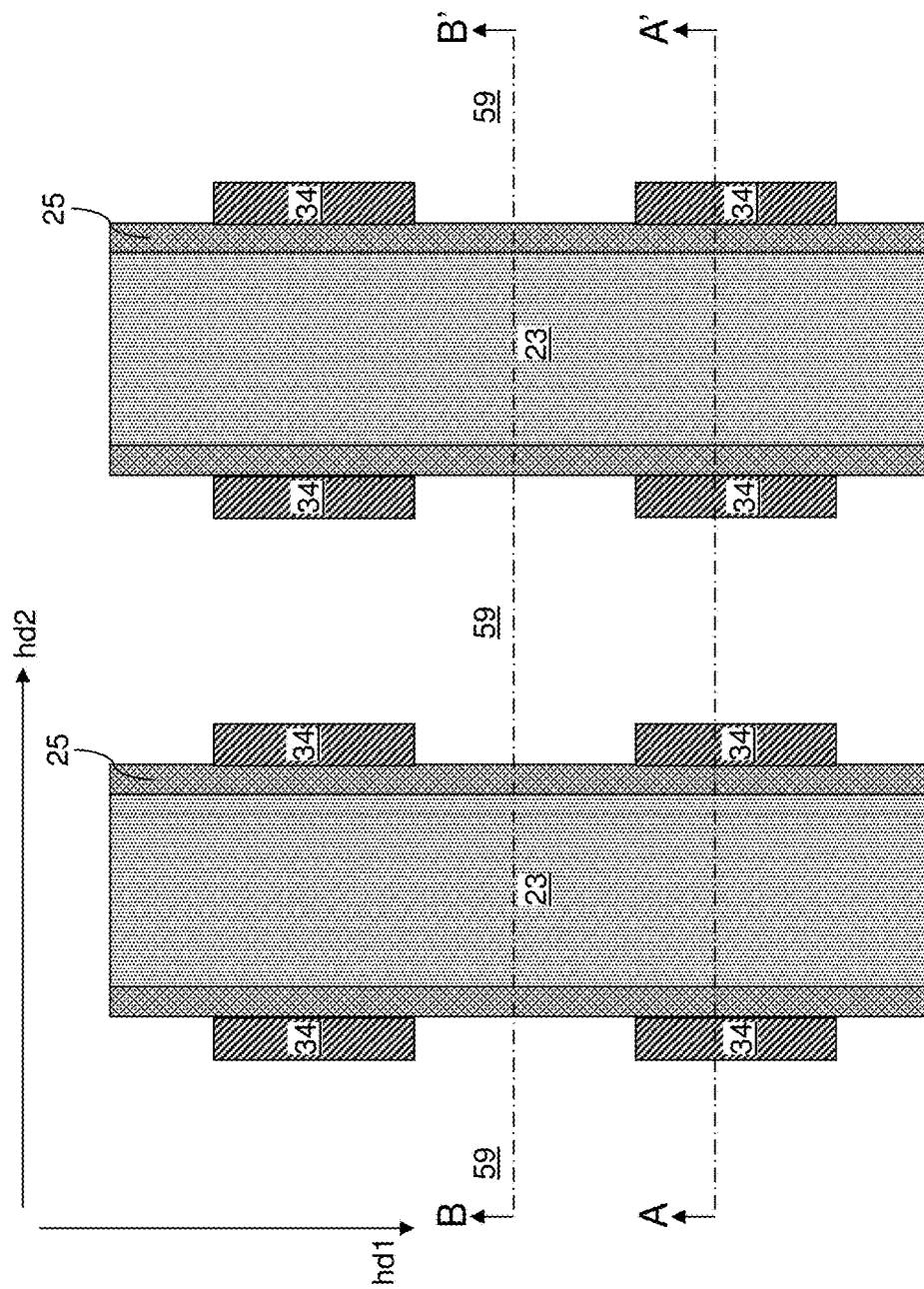
FIG. 26C is a horizontal cross-sectional view of the second exemplary structure of FIGS. 26A and 26B along the horizontal plane C-C' in FIGS. 26A and 26B.
Figure 26D:
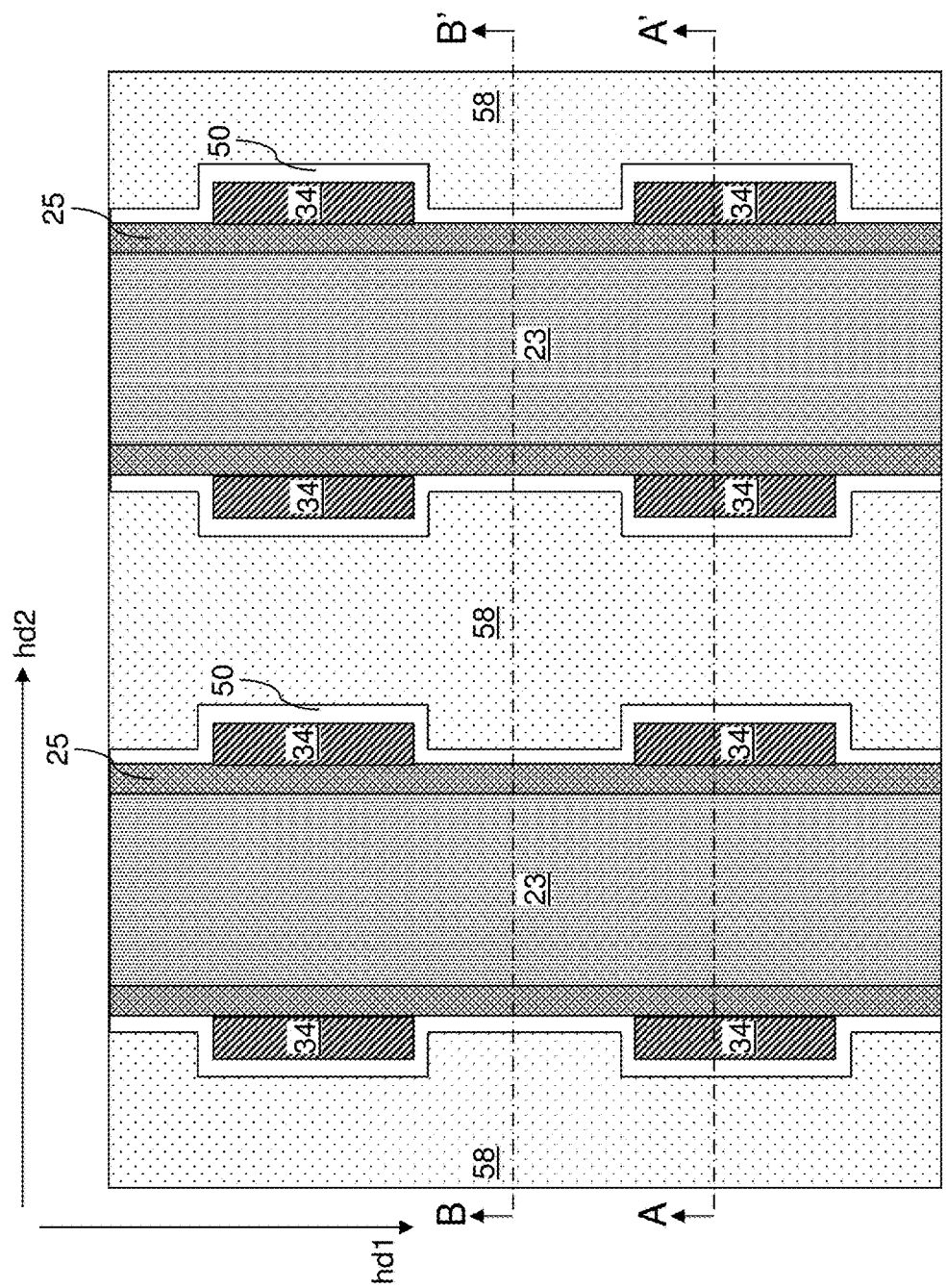
FIG. 26D is a horizontal cross-sectional view of the first exemplary structure of FIGS. 26A and 26B along the horizontal plane D-D' in FIGS. 26A and 26B.

Referring to FIGS. 25A-25C, an anisotropic etch that etches the material of the laterally-undulating gate electrode layer 52L selective to the material of the laterally-undulating gate dielectric layer 50L or selective to the material of the upper dielectric rail structures 23 can be performed to etch horizontal portions of the laterally-undulating gate electrode layer 52L. Each remaining vertical portion of the laterally-undulating gate electrode layer 52L constitutes an inner gate electrode line 52. Each inner gate electrode line 52 is a laterally-undulating structure including laterally-undulating sidewalls, and thus, is a laterally-undulating gate electrode line. Further, an overetch can be performed to vertically recess the top surfaces of the inner gate electrode lines 52 so that the top surfaces of the inner gate electrode lines 52 after the overetch can be approximately at the height at which p-n junctions between the vertical semiconductor channel strips of final vertical field effect transistor structures and top active regions of the final vertical field effect transistor structures.

In the semiconductor device to be subsequently formed, multiple instances of a vertical field effect transistor can be provided around a matrix rail structure (21, 23, 25) such that the multiple instances are spaced apart along the first horizontal direction hd1. Each instance of the vertical field effect transistor can include a single inner gate electrode 522. Each inner gate electrodes 522 of the multiple instances of the vertical field effect transistor formed around the matrix rail structure (21, 23, 25) can be a respective portion of an inner gate electrode lines 52 that is shared among each of the multiple instances of the vertical field effect transistor. Each inner gate electrode 522 can contact respective sidewalls of a pair of inner gate dielectrics. Each inner gate electrode 522 is a portion of an inner gate electrode line 52 that extends along the first horizontal direction hd1. Thus, a pair of inner gate electrode lines 52 is provided around each matrix rail structure (21, 23, 25). Each of the pair of inner gate electrode lines 52 laterally extends generally along the first horizontal direction hd1 through each of the multiple instances of the vertical field effect transistor with bends 524 at instances of the lateral jogs 504 of the pair of inner gate dielectric layers 50.

Dopants of the first conductivity type can be implanted into upper portions of the vertical semiconductor channel strips 30 to convert upper portions of each vertical semiconductor channel strip 30 into top active regions 34. The atomic concentration of dopants of the second conductivity type in the top active regions 34 can be in a range from $1.0 \times 10^{19}/cm^3$ to $2.0 \times 10^{21}/cm^3$, although lesser and greater atomic concentrations can also be employed. P-n junctions can be formed between the top active regions 34 and remaining portions of the vertical semiconductor channel strips 30. The height of the p-n junctions between the top active regions 34 and the vertical semiconductor channel strips 30 can be about the height of the top surfaces of the inner gate electrodes, which are portions of the inner gate electrode lines 52.

Referring to FIGS. 26A-26D, a dielectric material such as silicon oxide can be deposited in remaining volumes of the laterally-undulating gate electrode trenches 49L. Excess portions of the deposited dielectric material can be removed from above the horizontal plane including the top surfaces of the upper dielectric rail structures 23 by a planarization process. Chemical mechanical planarization (CMP) or a recess etch may be employed for the planarization process. Each remaining portion of the deposited dielectric material constitutes an inner isolation dielectric line 58 that extends along the first horizontal direction hd1. The inner isolation dielectric lines 58 can be formed over the inner gate electrode lines 52.

The inner isolation dielectric lines 58 can be vertically recessed with respect to the top surfaces of the matrix rail structures (21, 23, 25) and the top surfaces of the top active regions 34 by an etch process, which may be an isotropic etch process or an anisotropic etch process. In an illustrative embodiment, the inner isolation dielectric lines 58 can include doped or undoped silicate glass or organosilicate glass, and a wet etch employing hydrofluoric acid can be employed to vertically recess the top surfaces of the inner isolation dielectric lines 58 relative to the top surfaces of the matrix rail structures (21, 23, 25) and the top surfaces of the top active regions 34. Line trenches 59 can be formed in the recessed regions overlying the inner isolation dielectric lines 58. The duration of the etch process can be selected such that the recessed top surfaces of the inner isolation dielectric lines 58 are located above the horizontal plane including the top surfaces of the inner gate electrode lines 52. Thus, the inner gate electrode lines 52 are not physically exposed after formation of the line trenches 59. The line trenches 59 can have a laterally-undulating width along the second horizontal direction hd2. In other words, the width of each line trench 59 as measured along the second horizontal direction hd2 can undulate as the location of measurement of the width moves along the first horizontal direction hd1.

Figure 27A:
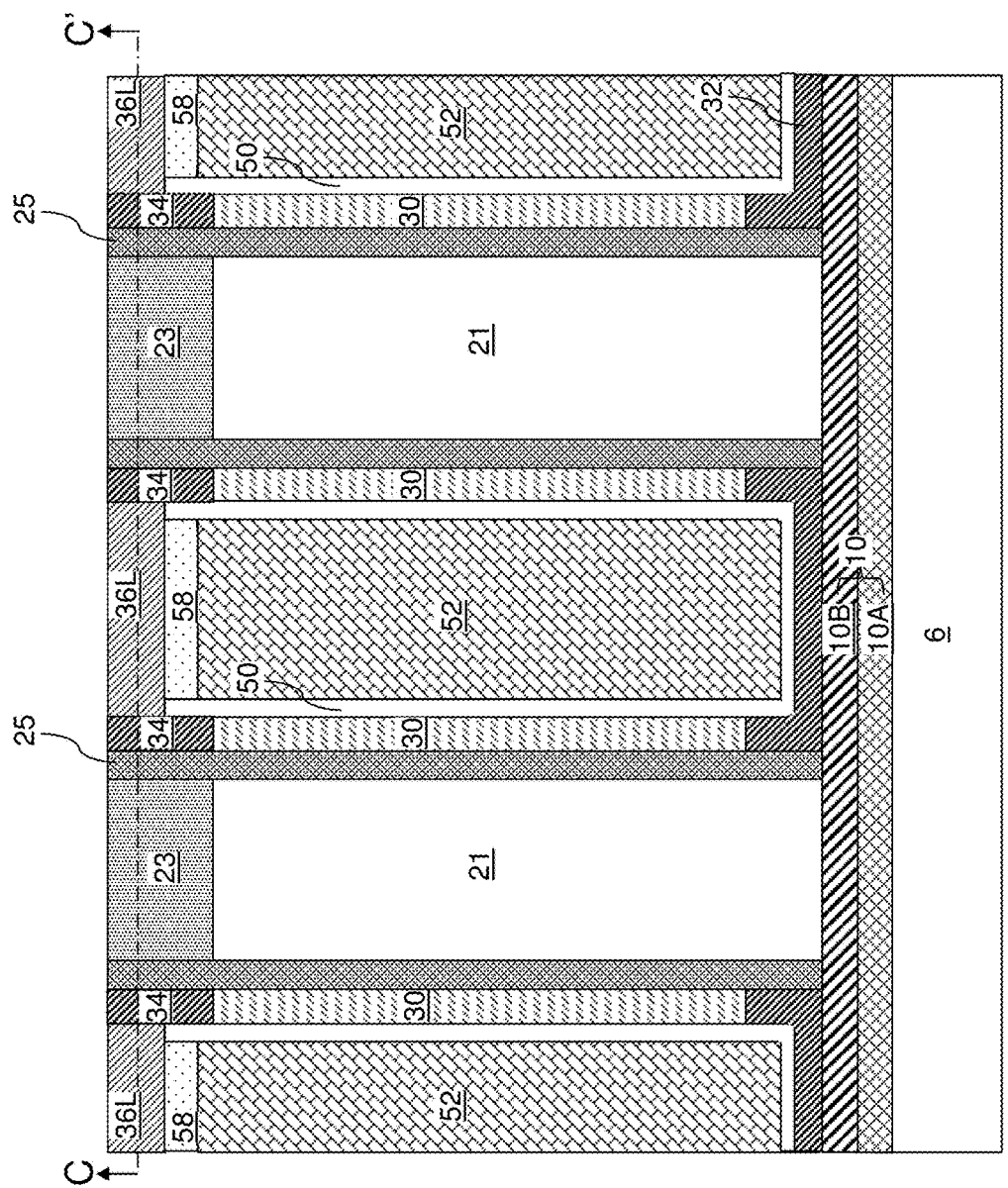
FIG. 27A is a vertical cross-sectional view of the second exemplary structure after formation of top electrode connection layers along the vertical plane A-A' in FIG. 27C according to a second embodiment of the present disclosure.
Figure 27B:
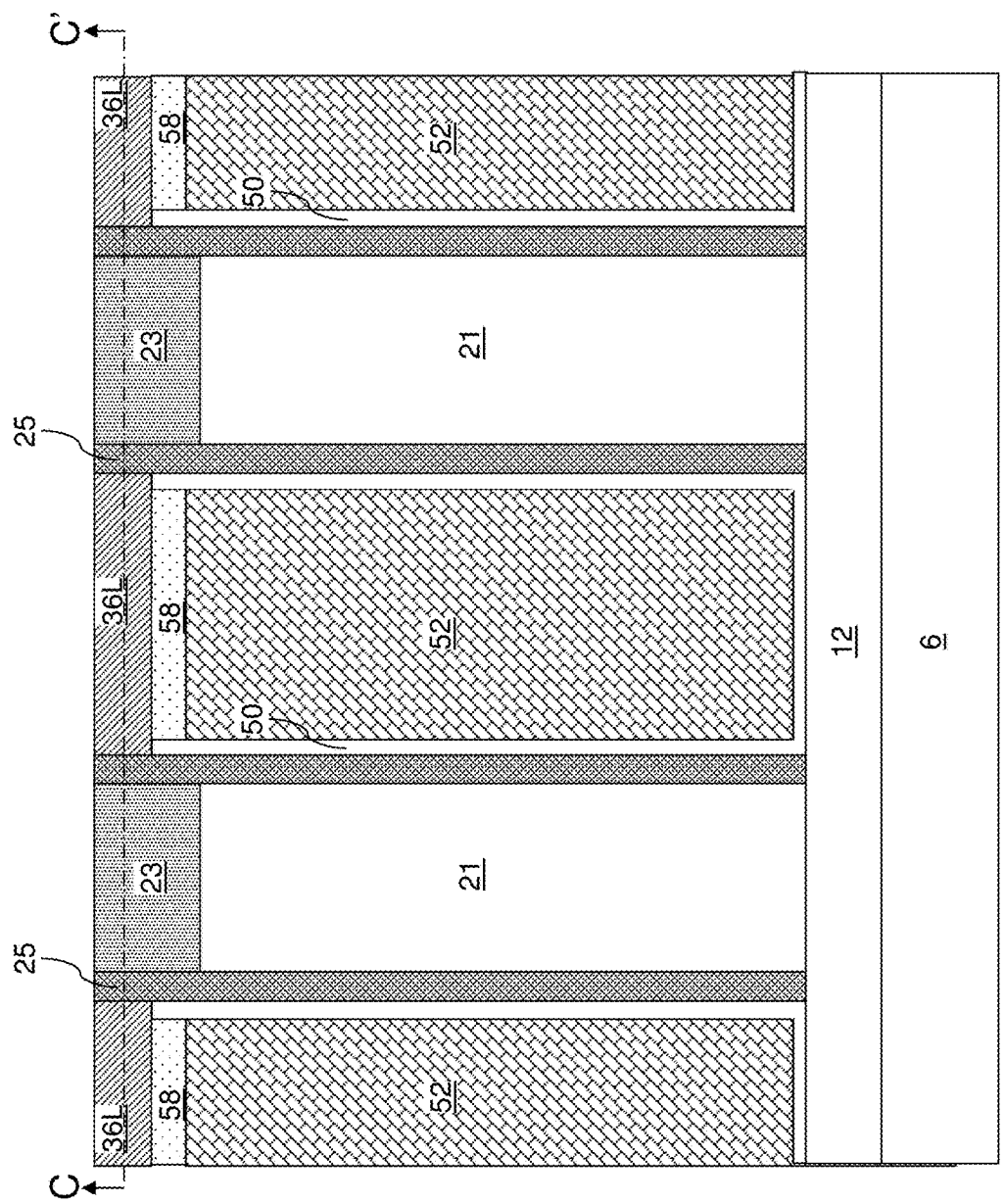
FIG. 27B is a vertical cross-sectional view of the second exemplary structure of FIG. 27A along the vertical plane B-B' in FIG. 27C according to the second embodiment of the present disclosure.
Figure 27C:
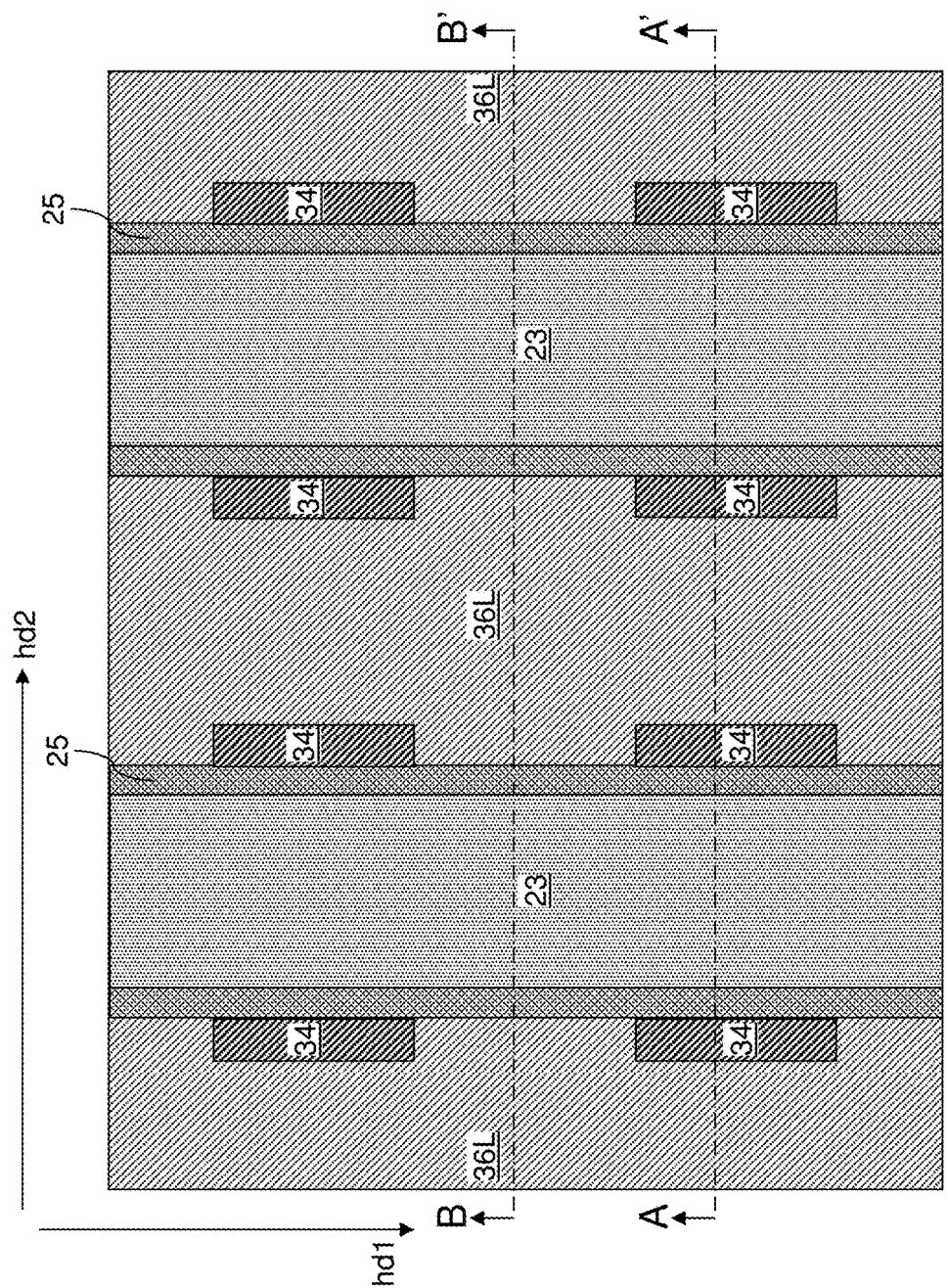
FIG. 27C is a horizontal cross-sectional view of the second exemplary structure of FIGS. 27A and 27B along the horizontal plane C-C' in FIGS. 27A and 27B.
Figure 28A:
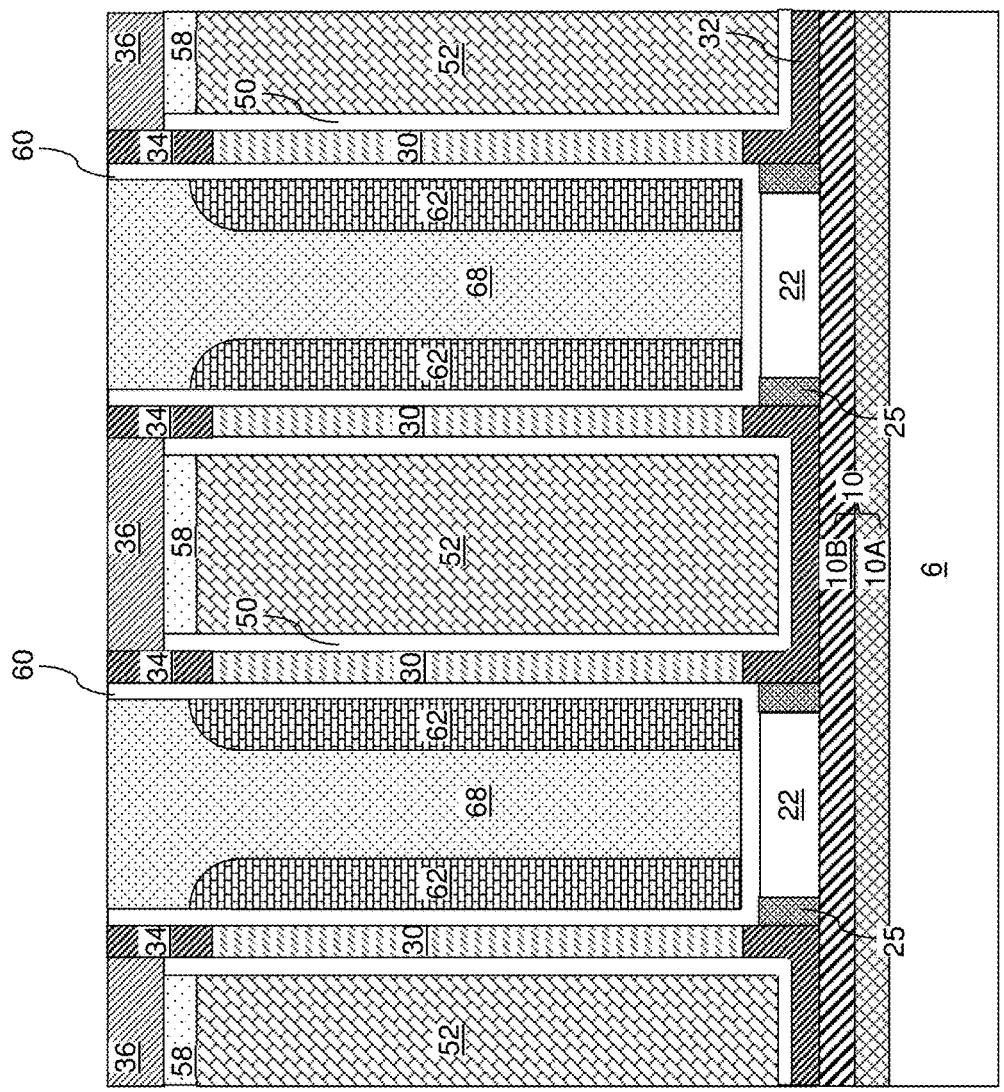
FIG. 28A is a vertical cross-sectional view of the second exemplary structure after formation of inner gate electrodes and outer isolation dielectric lines along the vertical plane A-A' in FIG. 28C according to a second embodiment of the present disclosure.
Figure 28B:
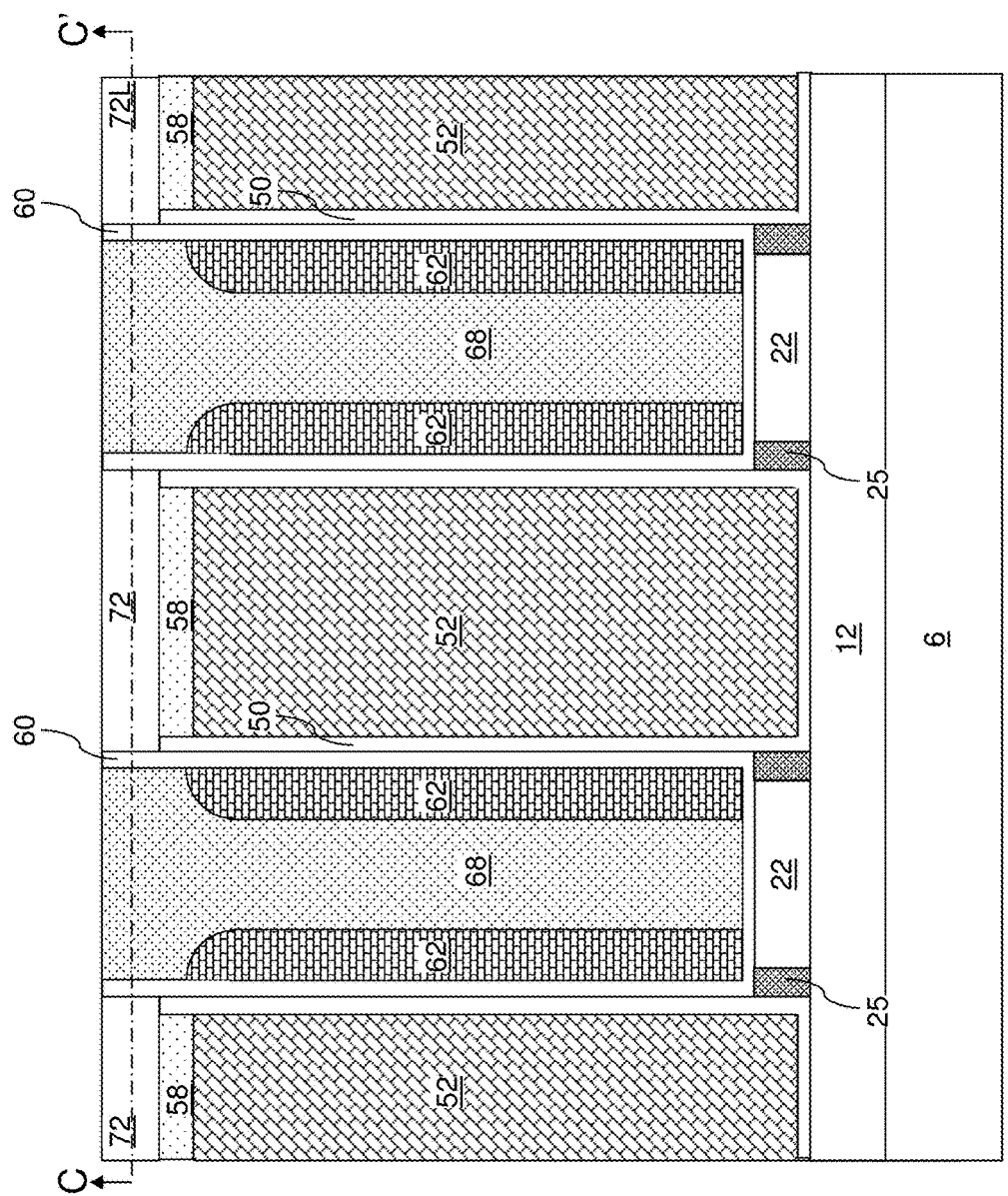
FIG. 28B is a vertical cross-sectional view of the second exemplary structure of FIG. 28A along the vertical plane B-B' in FIG. 28C according to the second embodiment of the present disclosure.
Figure 28C:
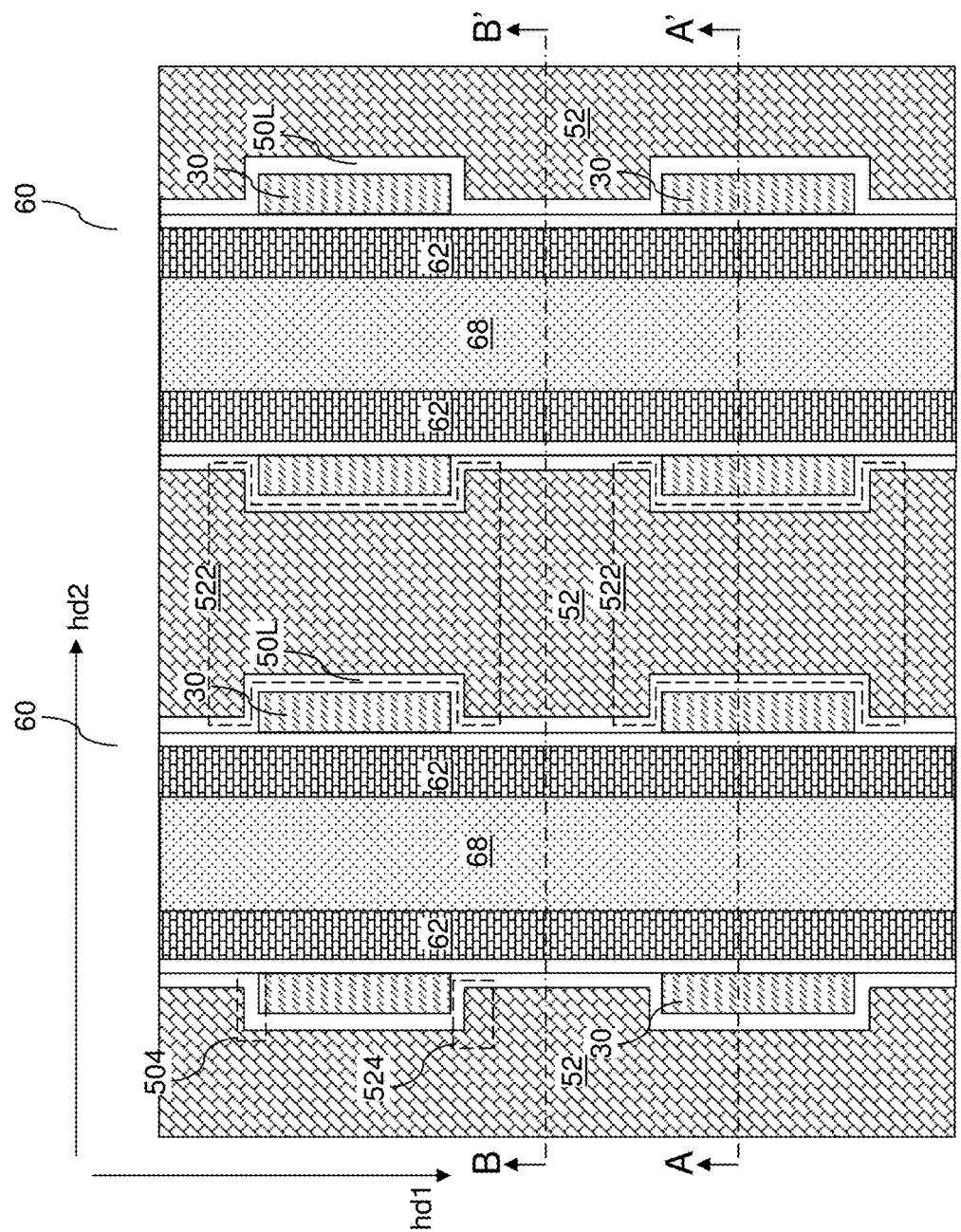
FIG. 28C is a horizontal cross-sectional view of the second exemplary structure of FIGS. 28A and 28B along the horizontal plane C-C' in FIGS. 28A and 28B.
Figure 28D:
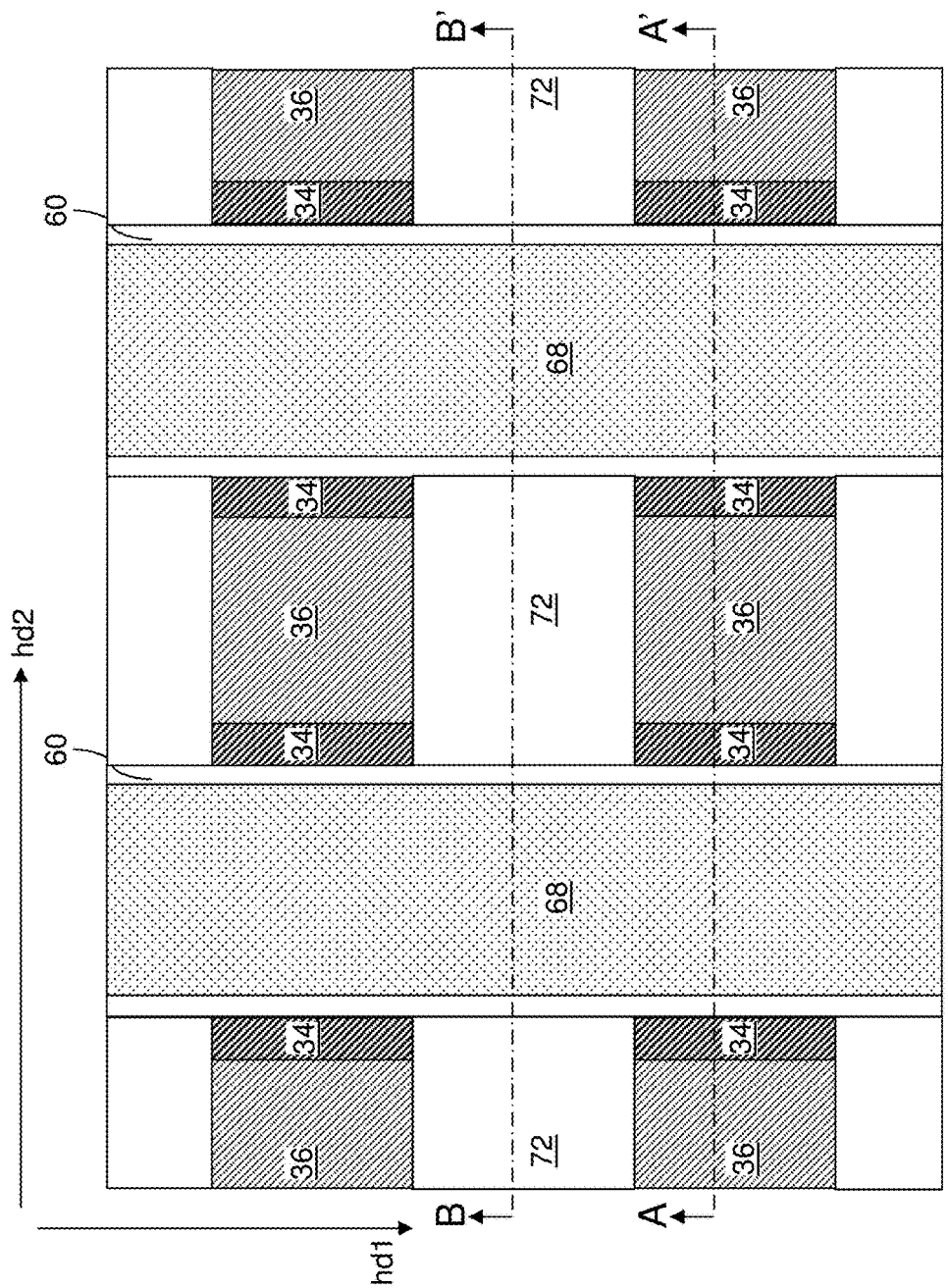
FIG. 28D is a horizontal cross-sectional view of the second exemplary structure of FIGS. 28A and 28B along the horizontal plane D-D' in FIGS. 28A and 28B.

Referring to FIGS. 27A-27C, top electrode connection layers 36L can be formed in the line trenches 59. For example, at least one conductive material can be deposited to fill the line trenches 59. The at least one conductive material can include a doped semiconductor material (such as polysilicon) having a doping of the first conductivity type, and/or a metallic material such as TiN, TaN, WN, W, Co, Ru, Ta, Ti, alloys thereof, and/or layer stacks thereof. In one embodiment, the at least one conductive material can include doped polysilicon. Excess portions of the at least one conductive material can be removed from above the horizontal plane including the top surfaces of the matrix rail structures (21, 23, 25) by a planarization process, which can include, for example, chemical mechanical planarization (CMP) and/or a recess etch. Each top electrode connection layer 36L extends between a neighboring par of matrix rail structures (21, 23, 25), and laterally extends through multiple neighboring pairs of vertical semiconductor channel strips 30 along the first horizontal direction hd1.

Subsequently, each matrix rail structure (21, 23, 25) can be replaced with a respective set of at least one gate electrode rail (i.e., at least one rail embodying a gate electrode) and straight-sidewalled gate dielectrics (i.e., gate dielectrics free of laterally-undulating sidewalls). Each set of the at least one gate electrode rail and straight-sidewalled gate dielectrics may include a pair of gate electrode rail gate electrodes and a straight-sidewalled gate dielectric layer including the straight-sidewalled gate dielectrics therein.

Referring to FIGS. 28A-28D, the processing steps of FIGS. 16A-16C, 17A-17C, 18A-18C, 19A-19C, 20A-20C, 21A-21D, 22A-22C, and 23A-23C can be sequentially performed.

Each of the pair of inner gate dielectrics of the multiple instances of the vertical field effect transistor is a respective portion of an inner gate dielectric layer 50 (which is a laterally-undulating gate dielectric layer) that laterally extends generally along the first horizontal direction hd1 through each of the multiple instances of the vertical field effect transistor with lateral jogs at instances of the transverse sidewalls along the second horizontal direction hd2. An outer gate dielectric contacts a first sidewall of each vertical semiconductor channel strip 30, and an inner gate dielectric contacts a second sidewall of each vertical semiconductor channel strip 30. Each transverse sidewall of the vertical semiconductor channel strips 30 contacts a respective inner gate dielectric.

Each vertical field effect transistor includes a pair of vertical semiconductor channel strips 30. A pair of bottom active regions 32 can contact a pair of vertical semiconductor channel strips 30, and can be electrically shorted to each other via a bottom electrode line 10. A pair of top active regions 34 contacts top portions of the pair of vertical semiconductor channel strips 30, and can be electrically shorted to each other via a conductive structure such as a top electrode connector 36.

Referring to FIGS. 29A and 29B, a third exemplary structure according to a third embodiment of the present disclosure is shown after formation of matrix rail structures (122, 152, 150). The matrix rail structures (122, 152, 150) include a dielectric pedestal 122, gate dielectric layer 150, and an electrically conductive inner gate electrode rail 152, which can be formed on the first exemplary structure illustrated in FIGS. 1A-1C.

For example, a layer stack of a dielectric material layer and a conductive material layer can be formed over the laterally alternating stack of bottom electrode lines 10 and bottom electrode isolation structures 12, and can be patterned to form composite rail structures (122, 152) laterally extending along the first horizontal direction hd1. For example, the dielectric material layer can be a silicon oxide layer having a thickness that is on the order of the height of bottom active regions to be subsequently formed. In one embodiment, the thickness of the dielectric material layer can be in a range from 5 nm to 100 nm, although lesser and greater thicknesses can also be employed. The conductive material layer can be a doped silicon layer or a metallic material layer including a metallic material (such as TiN, TaN, W, Co, Ru, Al, an alloy thereof, or a combination thereof) having a thickness that is greater than the height of inner gate electrodes for vertical field effect transistors to be subsequently formed. In one embodiment, the thickness of the conductive material layer can be in a range from 50 nm to 2,000 nm, although lesser and greater thicknesses can also be employed.

A photoresist layer can be applied over the conductive material layer, and can be lithographically patterned with a periodic line and space pattern, i.e., by lithographic exposure and development. Each line pattern in the developed photoresist material can laterally extend along the first horizontal direction hd1, which may be perpendicular to the lengthwise direction of the bottom electrode lines 10 which is the second horizontal direction. At least one anisotropic etch process can be performed to transfer the pattern of the developed photoresist material portions through the second dielectric material layer and the first dielectric material layer. The bottom electrode lines 10 may be employed as an etch stop layer and/or as an end point detection layer.

Each remaining portion of the conductive material layer constitutes an inner gate electrode rail 152, which is a straight-sidewalled inner gate electrode line, i.e., free of any lateral undulation of sidewalls. Each remaining portion of the dielectric material layer constitutes a dielectric pedestal 122, which is a rail structure. A vertical stack of a dielectric pedestal 122 and an inner gate electrode rail 152 constitutes a composite rail structure (122, 152), which laterally extends along the first horizontal direction hd1. In one embodiment, each composite rail structure (122, 152) can have a uniform width throughout. The width of each composite rail structure (122, 152) can be in a range from 30 nm to 500 nm, although lesser and greater widths can also be employed.

A continuous inner gate dielectric layer including a gate dielectric material can be deposited by a conformal deposition such as atomic layer deposition (ALD) or low pressure chemical vapor deposition (LPCVD). The continuous inner gate dielectric layer can include any material that can be employed for the laterally-undulating gate dielectric layer 50L or the continuous outer gate dielectric layer 60L of the first and second embodiments. The continuous inner gate dielectric layer is a straight-sidewalled gate dielectric layer that is free of laterally-undulating sidewalls. An anisotropic etch may be performed to remove horizontal portions of the continuous inner gate dielectric layer. Each remaining vertical portion of the continuous inner gate dielectric layer constitutes a straight-sidewalled gate dielectric layer 150, which functions as an inner gate dielectric layer and is free of laterally-undulating sidewalls. Each contiguous set of a composite rail structure (122, 152) and a pair of straight-sidewalled gate dielectric layer 150 constitutes a matrix rail structure (122, 152, 150).

The matrix rail structures (122, 152, 150) laterally extend along the first horizontal direction hd1. Each matrix rail structure (122, 152, 150) includes a pair of lengthwise sidewalls that extend along the first horizontal direction hd1. Upon formation, each matrix rail structure (122, 152, 150) includes a set of a gate electrode rail (i.e., an inner gate electrode rail 152) extending along the first horizontal direction hd1 and straight-sidewalled gate dielectrics, which can be portions of two straight-sidewalled gate dielectric layers 150 that contact sidewalls of vertical semiconductor channel strips to be subsequently formed. The matrix rail structures (122, 152, 150) can form a one-dimensional periodic array along the second horizontal direction hd2. Line trenches 149L extending along the first horizontal direction hd1 are present between the matrix rail structures (122, 152, 150).

Figure 30A:
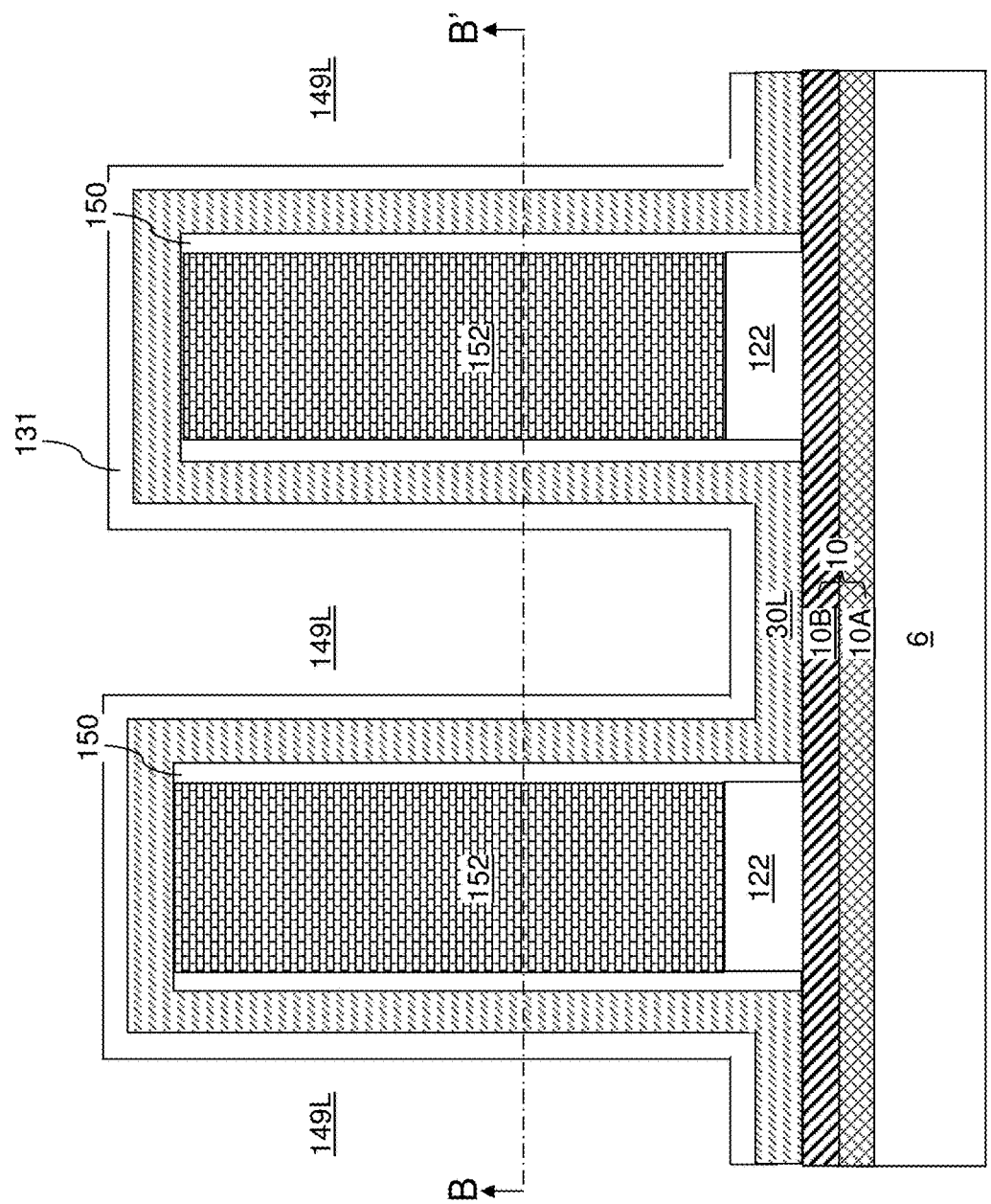
FIG. 30A is a vertical cross-sectional view of the third exemplary structure after formation of a semiconductor channel material layer and a sacrificial dielectric layer along the vertical plane A-A' in FIG. 30B according to the third embodiment of the present disclosure.
Figure 30B:
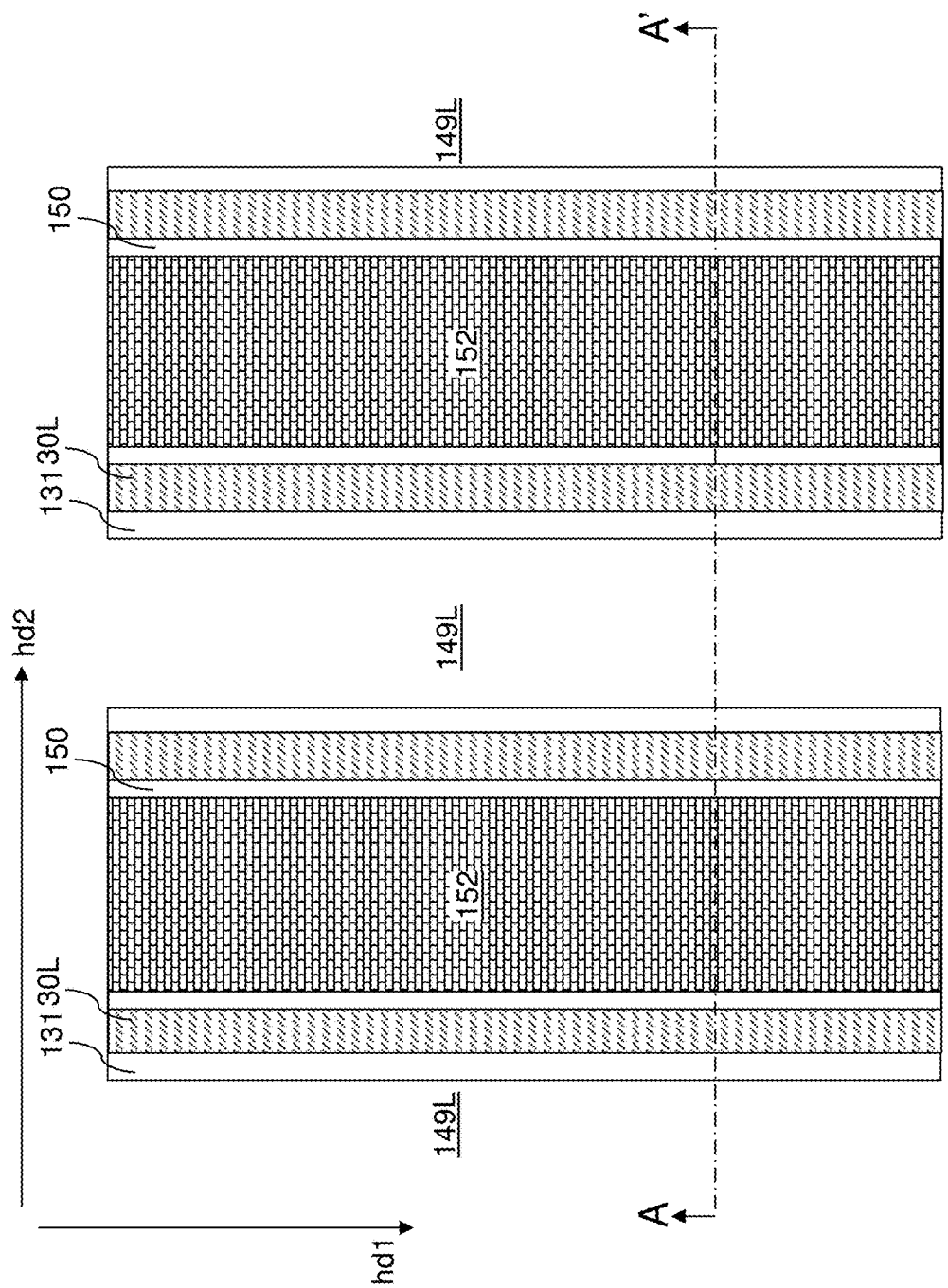
FIG. 30B is a horizontal cross-sectional view of the third exemplary structure of FIG. 30A.
Figure 31A:
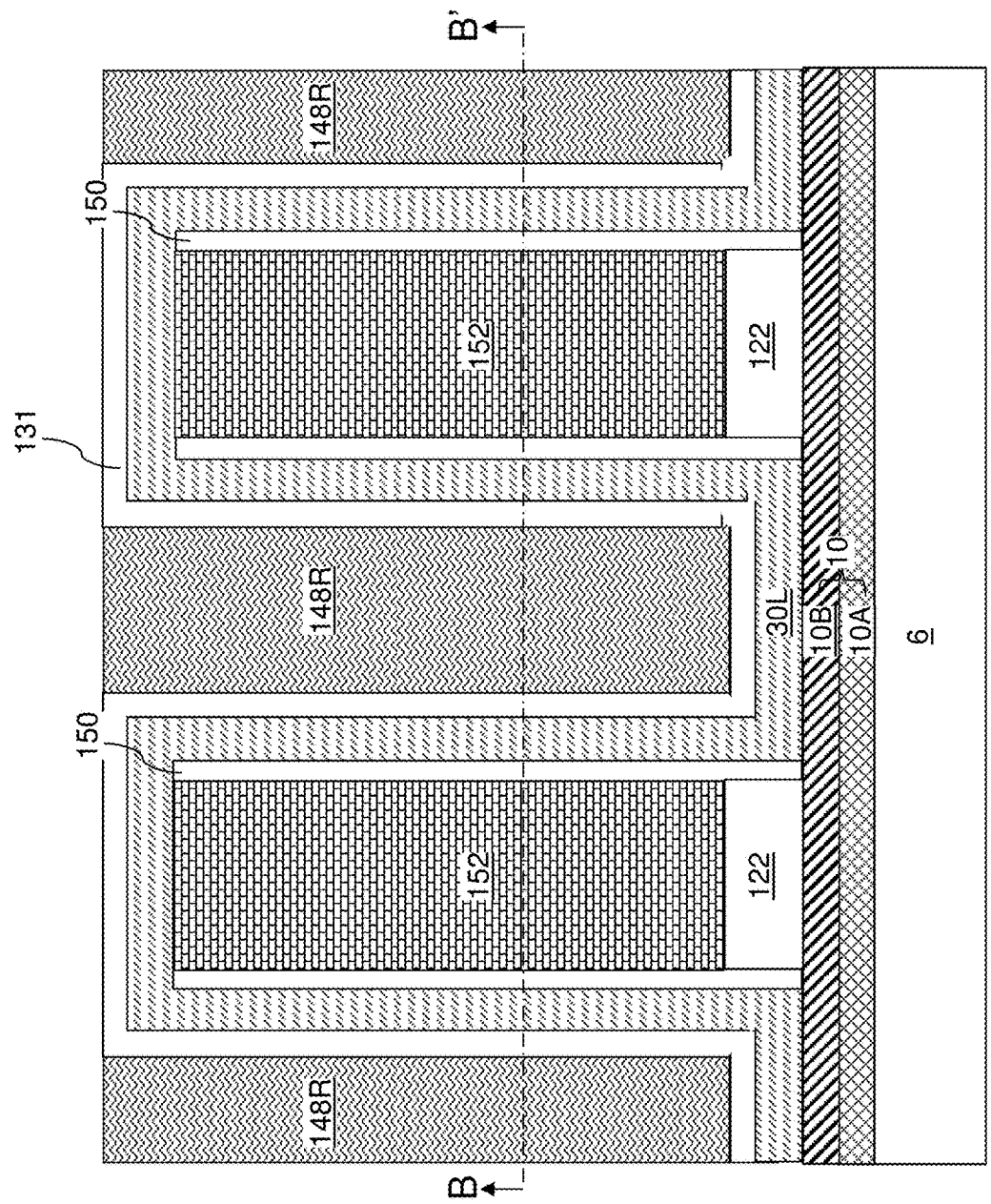
FIG. 31A is a vertical cross-sectional view of the third exemplary structure after formation of sacrificial fill line structures along the vertical plane A-A' in FIG. 31B according to the third embodiment of the present disclosure.
Figure 31B:
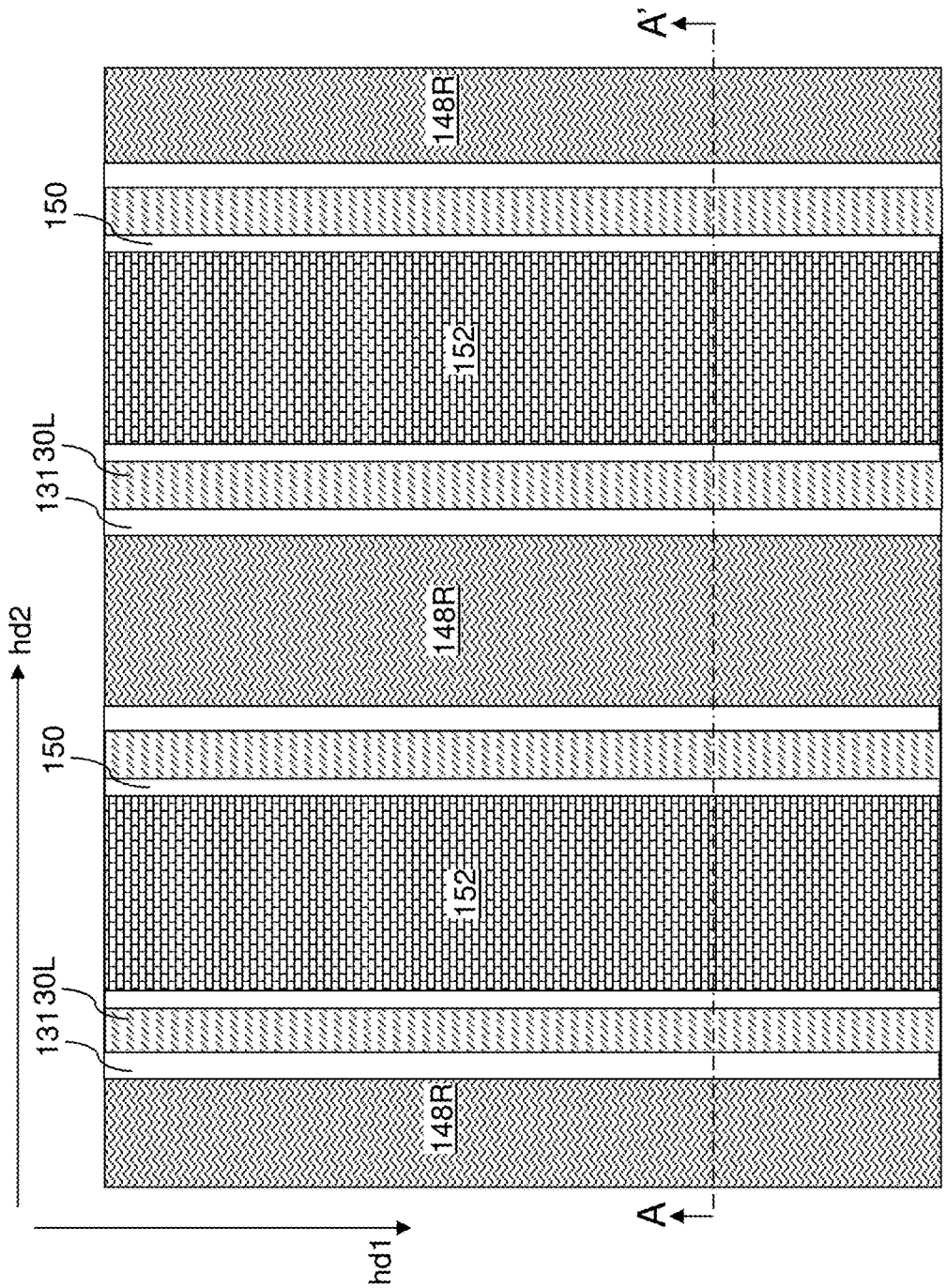
FIG. 31B is a horizontal cross-sectional view of the third exemplary structure of FIG. 31A.

Referring to FIGS. 30A and 30B, a semiconductor channel material layer 30L and a sacrificial dielectric layer 131 can be sequentially formed over the matrix rail structures (122, 152, 150). The semiconductor channel material layer 30L can be formed over the matrix rail structures (122, 152, 150) and on the entirety of the lengthwise sidewalls of the matrix rail structures (122, 152, 150). The semiconductor channel material layer 30L can be deposited by a conformal deposition method such as low pressure chemical vapor deposition (LPCVD) or plasma enhanced chemical vapor deposition (PECVD). The semiconductor channel material layer 30L can include the same material as in the first and second embodiments. The thickness of the semiconductor channel material layer 30L can be uniform throughout the entirety thereof, and can be in a range from 2 nm to 30 nm, such as from 3 nm to 10 nm, although lesser and greater thicknesses can also be employed. The thickness of the semiconductor channel material layer 30L may be selected to enable full depletion of vertical semiconductor channel strips during operation of the vertical field effect transistors.

The semiconductor channel material layer 30L can have a doping of second conductivity type that is the opposite of the first conductivity type. For example, if the first conductivity type is p-type, the second conductivity type is n-type, and vice versa. The dopant concentration in the semiconductor channel material layer 30L can be in a range from $1.0 \times 10^{15}/cm^3$ to $1.0 \times 10^{18}/cm^3$, although lesser and greater dopant concentrations can also be employed.

The sacrificial dielectric layer 131 can be formed over the semiconductor channel material layer 30L by a conformal or a non-conformal deposition process. The sacrificial dielectric layer 131 includes a dielectric material that can be subsequently removed selective to the semiconductor material of the semiconductor channel material layer 30L. For example, the sacrificial dielectric layer 131 can include silicon oxide. The thickness of the sacrificial dielectric layer 131 can be in a range from 3 nm to 30 nm, although lesser and greater thicknesses can also be employed.

At least one fill material is deposited in the line trenches 149L between the matrix rail structures (122, 152, 150). The spaces among the plurality of matrix rail structures (122, 152, 150) are filled with the at least one fill material after formation of the semiconductor channel material layer 30L. The at least one fill material may include a semiconductor material such as germanium or polysilicon. The at least one fill material is subsequently planarized to remove portions overlying the matrix rail structures (122, 152, 150). For example, a recess etch or chemical mechanical planarization (CMP) may be employed to planarized the at least one fill material. Each remaining portion of the at least one fill material constitutes a fill material line structure 148R, which are rail structures. Thus, each line trench 149L is filled with a fill material line structure 148R.

Figure 32A:
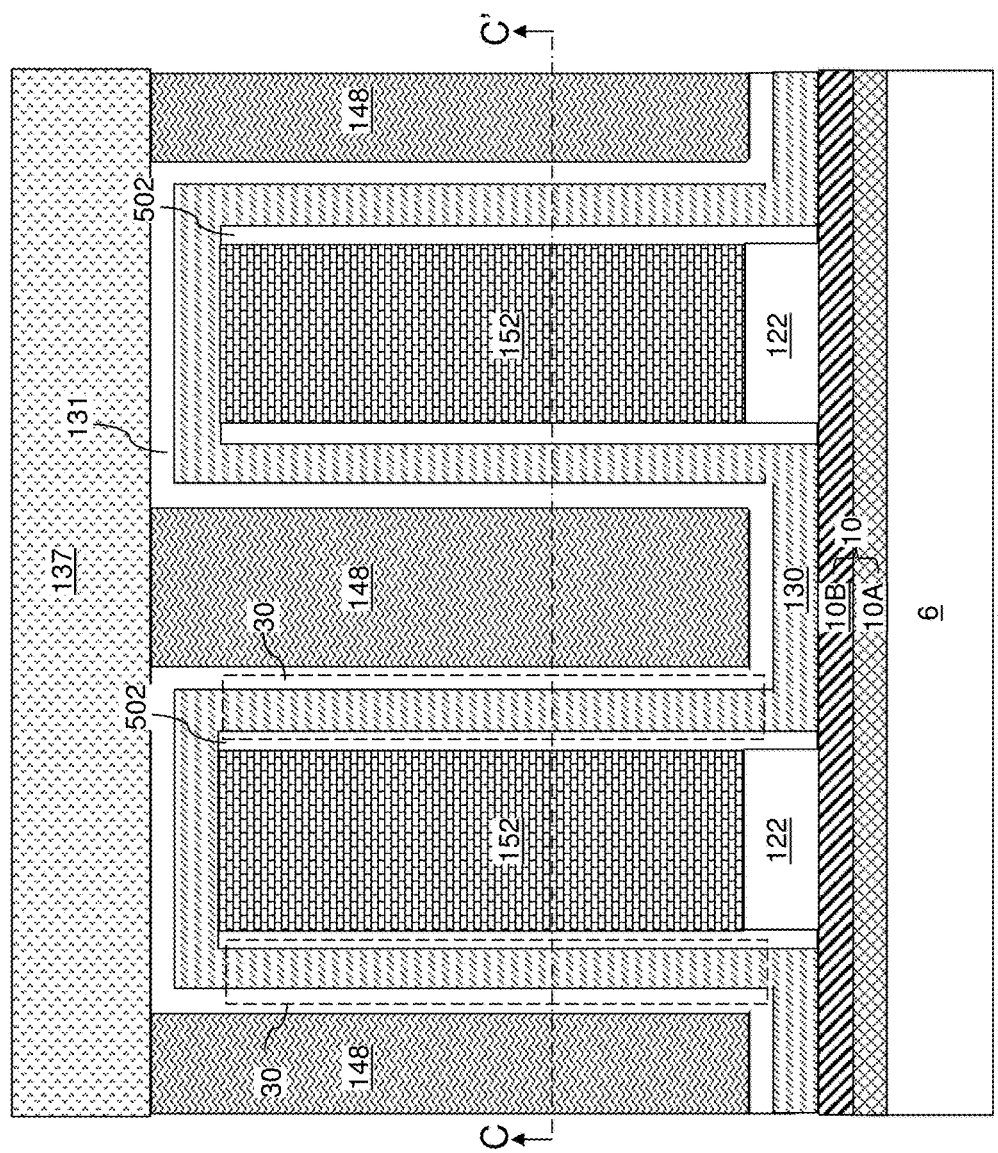
FIG. 32A is a vertical cross-sectional view of the third exemplary structure after formation of etch masks and isolation cavities along the vertical plane A-A' in FIG. 32C according to the first embodiment of the present disclosure.

Referring to FIGS. 32A-32C, etch masks 137 can be formed over the matrix rail structures (122, 152, 150) and the fill material line structures 148R. The plurality of etch masks 137 can laterally extend along the second horizontal direction hd2, and can be laterally spaced apart among one another along the first horizontal direction hd1. Each etch mask 137 can have a uniform thickness throughout. In one embodiment, the etch masks 137 can be patterned portions of a photoresist layer. In this case, the etch masks 137 can be formed, for example, by applying and lithographically patterning a photoresist layer. Alternatively, the etch masks 137 can be a hard mask layer that is patterned by transfer of a pattern in a patterned photoresist layer by an anisotropic etch.

The width of each etch mask 137 can be selected to be on the order of the width of vertical semiconductor channel strips to be subsequently formed underneath the etch mask 137. The spacing between each neighboring pair of etch masks 137 can be on the order of the spacing between a neighboring pair of vertical semiconductor channel strips to be subsequently formed. In one embodiment, the width of each etch mask 137 can be the same, and can be in a range from 20 nm to 600 nm, although lesser and greater widths can also be employed. In one embodiment, the spacing between neighboring pairs of etch mask 137 can be the same, and can be in a range from 20 nm to 600 nm, although lesser and greater spacings can also be employed.

Subsequently, portions of the fill material line structures 148R and portions of the semiconductor channel material layer 30L are removed from within areas that are not covered by the plurality of etch masks 137. Specifically, an anisotropic etch can be performed to remove the material of the fill material line structures 148R selective to the sacrificial dielectric layer 131 employing the etch masks 137 semiconductor channel material layer structure. Isolation cavities 149 are formed in each volume of the fill material line structures 148R that are not covered by the etch masks 137. Each remaining portion of the fill material line structures 148R constitutes a fill material pillar structure 148.

Subsequently, a first isotropic etch process can be performed to remove portions of the sacrificial dielectric layer 131 that are physically exposed to the isolation cavities 49, i.e., to remove portions of the sacrificial dielectric layer 131 that are not covered by the etch masks 137. For example, if the sacrificial dielectric layer 131 include silicon oxide, a wet etch employing hydrofluoric acid can be employed to remove portions of the sacrificial dielectric layer 131 located between areas covered by the etch masks 137.

A second isotropic etch process can be performed to remove portions of the semiconductor channel material layer that are not covered by the etch masks 137. For example, if the semiconductor channel material layer 30L include polysilicon, a wet etch employing a KOH solution can be employed to remove portions of the semiconductor channel material layer 30L located between areas covered by the etch masks 137. Each remaining discrete portion of the semiconductor channel material layer constitutes a semiconductor channel material strip 130 that extends along the second horizontal direction hd2 and over multiple matrix rail structures (122, 152, 150). Each semiconductor channel material strip 130 includes a plurality of vertical semiconductor channel strips 30, which are vertical portions of the semiconductor channel material strip 130.

Each semiconductor channel material strip 130 includes horizontal portions and vertical portions. Each vertical portion of a semiconductor channel material strip 130 includes a vertical semiconductor channel strip of vertical field effect transistors to be subsequently formed. Specifically, each vertical portion of a semiconductor channel material strip 130 between the two horizontal planes including the top surfaces of the inner gate electrode rails 152 and the bottom surfaces of the inner gate electrode rails 152 constitutes a vertical semiconductor channel strip.

Thus, the semiconductor channel material layer 30L can be patterned into a plurality of semiconductor channel material strips 130 straddling multiple matrix rail structures (122, 152, 150). The plurality of semiconductor channel material strips 130 can form a one-dimensional array that is repeated along the first horizontal direction hd1. Each semiconductor channel material strip 130 can overlie a respective bottom electrode line 10. Portions of the lengthwise sidewalls of the multiple matrix rail structures (122, 152, 150) are physically exposed to isolation cavities 149 between each neighboring pair of etch masks 137.

A third isotropic etch can be performed to etch physically exposed portions of the straight-sidewalled gate dielectric layer 150. Each straight-sidewalled gate dielectric layer 150 can be divided into straight-sidewalled gate dielectrics, which are herein referred to as inner gate dielectrics 502. Each inner gate dielectric 502 is free of lateral undulation.

Figure 33A:
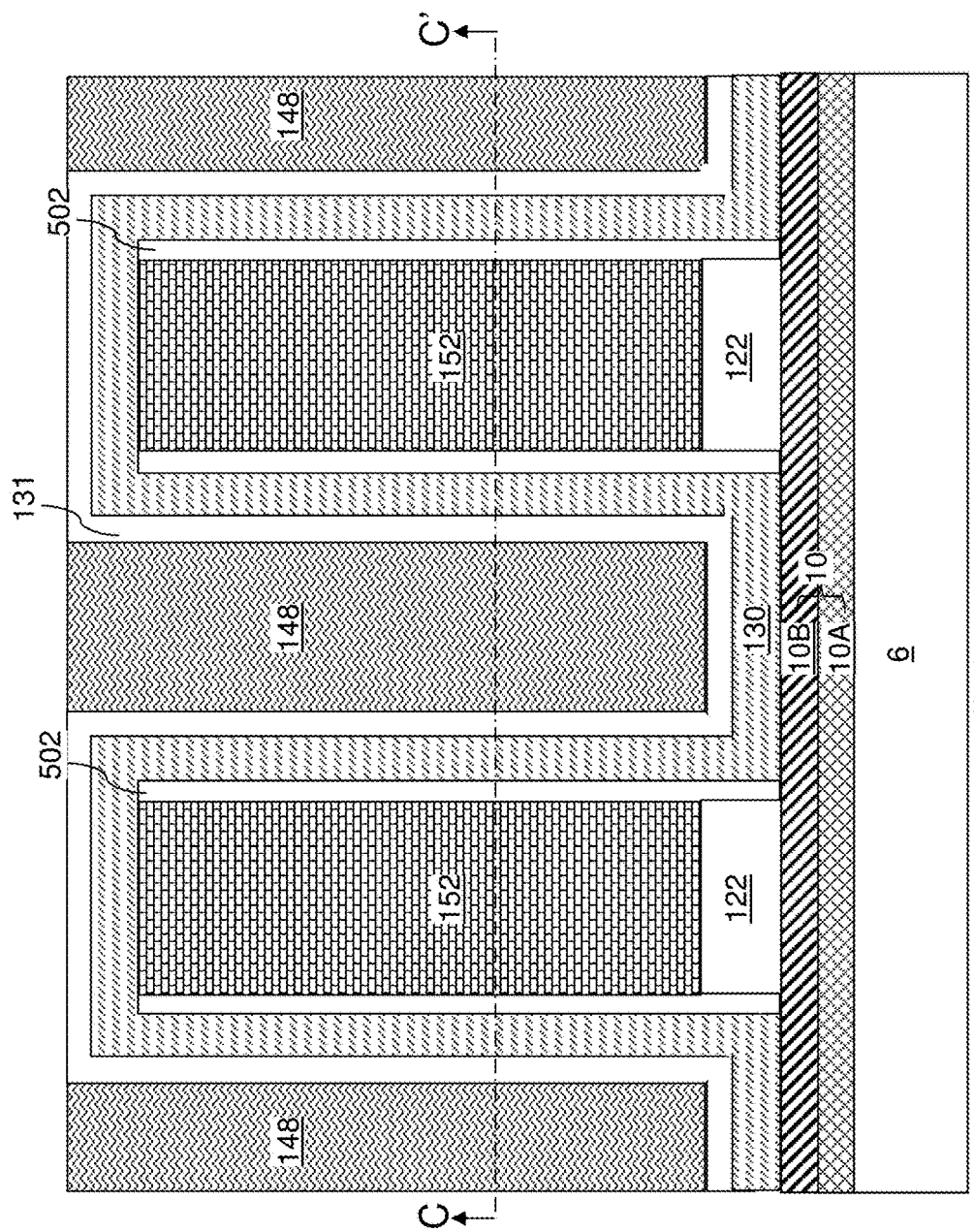
FIG. 33A is a vertical cross-sectional view of the third exemplary structure after formation of sacrificial protection structures along the vertical plane A-A' in FIG. 33C according to the first embodiment of the present disclosure.
Figure 33B:
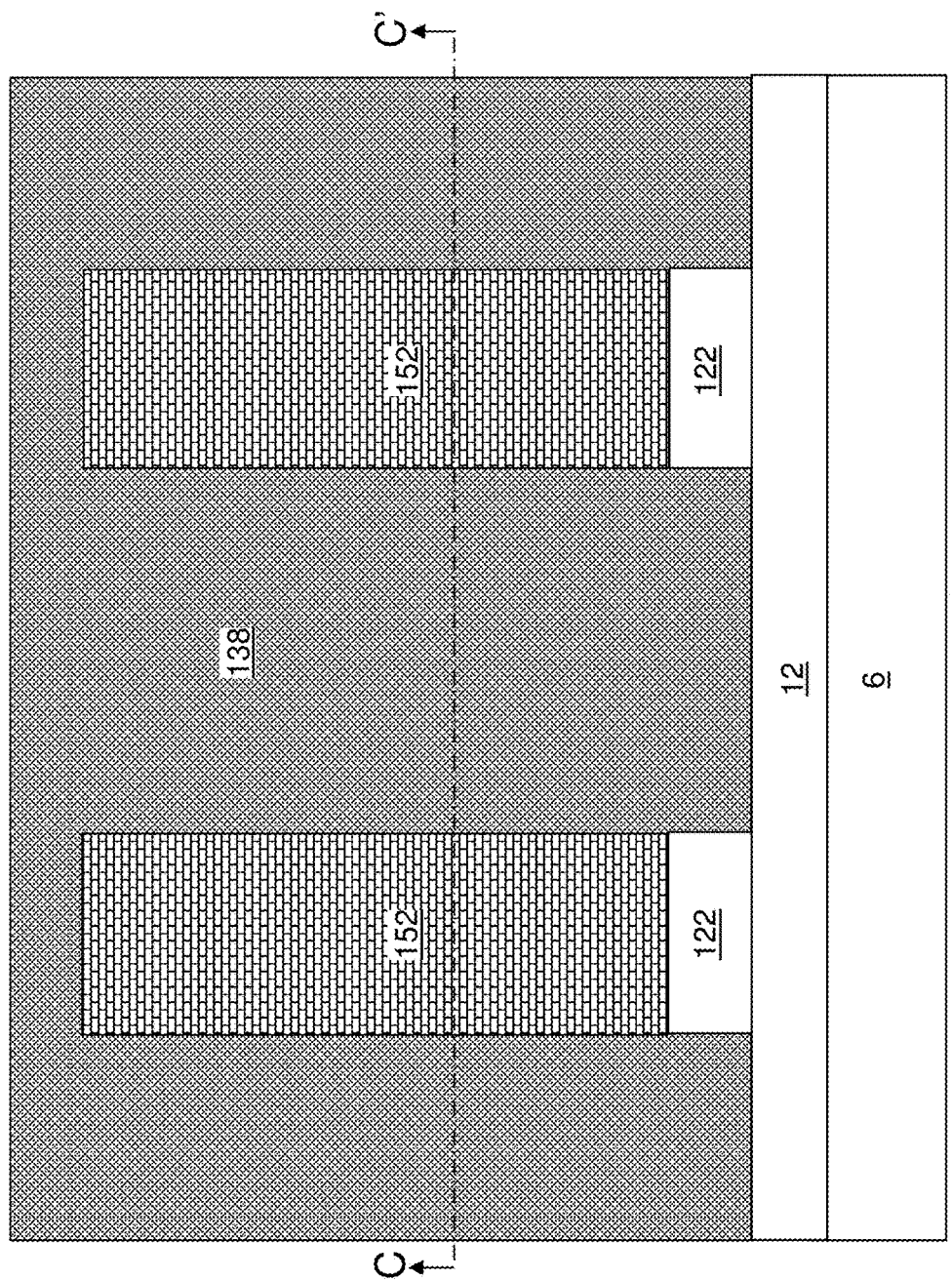
FIG. 33B is a vertical cross-sectional view of the third exemplary structure of FIG. 33A along the vertical plane B-B' in FIG. 33C.
Figure 33C:
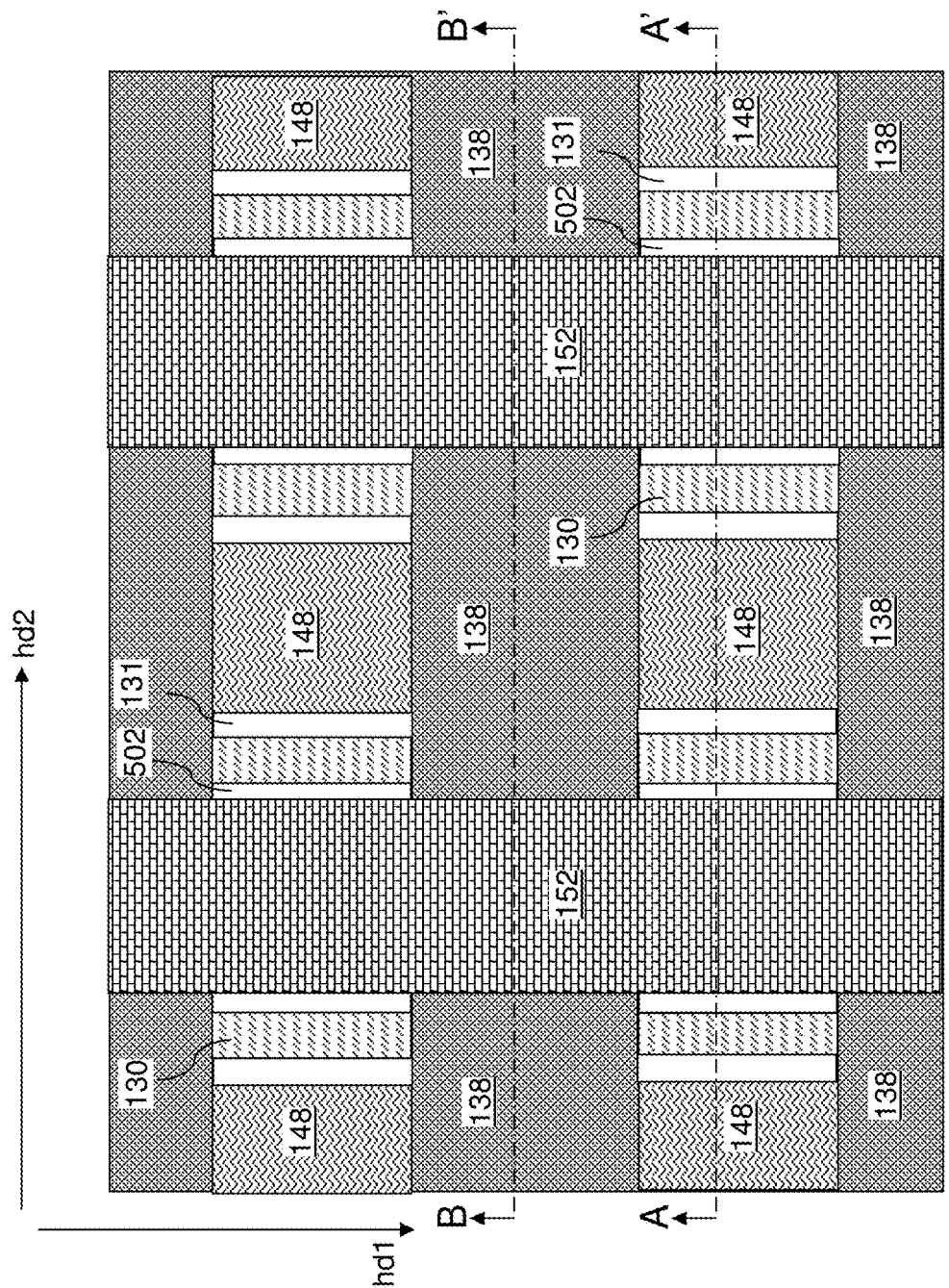
FIG. 33C is a vertical cross-sectional view of the third exemplary structure along the horizontal plane C-C' in FIGS. 33A and 33B.

Referring to FIGS. 33A-33C, the etch masks 137 can be removed selective to the composite rail structures (122, 152), for example, by ashing. A sacrificial material different from the materials of the composite rail structures (122, 152) and the semiconductor channel material strips 130 can be deposited in the isolation cavities 149, and excess portions of the sacrificial material can be removed from above the composite rail structures (122, 152). For example, the sacrificial material may be removed by a planarization process (such as chemical mechanical planarization or a recess etch) employing one of the material portions selected from the topmost portions of the sacrificial dielectric layer 131, topmost portions of the semiconductor channel material strips 130, and topmost portions of the composite rail structures (122, 152). Remaining portions of the sacrificial material form sacrificial protection structures 138 that fill each isolation cavity 149. In one embodiment, the sacrificial protection structures 138 can include silicon nitride. The sacrificial protection structures 138 protect the inner gate dielectrics 502 during subsequent removal of the fill material pillar structures 148 and the sacrificial dielectric liners 131.

Figure 34C:
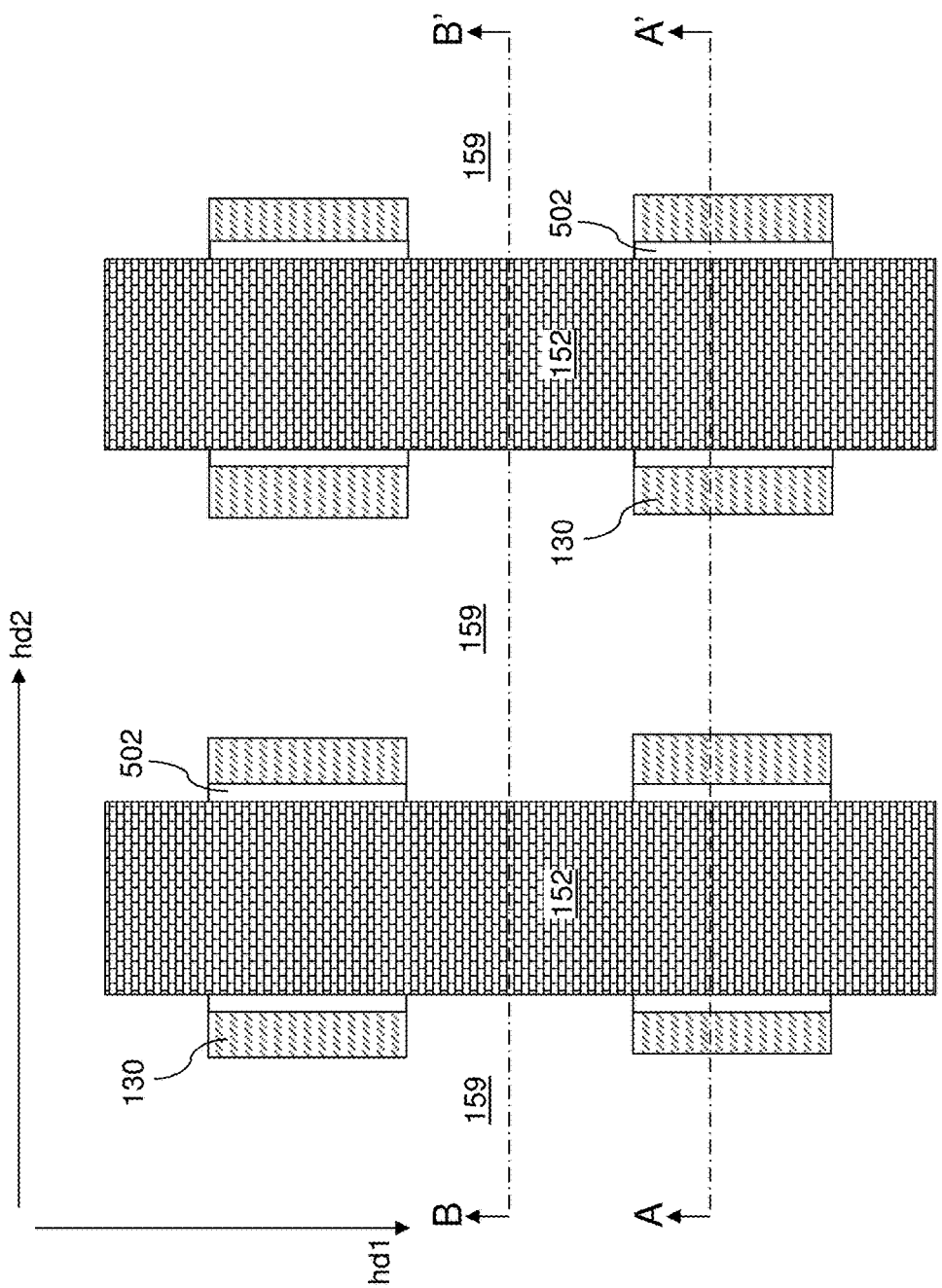
FIG. 34C is a horizontal cross-sectional view of the third exemplary structure of FIGS. 34A and 34B along the horizontal plane C-C' in FIGS. 34A and 34B.

Referring to FIGS. 34A-34C, the fill material pillar structures 148 can be removed selective to the sacrificial protection structures 138. For example, if the fill material pillar structures 148 include polysilicon, a wet etch employing KOH may be employed to remove the fill material pillar structures 148 selective to the sacrificial protection structures 138. Subsequently, the sacrificial dielectric liners 131 and the sacrificial protection structures 138 can be removed. Removal of the sacrificial protection structures 138 may be performed after, or prior to, removal of the sacrificial dielectric liners 131. If the sacrificial dielectric liners 131 include silicon oxide, a wet etch employing hydrofluoric acid can be employed to remove the sacrificial dielectric liners 131 selective to the semiconductor channel material strips 130. If the sacrificial protection structures 138 include silicon nitride, a wet etch employing hot phosphoric acid can be employed to remove the sacrificial protection structures 138.

A laterally-undulating gate electrode trench 159 is formed between each neighboring pair of composite rail structures (122, 152). Each laterally-undulating gate electrode trench 159 includes a pair of laterally-undulating sidewalls that include physically exposed surfaces of the composite rail structures (122, 152) and the semiconductor channel material strips 130.

Figure 35A:
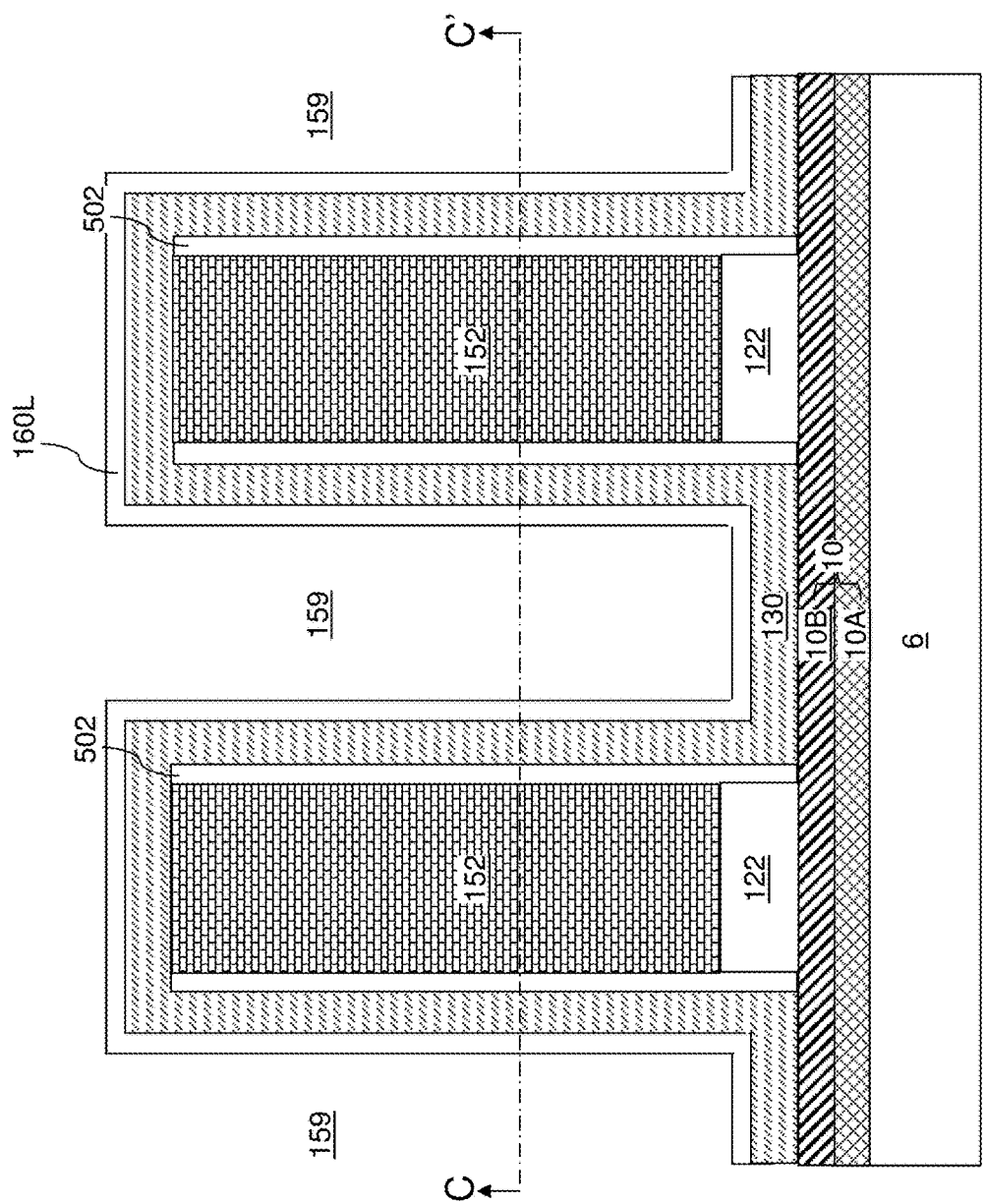
FIG. 35A is a vertical cross-sectional view of the third exemplary structure after formation of an outer gate dielectric layer along the vertical plane A-A' in FIG. 35C according to the third embodiment of the present disclosure.
Figure 35C:
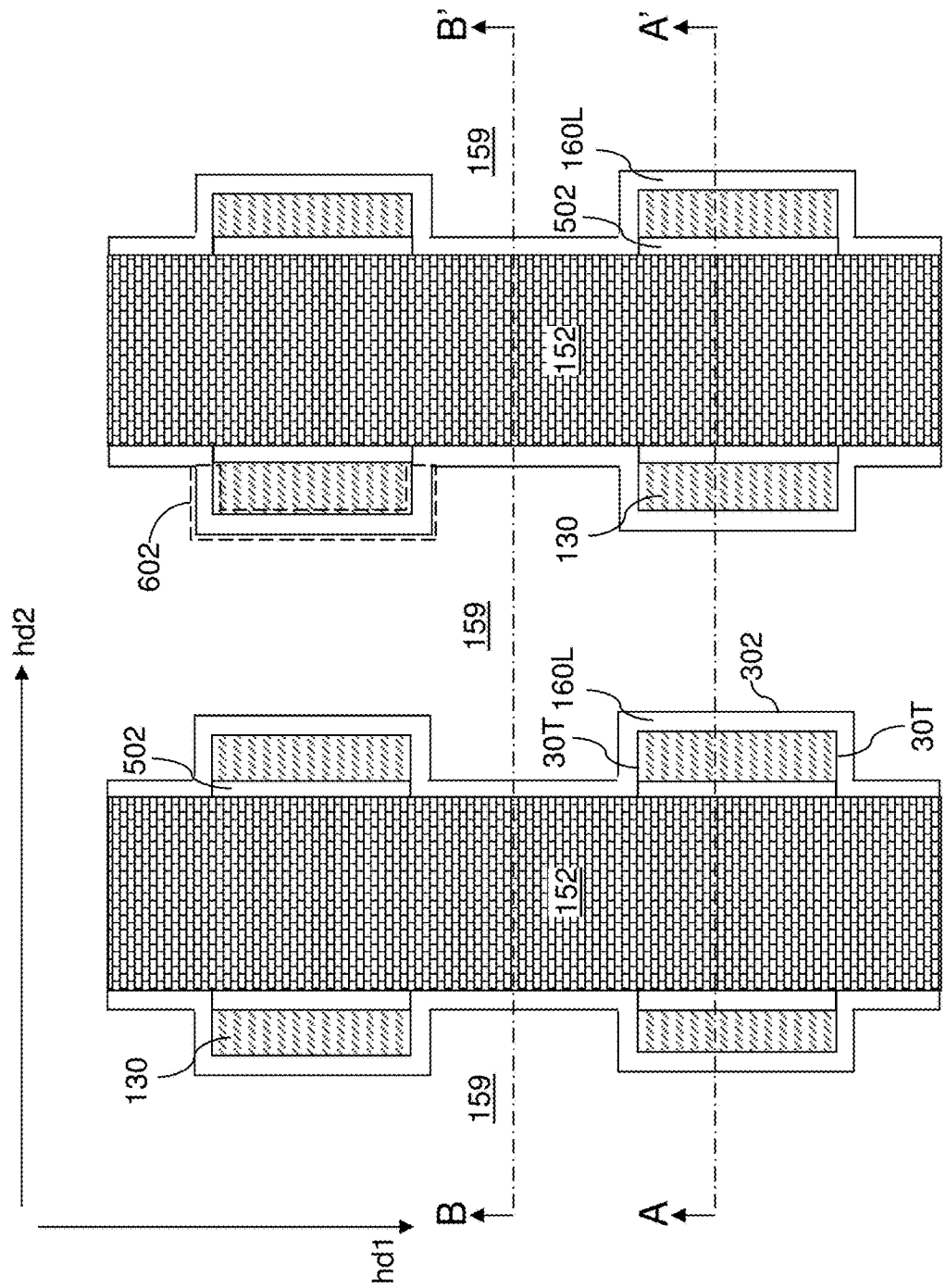
FIG. 35C is a horizontal cross-sectional view of the third exemplary structure of FIGS. 35A and 35B along the horizontal plane C-C' in FIGS. 35A and 35B.

Referring to FIGS. 35A-35C, a laterally-undulating gate dielectric layer 160L can be formed by deposition of a continuous dielectric material layer and/or thermal oxidation and/or nitridation of surface portions of the semiconductor channel material strips 130. The laterally-undulating gate dielectric layer 160L includes laterally-undulating sidewalls such as a sidewall (or a set of sidewalls) that includes physically exposed portions of a lengthwise sidewall of a composite rail structure (122, 152) and the physically exposed sidewalls of the semiconductor channel material strips 130 located directly on the lengthwise sidewall, or a sidewall that is exposed to a laterally-undulating gate electrode trench 159. The laterally-undulating sidewalls of the laterally-undulating gate dielectric layer 160L generally extend along the first horizontal direction hd1, and have lateral shifts or "jogs" along the second horizontal direction hd2. In this embodiment, the laterally-undulating gate dielectric layer 160L is an outer gate dielectric layer that includes outer gate dielectrics for field effect transistors to be subsequently formed.

While the present disclosure is described employing an embodiment in which the laterally-undulating gate dielectric layer 160L is formed as a continuous dielectric material layer, embodiments are expressly contemplated in which the laterally-undulating gate dielectric layer 160L is formed as discrete dielectric material portions formed by oxidation and/or nitridation of surface portions of the vertical semiconductor channel strips 30. The laterally-undulating gate dielectric layer 160L can be formed directly on the second sidewall 302 and the two transverse sidewalls 30T of each of the plurality of vertical semiconductor channel strips 30 and on portions of the lengthwise sidewalls 252 of the matrix rail structures (21, 23, 25). Each portion of the laterally-undulating gate dielectric layer 160L that is formed on the second sidewalls 302 and the transverse sidewalls 30T of the vertical semiconductor channel strips 30 constitutes an outer gate dielectric 602, which can be clam-shaped. The laterally-undulating gate dielectric layer 160L can include silicon oxide and/or a dielectric metal oxide (such as aluminum oxide), and can have a thickness in a range from 1 nm to 10 nm, although lesser and greater thicknesses can also be employed.

Figure 36A:
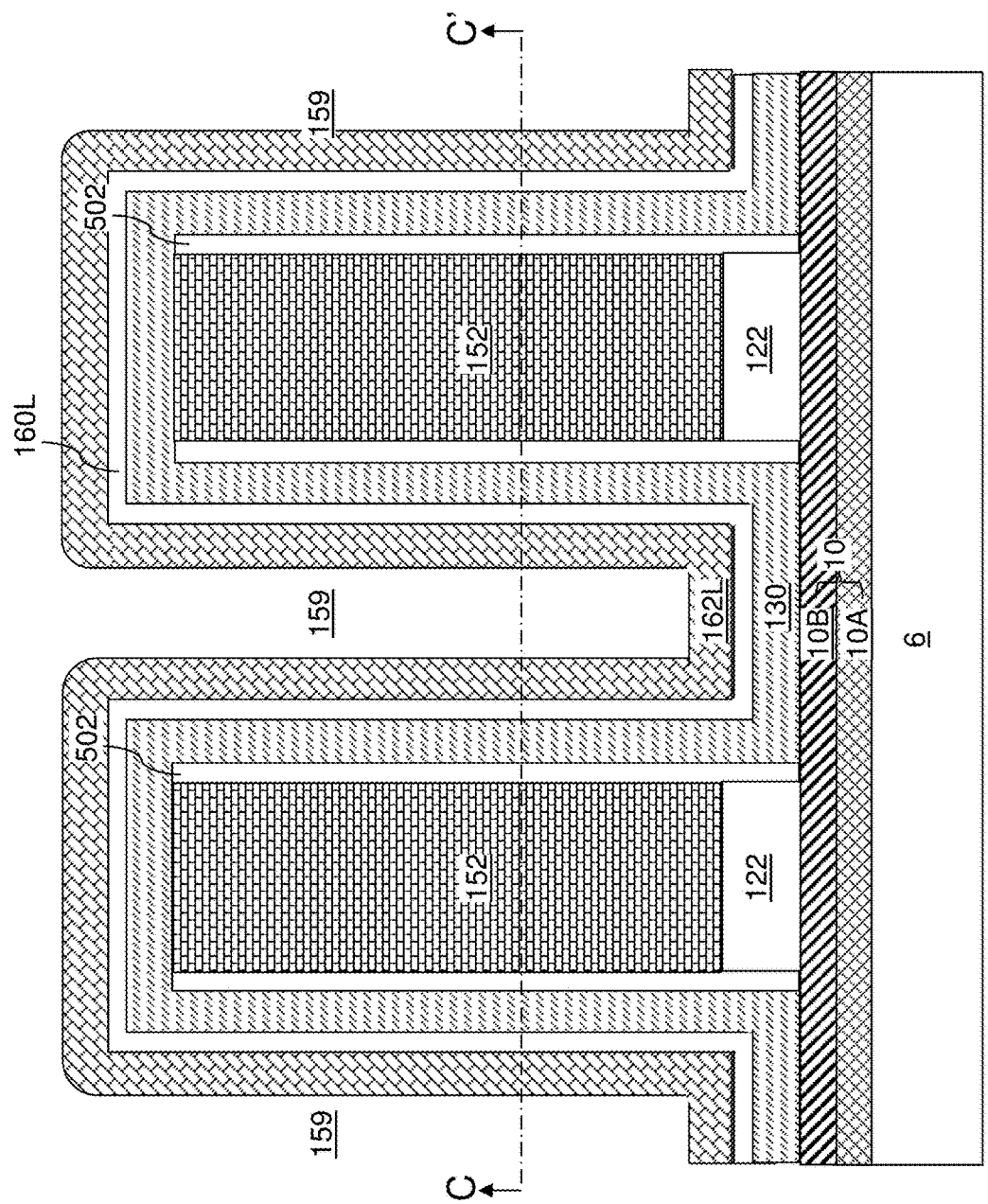
FIG. 36A is a vertical cross-sectional view of the third exemplary structure after formation of a laterally-undulating gate electrode layer along the vertical plane A-A' in FIG. 36C according to the third embodiment of the present disclosure.
Figure 36B:
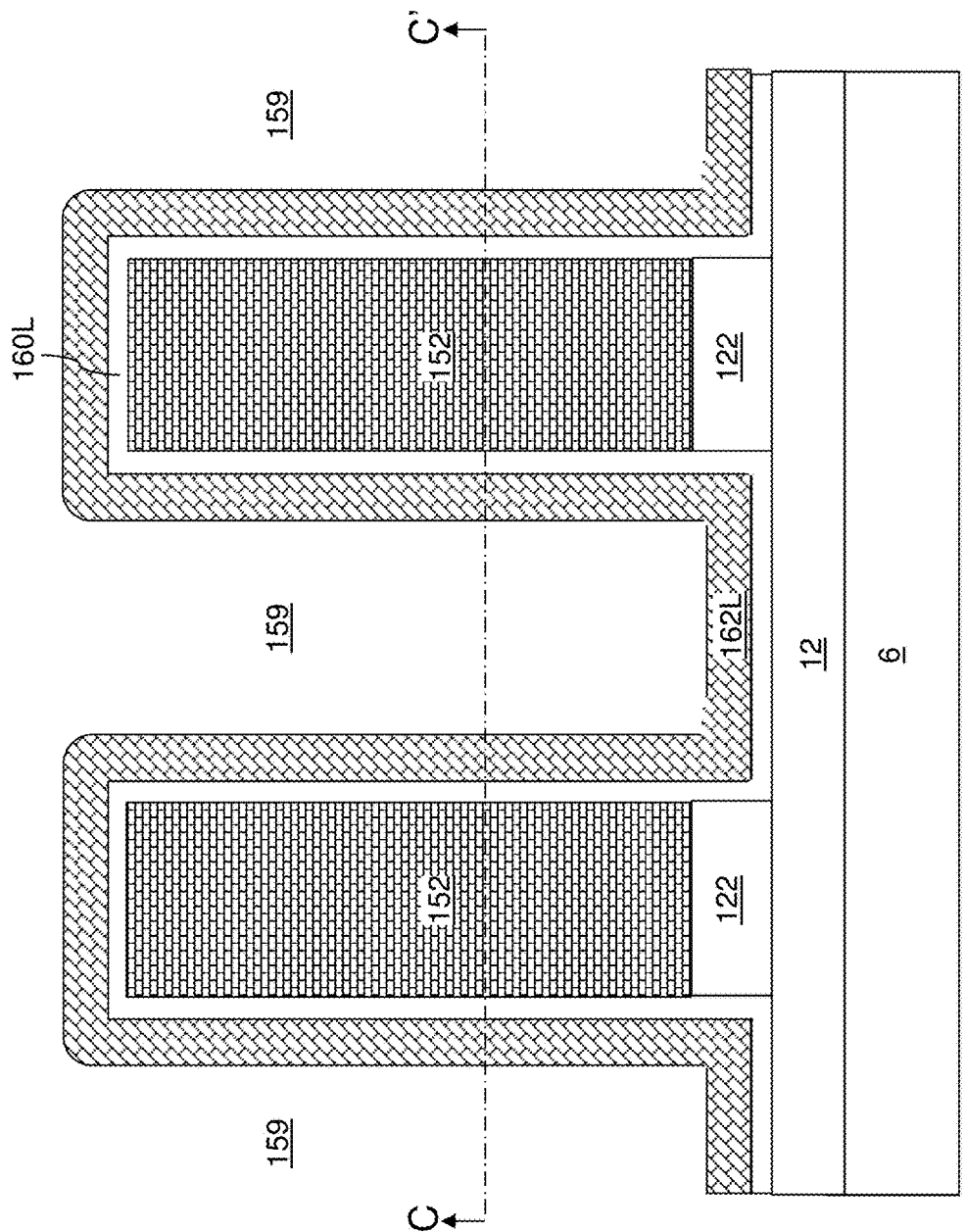
FIG. 36B is a vertical cross-sectional view of the third exemplary structure of FIG. 36A along the vertical plane B-B' in FIG. 36C according to the third embodiment of the present disclosure.
Figure 36C:
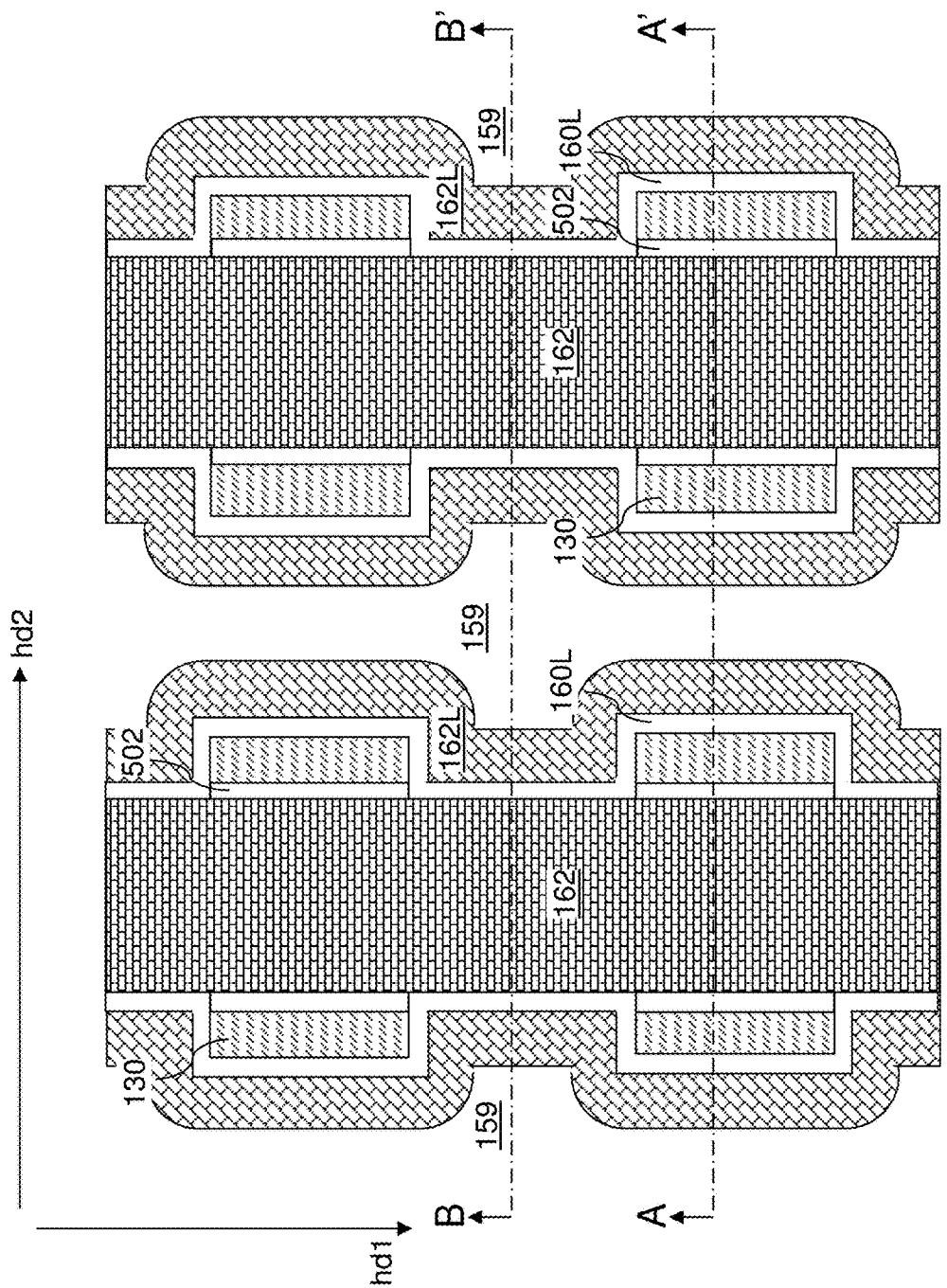
FIG. 36C is a horizontal cross-sectional view of the third exemplary structure of FIGS. 36A and 36B along the horizontal plane C-C' in FIGS. 36A and 36B.

Referring to FIGS. 36A-36C, a laterally-undulating gate electrode layer 162L can be formed on the laterally-undulating gate dielectric layer 160L. The laterally-undulating gate electrode layer 162L includes laterally-undulating sidewalls such as a continuous set of vertical interfaces with the laterally-undulating gate dielectric layer 160L that generally extends along the first horizontal direction hd1 includes lateral shifts or lateral jogs of alternating opposite directions along (or against) the second horizontal direction hd2. The laterally-undulating gate electrode layer 162L can be an outer gate electrode layer. The laterally-undulating gate electrode layer 162L can include a metallic material such as titanium nitride, tantalum nitride, tungsten nitride, tungsten, titanium, tantalum, cobalt, ruthenium, an alloy thereof, and/or a layer stack thereof. In one embodiment, the laterally-undulating gate electrode layer 162L can include a layer of titanium nitride. Alternatively or additionally, the laterally-undulating gate electrode layer 162L can include a doped semiconductor material such as doped polysilicon. The thickness of the laterally-undulating gate electrode layer 162L can be in a range from 2 nm to 200 nm, although lesser and greater thicknesses can also be employed. The laterally-undulating gate electrode layer 162L can be formed by a conformal deposition process such as chemical vapor deposition (CVD) or atomic layer deposition (ALD). The laterally-undulating gate electrode trenches 159 can have a lesser width in a region between an adjacent pair of vertical semiconductor channel strips 30 than in a region between a pair of interfaces between the laterally-undulating gate dielectric layer 160L and a neighboring pair of composite rail structures (122, 152).

Figure 37A:
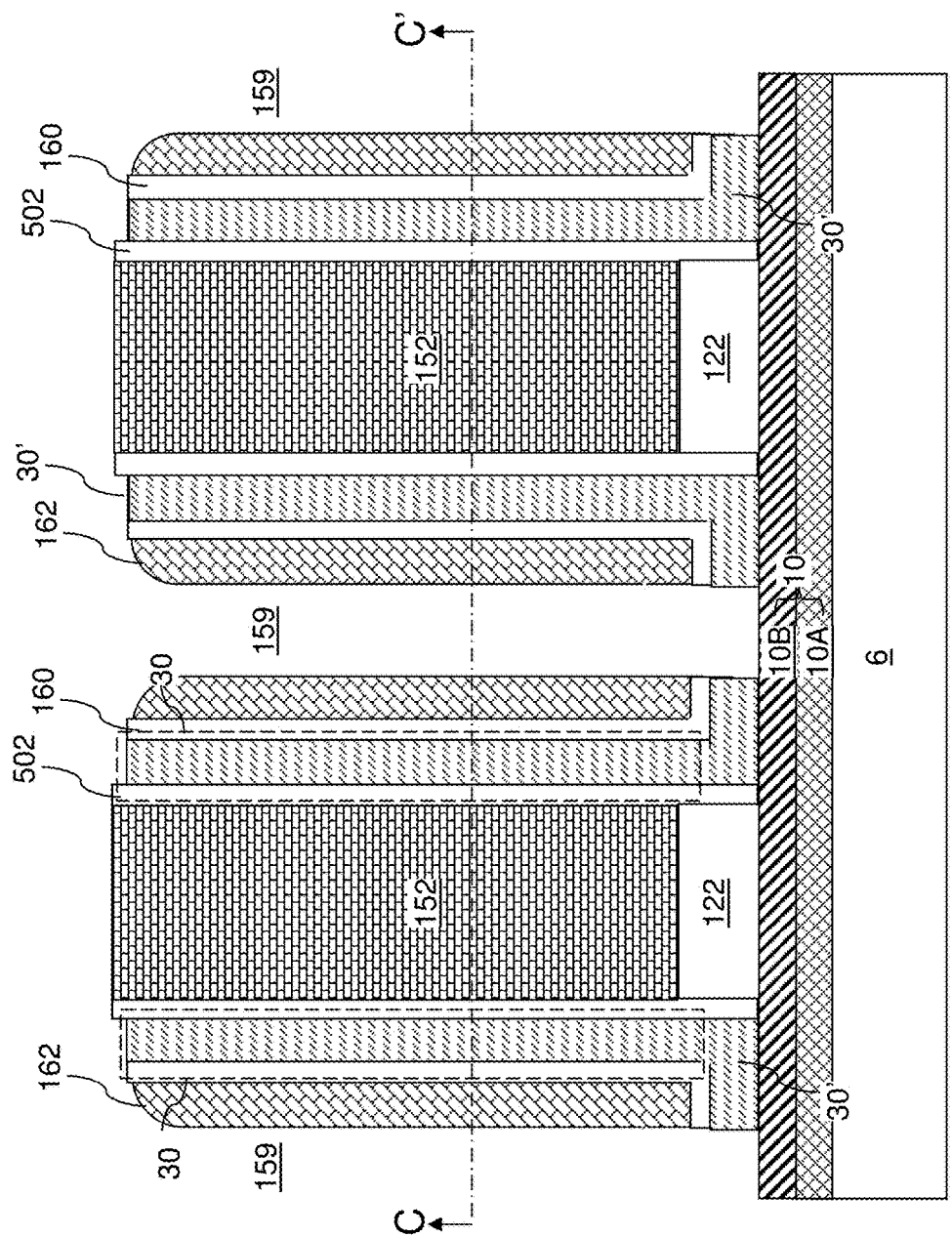
FIG. 37A is a vertical cross-sectional view of the third exemplary structure after formation of outer gate electrode lines along the vertical plane A-A' in FIG. 37C according to the third embodiment of the present disclosure.
Figure 37B:
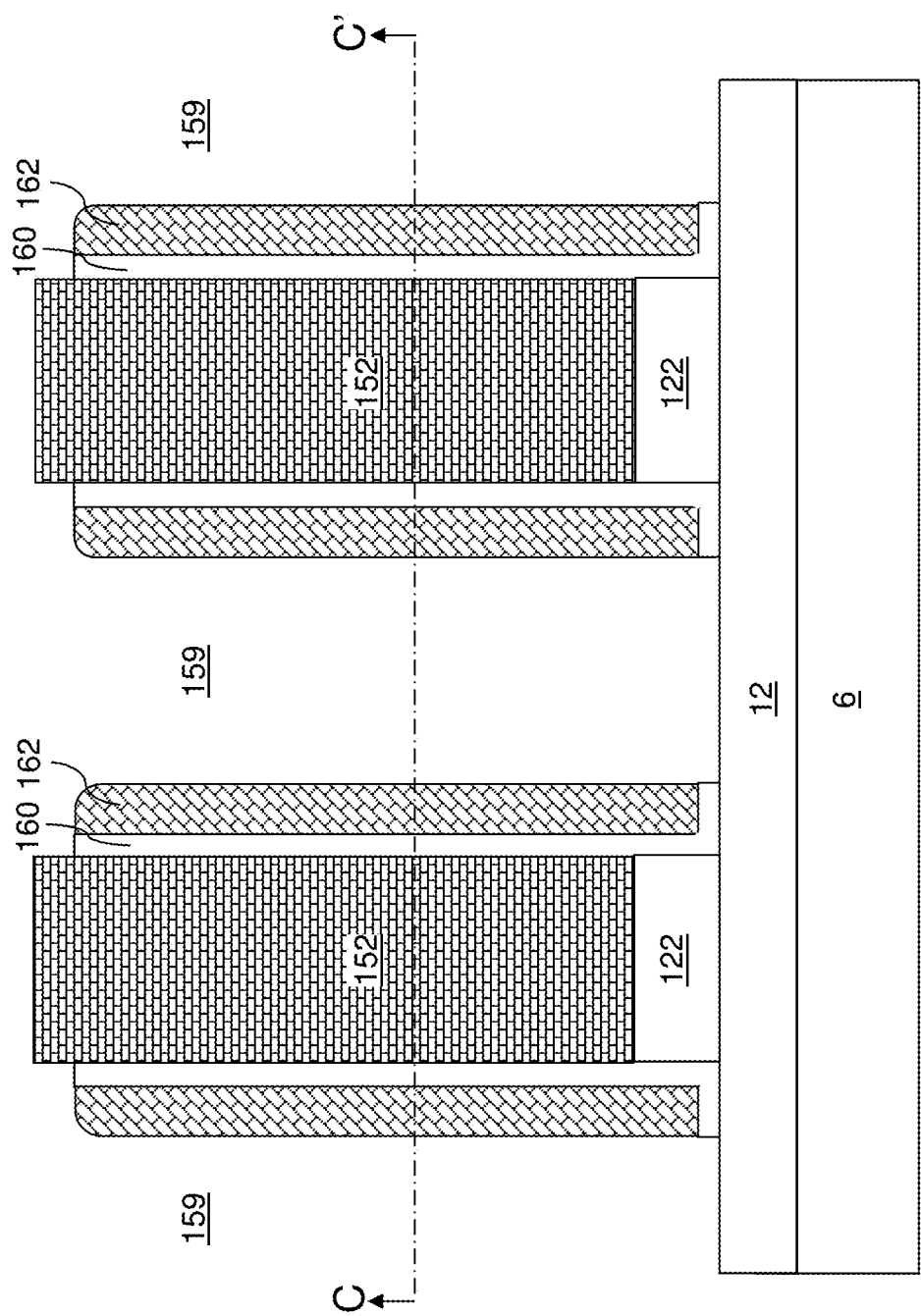
FIG. 37B is a vertical cross-sectional view of the third exemplary structure of FIG. 37A along the vertical plane B-B' in FIG. 37C according to the third embodiment of the present disclosure.
Figure 37C:
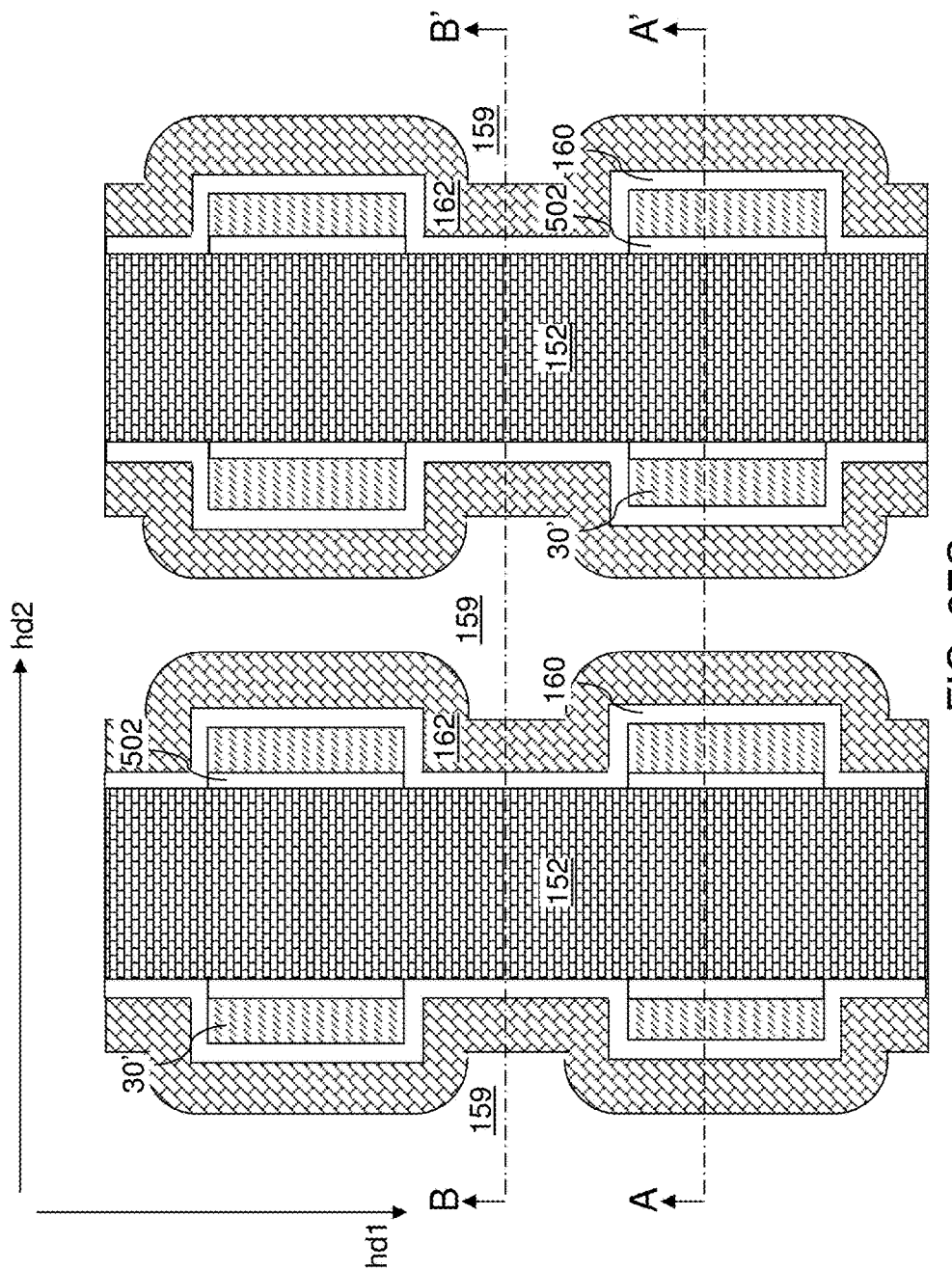
FIG. 37C is a horizontal cross-sectional view of the third exemplary structure of FIGS. 37A and 37B along the horizontal plane C-C' in FIGS. 37A and 37B.

Referring to FIGS. 37A-37C, at least one anisotropic etch process is performed, which etches horizontal portions of the laterally-undulating gate electrode layer 162L, the laterally-undulating gate dielectric layer 160L, and the semiconductor channel material strips 130. Each remaining portion of the laterally-undulating gate electrode layer 162L forms a gate electrode, which is adjacent to an outer sidewall of a set of vertical semiconductor channel strips 30, and is therefore, referred to as an outer gate electrode line 162. Each outer gate electrode line 162 is a laterally-undulating gate electrode line. Each remaining portion of the laterally-undulating gate dielectric layer 160L is an outer gate dielectric layer 160, which is a laterally-undulating structure including a pair of laterally-undulating sidewalls. Each remaining portion of the semiconductor channel material strips 130 constitutes an L-shaped semiconductor channel strip 30' that includes a vertical portion (which is a vertical semiconductor channel strip 30) and a horizontal portion adjoined to the vertical portion.

On overetch can be performed to vertically recess the top surfaces of the outer gate electrode lines 162 so that the top surfaces of the outer gate electrode lines 162 after the overetch can be approximately at the height at which p-n junctions between the vertical semiconductor channel strips 30 of final vertical field effect transistor structures and top active regions of the final vertical field effect transistor structures.

The semiconductor device can comprise multiple instances of a vertical field effect transistor that are spaced apart along the first horizontal direction. Multiple instances of a vertical field effect transistor can be provided around each matrix rail structure (122, 152, 150) as provided at the processing steps of FIGS. 29A and 29B such that the multiple instances are spaced apart along the first horizontal direction hd1. Each instance of the vertical field effect transistor can include an inner gate electrode which is a portion of an inner gate electrode rail 152. A pair of outer gate electrodes can contact a respective one of a pair of outer gate dielectrics of a vertical field effect transistor. Each of the pair of outer gate electrodes of the multiple instances of the vertical field effect transistor can be a respective portion of a pair of outer gate electrode lines 162 that is shared among each of the multiple instances of the vertical field effect transistor. In one embodiment, each of the pair of outer gate electrode lines 162 laterally extends generally along the first horizontal direction hd1 through each of the multiple instances of the vertical field effect transistor with bends at instances of the lateral jogs of the pair of outer gate dielectric layers 160. The multiple instances of the vertical field effect transistor can be repeated along the second direction hd2 to form a two-dimensional array of vertical field effect transistors.

Figure 38A:
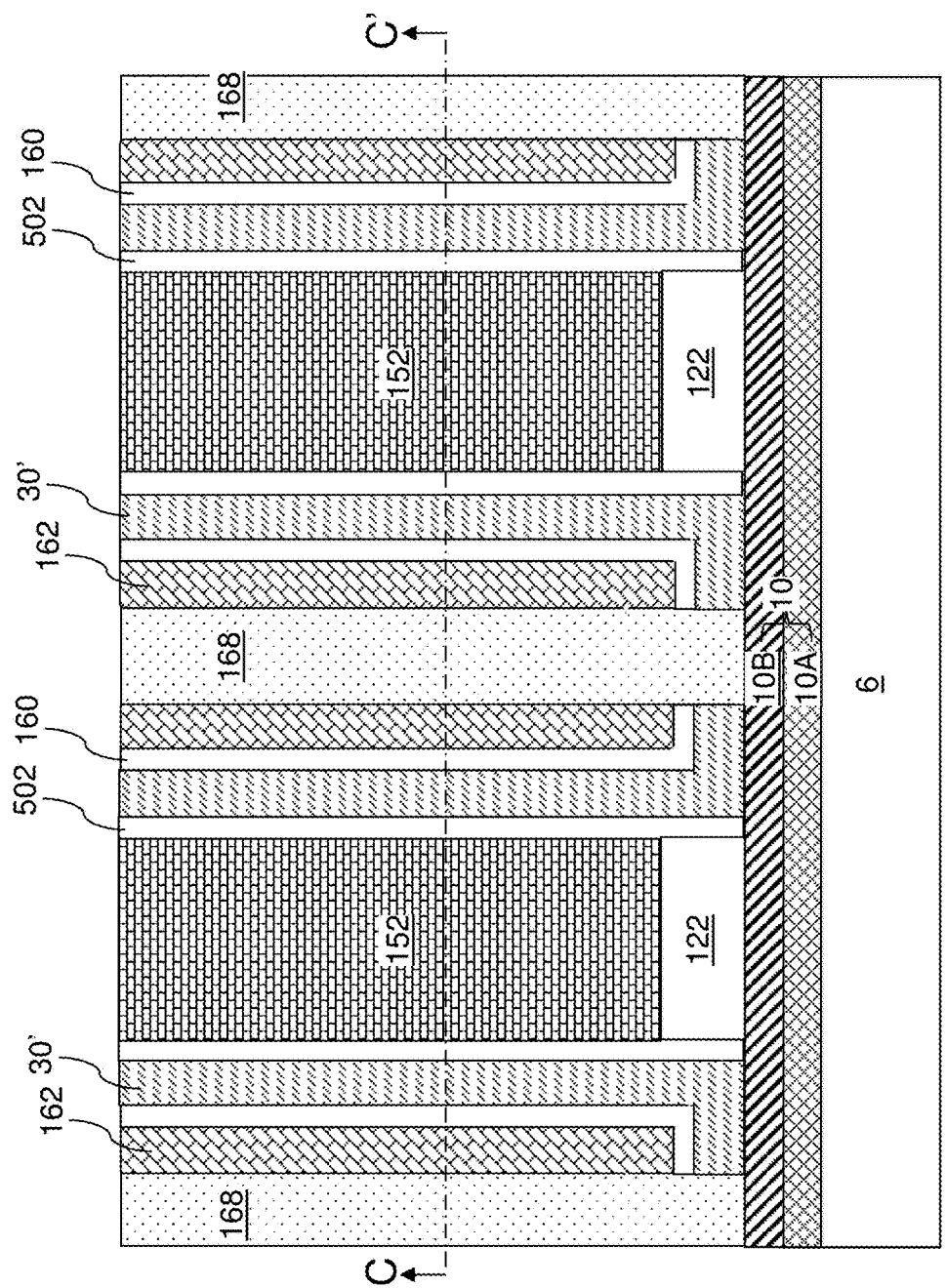
FIG. 38A is a vertical cross-sectional view of the third exemplary structure after deposition of a dielectric material and a planarization process along the vertical plane A-A' in FIG. 38C according to the third embodiment of the present disclosure.
Figure 38B:
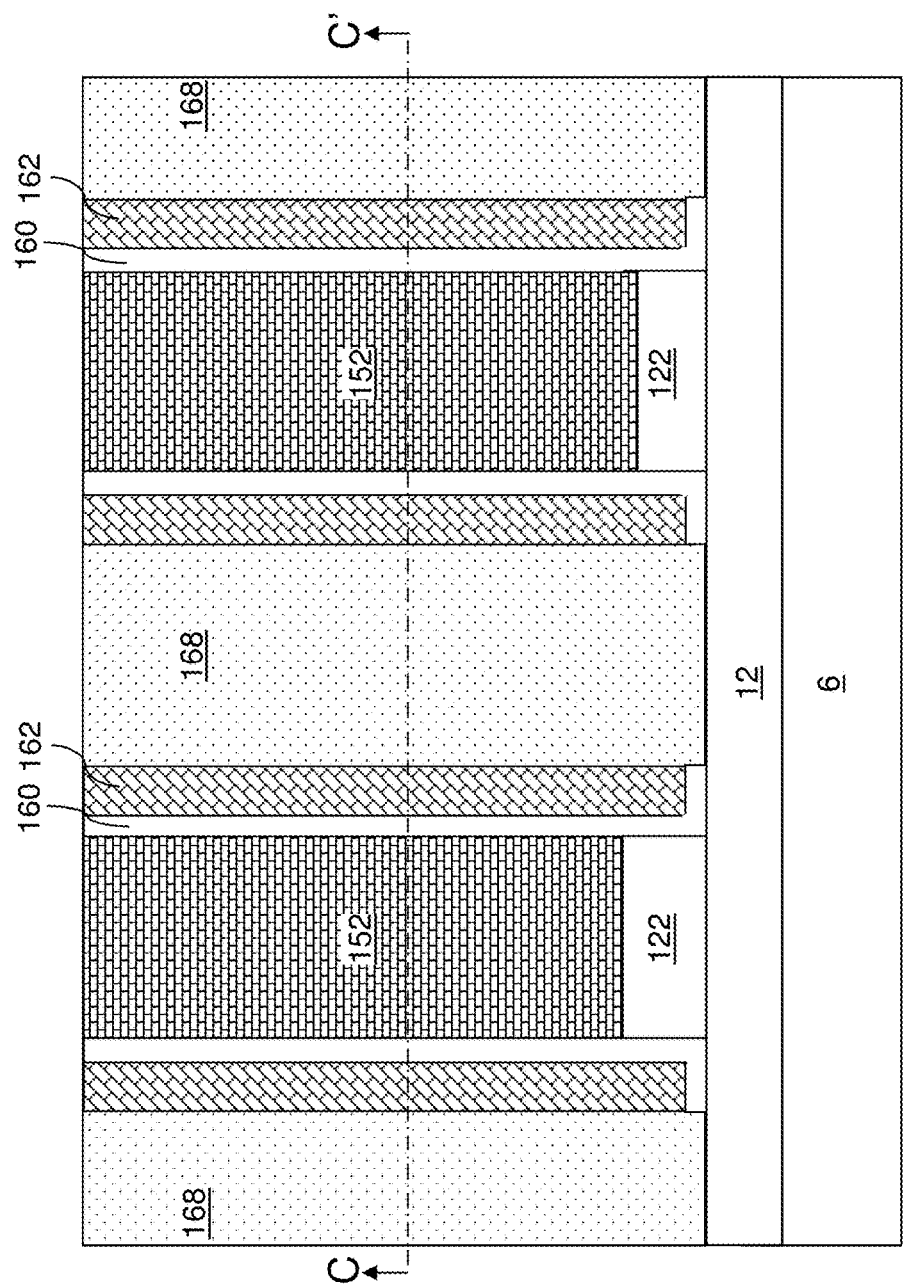
FIG. 38B is a vertical cross-sectional view of the third exemplary structure of FIG. 38A along the vertical plane B-B' in FIG. 38C according to the third embodiment of the present disclosure.
Figure 38C:
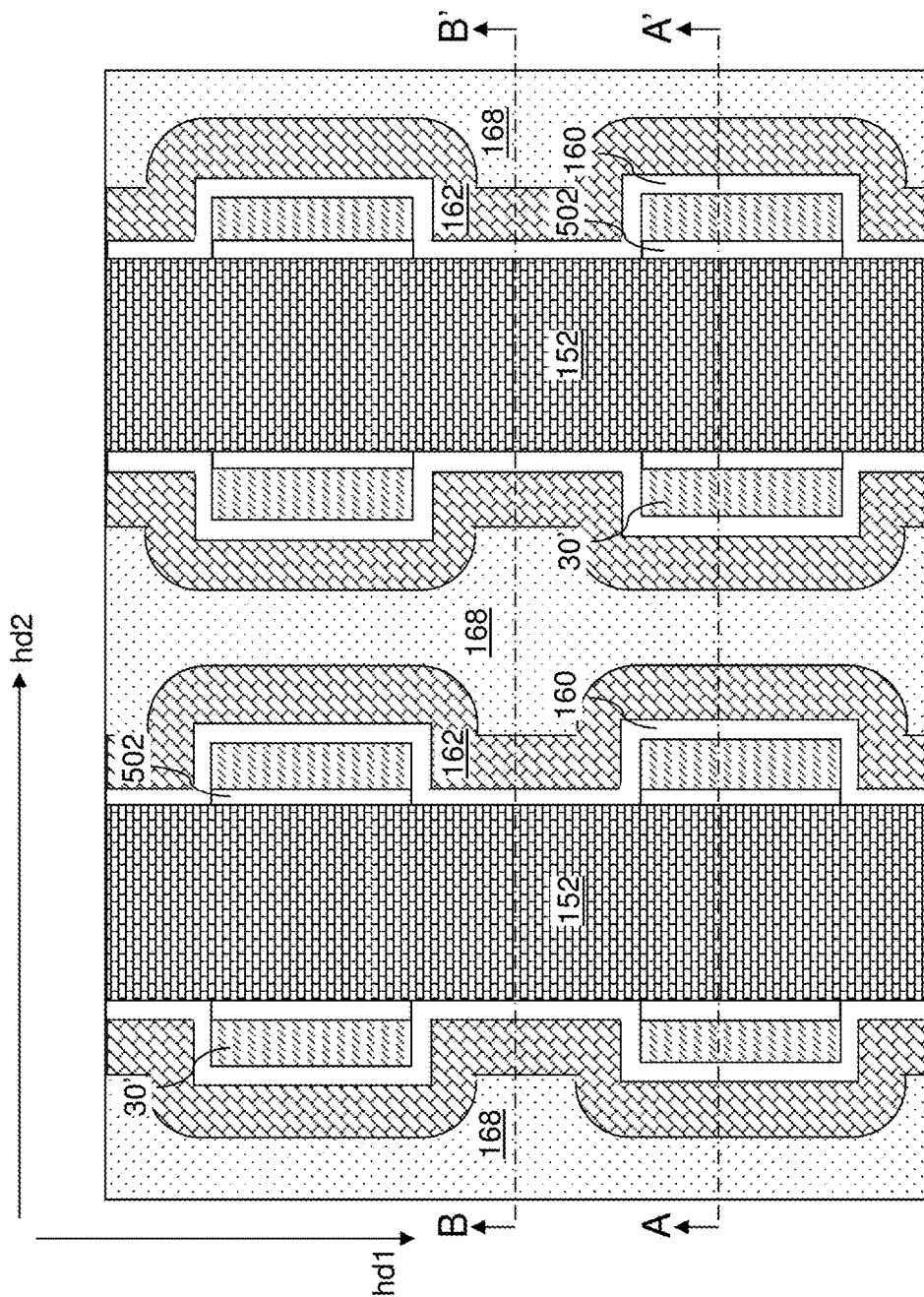
FIG. 38C is a horizontal cross-sectional view of the third exemplary structure of FIGS. 38A and 38B along the horizontal plane C-C' in FIGS. 38A and 38B.

Referring to FIGS. 38A-38C, a dielectric material such as silicon oxide can be deposited in remaining volumes of the laterally-undulating gate electrode trenches 159 by a conformal deposition process or a combination of a non-conformal deposition process and a reflow process. A planarization process can be performed to remove excess portions of the deposited dielectric material from above the inner gate electrode rails 152. Chemical mechanical planarization (CMP) or a recess etch may be employed for the planarization process. Each remaining portion of the deposited dielectric material constitutes an outer isolation dielectric line 168 that extends along the first horizontal direction hd1. The outer isolation dielectric lines 168 can be formed directly on the lower electrode lines 10 and the bottom electrode isolation structures 12. The outer isolation dielectric lines 168 are laterally-undulating structures, each of which includes a pair of laterally-undulating sidewalls.

In one embodiment, a chemical mechanical planarization process can be performed to provide planarized top surfaces for the inner gate electrode rails 152, the inner gate dielectrics 502, the L-shaped semiconductor channel strips 30', the outer gate dielectric layers 160, the outer gate electrode lines 162, and the outer isolation dielectric lines 168. In one embodiment, the planarized top surfaces of the inner gate electrode rails 152, the inner gate dielectrics 502, the L-shaped semiconductor channel strips 30', the outer gate dielectric layers 160, the outer gate electrode lines 162, and the outer isolation dielectric lines 168 may be located within a same horizontal plane.

Figure 39A:
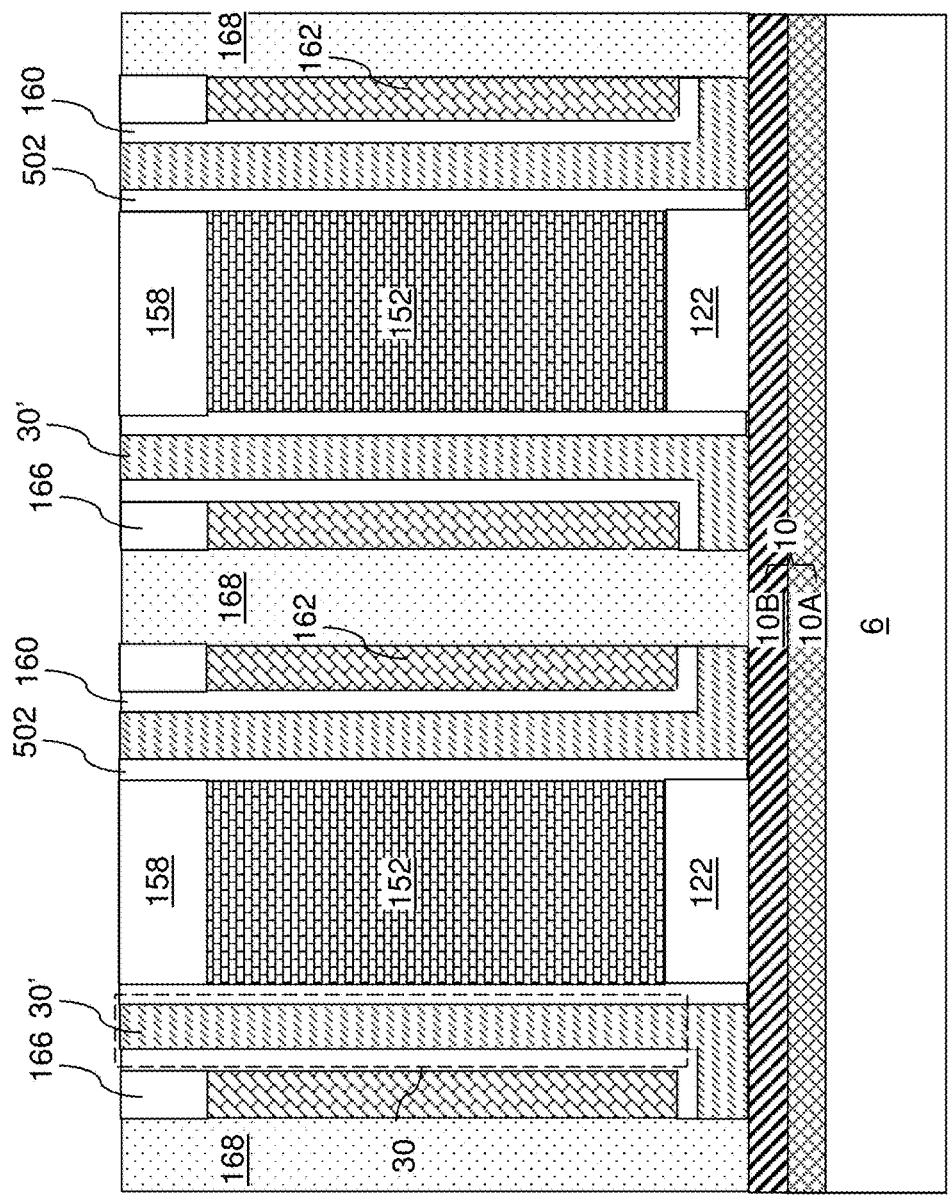
FIG. 39A is a vertical cross-sectional view of the third exemplary structure after recessing inner and outer gate electrode lines and forming cap dielectric lines along the vertical plane A-A' in FIG. 39C according to the third embodiment of the present disclosure.
Figure 39B:
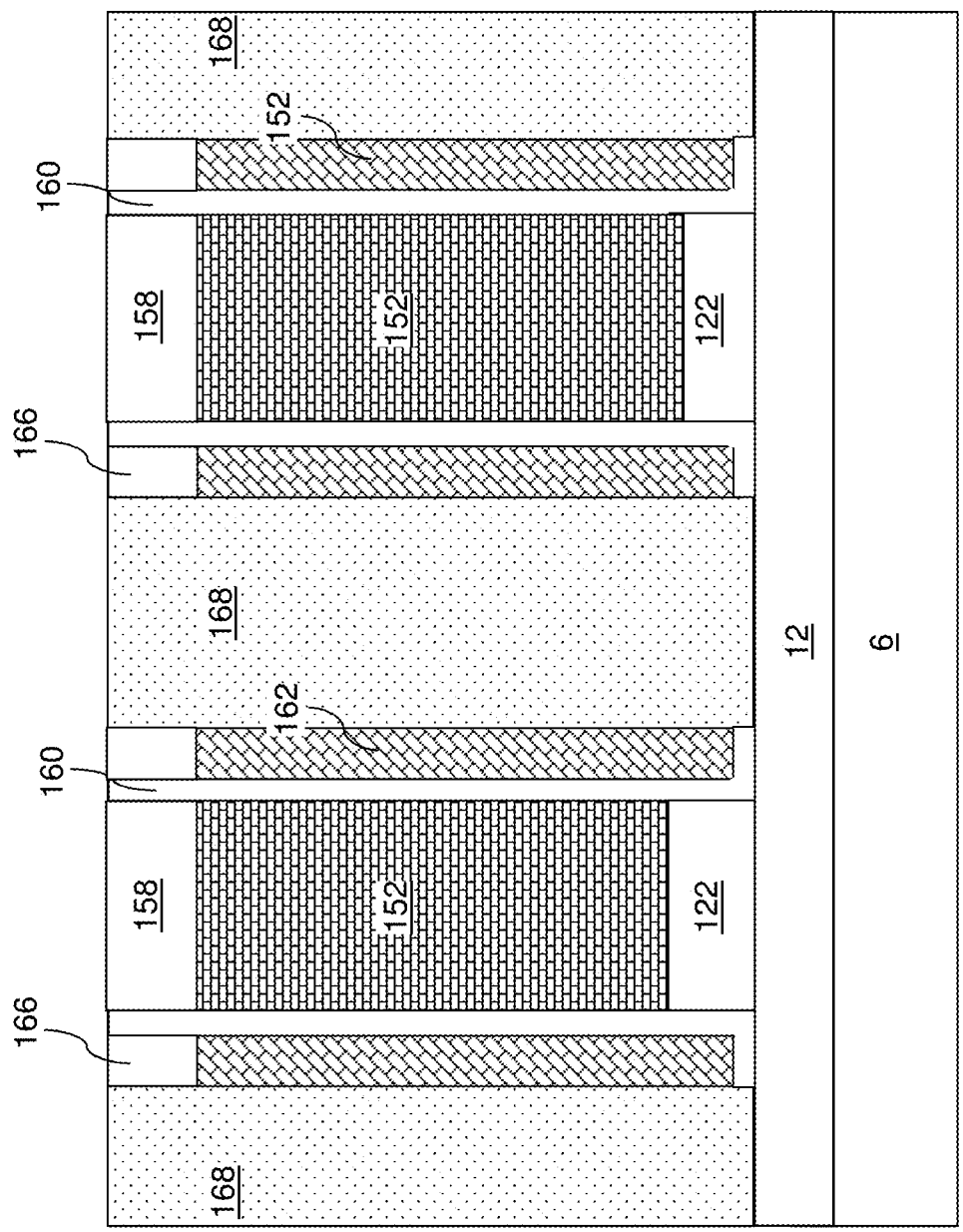
FIG. 39B is a vertical cross-sectional view of the third exemplary structure of FIG. 39A along the vertical plane B-B' in FIG. 39C according to the third embodiment of the present disclosure.
Figure 39C:
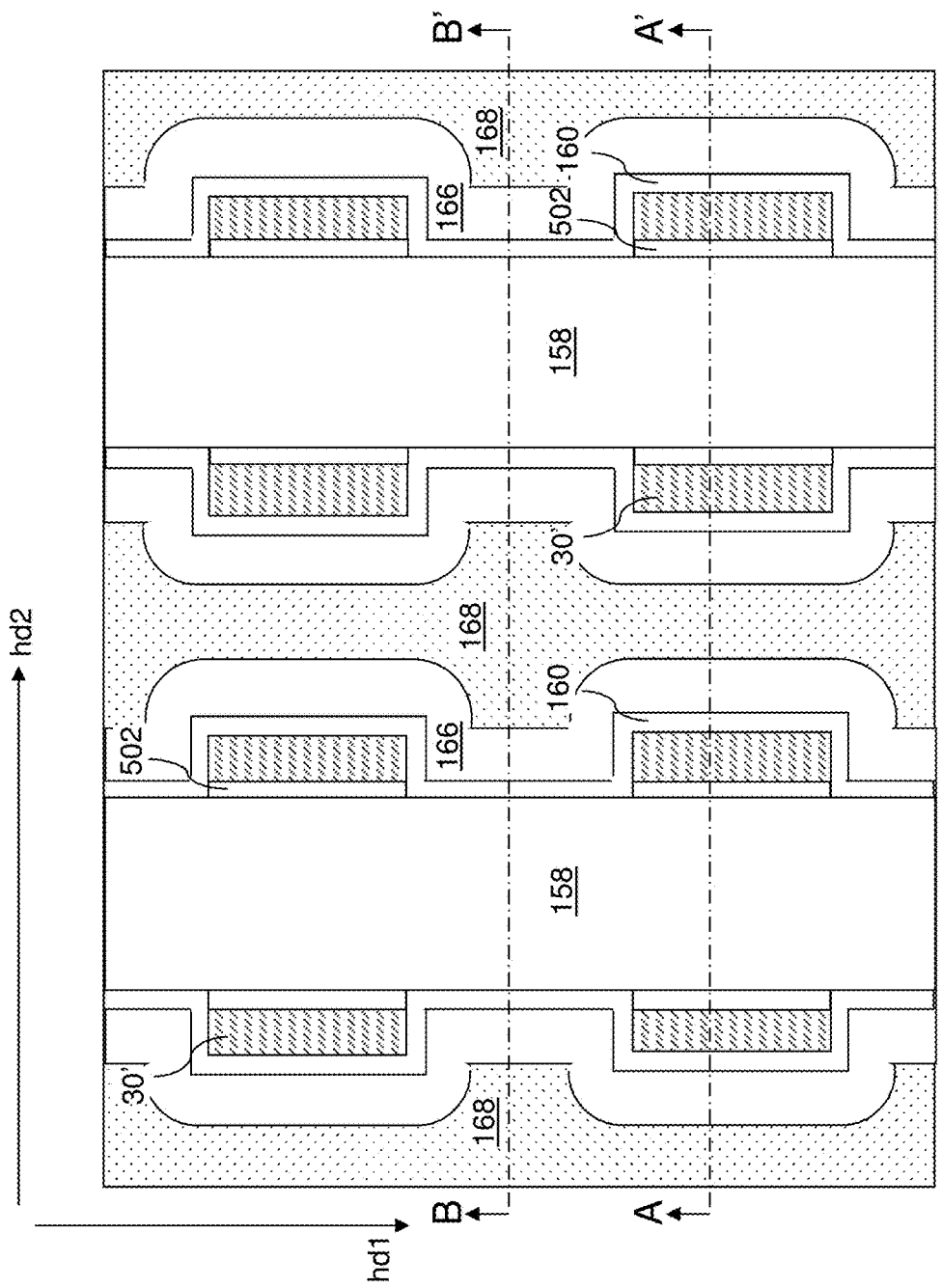
FIG. 39C is a top-down view of the third exemplary structure of FIGS. 39A and 39B.

Referring to FIGS. 39A-39C, physically exposed top surfaces of the inner gate electrode rails 152 and the outer gate electrode lines 162 can be vertically recessed simultaneously or sequentially. The depth of recess of the inner gate electrode rails 152 and the outer gate electrode lines 162 can be selected to be about the height of top active regions to be subsequently formed. Specifically, the depth of recess of the inner gate electrode rails 152 and the outer gate electrode lines 162 can be determined such that the recessed top surfaces of the depth of recess of the inner gate electrode rails 152 and the outer gate electrode lines 162 provide optimal overlap with top active regions to be subsequently formed by conversion of top portions of the L-shaped semiconductor channel strips 30', each of which includes a respective vertical semiconductor channel strip 30. In one embodiment, the inner gate electrode rails 152 and the outer gate electrode lines 162 can include a same conductive material such as TiN, and vertical recessing of the inner gate electrode rails 152 and the outer gate electrode lines 162 can be performed simultaneously. In one embodiment, the recess depth of the inner gate electrode rails 152 and the outer gate electrode lines 162 can be in a range from 5 nm to 100 nm, although lesser and greater recess depths can also be employed. Each portion of an inner gate electrode rail 152 that contacts an inner gate dielectric 502 is an inner gate electrode. Each inner gate electrode rail 152 includes multiple inner gate electrodes for a set of vertical field effect transistors arranged along the first horizontal direction hd1.

A dielectric material such as silicon oxide can be deposited in the vertical recesses, for example, by a conformal deposition process and an optional reflow process. Excess portions of the dielectric material can be removed from above the top surfaces of the L-shaped semiconductor channel strips 30' and the outer isolation dielectric lines 168 by a planarization process. An inner cap dielectric line 158 (which can be a rail structure) can be formed within each vertical recess overlying an inner gate electrode rail 152. An outer cap dielectric line 166 can be formed within each vertical recess overlying an outer gate electrode line 162.

Figure 40B:
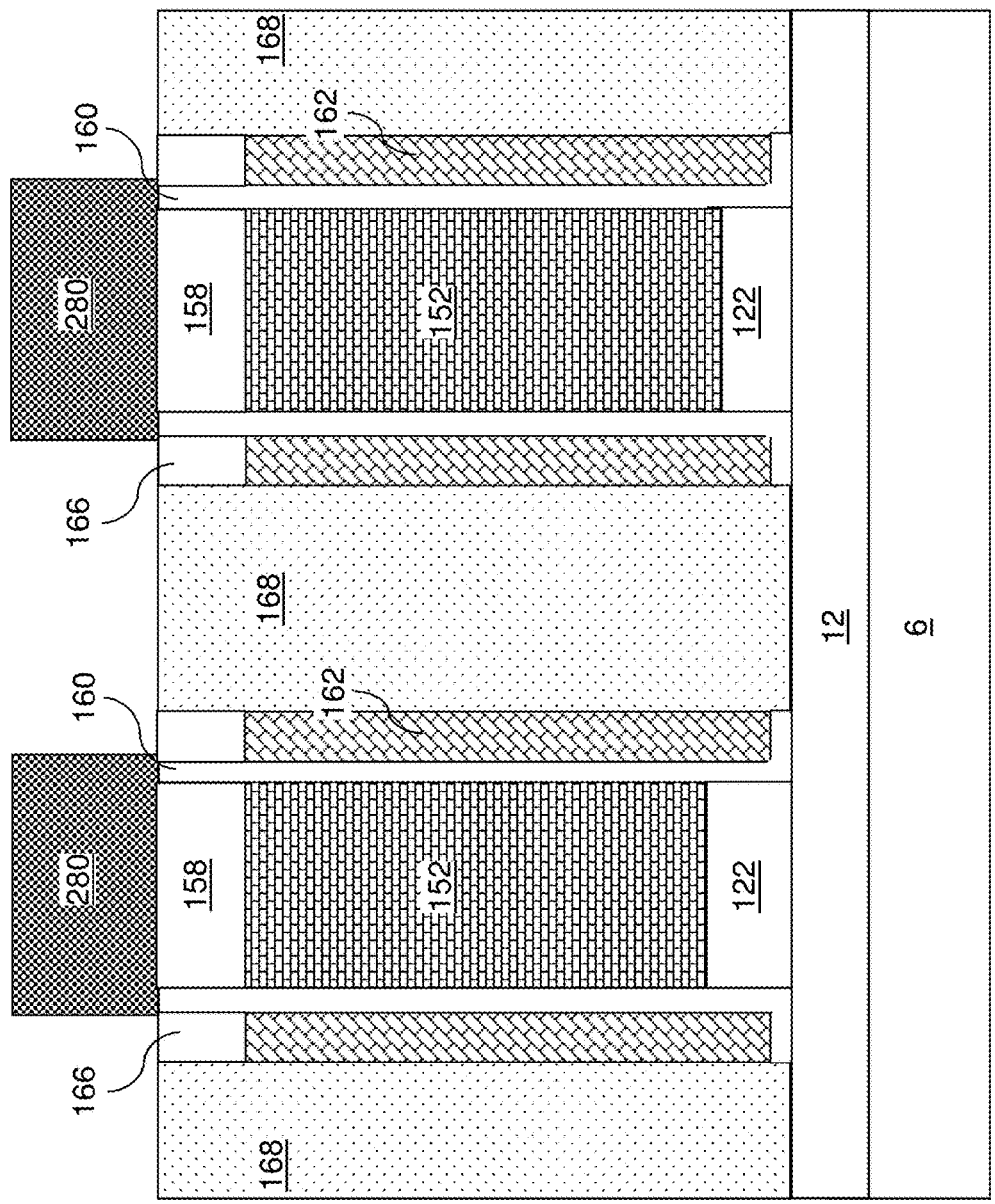
FIG. 40B is a vertical cross-sectional view of the third exemplary structure of FIG. 40A along the vertical plane B-B' in FIG. 40C according to the third embodiment of the present disclosure.
Figure 40C:
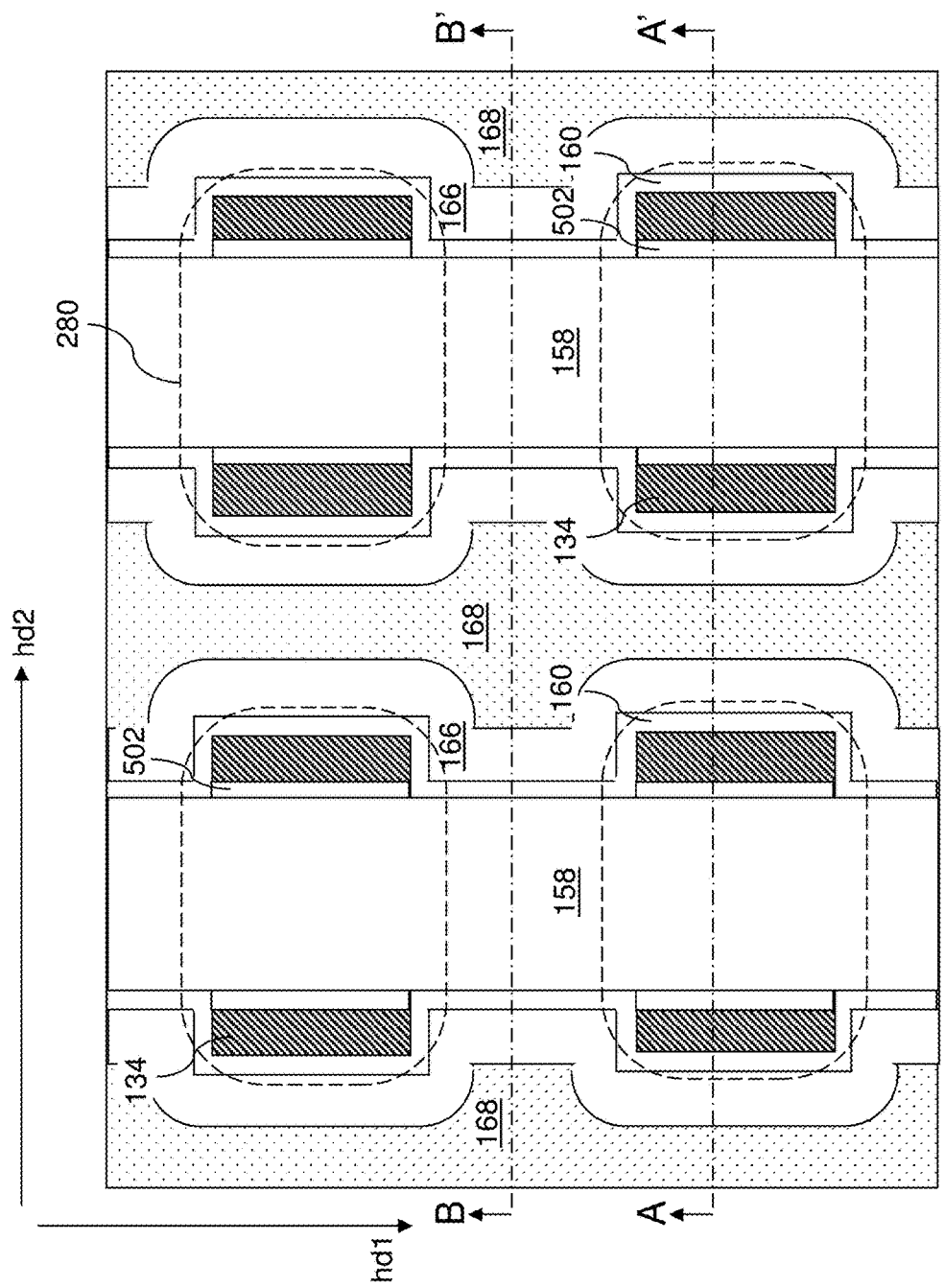
FIG. 40C is a top-down view of the third exemplary structure of FIGS. 40A and 40B.

Referring to FIGS. 40A-40C, top active regions 134 and bottom active regions 132 are formed by doping of top portions and bottom portions of the L-shaped semiconductor channel strips 30' with dopants of the first conductivity type. Each portion of the L-shaped semiconductor channel strip 30' that is not converted into the top active regions 134 or the bottom active regions 132 is a vertical semiconductor channel strip 30 that has a vertical strip shape and functions as a vertical semiconductor channel. For example, dopants of the first conductivity type can be implanted into top portions of the along the L-shaped semiconductor channel strips 30' by an ion implantation process. The angle and the energy of the ion implantation process can be selected to provide a suitable overlap between the top active regions 134 and the inner gate electrode rails 152 and the outer gate electrode lines 162. An activation anneal can be performed at an elevated temperature, which can be in a range from 850 degrees Celsius to 1,050 degrees Celsius. Dopants of the first conductivity type diffuse upward from the doped semiconductor bottom electrode line portions 10B into bottom portions of the L-shaped semiconductor channel strips 30' during the activation anneal to form the bottom active regions 132. The duration and the temperature of the activation anneal can be selected such that a suitable vertical overlap is provided between each bottom active regions 132 and a respective electrically coupled pair of an inner gate electrode rail 152 and an outer gate electrode line 162.

Each pair of top active regions 134 for a vertical field effect transistor can be electrically shorted to each other by a conductive structure 280, which can contact the pair of top active regions 134 from above. Each pair of top active regions 134 can contact a top portion of a respective pair of vertical semiconductor channels 30, and can be electrically shorted to each other via a respective conductive structure 280. In one embodiment, the conductive structures 280 can be contact via structures (e.g., vertical local bit line) formed through a dielectric material layer (not shown).

Figure 41:
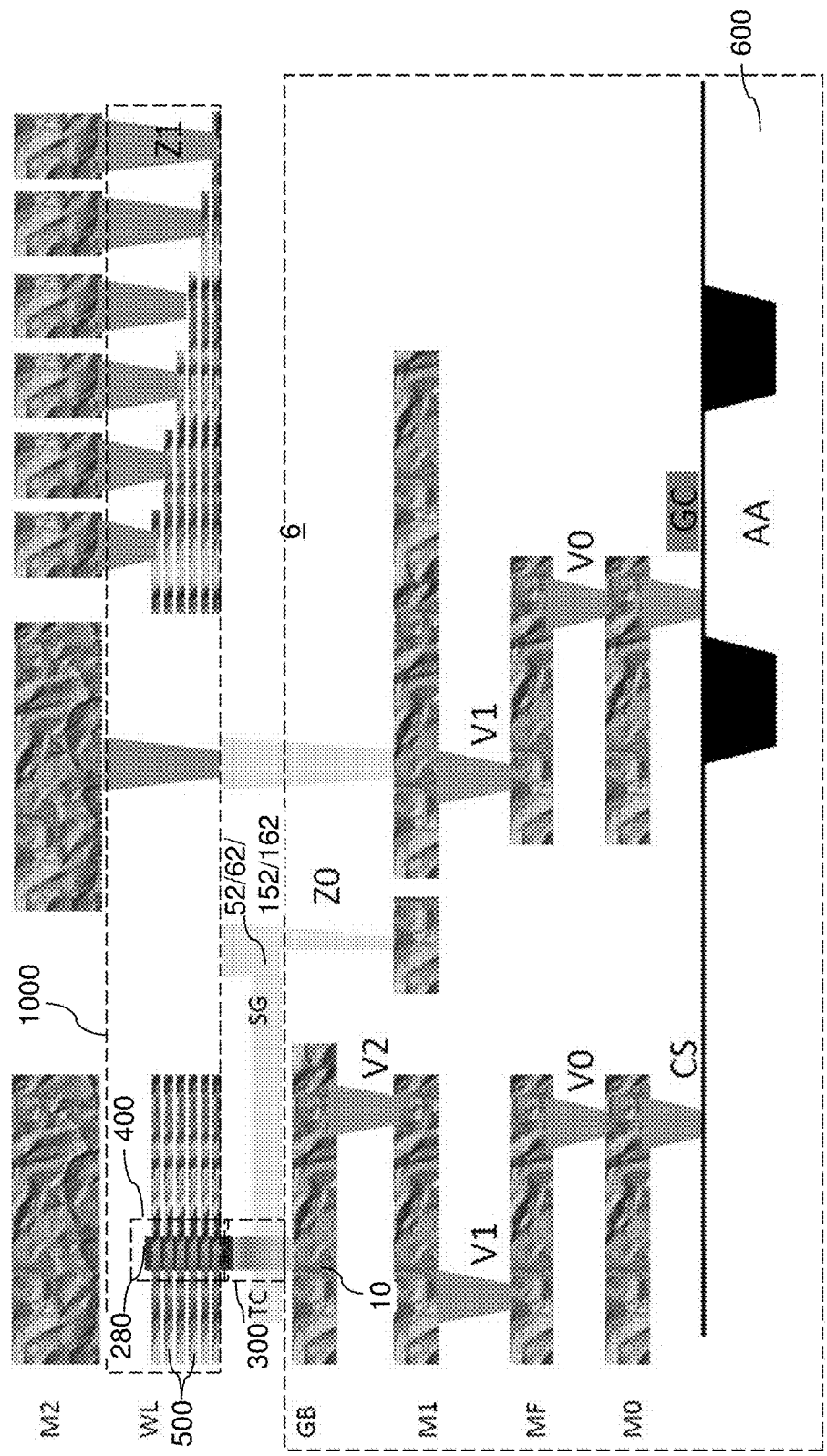
FIG. 41 is a schematic vertical cross-sectional view of a three-dimensional memory device employing an array of vertical field effect transistors of an embodiment of the present disclosure.

FIG. 41 illustrates a three-dimensional memory device employing an array of vertical field effect transistors of an embodiment of the present disclosure. The vertical field effect transistors 300TC function as select transistors of a three dimensional memory device 1000, such as a three dimensional resistive random access memory ReRAM device. A pair of top active regions (34, 134) of each vertical field effect transistor 300TC can be connected to a vertical access line (such as a local bit line) 280 of the three-dimensional memory device 1000. Each vertical field effect transistor controls the activation (i.e., selection) of the respective vertical access line 280. The three-dimensional memory device 1000 includes a vertical stack 400 of memory elements and a vertical stack of word lines 500 separated by insulating layers. In one embodiment, the vertical stack 400 of memory elements can include a vertical stack of resistive random access memory (ReRAM) elements, such as metal oxide (e.g., titanium oxide or nickel oxide) or chalcogenide elements located at the intersections of the vertical access lines 280 and word lines 500. The ReRAM elements change their resistivity in response to an application of a voltage between a respective vertical access line and word line that sandwich the respective ReRAM element. The three-dimensional memory device 1000 can include a two-dimensional array of vertical stacks 400 to provide a three-dimensional array of memory elements. The three-dimensional array of memory elements can be accessed by a two-dimensional array of vertical field effect transistors 300TC described above.

While FIG. 41 illustrated only one instance of a vertical field effect transistor, multiple vertical field effect transistors 300 can be connected to a common bottom electrode line 10 (i.e., to a global bit line) provided at the global bitline (GB) level, which is one of the metal interconnect levels located in or above the substrate 6. The substrate 6 may include a silicon wafer 600 containing various semiconductor devices (e.g., CMOS transistors of a driver circuit) within an active region AA and including various structures at various levels between the memory device 1000 and the silicon wafer 600 such as a gate conductor level GC (e.g., containing gate electrodes for the CMOS transistors of the driver circuit), a contact level CS, a first line level M0, a first via level V0, a second line level MF, a second via level V1, a third line level M1, a third via level V2, and connection level such as Z0. These levels may interconnect the driver circuit with the vertical select field effect transistors 300TC, with word lines 500 and/or with an external contact. In addition, overlying metal interconnect levels such as M2 may be provided which is used to contact the word lines 500 at a stepped terrace contact region using connection level Z1. The various gate electrodes (52, 62, 152, 162) of the present disclosure may be select gate electrodes which are provided at a select gate level SG. The gate electrodes may function as select gate electrodes for a plurality of vertical select transistors (i.e., for a plurality of discrete channels).

The various embodiments of the present disclosure provide at least one vertical field effect transistor. The vertical field effect transistor can include at least one inner gate electrode (522, 152) extending along a first horizontal direction hd1; a pair of inner gate dielectrics 502 contacting a respective sidewall of the at least one inner gate electrode (522, 152) and vertically extending above topmost edges of the at least one inner gate electrode (522, 152); a pair of vertical semiconductor channel strips 30, each including a first sidewall 301 contacting a respective one of the pair of inner gate dielectrics 502, a second sidewall 302 that is parallel to the first sidewall 301, and two transverse sidewalls 30T each adjoining the first sidewall 301 and the second sidewall 302; a pair of outer gate dielectrics (602, 160) contacting a respective one of the pair of vertical semiconductor channel strips 30; a pair of outer gate electrodes (622, 162) contacting a respective one of the pair of outer gate dielectrics (602, 160); at least one bottom active region (32, 132) contacting the pair of vertical semiconductor channel strips 30 and electrically shorted to a bottom electrode line 10; and a pair of top active regions (34, 134) contacting a top portion of a respective one of the pair of vertical semiconductor channel strips 30 and electrically shorted to each other via a conductive structure (36, 280).

In some embodiments, each transverse sidewall 30T of the pair of vertical semiconductor channel strip 30 contacts a respective one of the pair of outer gate dielectrics (602, 160) or a respective one of the pair of inner gate dielectrics 522. In some embodiments, the semiconductor device comprises multiple instances of the vertical field effect transistor that are spaced apart along the first horizontal direction hd1; and each of the pair of outer gate electrodes (622, 162) of the multiple instances of the vertical field effect transistor is a respective portion of a pair of outer gate electrode lines (62, 162) that is shared among each of the multiple instances of the vertical field effect transistor.

Each of the pair of outer gate dielectrics 160 of the multiple instances of the vertical field effect transistor can be a respective portion of a pair of outer gate dielectric layers 160 that laterally extends generally along the first horizontal direction hd1 through each of the multiple instances of the vertical field effect transistor with lateral jogs along a second horizontal direction hd2 at instances of the transverse sidewalls 30T as illustrated in the third exemplary structure.

The at least one inner gate electrode 522 can comprise at least one portion of at least one inner gate electrode line 52 that laterally extends generally along the first horizontal direction hd1 through each of the multiple instances of the vertical field effect transistor and has laterally-undulating sidewalls as illustrated in the first and second embodiments.

In some embodiments, each of the at least one inner gate electrode (522, 152) of the multiple instances of the vertical field effect transistor can be a respective portion of at least one inner gate electrode line (52, 152) that is shared among each of the multiple instances of the vertical field effect transistor. Each of the pair of outer gate electrode lines 62 can have a uniform width along a second horizontal direction hd2 that is perpendicular to the first horizontal direction hd1 throughout the multiple instances of the vertical field effect transistor as illustrated in the first and second exemplary structures.

The at least one inner gate electrode line 52 can be a single inner gate electrode line having a laterally-undulating width as a function of a location along the first horizontal direction hd1, and each of the at least one inner gate electrode 522 of the multiple instances of the vertical field effect transistor can be a respective portion of the single inner gate electrode line 52 as illustrated in the second exemplary structure.

The at least one inner gate electrode line 52 can be a pair of inner gate electrode lines 52 laterally spaced apart from each other along a second horizontal direction hd2 that is perpendicular to the first horizontal direction hd1, a lateral separation distance between the pair of inner gate electrode lines 52 can modulate along the first horizontal direction hd1, and each of the at least one inner gate electrode 522 of the multiple instances of the vertical field effect transistor can be a respective portion of the pair of inner gate electrode lines 52 as illustrated in the first embodiment.

Each inner gate dielectric 502 within the multiple instances of the vertical field effect transistor can be a respective portion of at least one inner gate dielectric layer 50 that laterally extends along the first horizontal direction hd1 and contacts the pair of outer gate dielectric layers 60 between neighboring instances of the field effect transistors within the multiple instances of the vertical field effect transistor as illustrated in the first and second exemplary structures.

Each inner gate dielectric 502 within the multiple instances of the vertical field effect transistor can be a discrete dielectric material portion that is physically spaced apart from other inner gate dielectrics 502 and has a same lateral extent along the first horizontal direction hd1 as a vertical semiconductor channel strip 30 that each inner gate dielectric 502 contacts as illustrated in the third exemplary structure.

In some embodiments, the at least one instance of a vertical field effect transistor can comprise a two-dimensional rectangular array of a plurality of instances of the vertical field effect transistor.

The entirety of the vertical semiconductor channel strip 30 can be a depletion zone in each of the vertical field effect transistors of the present disclosure. Thus, the vertical field effect transistors of the present disclosure functions as fully depleted field effect transistor that displays electrical characteristics of fully depleted silicon-on-insulator field effect transistors with a modification in the direction of the channel. Each vertical semiconductor channel strip 30 can be fully laterally enclosed (i.e., surrounded) by an inner gate dielectric and an outer gate dielectric. Further, each vertical semiconductor channel strip 30 is controlled by a pair of gate electrodes that includes an inner gate electrode (522, 152) and an outer gate electrode (622, 162). Each vertical field effect transistor includes a pair of vertical semiconductor channel strips 30 that are parallel to each other, and are laterally spaced from each other by at least one inner gate electrode (522, 152).

The at least one inner gate electrode (522, 152) can be a single inner electrode or a pair of inner electrodes. Two outer gate electrodes (622, 162) are provided per vertical field effect transistor. Thus, a total of three gate electrodes or four gate electrodes are provided for two vertical channels of each vertical field effect transistor. The voltages of the three or four gate electrodes can be controlled to provide full depletion in both of the vertical semiconductor channel strips 30 during operation of the vertical field effect transistor, thereby enhancing the current-voltage characteristics of the vertical field effect transistor. Specifically, the on-current of the vertical field effect transistor of the present disclosure can be greater than the on-current of a comparative exemplary vertical field effect transistor having the same channel length (along the direction of the current flow) and the same channel width (i.e., the total interface area with the gate dielectrics) and operating at the same operating voltage due to the complete control of the channel through full depletion. Further, the three or four gate electrodes of the vertical field effect transistors of the present disclosure in conjunction with the thin vertical semiconductor channel strips 30 that enables full depletion can provide a lesser off-current than the off-current of a comparative exemplary vertical field effect transistor having the same channel length and the same channel width and operating at the same operating voltage due to the complete control of the channel through full depletion.

Figure 42A:
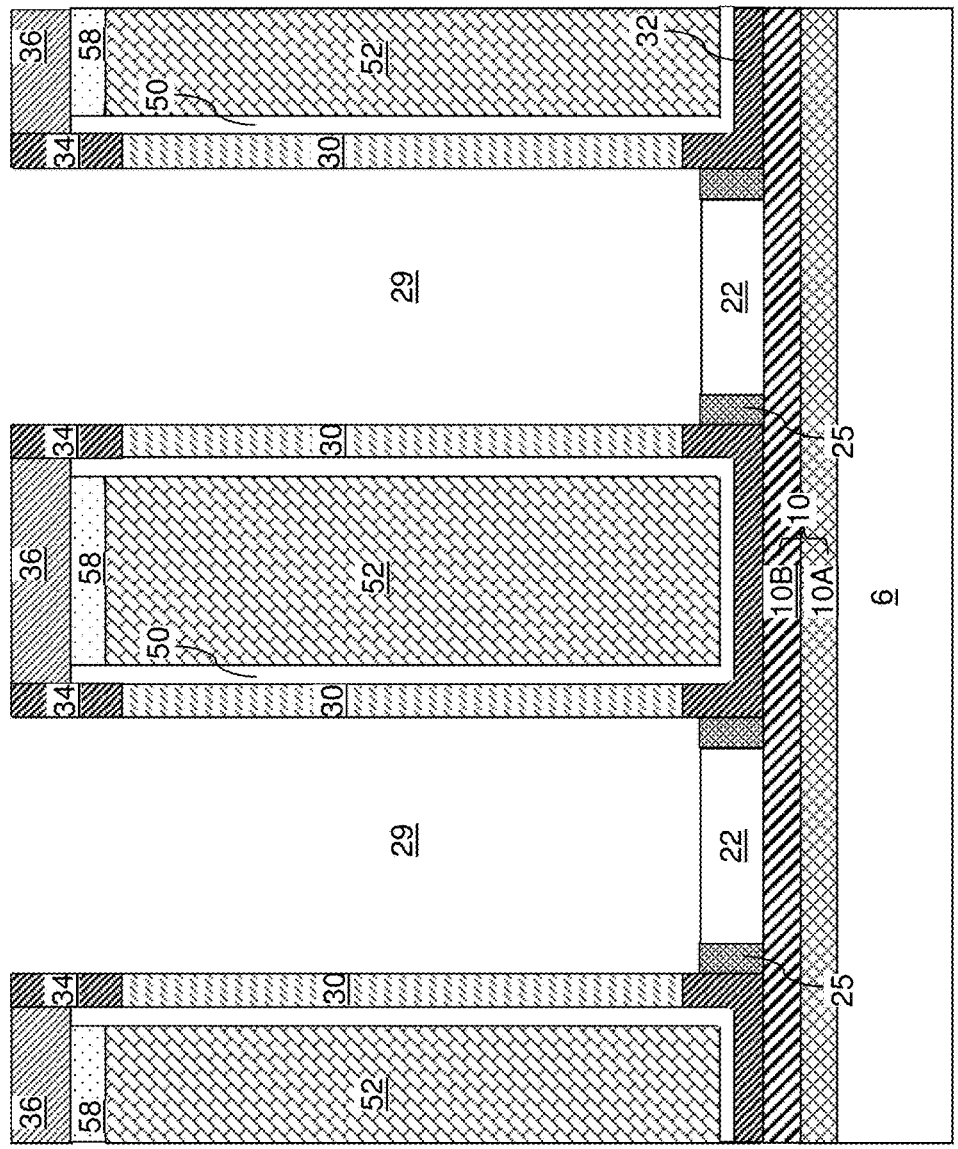
Figure 42B:
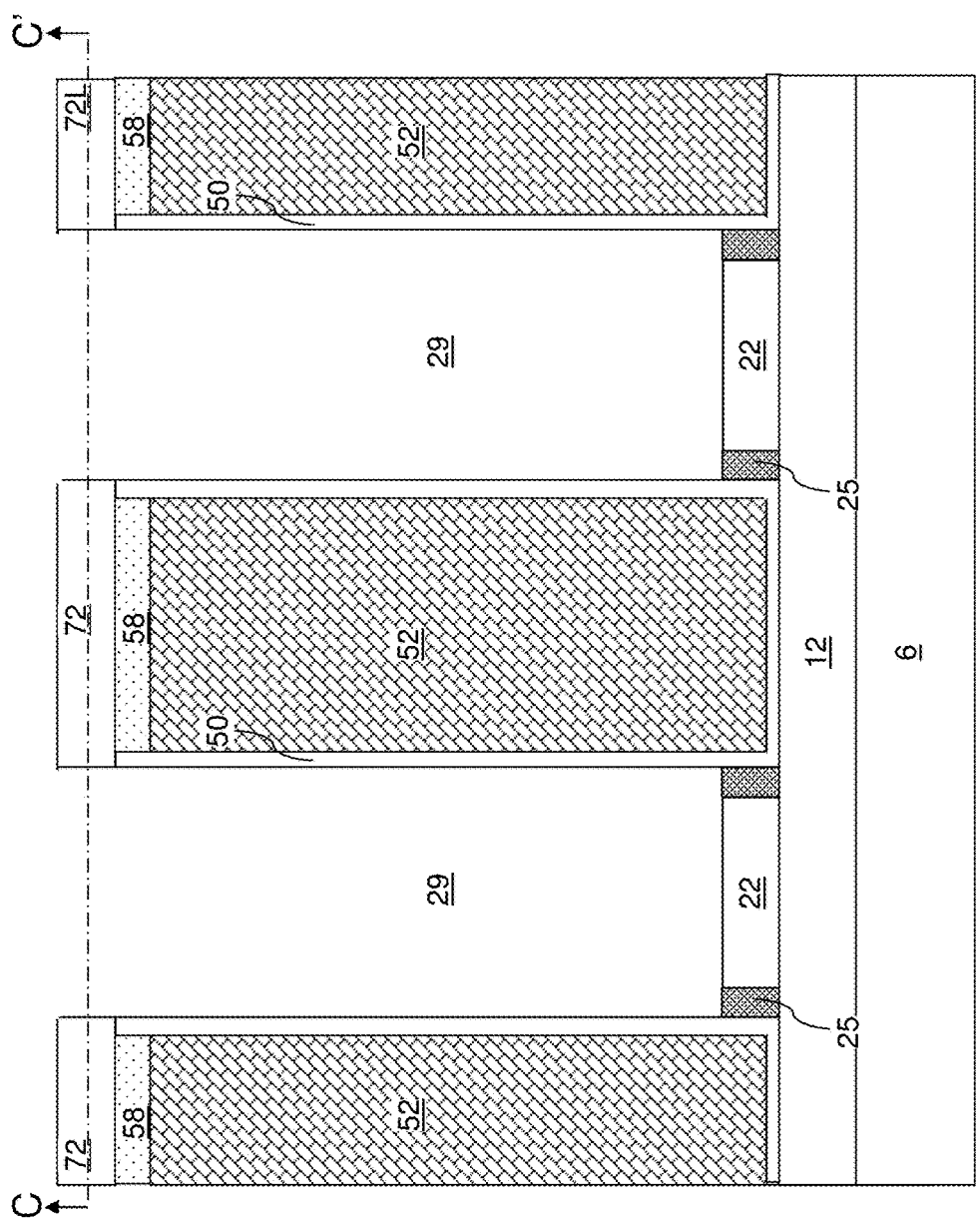
Figure 42C:
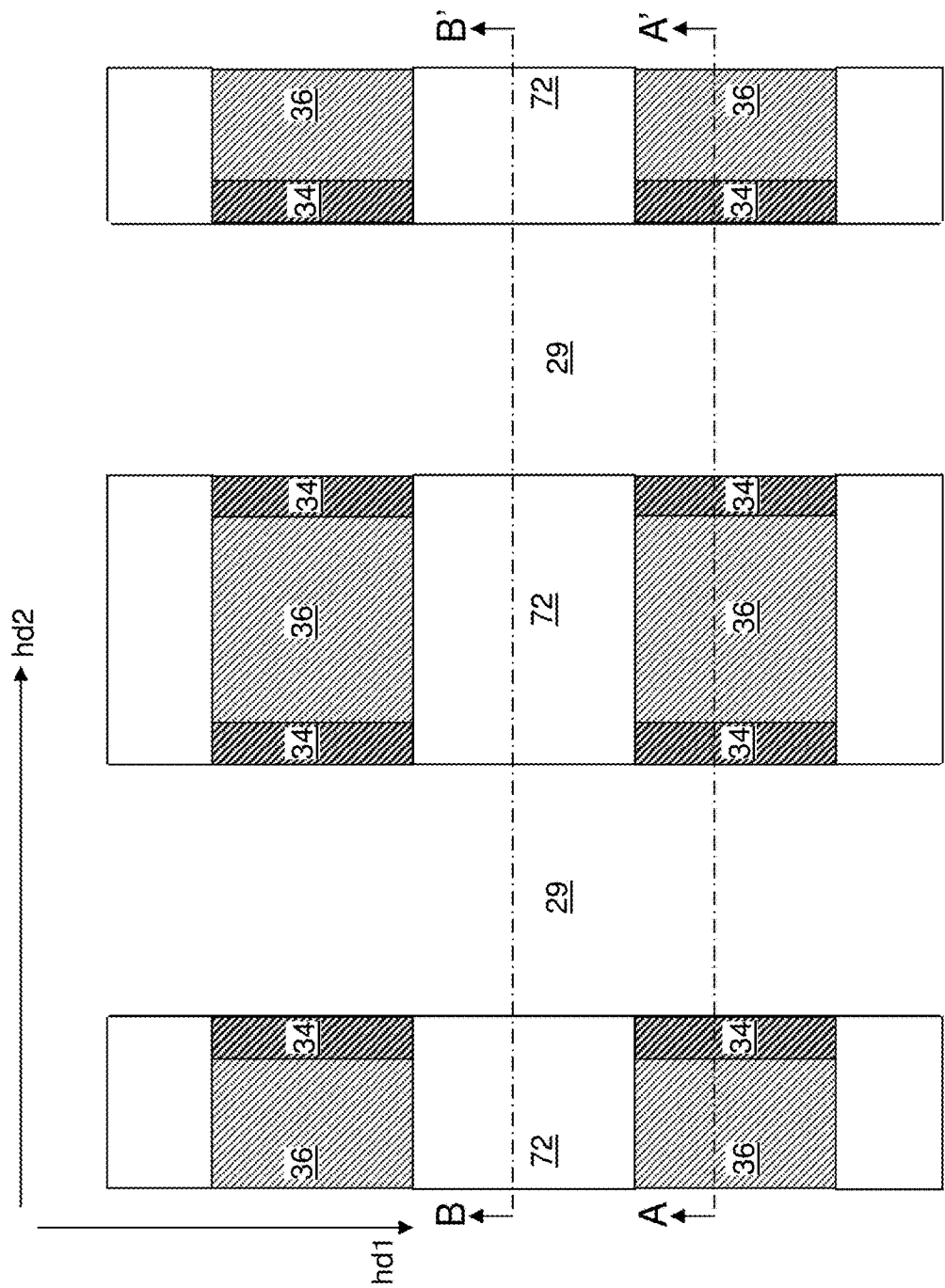

Referring to FIGS. 42A-42C, a fourth exemplary structure according to a fourth embodiment of the present disclosure can be derived from the from the second exemplary structure of FIGS. 27A-27C by performing the processing steps of FIGS. 16A-16C and 17A-17C. Outer gate electrode cavities 29 can be formed between inner gate electrode lines 52, which are laterally-undulating structures including laterally-undulating sidewalls, and thus, is a laterally-undulating gate electrode line.

Referring to FIGS. 43A-43D, the processing steps of FIGS. 18A-18C can be performed to form outer gate dielectrics 60 on the physically exposed surfaces of the vertical semiconductor channel strips 30, for example, by conformal deposition of a gate dielectric material and/or by thermal oxidation and/or nitridation of the physically exposed surface portions of the vertical semiconductor channel strips 30.

A conductive material is deposited and vertically recessed to form outer gate electrode rails 352, each of which can be straight-sidewalled. The outer gate electrode rails 352 can include the same material as the straight-sidewalled gate electrode layer 62L of the first embodiment. Thus, the outer gate electrode rails 352 can be made of a different electrically conductive material than the inner gate electrode lines 52. For example, the outer gate electrode rails 352 can be made of a metallic material (e.g., metal or metal alloy, such as titanium nitride or tungsten), while the inner gate electrode lines 52 can be made of heavily doped semiconductor material, such as heavily doped polysilicon. Subsequently, a dielectric material such as doped or undoped silicate glass or organosilicate glass can be deposited over the outer gate electrode rails 352 to form outer isolation dielectric lines 68 can laterally extend along the first horizontal direction hd1. Each outer isolation dielectric line 68 can be formed over a single outer gate electrode rail 352.

In the configuration of the fourth exemplary structure, each outer gate electrode lines 352 can be shared by a pair of vertical field effect transistors that are laterally spaced apart along the second horizontal direction. Current flow within a pair of vertical semiconductor channel strips 30 of a field effect transistor can be controlled by an inner gate electrode line 52 and a pair of outer gate electrode rails 352. Each outer gate electrode rail 352 can be shared between a pair of vertical field effect transistors that are laterally spaced apart along the second horizontal direction hd2. Voltages to the inner gate electrode lines 52 and/or the outer gate electrode rails 352 can be applied such that current flow through each vertical semiconductor channel strip 30 is enabled. The fourth exemplary structure can replace any of the first, second, and third exemplary structures.

Figure 43A:
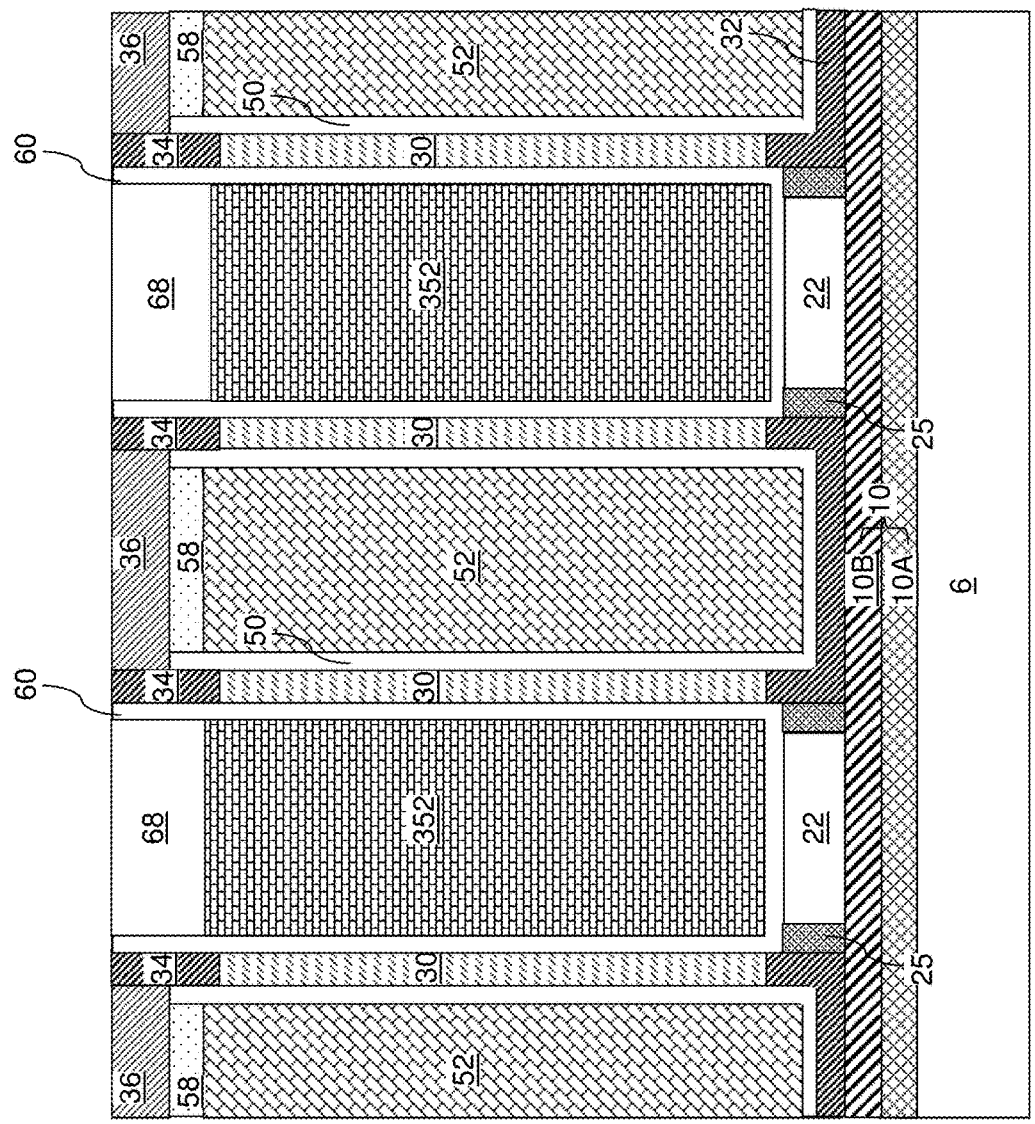
Figure 43B:
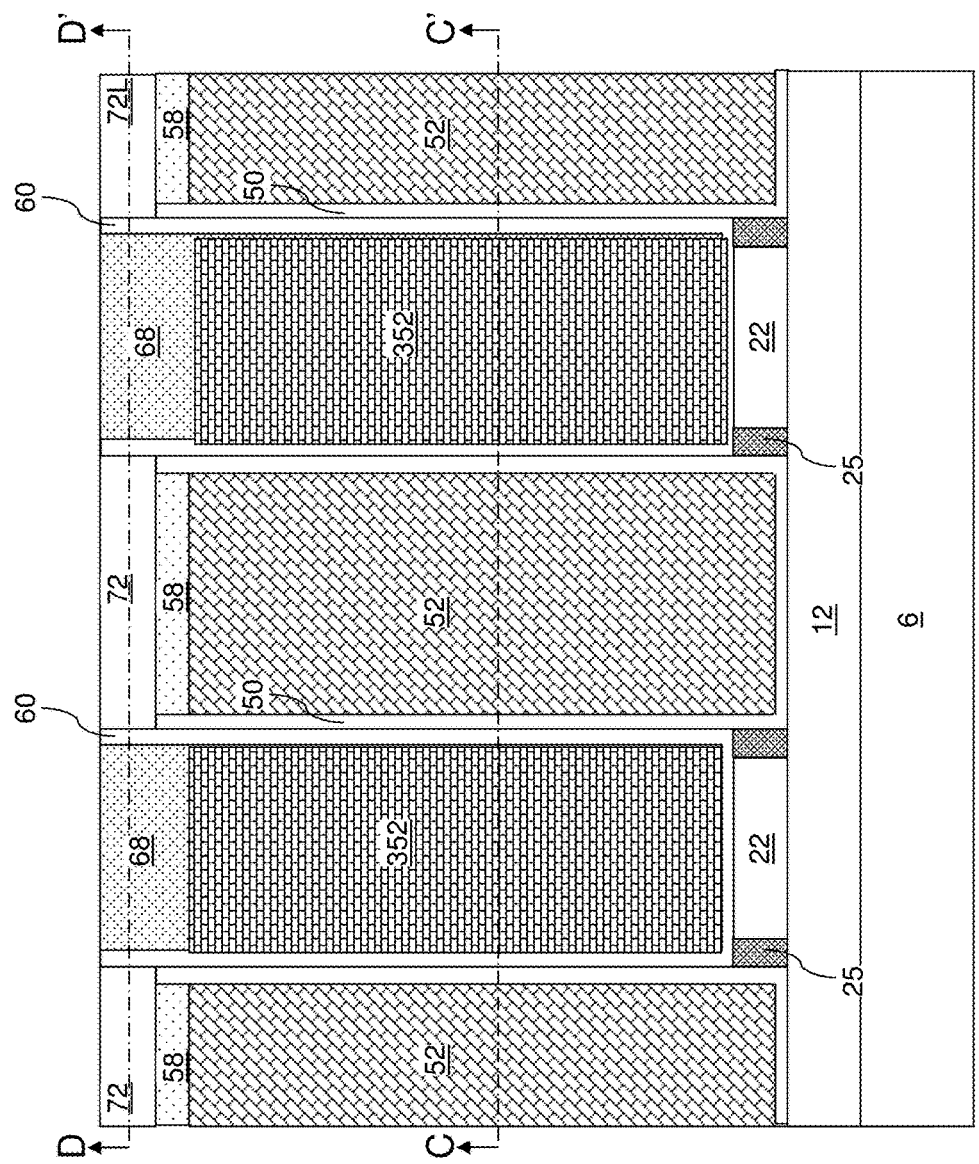
Figure 43C:
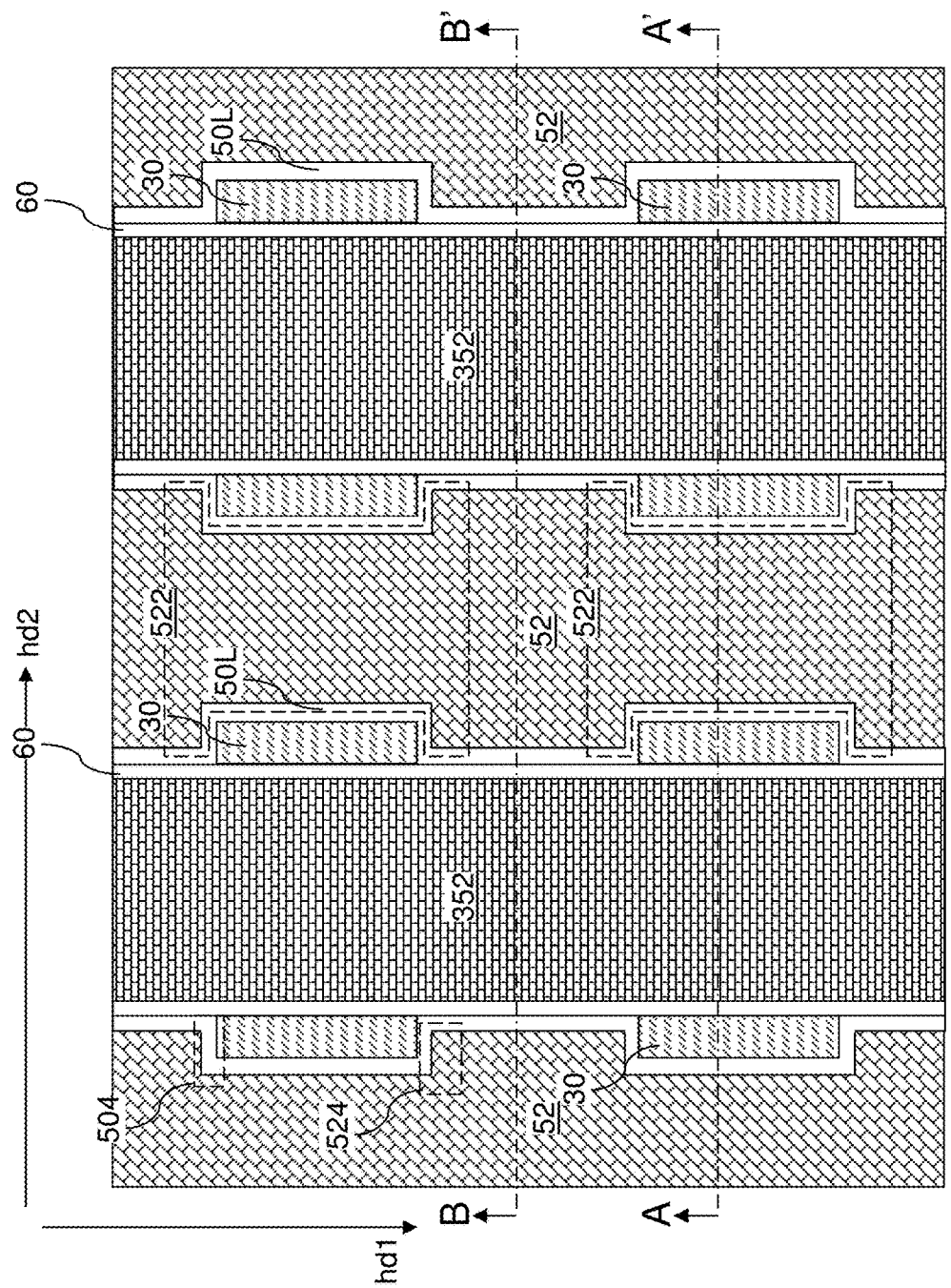
Figure 43D:
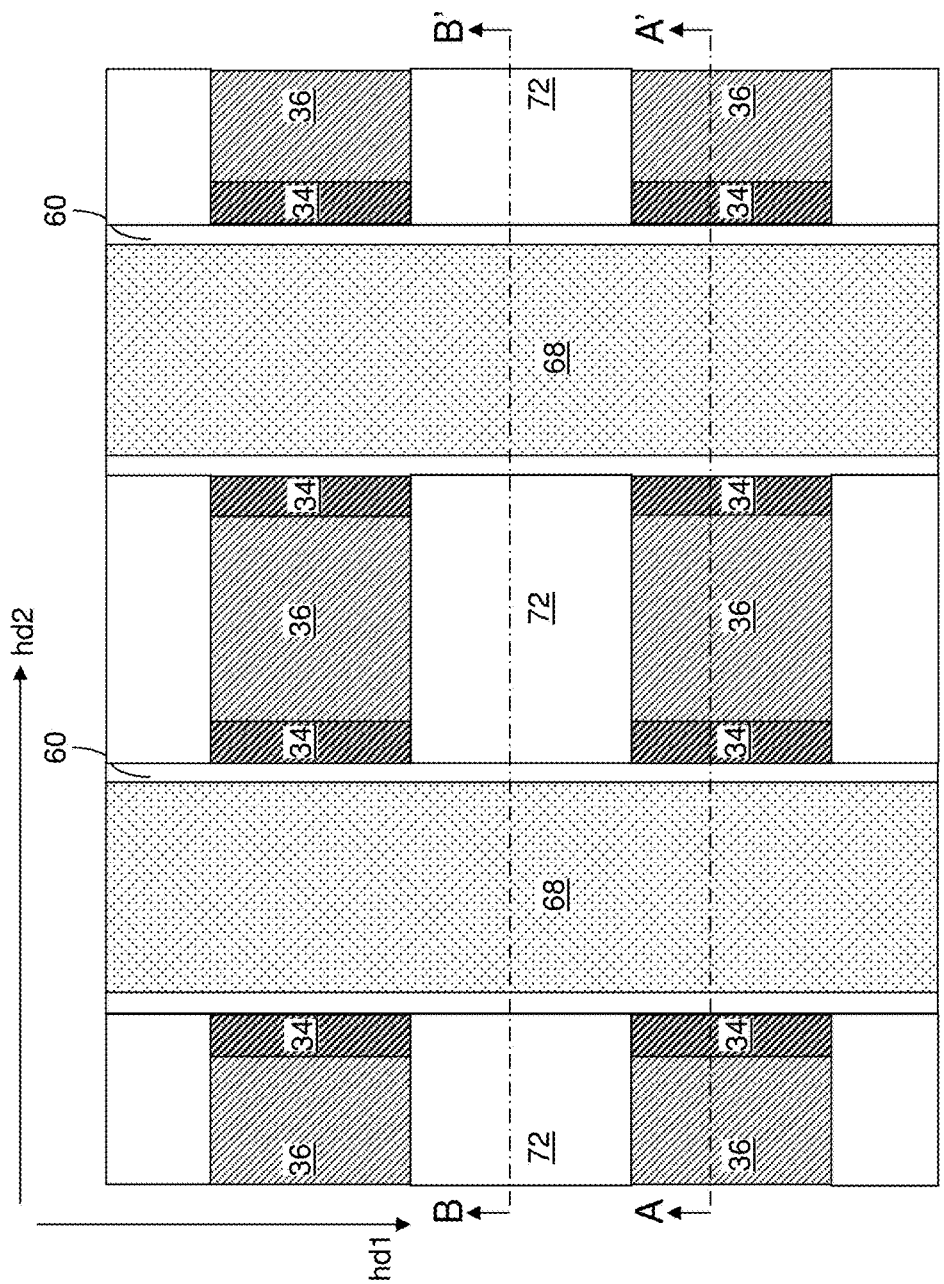

The fourth exemplary structure includes a semiconductor device comprising at least one vertical field effect transistor. Each vertical field effect transistor includes: an inner gate electrode 522 (i.e., a portion of an inner gate electrode line 52, as shown in FIG. 43C) extending along a first horizontal direction hd1; a pair of inner gate dielectrics (i.e., portions of two laterally-undulating gate dielectric layers 50L) contacting a respective sidewall of the inner gate electrode 522 and vertically extending above topmost edges of the inner gate electrode 522; a pair of vertical semiconductor channel strips 30, each including a first sidewall contacting a respective one of the pair of inner gate dielectrics, a second sidewall that is parallel to the first sidewall, and two transverse sidewalls each adjoining the first sidewall and the second sidewall; a pair of outer gate dielectrics (i.e., portions of an outer gate dielectric layer 60) contacting a respective one of the pair of vertical semiconductor channel strips 30; a pair of outer gate electrodes (i.e., portions of two outer gate electrode rails 352) contacting a respective one of the pair of outer gate dielectrics; at least one bottom active region 32 contacting the pair of vertical semiconductor channel strips 30 and electrically shorted to a bottom electrode line 10; and a pair of top active regions 34 contacting a top portion of a respective one of the pair of vertical semiconductor channel strips 30 and electrically shorted to each other via a conductive structure (e.g., a top electrode connector 36), as shown in FIG. 43A.

Each of the inner gate electrode lines/rails can be electrically biased independently by a respective inner gate electrode driver circuit. Each of the outer gate electrode lines/rails can be electrically biased independently by a respective outer gate electrode driver circuit. In one embodiment, a set of at least one inner gate electrode rail and at least one outer gate electrode rail for a single vertical field effect transistor may be electrically coupled and/or shorted (e.g., electrically connected to the same select gate line). This mode of operation may be carried out with vertical field effect transistors of the first, second and third embodiments. Alternatively, at least one inner gate electrode rail and at least one outer gate electrode rail for a single vertical field effect transistor may be electrically isolated and independently controlled (e.g., at least one inner gate electrode is electrically connected to different select gate line from at least one of the pair of outer gate electrodes). In this case, each of the outer gate electrode rails/lines can be biased independently (e.g., at different voltages) of the inner gate electrode rails/lines in the same field effect transistor. Likewise, each of the inner gate electrode rails/lines can be biased independently of the outer gate electrode rails/lines in the same field effect transistor. This mode of operation may be carried out with vertical field effect transistors of the first, second, third, and fourth embodiments. In the fourth embodiment, the inner gate electrode can be made of a different material from the two outer gate electrodes and can be biased differently from the two outer gate electrodes. Furthermore, the two outer gate electrodes and electrically connected to each other and biased together at the same voltage.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor device comprising at least one vertical field effect transistor, comprising:
    at least one inner gate electrode extending along a first horizontal direction;
    a pair of inner gate dielectrics contacting a respective sidewall of the at least one inner gate electrode and vertically extending above topmost edges of the at least one inner gate electrode;
    a pair of vertical semiconductor channel strips, each including a first sidewall contacting a respective one of the pair of inner gate dielectrics, a second sidewall that is parallel to the first sidewall, and two transverse sidewalls each adjoining the first sidewall and the second sidewall;
    a pair of outer gate dielectrics contacting a respective one of the pair of vertical semiconductor channel strips;
    a pair of outer gate electrodes contacting a respective one of the pair of outer gate dielectrics;
    at least one bottom active region contacting the pair of vertical semiconductor channel strips and electrically shorted to a bottom electrode line; and
    a pair of top active regions contacting a top portion of a respective one of the pair of vertical semiconductor channel strips and electrically shorted to each other via a conductive structure.

2. The semiconductor device of claim 1, wherein each transverse sidewall of the pair of vertical semiconductor channel strip contacts a respective one of the pair of outer gate dielectrics or a respective one of the pair of inner gate dielectrics.

3. The semiconductor device of claim 1, wherein:
    the semiconductor device comprises multiple instances of the vertical field effect transistor that are spaced apart along the first horizontal direction; and
    each of the pair of outer gate electrodes of the multiple instances of the vertical field effect transistor is a respective portion of a pair of outer gate electrode lines that is shared among each of the multiple instances of the vertical field effect transistor.

4. The semiconductor device of claim 3, wherein each of the pair of outer gate dielectrics of the multiple instances of the vertical field effect transistor is a respective portion of a pair of outer gate dielectric layers that laterally extends generally along the first horizontal direction through each of the multiple instances of the vertical field effect transistor with lateral jogs along a second horizontal direction at instances of the transverse sidewalls.

5. The semiconductor device of claim 3, wherein the at least one inner gate electrode comprises at least one portion of at least one inner gate electrode line that laterally extends generally along the first horizontal direction through each of the multiple instances of the vertical field effect transistor and has laterally-undulating sidewalls.

6. The semiconductor device of claim 3, wherein:
    each of the at least one inner gate electrode of the multiple instances of the vertical field effect transistor is a respective portion of at least one inner gate electrode line that is shared among each of the multiple instances of the vertical field effect transistor; and each of the pair of outer gate electrode lines has a uniform width along a second horizontal direction that is perpendicular to the first horizontal direction throughout the multiple instances of the vertical field effect transistor.

7. The semiconductor device of claim 6, wherein:
the at least one inner gate electrode line is a single inner gate electrode line having a laterally-undulating width as a function of a location along the first horizontal direction; and
each of the at least one inner gate electrode of the multiple instances of the vertical field effect transistor is a respective portion of the single inner gate electrode line.

8. The semiconductor device of claim 6, wherein:
the at least one inner gate electrode line is a pair of inner gate electrode lines laterally spaced apart from each other along a second horizontal direction that is perpendicular to the first horizontal direction, wherein a lateral separation distance between the pair of inner gate electrode lines modulates along the first horizontal direction; and
each of the at least one inner gate electrode of the multiple instances of the vertical field effect transistor is a respective portion of the pair of inner gate electrode lines.

9. The semiconductor device of claim 3, wherein each inner gate dielectric within the multiple instances of the vertical field effect transistor is a respective portion of at least one inner gate dielectric layer that laterally extends along the first horizontal direction and contacts the pair of outer gate dielectric layers between neighboring instances of the field effect transistors within the multiple instances of the vertical field effect transistor.

10. The semiconductor device of claim 3, wherein each inner gate dielectric within the multiple instances of the vertical field effect transistor is a discrete dielectric material portion that is physically spaced apart from other inner gate dielectrics and has a same lateral extent along the first horizontal direction as a vertical semiconductor channel strip that each inner gate dielectric contacts.

11. The semiconductor device of claim 1, further comprising:
a plurality of word lines located over the at least one vertical field effect transistor;
a vertical local bit line electrically connected to the vertical field effect transistor which is a select transistor for the vertical local bit line; and
a vertical stack of resistive random access memory elements located at intersections of the vertical local bit line with the plurality of word lines.

12. The semiconductor device of claim 1, wherein:
the at least one inner gate electrode is electrically connected to different select gate line than at least one of the pair of outer gate electrodes;
the at least one inner gate electrode is configured to be biased at a different voltage from the at least one of the pair of outer gate electrodes; and
the at least one inner gate electrode is made from a different material than at least one of the pair of outer gate electrodes.

13. A method of forming a semiconductor device comprising at least one vertical field effect transistor, the method comprising:

forming matrix rail structures over a substrate, wherein each of the matrix rail structures includes a pair of lengthwise sidewalls that extend along a first horizontal direction and comprises, or is at least partially subsequently replaced with, a set of at least one gate electrode rail extending along the first horizontal direction and straight-sidewalled gate dielectrics;

forming a plurality of vertical semiconductor channel strips on portions of the lengthwise sidewalls of the matrix rail structures, wherein each of the plurality of vertical semiconductor channel strips includes a first sidewall contacting a respective portion of the lengthwise sidewalls of the at least one matrix rail structure, a second sidewall that is parallel to the first sidewall, and two transverse sidewalls each adjoining the first sidewall and the second sidewall;

forming a laterally-undulating gate dielectric layer on the second sidewall of the plurality of vertical semiconductor channel strips and on additional portions of the lengthwise sidewalls of the matrix rail structures; and forming at least one laterally-undulating gate electrode line between each neighboring pair of matrix rail structures, wherein each sidewall of the plurality of vertical semiconductor channel strips is physically contacted by a dielectric surface of a combination of portions of the laterally-undulating gate dielectric layer and a respective straight-sidewalled gate dielectric.

14. The method of claim 13, further comprising:
forming a semiconductor channel material layer over the matrix rail structures and on an entirety of the lengthwise sidewalls of the matrix rail structures; and
patterning the semiconductor channel material layer into the plurality of vertical semiconductor channel strips.

15. The method of claim 14, wherein:
the matrix rail structures are laterally spaced apart along a second horizontal direction; and
the method further comprises filling spaces among the matrix rail structures with at least one fill material after formation of the semiconductor channel material layer.

16. The method of claim 15, further comprising:
forming a plurality of etch masks extending along the second horizontal direction and spaced among one another along the first horizontal direction over material portions of the semiconductor channel material layer;
removing portions of the semiconductor channel material layer and the at least one fill material from within areas not covered by the plurality of etch masks; and
removing the plurality of etch masks and remaining portions of the at least one fill material.

17. The method of claim 13, further comprising forming a laterally-undulating cap dielectric lines over each laterally-undulating gate electrode line, wherein each of the matrix rail structures is replaced with a respective set of at least one gate electrode rail and straight-sidewalled gate dielectrics after formation of the inner isolation dielectric lines.

18. The method of claim 17, wherein the matrix rail structures is formed by:
depositing a layer stack of a first dielectric material layer and a second dielectric material layer;
patterning the layer stack into dielectric rail structures laterally extending along the first horizontal direction; and
forming a dielectric spacer on each of the dielectric rail structures, wherein each contiguous combination of a dielectric rail structure and a dielectric spacer constitutes one of the matrix rail structures.

19. The method of claim 17, further comprising:

physically exposing first sidewalls of each of the plurality of vertical semiconductor channel strips by removal of a predominant portion of each of the matrix rail structures;

forming a conformal gate dielectric layer as a continuous dielectric material layer that physically contacts each first sidewall of the plurality of vertical semiconductor channel strips, wherein the straight-sidewalled gate dielectrics comprise portions of the conformal gate dielectric layer adjacent to the plurality of vertical semiconductor channel strips.

20. The method of claim 17, wherein:

the at least one laterally-undulating gate electrode line formed between each neighboring pair of matrix rail structures consists of a single inner gate electrode line that contacts an entirety of a top surface of a horizontal portion of the laterally-undulating gate dielectric layer that extends between two vertical portions of the laterally-undulating gate dielectric layer; and an inner isolation dielectric line is formed over each single inner gate electrode line, wherein the inner isolation dielectric line is vertically spaced from the horizontal portion of the laterally-undulating gate dielectric layer by the single inner gate electrode line.

21. The method of claim 20, wherein:

the inner gate electrode line comprises a first electrically conductive material;

the least one gate electrode rail comprises a second electrically conductive material different from the first electrically conductive material; and the least one gate electrode rail is shared with an adjacent field effect transistor.

22. The method of claim 17, wherein:

the at least one laterally-undulating gate electrode line formed between each neighboring pair of matrix rail structures comprises two inner gate electrode lines that contacts a respective portion of a top surface of a horizontal portion of the laterally-undulating gate dielectric layer that extends between two vertical portions of the laterally-undulating gate dielectric layer; and an inner isolation dielectric line is formed over the two inner gate electrode lines and directly on a region of the top surface of the horizontal portion of the laterally-undulating gate dielectric layer and between the two inner gate electrode lines.

23. The method of claim 22, wherein the two inner gate electrode lines are formed by:

depositing a continuous inner gate electrode layer on the laterally-undulating gate dielectric layer; and anisotropically etching the continuous inner gate electrode layer to remove horizontal portions thereof, wherein remaining vertical portion of the continuous inner gate electrode layer comprises the two inner gate electrode lines.

24. The method of claim 13, wherein each of the matrix rail structures comprises a respective set of an inner gate electrode rail and respective inner gate dielectrics upon formation.

25. The method of claim 13, further comprising:

forming bottom active regions by doping a semiconductor material portion located underneath the plurality of vertical semiconductor channel strips; and forming top active regions on the plurality of vertical semiconductor channel strips by doping of upper portions of the plurality of vertical semiconductor channel strips and by deposition of doped semiconductor material portions in contact with the doped upper portions of the plurality of vertical semiconductor channel strips.

26. The method of claim 13, further comprising:

forming a plurality of word lines located over the at least one vertical field effect transistor;

forming a vertical local bit line electrically connected to the vertical field effect transistor which is a select transistor for the vertical local bit line; and forming a vertical stack of resistive random access memory elements located at intersections of the vertical local bit line with the plurality of word lines.

* * * * *